(12) United States Patent
Miura et al.

(10) Patent No.: US 7,471,171 B2
(45) Date of Patent: Dec. 30, 2008

(54) ELASTIC BOUNDARY WAVE DEVICE, RESONATOR, AND FILTER

(75) Inventors: Michio Miura, Kawasaki (JP); Satoru Matsuda, Kawasaki (JP); Takashi Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 121 days.

(21) Appl. No.: 11/711,893

(22) Filed: Feb. 28, 2007

(65) Prior Publication Data

US 2007/0229192 A1 Oct. 4, 2007

(30) Foreign Application Priority Data

Feb. 28, 2006 (JP) ............................. 2006-053486

(51) Int. Cl.
  H03H 9/25 (2006.01)
  H03H 9/64 (2006.01)
(52) U.S. Cl. ................... 333/193; 333/195; 310/313 A; 310/313 B
(58) Field of Classification Search ............... 333/193, 333/195; 310/313 B
  See application file for complete search history.

(56) References Cited

U.S. PATENT DOCUMENTS

| 4,484,098 A | * | 11/1984 | Cullen et al. ............ 310/313 A |
| 7,224,101 B2 | * | 5/2007 | Mishima et al. ......... 310/313 A |
| 7,310,027 B2 | * | 12/2007 | Kando ........................ 333/133 |
| 2007/0176711 A1 | * | 8/2007 | Kando ........................ 333/193 |

FOREIGN PATENT DOCUMENTS

| JP | 2003-209458 A | | 7/2003 |
| WO | WO 2005/036743 | * | 4/2005 |
| WO | WO 2005/036744 | * | 4/2005 |

OTHER PUBLICATIONS

Masatsune Yamaguchi et al.; "Highly Piezoelectric Boundary Waves in Si/siO$_2$/LiNbO$_3$ Structure"; Proceeding of 1998 IEEE; International Frequency Control Symposium; IEEE; pp. 484-488; The United States of America.

* cited by examiner

*Primary Examiner*—Barbara Summons
(74) *Attorney, Agent, or Firm*—Arent Fox LLP

(57) ABSTRACT

An elastic boundary wave device includes a LiNbO$_3$ substrate, an electrode exciting an elastic wave and provided on the substrate, and a silicon oxide film provided on the substrate to cover the electrode, and parameters of the elastic boundary wave device have any one of ranges, where "θ" is a rotation Y cut angle of the substrate, "a" is a ratio of copper density with respect to a density of a material used as the electrode, "λ" is a wavelength of the elastic wave excited by the electrode, "h" is a film thickness of the electrode, "H" is a thickness of the silicon oxide film.

14 Claims, 64 Drawing Sheets

A1: $h/(\lambda \cdot a) = 0.12$
A2: $h/(\lambda \cdot a) = -0.08 H/\lambda + 0.156$
A3: $h/(\lambda \cdot a) = 0.116$
A4: $h/(\lambda \cdot a) = -0.047 H/\lambda + 0.136$
A5: $h/(\lambda \cdot a) = -0.01 H/\lambda + 0.118$
A6: $h/(\lambda \cdot a) = -0.208 H/\lambda + 0.128$
A7: $h/(\lambda \cdot a) = -0.125 H/\lambda + 0.0925$ Y-CUT ANGLE $\theta = 26°$ B1: $h/(\lambda \cdot a) = -0.05H/\lambda + 0.132$
B2: $h/(\lambda \cdot a) = 0.112$
B3: $h/(\lambda \cdot a) = 0.1$
B4: $h/(\lambda \cdot a) = -0.3H/\lambda + 0.17$
B5: $h/(\lambda \cdot a) = -0.1H/\lambda + 0.09$

FIG. 22

Y-CUT ANGLE $\theta = 27°$

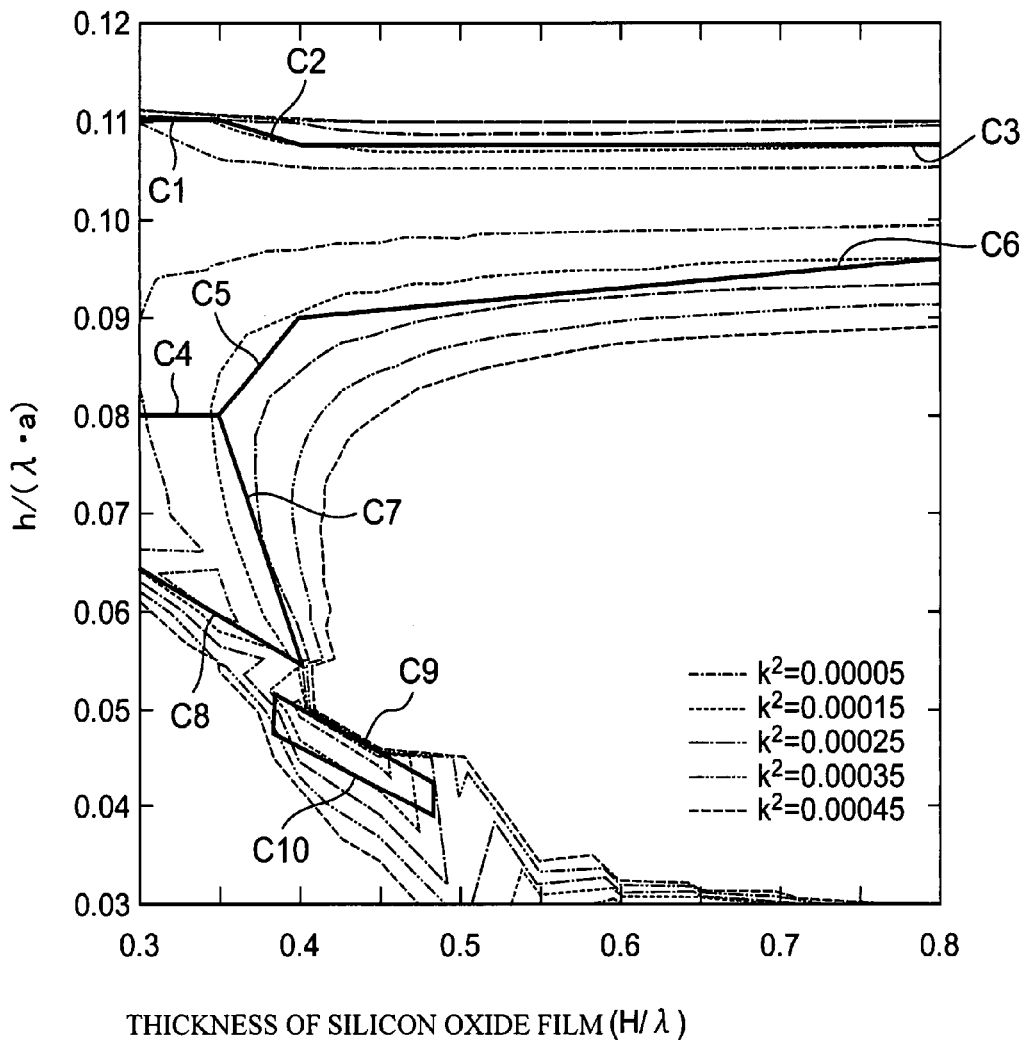

THICKNESS OF SILICON OXIDE FILM (H/$\lambda$)

C1: h/($\lambda \cdot$a) = 0.11
C2: h/($\lambda \cdot$a) = −0.04H/$\lambda$ + 0.124
C3: h/($\lambda \cdot$a) = 0.108
C4: h/($\lambda \cdot$a) = 0.08
C5: h/($\lambda \cdot$a) = 0.2H/$\lambda$ + 0.01
C6: h/($\lambda \cdot$a) = 0.015H/$\lambda$ + 0.084
C7: h/($\lambda \cdot$a) = −0.5H/$\lambda$ + 0.255
C8: h/($\lambda \cdot$a) = −0.09H/$\lambda$ + 0.091
C9: h/($\lambda \cdot$a) = −0.1H/$\lambda$ + 0.091
C10: h/($\lambda \cdot$a) = −0.1H/$\lambda$ + 0.087

FIG. 23

Y-CUT ANGLE $\theta = 28°$

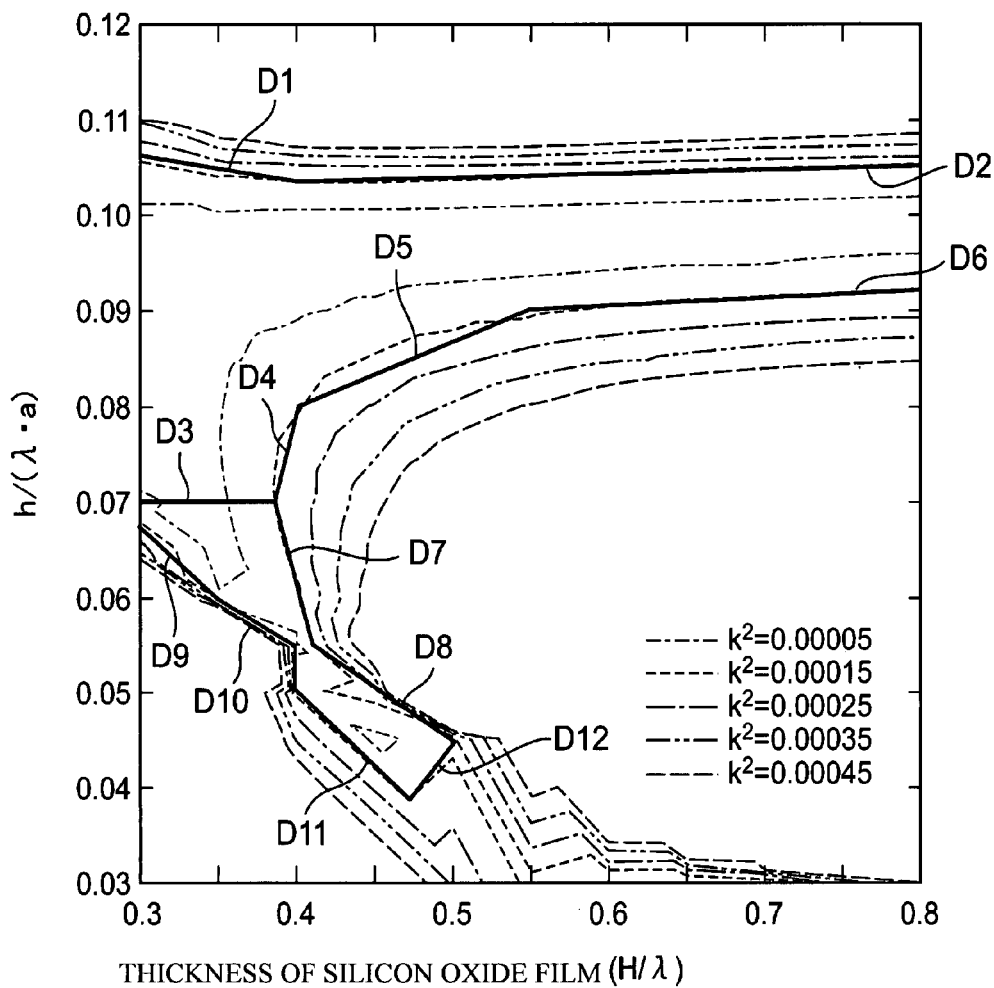

THICKNESS OF SILICON OXIDE FILM (H/$\lambda$)

D1: h/($\lambda \cdot$a)=−0.03H/$\lambda$ +0.116
D2: h/($\lambda \cdot$a)=0.005H/$\lambda$ +0.102
D3: h/($\lambda \cdot$a)=0.07
D4: h/($\lambda \cdot$a)=0.5H/$\lambda$ −0.12
D5: h/($\lambda \cdot$a)=0.067H/$\lambda$ +0.053
D6: h/($\lambda \cdot$a)=0.008H/$\lambda$ +0.0856
D7: h/($\lambda \cdot$a)=−0.5H/$\lambda$ +0.26
D8: h/($\lambda \cdot$a)=−0.111H/$\lambda$ +0.101
D9: h/($\lambda \cdot$a)=−0.16H/$\lambda$ +0.116
D10: h/($\lambda \cdot$a)=−0.1H/$\lambda$ +0.095
D11: h/($\lambda \cdot$a)=−0.171H/$\lambda$ +0.119
D12: h/($\lambda \cdot$a)=0.233H/$\lambda$ −0.0717

FIG. 24

Y-CUT ANGLE $\theta = 29°$

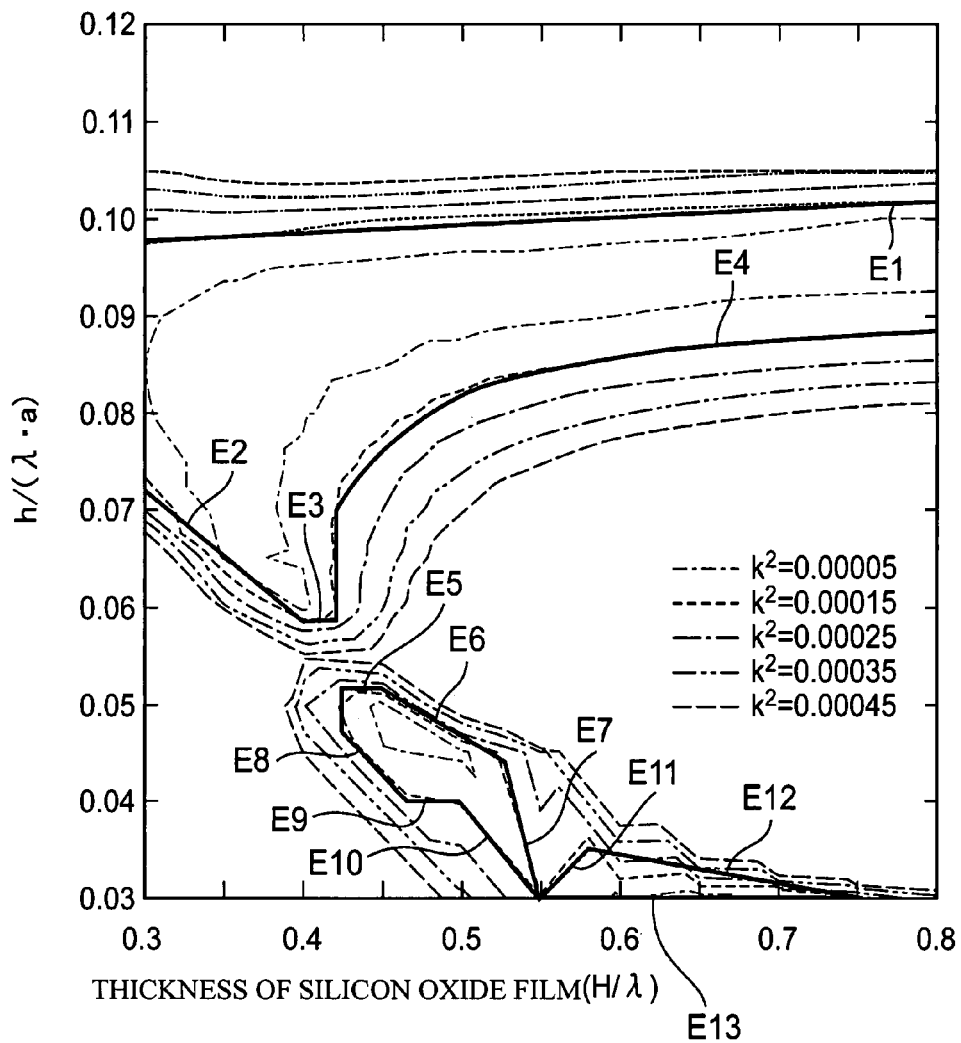

THICKNESS OF SILICON OXIDE FILM($H/\lambda$)

E1: $h/(\lambda \cdot a) = 0.008 H/\lambda + 0.0956$
E2: $h/(\lambda \cdot a) = -0.14 H/\lambda + 0.114$
E3: $h/(\lambda \cdot a) = 0.058$
E4: $h/(\lambda \cdot a) = -0.342(H/\lambda)^2 + 0.465 H/\lambda - 0.0648$
E5: $h/(\lambda \cdot a) = 0.052$
E6: $h/(\lambda \cdot a) = -0.0875 H/\lambda + 0.0914$
E7: $h/(\lambda \cdot a) = -0.75 H/\lambda + 0.443$
E8: $h/(\lambda \cdot a) = -0.175 H/\lambda + 0.121$
E9: $h/(\lambda \cdot a) = 0.04$
E10: $h/(\lambda \cdot a) = -0.2 H/\lambda + 0.14$
E11: $h/(\lambda \cdot a) = 0.167 H/\lambda - 0.0617$
E12: $h/(\lambda \cdot a) = -0.0294 H/\lambda + 0.0521$
E13: $h/(\lambda \cdot a) = 0.03$

FIG. 25

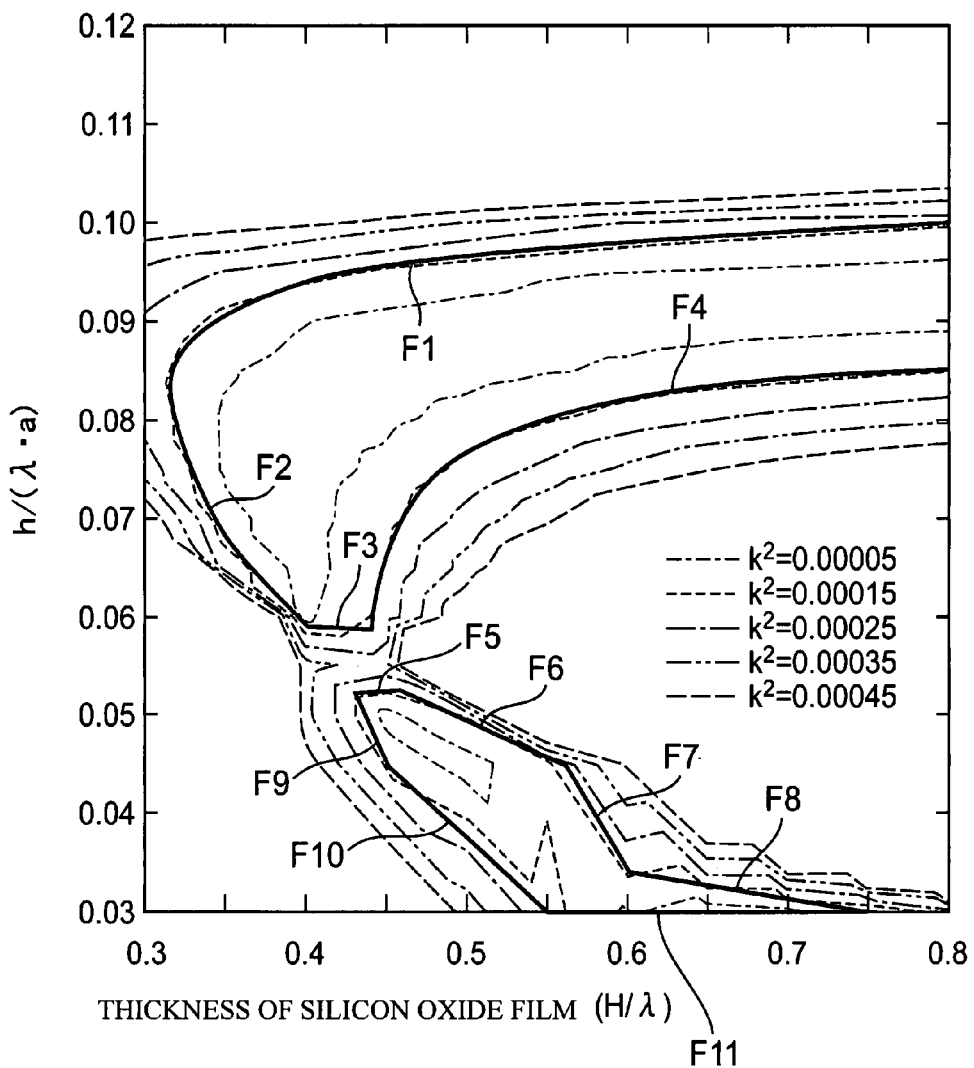

Y-CUT ANGLE $\theta = 30°$

THICKNESS OF SILICON OXIDE FILM $(H/\lambda)$

F1: $h/(\lambda \cdot a) = -0.286(H/\lambda)^2 + 0.356 H/\lambda - 0.0027$
F2: $h/(\lambda \cdot a) = 3.33(H/\lambda)^2 - 2.7 H/\lambda + 0.605$
F3: $h/(\lambda \cdot a) = 0.058$
F4: $h/(\lambda \cdot a) = -0.75(H/\lambda)^2 + 1.005 H/\lambda - 0.239$
F5: $h/(\lambda \cdot a) = 0.052$
F6: $h/(\lambda \cdot a) = -0.0727 H/\lambda + 0.0855$
F7: $h/(\lambda \cdot a) = -0.333 H/\lambda + 0.234$
F8: $h/(\lambda \cdot a) = -0.0267 H/\lambda + 0.05$
F9: $h/(\lambda \cdot a) = -0.4 H/\lambda + 0.224$
F10: $h/(\lambda \cdot a) = -0.14 H/\lambda + 0.107$
F11: $h/(\lambda \cdot a) = 0.03$

FIG. 26

Y-CUT ANGLE $\theta = 31°$

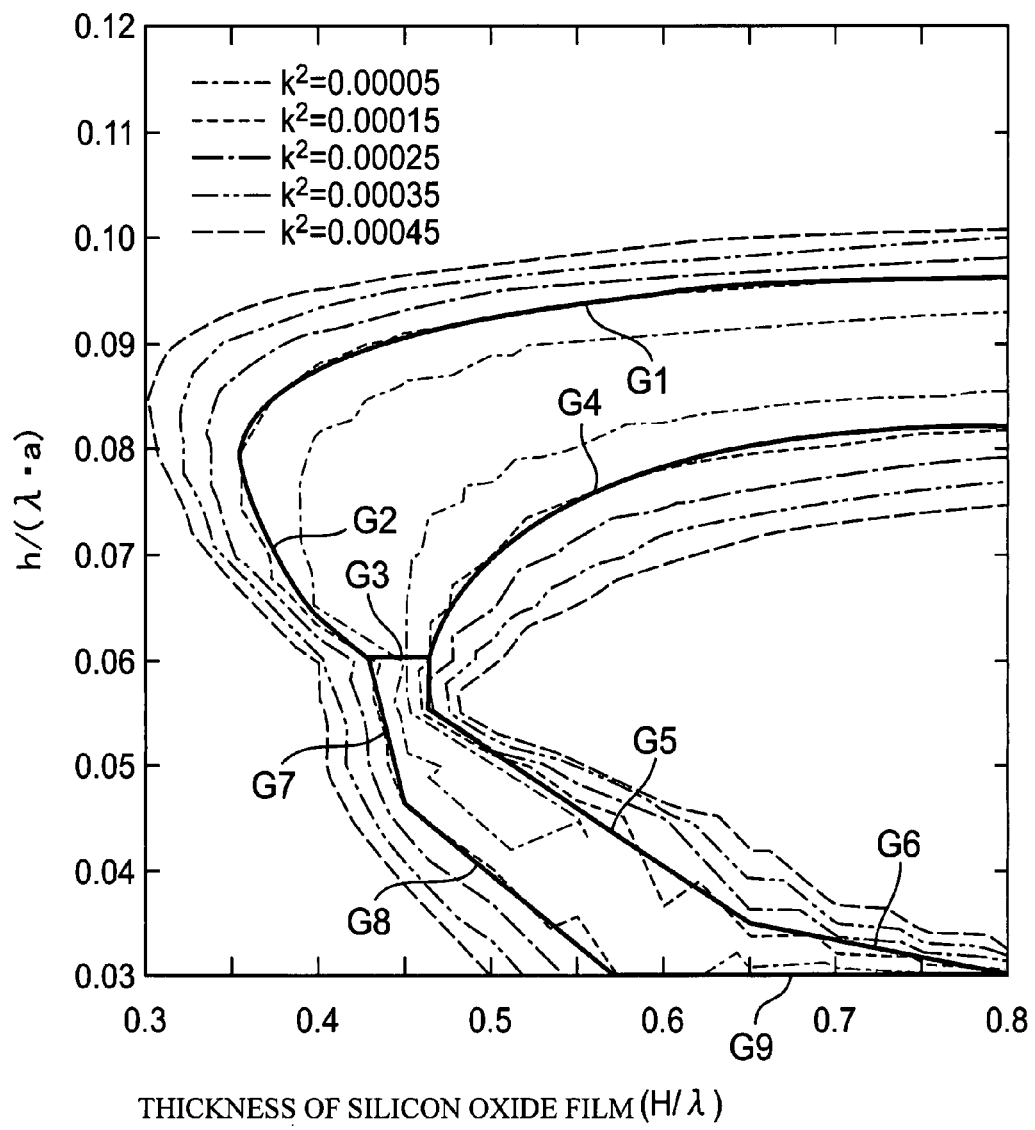

THICKNESS OF SILICON OXIDE FILM (H/$\lambda$)

G1: $h/(\lambda \cdot a) = -0.131(H/\lambda)^2 + 0.188H/\lambda + 0.0293$
G2: $h/(\lambda \cdot a) = 4.64(H/\lambda)^2 - 3.95H/\lambda + 0.902$
G3: $h/(\lambda \cdot a) = 0.06$
G4: $h/(\lambda \cdot a) = -0.283(H/\lambda)^2 + 0.424H/\lambda - 0.0758$
G5: $h/(\lambda \cdot a) = -0.108H/\lambda + 0.105$
G6: $h/(\lambda \cdot a) = -0.0333H/\lambda + 0.0567$
G7: $h/(\lambda \cdot a) = -0.65H/\lambda + 0.34$
G8: $h/(\lambda \cdot a) = -0.142H/\lambda + 0.111$
G9: $h/(\lambda \cdot a) = 0.03$ Y-CUT ANGLE $\theta = 32°$ H1: $h/(\lambda \cdot a) = -0.153(H/\lambda)^2 + 0.219 H/\lambda + 0.0169$
H2: $h/(\lambda \cdot a) = -0.2 H/\lambda + 0.15$
H3: $h/(\lambda \cdot a) = 0.06$
H4: $h/(\lambda \cdot a) = -0.346(H/\lambda)^2 + 0.5 H/\lambda - 0.1$
H5: $h/(\lambda \cdot a) = -0.135 H/\lambda + 0.125$
H6: $h/(\lambda \cdot a) = -0.0333 H/\lambda + 0.0587$
H7: $h/(\lambda \cdot a) = -0.154 H/\lambda + 0.119$
H8: $h/(\lambda \cdot a) = 0.03$ I1: $h/(\lambda \cdot a) = -1.266(H/\lambda)^2 + 1.614 H/\lambda - 0.39$
I2: $h/(\lambda \cdot a) = -0.4 H/\lambda + 0.242$
I3: $h/(\lambda \cdot a) = 0.062$
I4: $h/(\lambda \cdot a) = -0.167(H/\lambda)^2 + 0.263 H/\lambda - 0.028$
I5: $h/(\lambda \cdot a) = 0.06 H/\lambda + 0.028$
I6: $h/(\lambda \cdot a) = -0.11 H/\lambda + 0.113$
I7: $h/(\lambda \cdot a) = -0.03 H/\lambda + 0.057$
I8: $h/(\lambda \cdot a) = -0.3 H/\lambda + 0.19$
I9: $h/(\lambda \cdot a) = -0.145 H/\lambda + 0.116$
I10: $h/(\lambda \cdot a) = 0.03$ Y-CUT ANGLE $\theta = 34°$ THICKNESS OF SILICON OXIDE FILM (H/$\lambda$)

J1: h/($\lambda \cdot$a) = −0.284(H/$\lambda$)$^2$+0.396H/$\lambda$ −0.0471
J2: h/($\lambda \cdot$a) = −0.109H/$\lambda$ +0.116
J3: h/($\lambda \cdot$a) = 0.064
J4: h/($\lambda \cdot$a) = −0.6594(H/$\lambda$)$^2$+0.9382H/$\lambda$ −0.257
J5: h/($\lambda \cdot$a) = −0.0929H/$\lambda$ +0.108
J6: h/($\lambda \cdot$a) = −0.155H/$\lambda$ +0.121
J7: h/($\lambda \cdot$a) = 0.03

Y-CUT ANGLE $\theta = 36°$

THICKNESS OF SILICON OXIDE FILM (H/$\lambda$)

K1: $h/(\lambda \cdot a) = 0.06$
K2: $h/(\lambda \cdot a) = -0.273(H/\lambda)^2 + 0.415H/\lambda - 0.0748$
K3: $h/(\lambda \cdot a) = -0.5(H/\lambda)^2 + 0.76H/\lambda - 0.219$
K4: $h/(\lambda \cdot a) = -0.117H/\lambda + 0.132$
K5: $h/(\lambda \cdot a) = -0.16H/\lambda + 0.126$
K6: $h/(\lambda \cdot a) = 0.03$ Y-CUT ANGLE $\theta = 39°$ L1: $h/(\lambda \cdot a) = 0.2H/\lambda - 0.054$
L2: $h/(\lambda \cdot a) = 0.066$
L3: $h/(\lambda \cdot a) = 0.09H/\lambda + 0.003$
L4: $h/(\lambda \cdot a) = -0.2H/\lambda + 0.154$
L5: $h/(\lambda \cdot a) = 0.03$ FIG. 32  FILM THICKNESS OF ELECTRODE
h=0.03 λ/a a1: $\theta = 75(H/\lambda)^2 - 82.5H/\lambda + 103.687$
a2: $\theta = -85.7H/\lambda + 97.7$
a3: $\theta = 42$
a4: $\theta = 120H/\lambda - 36$
a5: $\theta = 18$
a6: $\theta = 40H/\lambda - 2$ FIG. 33  FILM THICKNESS OF ELECTRODE
$h = 0.045 \lambda / a$ THICKNESS OF SILICON OXIDE FILM (H/$\lambda$)

b1: $\theta = 24H/\lambda + 88.8$
b2: $\theta = -120H/\lambda + 114$
b3: $\theta = 48$
b4: $\theta = 180H/\lambda - 51$
b5: $\theta = 34.3H/\lambda + 11.6$ c1: $\theta = 80H/\lambda - 4$
c2: $\theta = 20H/\lambda + 23$ d1: $\theta = -26.7(H/\lambda)^2 + 52H/\lambda + 15.5$
d2: $\theta = 25H/\lambda + 21$
d3: $\theta = -16.7(H/\lambda)^2 + 38.3H/\lambda + 16$ FILM THICKNESS OF ELECTRODE
h=0.075 λ/a e1: $\theta = -25(H/\lambda)^2 + 47.5H/\lambda + 17$
e2: $\theta = -25(H/\lambda)^2 + 42.5H/\lambda + 15.2$ FILM THICKNESS OF ELECTRODE
h=0.08 λ /a

THICKNESS OF SILICON OXIDE FILM (H/ λ )

f1: $\theta = -21.4(H/\lambda)^2 + 38.2H/\lambda + 20.1$
f2: $\theta = -23.3(H/\lambda)^2 + 35.8H/\lambda + 17.4$ FIG. 38  FILM THICKNESS OF ELECTRODE
h=0.085 λ/a

THICKNESS OF SILICON OXIDE FILM (H/λ)

g1: $\theta = -13.3(H/\lambda)^2 + 24.7H/\lambda + 24$
g2: $\theta = -16(H/\lambda)^2 + 25.6H/\lambda + 19.8$ FILM THICKNESS OF ELECTRODE
h=0.09 λ/a h1: $\theta = 10H/\lambda + 26.5$
h2: $\theta = 6H/\lambda + 28.7$
h3: $\theta = 4H/\lambda + 25.3$ i1: $\theta = 4H/\lambda + 28.3$
i2: $\theta = 2H/\lambda + 25.9$ j1: $\theta = 2H/\lambda + 28.2$
j2: $\theta = 26$ k1: $\theta = 28$
k2: $\theta = -5H/\lambda + 27.5$
k3: $\theta = 25$ Y-CUT ANGLE $\theta = 0°$ THICKNESS OF SILICON OXIDE FILM $(H/\lambda)$ $h/\lambda$ M1: $h/(\lambda \cdot a) = H/\lambda$ M2: $h/(\lambda \cdot a) = -2H/\lambda + 1.8$ M3: $h/(\lambda \cdot a) = 1.543(H/\lambda)^2 - 2.484 H/\lambda + 1.5$ Y-CUT ANGLE $\theta = 1°$ N1: $h/(\lambda \cdot a) = H/\lambda$
N2: $h/(\lambda \cdot a) = -0.3478 H/\lambda + 0.6847$
N3: $h/(\lambda \cdot a) = -0.6087 H/\lambda + 0.8232$
N4: $h/(\lambda \cdot a) = 0.6(H/\lambda)^2 - 0.98 H/\lambda + 0.83$ O1: $h/(\lambda \cdot a) = H/\lambda$
O2: $h/(\lambda \cdot a) = 28.998(H/\lambda)^2 - 29.088 H/\lambda + 7.668$
O3: $h/(\lambda \cdot a) = 1.6(H/\lambda)^2 - 2.06 H/\lambda + 1.003$
O4: $h/(\lambda \cdot a) = -0.0733 H/\lambda + 0.3877$ P1: $h/(\lambda \cdot a) = H/\lambda$
P2: $h/(\lambda \cdot a) = -0.111 H/\lambda + 0.5511$
P3: $h/(\lambda \cdot a) = 3.4(H/\lambda)^2 - 4.45 H/\lambda + 1.909$
P4: $h/(\lambda \cdot a) = -0.06 H/\lambda + 0.492$
P5: $h/(\lambda \cdot a) = 0.45$
P6: $h/(\lambda \cdot a) = -0.46 H/\lambda + 0.5293$
P7: $h/(\lambda \cdot a) = -2.96 H/\lambda + 1.498$
P8: $h/(\lambda \cdot a) = -0.58 H/\lambda + 0.546$
P9: $h/(\lambda \cdot a) = 1.2667(H/\lambda)^2 - 1.503 H/\lambda + 0.705$
P10: $h/(\lambda \cdot a) = -0.04 H/\lambda + 0.283$

Y-CUT ANGLE θ = 9°

Y-CUT ANGLE $\theta = 10°$

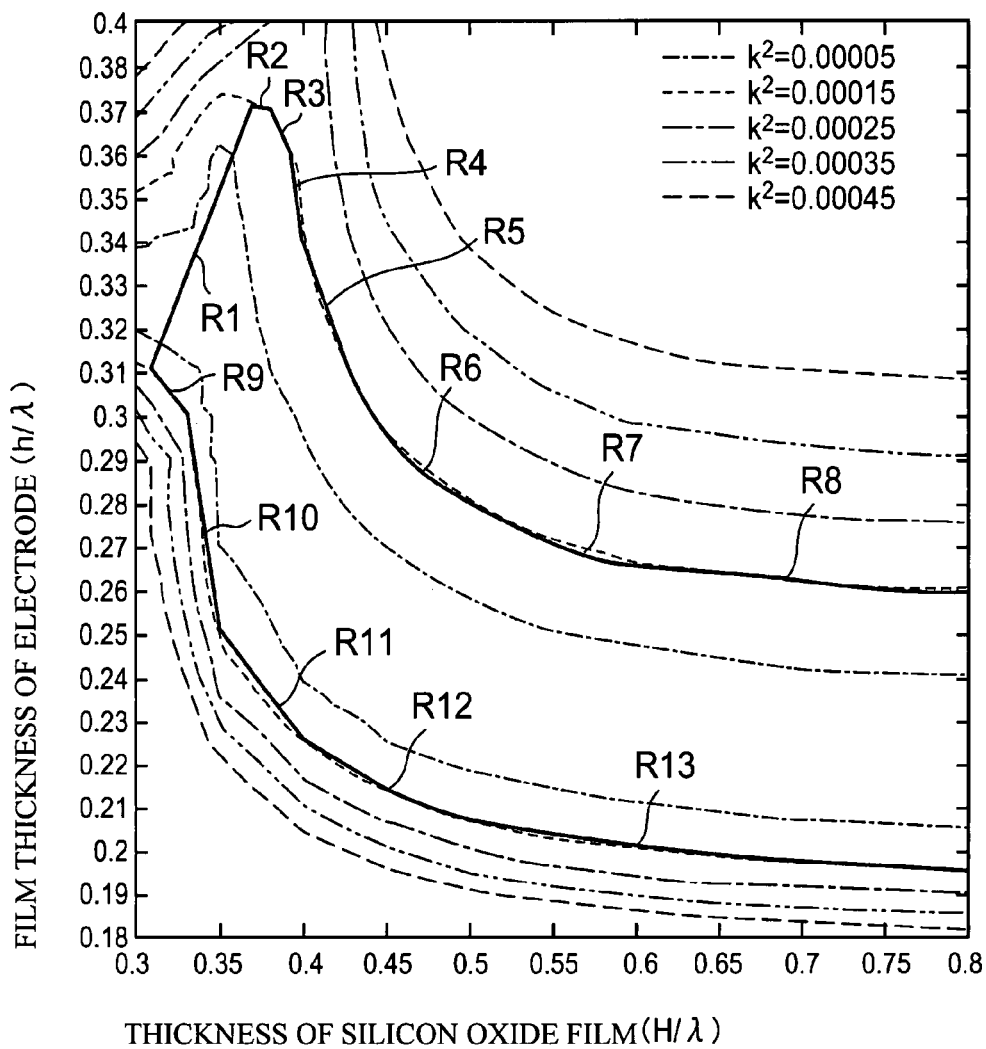

R1: $h/(\lambda \cdot a) = H/\lambda$
R2: $h/(\lambda \cdot a) = 0.37$
R3: $h/(\lambda \cdot a) = -1.111H/\lambda + 0.7956$
R4: $h/(\lambda \cdot a) = -2.5H/\lambda + 1.34$
R5: $h/(\lambda \cdot a) = 12(H/\lambda)^2 - 11.1H/\lambda + 2.86$
R6: $h/(\lambda \cdot a) = 3.2(H/\lambda)^2 - 3.36H/\lambda + 1.159$
R7: $h/(\lambda \cdot a) = 0.5455(H/\lambda)^2 - 0.7327H/\lambda + 0.509$
R8: $h/(\lambda \cdot a) = 0.08848(H/\lambda)^2 - 0.1616H/\lambda + 0.3307$
R9: $h/(\lambda \cdot a) = -0.4762H/\lambda + 0.4576$
R10: $h/(\lambda \cdot a) = -2.632H/\lambda + 1.171$
R11: $h/(\lambda \cdot a) = -0.5H/\lambda + 0.425$
R12: $h/(\lambda \cdot a) = (H/\lambda)^2 - 1.09H/\lambda + 0.501$
R13: $h/(\lambda \cdot a) = 0.1(H/\lambda)^2 - 0.17H/\lambda + 0.266$

FIG. 53

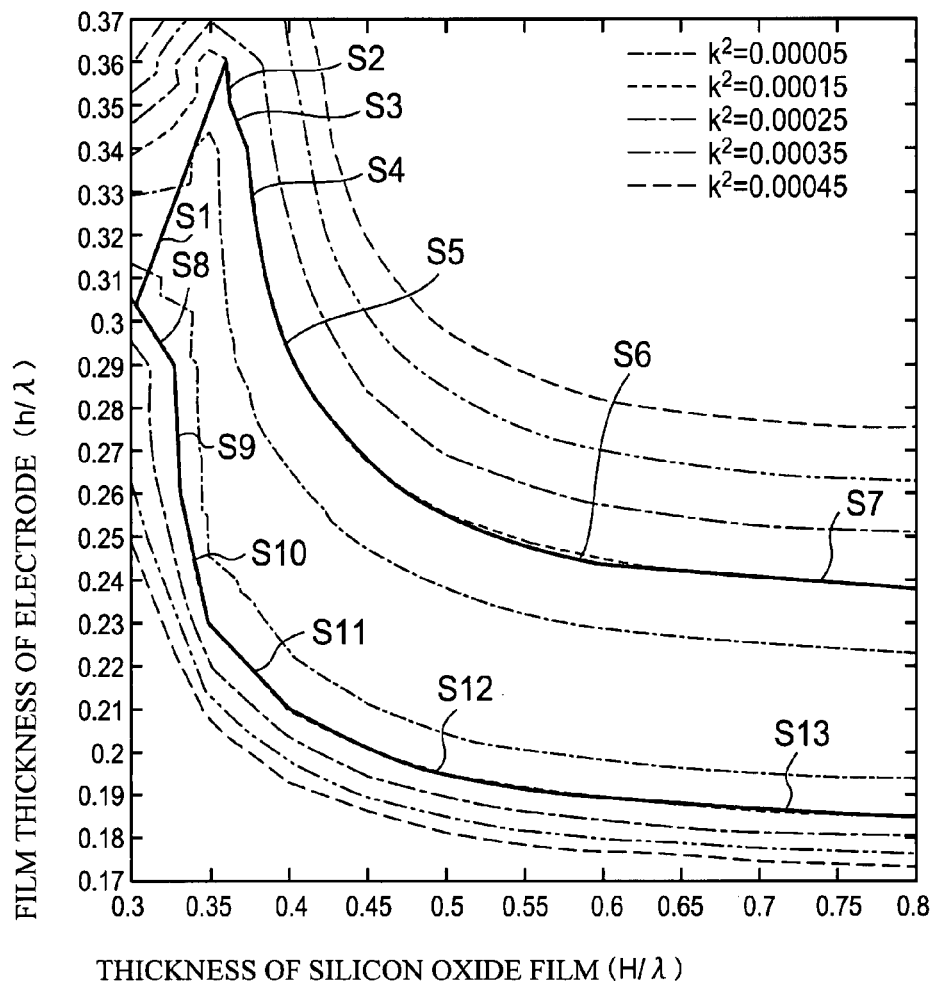

Y-CUT ANGLE $\theta = 11°$

THICKNESS OF SILICON OXIDE FILM ($H/\lambda$)

FILM THICKNESS OF ELECTRODE ($h/\lambda$)

S1: $h/(\lambda \cdot a) = H/\lambda$
S2: $h/(\lambda \cdot a) = -4H/\lambda + 1.8$
S3: $h/(\lambda \cdot a) = -0.8H/\lambda + 0.64$
S4: $h/(\lambda \cdot a) = 80.702(H/\lambda)^2 - 64.344H/\lambda + 13.120$
S5: $h/(\lambda \cdot a) = 3(H/\lambda)^2 - 3.091H/\lambda + 1.051$
S6: $h/(\lambda \cdot a) = 0.4(H/\lambda)^2 - 0.56H/\lambda + 0.436$
S7: $h/(\lambda \cdot a) = -0.02H/\lambda + 0.254$
S8: $h/(\lambda \cdot a) = -0.56H/\lambda + 0.474$
S9: $h/(\lambda \cdot a) = -15H/\lambda + 5.225$
S10: $h/(\lambda \cdot a) = -1.579H/\lambda + 0.7826$
S11: $h/(\lambda \cdot a) = -0.4H/\lambda + 0.37$
S12: $h/(\lambda \cdot a) = 0.4762(H/\lambda)^2 - 0.5786H/\lambda + 0.3652$
S13: $h/(\lambda \cdot a) = 0.0381(H/\lambda)^2 - 0.07905H/\lambda + 0.2229$

FIG. 54

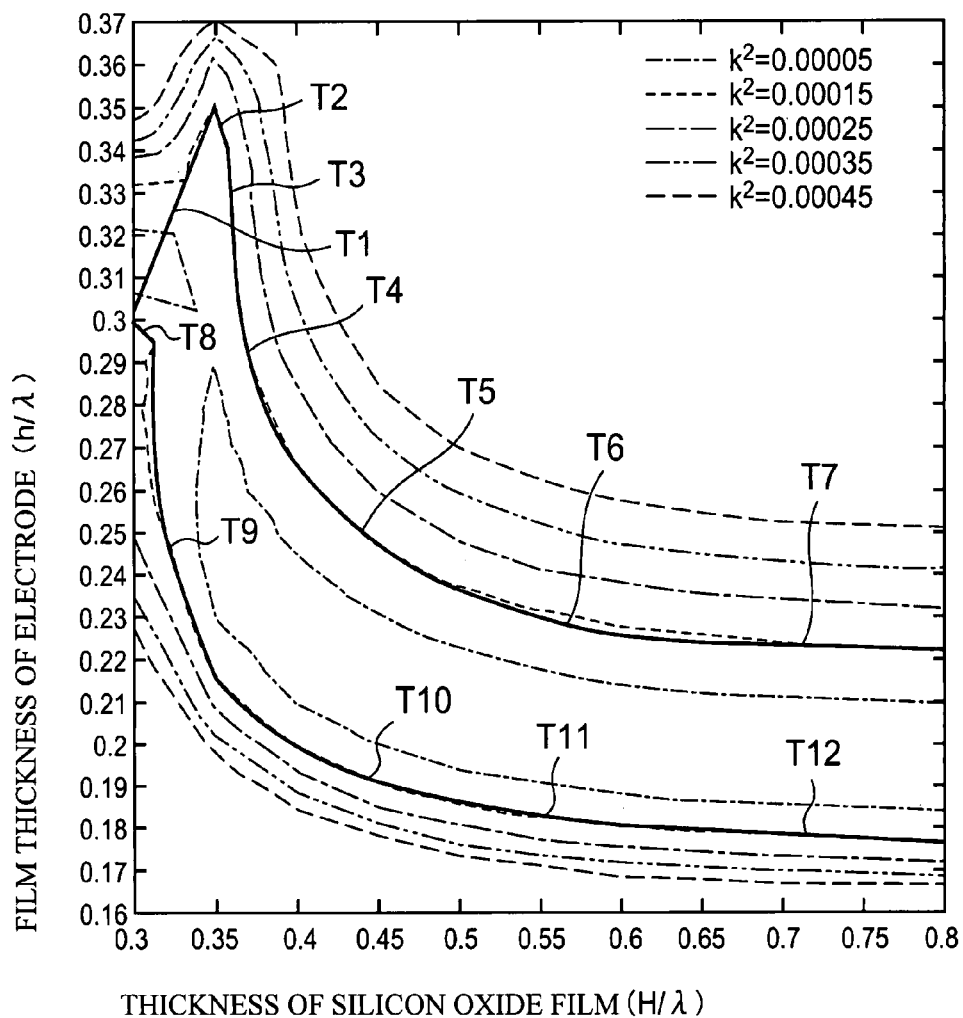

T1: $h/(\lambda \cdot a) = H/\lambda$
T2: $h/(\lambda \cdot a) = -1.25 H/\lambda + 0.7875$
T3: $h/(\lambda \cdot a) = -6.667 H/\lambda + 2.7267$
T4: $h/(\lambda \cdot a) = 27.781(H/\lambda)^2 - 22.3379 H/\lambda + 4.7569$
T5: $h/(\lambda \cdot a) = 2.18(H/\lambda)^2 - 2.271 H/\lambda + 0.8263$
T6: $h/(\lambda \cdot a) = 0.44(H/\lambda)^2 - 0.578 H/\lambda + 0.4148$
T7: $h/(\lambda \cdot a) = -0.02667 H/\lambda + 0.2423$
T8: $h/(\lambda \cdot a) = -0.5 H/\lambda + 0.45$
T9: $h/(\lambda \cdot a) = 25.1541(H/\lambda)^2 - 18.099 H/\lambda + 3.4683$
T10: $h/(\lambda \cdot a) = 1.8(H/\lambda)^2 - 1.69 H/\lambda + 0.586$
T11: $h/(\lambda \cdot a) = 0.3333(H/\lambda)^2 - 0.4167 H/\lambda + 0.31$
T12: $h/(\lambda \cdot a) = -0.02 H/\lambda + 0.192$

FIG. 55

Y-CUT ANGLE $\theta = 13°$

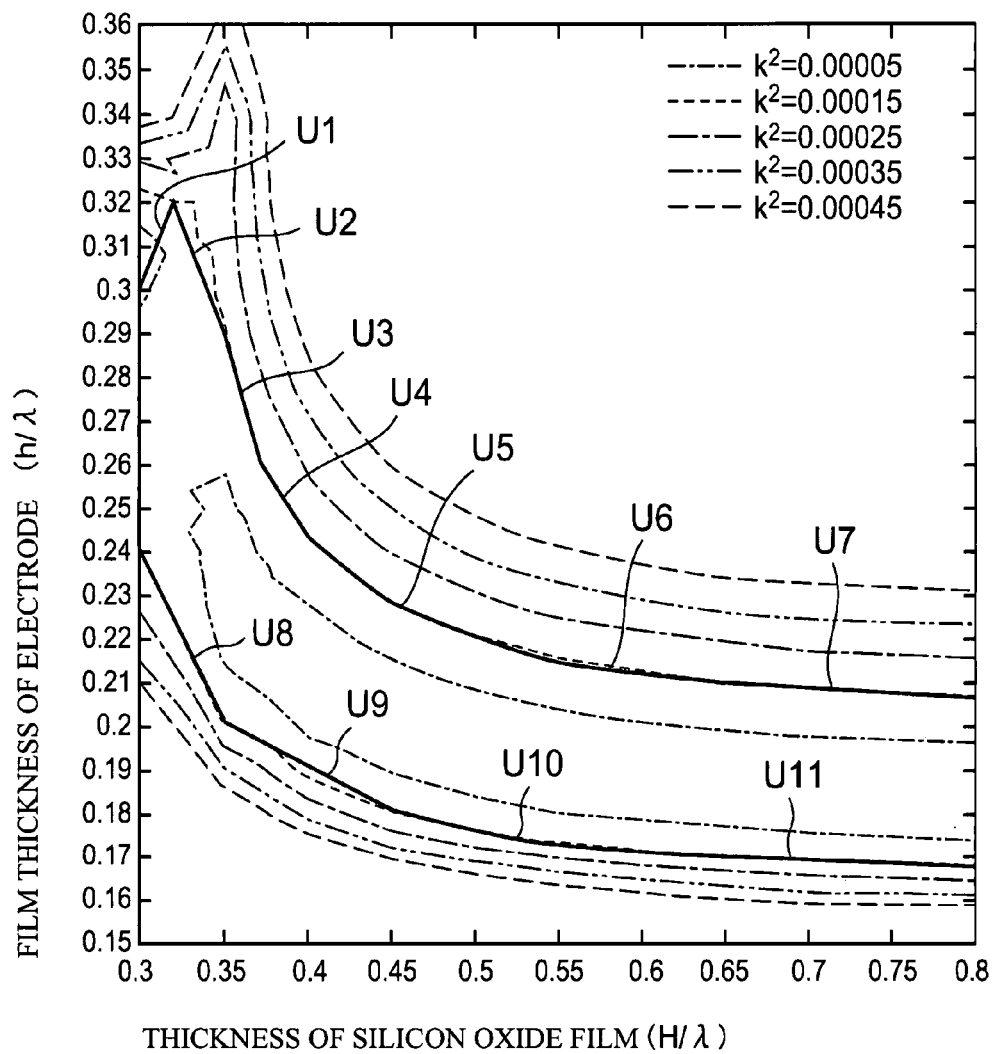

U1: $h/(\lambda \cdot a) = H/\lambda$
U2: $h/(\lambda \cdot a) = -H/\lambda + 0.64$
U3: $h/(\lambda \cdot a) = -1.3044 H/\lambda + 0.7465$
U4: $h/(\lambda \cdot a) = -0.6296 H/\lambda + 0.4949$
U5: $h/(\lambda \cdot a) = 1.6(H/\lambda)^2 - 1.66 H/\lambda + 0.651$
U6: $h/(\lambda \cdot a) = 0.4667(H/\lambda)^2 - 0.61 H/\lambda + 0.4093$
U7: $h/(\lambda \cdot a) = -0.02 H/\lambda + 0.223$
U8: $h/(\lambda \cdot a) = -0.8 H/\lambda + 0.48$
U9: $h/(\lambda \cdot a) = -0.2 H/\lambda + 0.27$
U10: $h/(\lambda \cdot a) = 0.09524(H/\lambda)^2 - 0.1595 H/\lambda + 0.2325$
U11: $h/(\lambda \cdot a) = -0.01143 H/\lambda + 0.1771$

FIG. 56

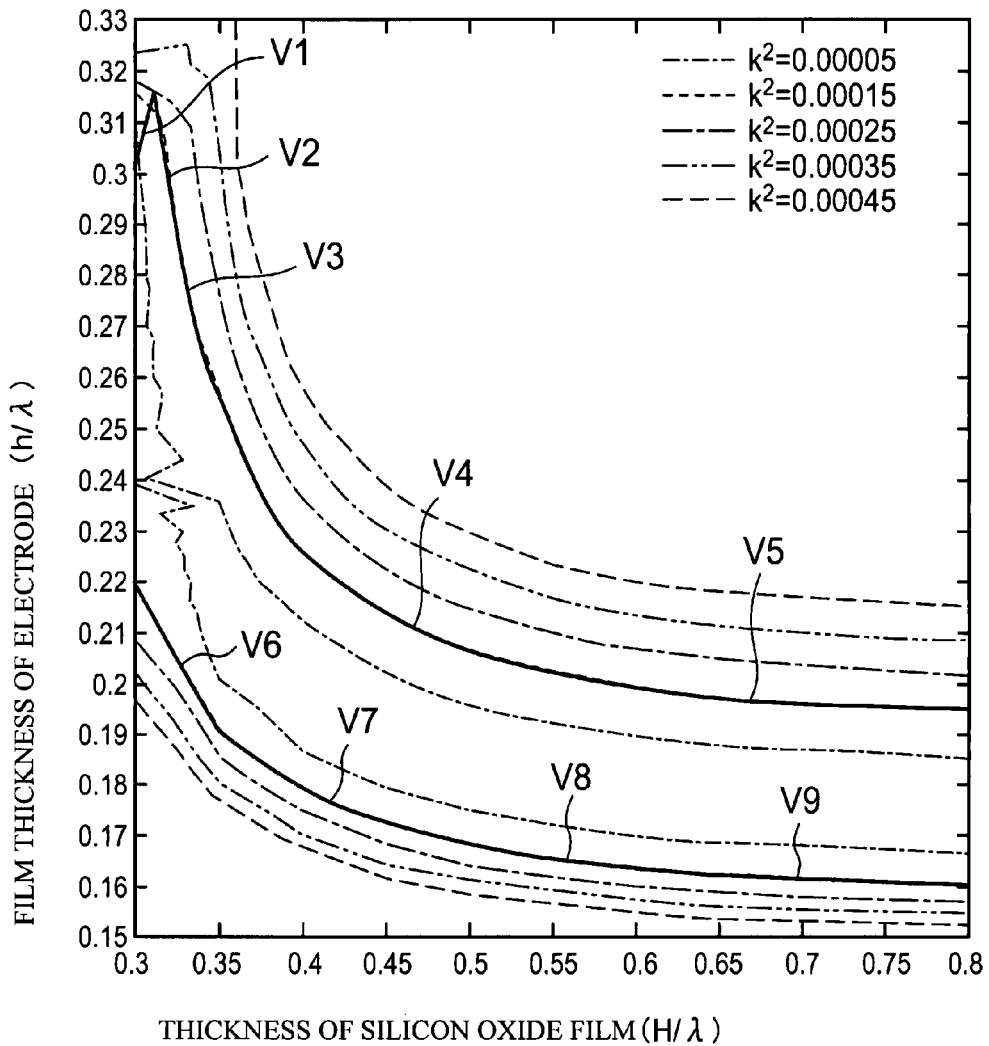

V1: $h/(\lambda \cdot a) = H/\lambda$
V2: $h/(\lambda \cdot a) = -4H/\lambda + 1.59$
V3: $h/(\lambda \cdot a) = 6.933(H/\lambda)^2 - 5.88H/\lambda + 1.4687$
V4: $h/(\lambda \cdot a) = 0.6618(H/\lambda)^2 - 0.7924H/\lambda + 0.437$
V5: $h/(\lambda \cdot a) = 0.11527(H/\lambda)^2 - 0.1829H/\lambda + 0.2676$
V6: $h/(\lambda \cdot a) = -0.6H/\lambda + 0.4$
V7: $h/(\lambda \cdot a) = 0.8(H/\lambda)^2 - 0.82H/\lambda + 0.379$
V8: $h/(\lambda \cdot a) = 0.2095(H/\lambda)^2 - 0.2814H/\lambda + 0.2564$
V9: $h/(\lambda \cdot a) = -0.0133H/\lambda + 0.1707$

FIG. 57

Y-CUT ANGLE $\theta = 15°$

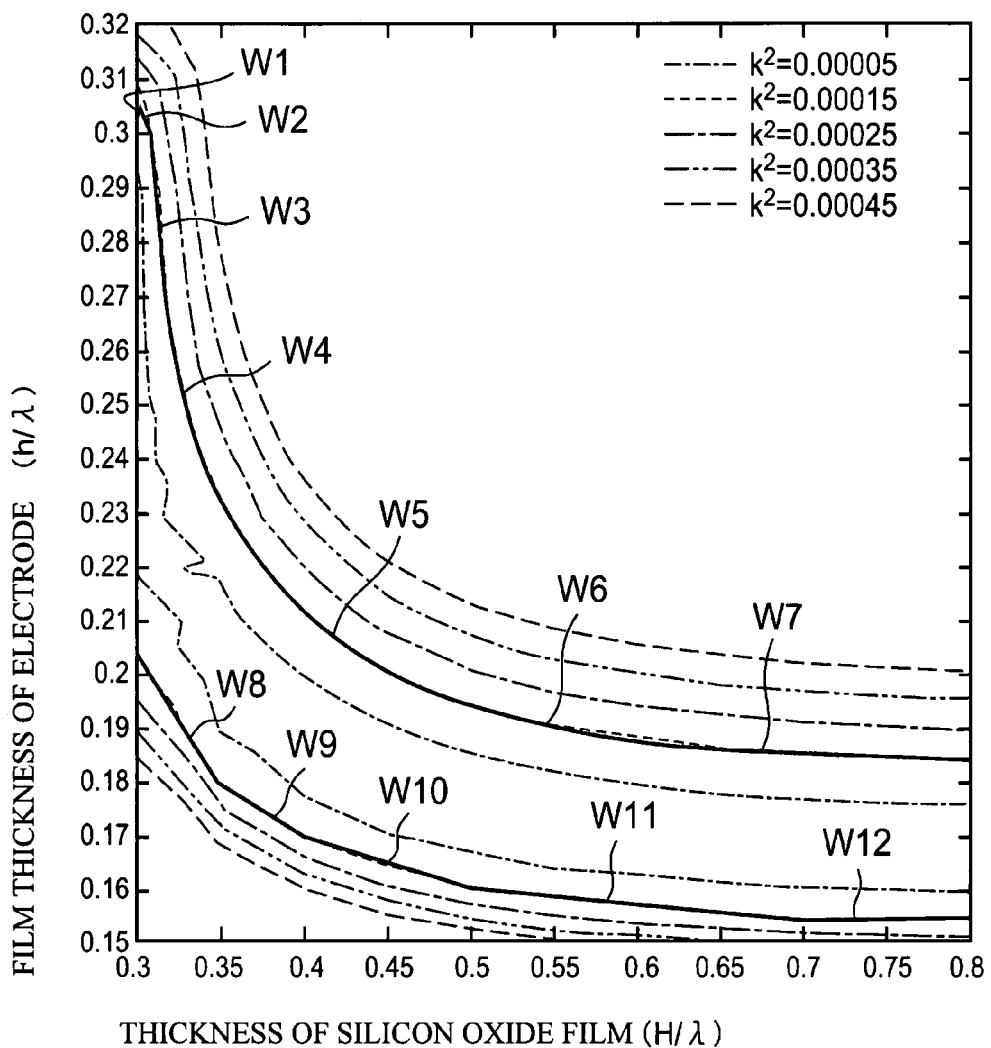

THICKNESS OF SILICON OXIDE FILM (H/$\lambda$)

W1: $h/(\lambda \cdot a) = H/\lambda$
W2: $h/(\lambda \cdot a) = -1.25H/\lambda + 0.685$
W3: $h/(\lambda \cdot a) = -2.308H/\lambda + 1.011$
W4: $h/(\lambda \cdot a) = 11.239(H/\lambda)^2 - 8.748H/\lambda + 1.920$
W5: $h/(\lambda \cdot a) = 1.1733(H/\lambda)^2 - 1.2347H/\lambda + 0.518$
W6: $h/(\lambda \cdot a) = 0.267(H/\lambda)^2 - 0.36H/\lambda + 0.3073$
W7: $h/(\lambda \cdot a) = -0.01333H/\lambda + 0.1947$
W8: $h/(\lambda \cdot a) = -0.5H/\lambda + 0.355$
W9: $h/(\lambda \cdot a) = -0.2H/\lambda + 0.25$
W10: $h/(\lambda \cdot a) = -0.1H/\lambda + 0.21$
W11: $h/(\lambda \cdot a) = -0.03H/\lambda + 0.175$
W12: $h/(\lambda \cdot a) = 0.154$

FIG. 58

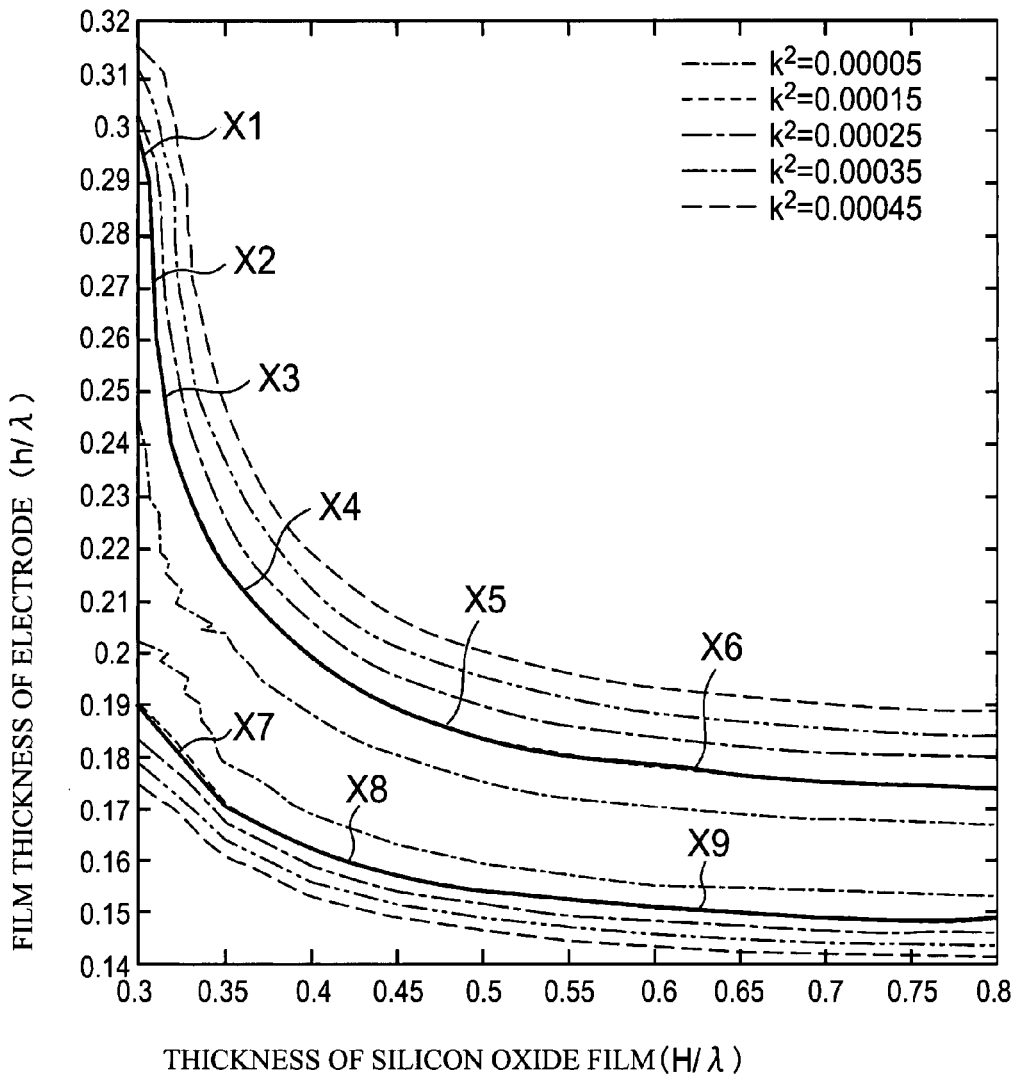

Y-CUT ANGLE $\theta = 16°$

X1: $h/(\lambda \cdot a) = -1.25 H/\lambda + 0.675$
X2: $h/(\lambda \cdot a) = -10 H/\lambda + 3.37$
X3: $h/(\lambda \cdot a) = -2 H/\lambda + 0.882$
X4: $h/(\lambda \cdot a) = 5.9188(H/\lambda)^2 - 4.799 H/\lambda + 1.171$
X5: $h/(\lambda \cdot a) = 0.711(H/\lambda)^2 - 0.7956 H/\lambda + 0.4024$
X6: $h/(\lambda \cdot a) = 0.128(H/\lambda)^2 - 0.197 H/\lambda + 0.2495$
X7: $h/(\lambda \cdot a) = -0.4 H/\lambda + 0.31$
X8: $h/(\lambda \cdot a) = 0.3556(H/\lambda)^2 - 0.4089 H/\lambda + 0.2696$
X9: $h/(\lambda \cdot a) = 0.08762(H/\lambda)^2 - 0.1306 H/\lambda + 0.1974$ Y1: $h/(\lambda \cdot a) = 8.6(H/\lambda)^2 - 6.75H/\lambda + 1.511$
Y2: $h/(\lambda \cdot a) = 0.467(H/\lambda)^2 - 0.557H/\lambda + 0.335$
Y3: $h/(\lambda \cdot a) = 0.0667(H/\lambda)^2 - 0.11H/\lambda + 0.2103$
Y4: $h/(\lambda \cdot a) = 1.133(H/\lambda)^2 - 1.043H/\lambda + 0.391$
Y5: $h/(\lambda \cdot a) = 0.133(H/\lambda)^2 - 0.183H/\lambda + 0.2065$
Y6: $h/(\lambda \cdot a) = -0.0075H/\lambda + 0.149$ Z1: $h/(\lambda \cdot a) = 4(H/\lambda)^2 - 3.28 H/\lambda + 0.848$
Z2: $h/(\lambda \cdot a) = 0.467(H/\lambda)^2 - 0.537 H/\lambda + 0.316$
Z3: $h/(\lambda \cdot a) = 0.1(H/\lambda)^2 - 0.155 H/\lambda + 0.217$
Z4: $h/(\lambda \cdot a) = 0.867(H/\lambda)^2 - 0.817 H/\lambda + 0.337$
Z5: $h/(\lambda \cdot a) = -0.05 H/\lambda + 0.1675$
Z6: $h/(\lambda \cdot a) = -0.008 H/\lambda + 0.1444$ Y-CUT ANGLE $\theta = 19°$ THICKNESS OF SILICON OXIDE FILM ($H/\lambda$)

AA1: $h/(\lambda \cdot a) = 2.8(H/\lambda)^2 - 2.34H/\lambda + 0.655$
AA2: $h/(\lambda \cdot a) = 0.467(H/\lambda)^2 - 0.537H/\lambda + 0.307$
AA3: $h/(\lambda \cdot a) = 0.04(H/\lambda)^2 - 0.07H/\lambda + 0.1794$
AA4: $h/(\lambda \cdot a) = 0.933(H/\lambda)^2 - 0.847H/\lambda + 0.331$
AA5: $h/(\lambda \cdot a) = 0.081(H/\lambda)^2 - 0.118H/\lambda + 0.1759$
AA6: $h/(\lambda \cdot a) = -0.005H/\lambda + 0.137$ BB1: $h/(\lambda \cdot a) = 2.4(H/\lambda)^2 - 2H/\lambda + 0.574$
BB2: $h/(\lambda \cdot a) = 0.4(H/\lambda)^2 - 0.46H/\lambda + 0.278$
BB3: $h/(\lambda \cdot a) = 0.0933(H/\lambda)^2 - 0.142H/\lambda + 0.1959$
BB4: $h/(\lambda \cdot a) = 0.667(H/\lambda)^2 - 0.627H/\lambda + 0.281$
BB5: $h/(\lambda \cdot a) = 0.107(H/\lambda)^2 - 0.141H/\lambda + 0.176$
BB6: $h/(\lambda \cdot a) = -0.00444H/\lambda + 0.1326$ CC1: $h/(\lambda \cdot a) = 2.2(H/\lambda)^2 - 1.83H/\lambda + 0.529$
CC2: $h/(\lambda \cdot a) = 0.357(H/\lambda)^2 - 0.404H/\lambda + 0.2533$
CC3: $h/(\lambda \cdot a) = 0.0604(H/\lambda)^2 - 0.0976H/\lambda + 0.1744$
CC4: $h/(\lambda \cdot a) = 0.733(H/\lambda)^2 - 0.657H/\lambda + 0.276$
CC5: $h/(\lambda \cdot a) = 0.04286(H/\lambda)^2 - 0.065H/\lambda + 0.1496$ Y-CUT ANGLE $\theta = 22°$ DD1: $h/(\lambda \cdot a) = 0.198(H/\lambda)^2 - 0.291H/\lambda + 0.234$
DD2: $h/(\lambda \cdot a) = 0.8(H/\lambda)^2 - 0.69H/\lambda + 0.2735$
DD3: $h/(\lambda \cdot a) = -0.00286H/\lambda + 0.1263$ Y-CUT ANGLE $\theta = 23°$ EE1: $h/(\lambda \cdot a) = 0.568(H/\lambda)^2 - 0.649H/\lambda + 0.2976$
EE2: $h/(\lambda \cdot a) = -0.03H/\lambda + 0.1425$
EE3: $h/(\lambda \cdot a) = 0.136(H/\lambda)^2 - 0.174H/\lambda + 0.1719$
EE4: $h/(\lambda \cdot a) = 0.125H/\lambda + 0.02625$ Y-CUT ANGLE $\theta = 24°$ FF1: $h/(\lambda \cdot a) = 0.4(H/\lambda)^2 - 0.46H/\lambda + 0.246$
FF2: $h/(\lambda \cdot a) = 0.116$
FF3: $h/(\lambda \cdot a) = 0.667(H/\lambda)^2 - 0.613H/\lambda + 0.253$
FF4: $h/(\lambda \cdot a) = -0.01H/\lambda + 0.118$
FF5: $h/(\lambda \cdot a) = -0.208H/\lambda + 0.128$
FF6: $h/(\lambda \cdot a) = -0.125H/\lambda + 0.0925$

ELASTIC BOUNDARY WAVE DEVICE, RESONATOR, AND FILTER

BACKGROUND OF THE INVENTION

1. Field of the Invention

This invention generally relates to elastic boundary wave devices, resonators, and filters, and more particularly, to an elastic boundary wave device, resonator, and filter, in which Stoneley wave can be suppressed.

2. Description of the Related Art

There are known surface acoustic wave (hereinafter, referred to as SAW) devices, as one of the devices that utilize elastic waves. The SAW devices are for use in various circuits such as, for example, transmit bandpass filter, receive bandpass filter, local filter, antenna duplexer, intermediate frequency (IF) filter, frequency modulation (FM) modulator, and the like. The circuits process wireless signals ranging from 45 MHz to 2 GHz of frequency bands typically used by, for example, mobile telephones.

In order to improve the temperature characteristics, Japanese Patent Application Publication No. 2003-209458 (hereinafter, referred to as Document 1) discloses an elastic surface wave device, in which there is deposited on a piezoelectric substrate, a silicon oxide film having a different code in the temperature characteristic from the piezoelectric substrate. In an elastic surface wave device, elastic waves concentrate and propagate along the substrate surface. A foreign material adhered to the substrate surface will change or degrade the characteristics thereof, such as the change in frequency, increase in loss, or the like. For this reason, the elastic surface wave device is generally mounted on the hermetically sealed package. This makes it difficult to reduce the size of the device, leading to increased production cost.

Masatsune Yamaguchi, Takashi Yamashita, Ken-ya Hashimoto, Tatsuya Omori, "Highly Piezoelectric Boundary Waves in Si/SiO$_2$/LiNbO$_3$ Structure" Proceeding of 1998 IEEE International Frequency Control Symposium (U.S.) IEEE, 1998, p.p. 484-488 (hereinafter, referred to as Document 2) discloses a device that utilizes boundary waves propagating along the boundary between different mediums, instead of the surface waves, in order to improve the temperature characteristic and to reduce the size and production cost of the device. Document 2 discloses the boundary waves in the structure where a silicon oxide film and a silicon film are deposited on a 0-degree rotation Y-plate LiNbO$_3$ (LN substrate), on the basis of the calculation results.

It is to be noted that Document 2 does not describe a method for producing an elastic boundary wave device having excellent characteristics suitable for practical use. As a problem against the practical use, there is an elastic wave excited as an unnecessary response, other than the elastic boundary waves utilized in the elastic boundary wave device. Such unnecessary response degrades the excellent frequency characteristics of the elastic boundary waves serving as a function of the elastic boundary wave device. As an example, FIG. 1 shows passband characteristics of a one-port resonator with an elastic boundary wave device. SH of FIG. 1 represents a response of a wave having a main component of Shear Horizontal (SH) wave utilized in the elastic boundary wave device. In other words, SH wave is used to fulfill the function thereof in the elastic boundary waved device. SV of FIG. 1 is observed as a response at a lower frequency side of SH. This is called Stoneley wave having a main component of Shear Vertical (SV) wave. As shown in FIG. 1, the Stoneley wave exciting as an elastic boundary wave is present at the closest frequency of the boundary wave having a main component of SH wave utilized in the elastic boundary wave device.

SUMMARY OF THE INVENTION

The present invention has been made in view of the above circumstances and provides an elastic boundary wave device, resonator, and filter, in which Stoneley wave can be suppressed, the Stoneley wave being present at the closest frequency of the boundary waves utilized as a function of the elastic boundary wave device.

According to one aspect of the present invention, there is provided an elastic boundary wave device including: a LiNbO$_3$ substrate; an electrode exciting an elastic wave and provided on the substrate; and a silicon oxide film provided on the substrate to cover the electrode, and parameters of the elastic boundary wave device have any one of ranges below, where "θ" is a rotation Y cut angle of the substrate, "a" is a ratio of copper density with respect to a density of a material used as the electrode, "λ" is a wavelength of the elastic wave excited by the electrode, "h" is a film thickness of the electrode, "H" is a thickness of the silicon oxide film:

when $0.045\lambda/a \leq h < 0.0525\lambda/a$, and
  when $25° \leq \theta < 26.5°$, $0.39\lambda \leq H < 0.46\lambda$,
  when $26.5° \leq \theta < 27.5°$, $0.41\lambda \leq H < 0.48\lambda$,
  when $27.5° \leq \theta < 28.5°$, $0.42\lambda \leq H < 0.51\lambda$,
  when $28.5° \leq \theta < 29.5°$, $0.43\lambda \leq H < 0.53\lambda$,
  when $29.5° \leq \theta < 30.5°$, $0.45\lambda \leq H < 0.56\lambda$,
  when $30.5° \leq \theta < 31.5°$, $0.46\lambda \leq H < 0.58\lambda$,
  when $31.5° \leq \theta < 32.5°$, $0.47\lambda \leq H < 0.61\lambda$,
  when $32.5° \leq \theta < 33.5°$, $0.48\lambda \leq H < 0.64\lambda$,
  when $33.5° \leq \theta < 35°$, $0.48\lambda \leq H < 0.67\lambda$,
  when $35° \leq \theta < 37.5°$, $0.5\lambda \leq H < 0.74\lambda$,
  when $37.5° \leq \theta < 42°$, $0.52\lambda \leq H < 0.8\lambda$,
  when $42° \leq \theta < 57°$, $0.55\lambda \leq H < 0.8\lambda$,
  when $57° \leq \theta < 63°$, $0.51\lambda \leq H < 0.8\lambda$,
  when $63° \leq \theta < 69°$, $0.46\lambda \leq H < 0.8\lambda$,
  when $69° \leq \theta < 75°$, $0.39\lambda \leq H < 0.8\lambda$,
  when $75° \leq \theta < 99°$, $0.3\lambda \leq H < 0.8\lambda$, and
  when $99° \leq \theta < 105°$, $0.58\lambda \leq H < 0.8\lambda$,
when $0.0525\lambda/a \leq h < 0.065\lambda/a$ and
  when $24° \leq \theta < 25°$, $0.3\lambda \leq H < 0.32\lambda$,
  when $25° \leq \theta < 26.5°$, $0.3\lambda \leq H < 0.37\lambda$,
  when $26.5° \leq \theta < 27.5°$, $0.33\lambda \leq H < 0.38\lambda$,
  when $27.5° \leq \theta < 28.5°$, $0.34\lambda \leq H < 0.41\lambda$,
  when $28.5° \leq \theta < 29.5°$, $0.37\lambda \leq H < 0.43\lambda$,
  when $29.5° \leq \theta < 30.5°$, $0.39\lambda \leq H < 0.44\lambda$,
  when $30.5° \leq \theta < 31.5°$, $0.42\lambda \leq H < 0.47\lambda$,
  when $31.5° \leq \theta < 32.5°$, $0.44\lambda \leq H < 0.48\lambda$,
  when $32.5° \leq \theta < 33.5°$, $0.47\lambda \leq H < 0.49\lambda$,
  when $33.5° \leq \theta < 34.5°$, $0.47\lambda \leq H < 0.51\lambda$,
  when $34.5° \leq \theta < 35.5°$, $0.48\lambda \leq H < 0.57\lambda$,
  when $35.5° \leq \theta < 36.5°$, $0.5\lambda \leq H < 0.62\lambda$,
  when $36.5° \leq \theta < 38°$, $0.52\lambda \leq H < 0.67\lambda$,
  when $38° \leq \theta < 40.5°$, $0.54\lambda \leq H < 0.79\lambda$,
  when $40.5° \leq \theta < 43.5°$, $0.58\lambda \leq H < 0.8\lambda$,
  when $43.5° \leq \theta < 46.5°$, $0.61\lambda \leq H < 0.8\lambda$,
  when $46.5° \leq \theta < 51°$, $0.64\lambda \leq H < 0.8\lambda$,
  when $51° \leq \theta < 57°$, $0.69\lambda \leq H < 0.8\lambda$, and
  when $57° \leq \theta < 63°$, $0.78\lambda \leq H < 0.8\lambda$,
when $0.065\lambda/a \leq h < 0.0725\lambda/a$ and
  when $25.5° \leq \theta < 26.5°$, $0.3\lambda \leq H < 0.32\lambda$,
  when $26.5° \leq \theta < 27.5°$, $0.3\lambda \leq H < 0.36\lambda$,
  when $27.5° \leq \theta < 28.5°$, $0.3\lambda \leq H < 0.38\lambda$,
  when $28.5° \leq \theta < 29.5°$, $0.32\lambda \leq H < 0.43\lambda$,
  when $29.5° \leq \theta < 30.5°$, $0.34\lambda \leq H < 0.46\lambda$,
  when $30.5° \leq \theta < 31.5°$, $0.36\lambda \leq H < 0.5\lambda$, when $31.5° \leq \theta < 32.5°$, $0.39\lambda \leq H < 0.55\lambda$,
when $32.5° \leq \theta < 33.5°$, $0.43\lambda \leq H < 0.6\lambda$,
when $33.5° \leq \theta < 35°$, $0.46\lambda \leq H < 0.66\lambda$,
when $35° \leq \theta < 36.5°$, $0.54\lambda \leq H < 0.8\lambda$,
when $36.5° \leq \theta < 37.5°$, $0.59\lambda \leq H < 0.8\lambda$,
when $37.5° \leq \theta < 38.5°$, $0.65\lambda \leq H < 0.8\lambda$, and
when $38.5° \leq \theta < 39°$, $0.73\lambda \leq H < 0.8\lambda$,
when $0.0725\lambda/a \leq h < 0.0775\lambda/a$ and
  when $26.5° \leq \theta < 27.5°$, $0.3\lambda \leq H < 0.35\lambda$,
  when $27.5° \leq \theta < 28.5°$, $0.3\lambda \leq H < 0.39\lambda$,
  when $28.5° \leq \theta < 29.5°$, $0.3\lambda \leq H < 0.43\lambda$,
  when $29.5° \leq \theta < 30.5°$, $0.33\lambda \leq H < 0.49\lambda$,
  when $30.5° \leq \theta < 31.5°$, $0.35\lambda \leq H < 0.56\lambda$,
  when $31.5° \leq \theta < 32.5°$, $0.39\lambda \leq H < 0.63\lambda$,
  when $32.5° \leq \theta < 33.5°$, $0.43\lambda \leq H < 0.75\lambda$,
  when $33.5° \leq \theta < 34.5°$, $0.47\lambda \leq H < 0.8\lambda$,
  when $34.5° \leq \theta < 35.5°$, $0.52\lambda \leq H < 0.8\lambda$,
  when $35.5° \leq \theta < 36.5°$, $0.57\lambda \leq H < 0.8\lambda$,
  when $36.5° \leq \theta < 37.5°$, $0.63\lambda \leq H < 0.8\lambda$, and
  when $37.5° \leq \theta < 38.5°$, $0.72\lambda \leq H < 0.8\lambda$,
when $0.0775\lambda/a \leq h < 0.0825\lambda/a$ and
  when $26.5° \leq \theta < 27.5°$, $0.3\lambda \leq H < 0.34\lambda$,
  when $27.5° \leq \theta < 28.5°$, $0.3\lambda \leq H < 0.41\lambda$,
  when $28.5° \leq \theta < 29.5°$, $0.3\lambda \leq H < 0.47\lambda$,
  when $29.5° \leq \theta < 30.5°$, $0.32\lambda \leq H < 0.56\lambda$,
  when $30.5° \leq \theta < 31.5°$, $0.36\lambda \leq H < 0.69\lambda$,
  when $31.5° \leq \theta < 32.5°$, $0.39\lambda \leq H < 0.8\lambda$,
  when $32.5° \leq \theta < 33.5°$, $0.44\lambda \leq H < 0.8\lambda$,
  when $33.5° \leq \theta < 35°$, $0.5\lambda \leq H < 0.8\lambda$,
  when $35° \leq \theta < 36.5°$, $0.65\lambda \leq H < 0.8\lambda$, and
  when $36.5° \leq \theta < 38°$, $0.77\lambda \leq H < 0.8\lambda$,
when $0.0825\lambda/a \leq h < 0.0875\lambda/a$ and
  when $26.5° \leq \theta < 27.5°$, $0.3\lambda \leq H < 0.36\lambda$,
  when $27.5° \leq \theta < 28.5°$, $0.3\lambda \leq H < 0.44\lambda$,
  when $28.5° \leq \theta < 29.5°$, $0.3\lambda \leq H < 0.57\lambda$,
  when $29.5° \leq \theta < 30.5°$, $0.32\lambda \leq H < 0.8\lambda$,
  when $30.5° \leq \theta < 31.5°$, $0.37\lambda \leq H < 0.8\lambda$,
  when $31.5° \leq \theta < 32.5°$, $0.43\lambda \leq H < 0.8\lambda$,
  when $32.5° \leq \theta < 33.5°$, $0.51\lambda \leq H < 0.8\lambda$,
  when $33.5° \leq \theta < 34.5°$, $0.59\lambda \leq H < 0.8\lambda$, and
  when $34.5° \leq \theta < 35.5°$, $0.72\lambda \leq H < 0.8\lambda$.
when $0.0875\lambda/a \leq h < 0.0925\lambda/a$ and
  when $26.5° \leq \theta < 27.5°$, $0.3\lambda \leq H < 0.39\lambda$,
  when $27.5° \leq \theta < 28.5°$, $0.3\lambda \leq H < 0.58\lambda$,
  when $28.5° \leq \theta < 29.5°$, $0.3\lambda \leq H < 0.8\lambda$,
  when $29.5° \leq \theta < 30.5°$, $0.33\lambda \leq H < 0.8\lambda$,
  when $30.5° \leq \theta < 31.5°$, $0.43\lambda \leq H < 0.8\lambda$,
  when $31.5° \leq \theta < 32.5°$, $0.53\lambda \leq H < 0.8\lambda$, and
  when $32.5° \leq \theta < 33.5°$, $0.67\lambda \leq H < 0.8$,
when $0.0925\lambda/a \leq h < 0.0975\lambda/a$ and
  when $26.5° \leq \theta < 27.5°$, $0.3\lambda \leq H < 0.63\lambda$,
  when $27.5° \leq \theta < 28.5°$, $0.3\lambda \leq H < 0.8\lambda$,
  when $28.5° \leq \theta < 29.5°$, $0.3\lambda \leq H < 0.8\lambda$,
  when $29.5° \leq \theta < 30.5°$, $0.42\lambda \leq H < 0.8\lambda$, and
  when $30.5° \leq \theta < 31.5°$, $0.6\lambda \leq H < 0.8\lambda$,
when $0.0975\lambda/a \leq h < 0.1025\lambda/a$ and
  when $25.5° \leq \theta < 26.5°$, $0.32\lambda \leq H < 0.7\lambda$,
  when $26.5° \leq \theta < 27.5°$, $0.3\lambda \leq H < 0.8\lambda$,
  when $27.5° \leq \theta < 28.5°$, $0.3\lambda \leq H < 0.8\lambda$, and
  when $28.5° \leq \theta < 29.5°$, $0.45\lambda \leq H < 0.8\lambda$,
when $0.1025\lambda/a \leq h < 0.1125\lambda/a$ and
  when $24.5° \leq \theta < 25.5°$, $0.6\lambda \leq H < 0.8\lambda$,
  when $25.5° \leq \theta < 26.5°$, $0.3\lambda \leq H < 0.8\lambda$,
  when $26.5° \leq \theta < 27.5°$, $0.3\lambda \leq H < 0.8\lambda$, and
  when $27.5° \leq \theta < 28.5°$, $0.3\lambda \leq H < 0.33\lambda$ and $0.64\lambda \leq H < 0.8\lambda$, and
when $0.1125\lambda/a \leq h < 0.12\lambda/a$ and when $22.5° \leq \theta < 23.5°$, $0.47\lambda \leq H < 0.76\lambda$, and
when $23.5° \leq \theta < 24.5°$, $0.36\lambda \leq H < 0.45\lambda$.

According to another aspect of the present invention, there is provided an elastic boundary wave device including: a $LiNbO_3$ substrate; an electrode exciting an elastic wave and provided on the substrate; and a silicon oxide film provided on the substrate to cover the electrode, and parameters of the elastic boundary wave device have any one of ranges below, where "$\theta$" is a rotation Y cut angle of the substrate, "a" is a ratio of copper density with respect to a density of a material used as the electrode, "$\lambda$" is a wavelength of the elastic wave excited by the electrode, "h" is a film thickness of the electrode, "H" is a thickness of the silicon oxide film:
when $0° \leq \theta < 0.5°$ and
  when $0.6 \leq H/\lambda \leq 0.8$, $h/(\lambda \cdot a) \leq H/\lambda$, and additionally,
    when $0.6 \leq H/\lambda < 0.625$, $h/(\lambda \cdot a) \geq -2H/\lambda + 1.8$, and
    when $0.625 \leq H/\lambda \leq 0.8$, $h/(\lambda \cdot a) \geq 1.543 (H/\lambda)^2 - 2.484 H/\lambda + 1.5$,
when $0.5° \leq \theta < 2°$ and
  when $0.508 \leq H/\lambda \leq 0.8$, $h/(\lambda \cdot a) \leq H/\lambda$, and additionally,
    when $0.508 \leq H/\lambda < 0.531$, $h/(\lambda \cdot a) \geq -0.3478 H/\lambda + 0.6847$,
    when $0.531 \leq H/\lambda < 0.6$, $h/(\lambda \cdot) \geq -0.6087 H/\lambda + 0.8232$, and
    when $0.6 \leq H/\lambda \leq 0.8$, $h/(\lambda \cdot a) \geq 0.6 (H/\lambda)^2 - 0.98 H/\lambda + 0.83$,
when $2° \leq \theta < 4.5°$ and
  when $0.45 \leq H/\lambda \leq 0.8$, $h/(\lambda \cdot a) \leq H/\lambda$, and additionally,
    when $0.45 \leq H/\lambda < 0.5$, $h/(\lambda \cdot a) \geq 28.998 (H/\lambda)^2 - 29.088 H/\lambda + 7.668$,
    when $0.5 \leq H/\lambda < 0.65$, $h/(\lambda \cdot a) \geq 1.6 (H/\lambda)^2 - 2.06 H/\lambda + 1.003$, and
    when $0.65 \leq H/\lambda \leq 0.8$, $h/(\lambda \cdot a) \geq -0.0733 H/\lambda + 0.3877$,
when $4.5° \leq \theta < 7.5°$ and
  when $0.3625 \leq H/\lambda < 0.496$, $h/(\lambda \cdot a) < H/\lambda$,
  when $0.496 \leq H/\lambda < 0.55$, $h/(\lambda \cdot a) \leq -0.111 H/\lambda + 0.5511$,
  when $0.55 \leq H/\lambda < 0.65$, $h/(\lambda \cdot a) \leq 3.4 (H/\lambda)^2 - 4.45 H/\lambda + 1.909$,
  when $0.65 \leq H/\lambda < 0.7$, $h/(\lambda \cdot a) \leq -0.06 H/\lambda + 0.492$, and
  when $0.7 \leq H/\lambda \leq 0.8$, $h/(\lambda \cdot a) \leq 0.45$, and additionally,
    when $0.3625 \leq H/\lambda < 0.3875$, $h/(\lambda \cdot a) \geq -0.46 H/\lambda + 0.5293$,
    when $0.3875 \leq H/\lambda < 0.4$, $h/(\lambda \cdot a) \geq -2.96 H/\lambda + 1.498$,
    when $0.4 \leq H/\lambda < 0.45$, $h/(\lambda \cdot a) \geq -0.58 H/\lambda + 0.546$,
    when $0.45 \leq H/\lambda < 0.6$, $h/(\lambda \cdot a) \geq 1.2667 (H/\lambda)^2 - 1.503 H/\lambda + 0.705$, and
    when $0.6 \leq H/\lambda \leq 0.8$, $h/(\lambda \cdot a) \geq -0.04 H/\lambda + 0.283$,
when $7.5° \leq \theta < 9.5°$ and
  when $0.315 \leq H/\lambda < 0.406$, $h/(\lambda \cdot a) \leq H/\lambda$,
  when $0.406 \leq H/\lambda < 0.419$, $h/(\lambda \cdot a) \leq -1.077 H/\lambda + 0.8432$,
  when $0.419 \leq H/\lambda < 0.45$, $h/(\lambda \cdot a) \leq 61.7512 (H/\lambda)^2 - 55.565 H/\lambda + 12.8326$,
  when $0.45 \leq H/\lambda < 0.6$, $h/(\lambda \cdot a) \leq 1.8667 (H/\lambda)^2 - 2.233 H/\lambda + 0.96$, and
  when $0.6 \leq H/\lambda \leq 0.8$, $h/(\lambda \cdot a) \leq 0.2 (H/\lambda)^2 - 0.32 H/\lambda + 0.412$, and additionally,
    when $0.315 \leq H/\lambda < 0.342$, $h/(\lambda \cdot a) \geq -0.5556 H/\lambda + 0.49$,
    when $0.342 \leq H/\lambda < 0.35$, $h/(\lambda \cdot a) \geq -3.75 H/\lambda + 1.5825$,
    when $0.35 \leq H/\lambda < 0.4$, $h/(\lambda \cdot a) \geq -0.6 H/\lambda + 0.48$,
    when $0.4 \leq H/\lambda < 0.55$, $h/(\lambda \cdot a) \geq 1.133 (H/\lambda)^2 - 1.243 H/\lambda + 0.556$, and
    when $0.55 \leq H/\lambda \leq 0.8$, $h/(\lambda \cdot a) \geq 0.1067 (H/\lambda)^2 - 0.18 H/\lambda + 0.2817$,
when $9.5° \leq \theta \leq 10.5°$ and
  when $0.31 \leq H/\lambda < 0.37$, $h/(\lambda \cdot a) \leq H/\lambda$,
  when $0.37 \leq H/\lambda < 0.383$, $h/(\lambda \cdot a) \leq 0.37$,
  when $0.383 \leq H/\lambda < 0.392$, $h/(\lambda \cdot a) \leq -1.111 H/\lambda + 0.7956$,
  when $0.392 \leq H/\lambda < 0.4$, $h/(\lambda \cdot a) \leq -2.5 H/\lambda + 1.34$,
  when $0.4 \leq H/\lambda < 0.45$, $h/(\lambda \cdot) - 12 (H/\lambda)^2 - 11.1 H/\lambda + 2.86$,
  when $0.45 \leq H/\lambda < 0.5$, $h/(\lambda \cdot a) \leq 3.2 (H/\lambda)^2 - 3.36 H/\lambda + 1.159$, when $0.5 \leq H/\lambda < 0.61$, $h/(\lambda \cdot a) \leq 0.5455 \ (H/\lambda)^2 - 0.7327 H/\lambda + 0.509$, and when $0.61 \leq H/\lambda \leq 0.8$, $h/(\lambda \cdot a) \leq 0.08848 \ (H/\lambda)^2 - 0.1616 H/\lambda + 0.3307$, and additionally, when $0.31 \leq H/\lambda < 0.331$, $h/(\lambda \cdot a) \geq -0.4762 H/\lambda + 0.4576$, when $0.331 \leq H/\lambda < 0.35$, $h/(\lambda \cdot a) \geq -2.632 H/\lambda + 1.171$, when $0.35 \leq H/\lambda < 0.4$, $h/(\lambda \cdot a) \geq -0.5 H/\lambda + 0.425$, when $0.4 \leq H/\lambda < 0.5$, $h/(\lambda \cdot a) \geq (H/\lambda)^2 - 1.09 H/\lambda + 0.501$, and when $0.5 \leq H/\lambda \leq 0.8$, $h/(\lambda \cdot a) \geq 0.1 \ (H/\lambda)^2 - 0.17 H/\lambda + 0.266$, when $10.5° \leq \theta < 11.5°$ and when $0.304 \leq H/\lambda < 0.36$, $h/(\lambda \cdot a) \leq H/\lambda$, when $0.36 \leq H/\lambda < 0.3625$, $h/(\lambda \cdot a) \leq -4 H/\lambda + 1.8$, when $0.3625 \leq H/\lambda < 0.375$, $h/(\lambda \cdot a) < -0.8 H/\lambda + 0.64$, when $0.375 \leq H/\lambda < 0.4$, $h/(\lambda \cdot a) \leq 80.702 \ (H/\lambda)^2 - 64.344 H/\lambda + 13.120$, when $0.4 \leq H/\lambda < 0.5$, $h/(\lambda \cdot a) \leq 3 \ (H/\lambda)^2 - 3.091 H/\lambda + 1.051$, when $0.5 \leq H/\lambda < 0.7$, $h/(\lambda \cdot a) \leq 0.4 \ (H/\lambda)^2 - 0.56 H/\lambda + 0.436$, and when $0.7 \leq H/\lambda < 0.8$, $h/(\lambda \cdot a) \leq -0.02 H/\lambda + 0.254$, and additionally, when $0.304 \leq H/\lambda \leq 0.329$, $h/(\lambda \cdot a) \geq -0.56 H/\lambda + 0.474$, when $0.329 \leq H/\lambda < 0.331$, $h/(\lambda \cdot a) \geq -15 H/\lambda + 5.225$, when $0.331 \leq H/\lambda < 0.35$, $h/(\lambda \cdot a) \geq -1.579 H/\lambda + 0.7826$, when $0.35 \leq H/\lambda < 0.4$, $h/(\lambda \cdot a) \geq -0.4 H/\lambda + 0.37$, when $0.4 \leq H/\lambda < 0.575$, $h/(\lambda \cdot a) \geq 0.4762 \ (H/\lambda)^2 - 0.5786 H/\lambda + 0.3652$, and when $0.575 \leq H/\lambda \leq 0.8$, $h/(\lambda \cdot a) \geq 0.0381 \ (H/\lambda)^2 - 0.07905 H/\lambda + 0.2229$, when $11.5° \leq \theta \leq 12.5°$, and when $0.3 \leq H/\lambda < 0.35$, $h/(\lambda \cdot a) \leq H/\lambda$, when $0.35 \leq H/\lambda < 0.358$, $h/(\lambda \cdot a) \leq -1.25 H/\lambda + 0.7875$, when $0.358 \leq H/\lambda < 0.3625$, $h/(\lambda \cdot a) < -6.667 H/\lambda + 2.7267$, when $0.3625 \leq H/\lambda < 0.4$, $h/(\lambda \cdot a) \leq 27.781 \ (H/\lambda)^2 - 22.3379 H/\lambda + 4.7569$, when $0.4 \leq H/\lambda < 0.5$, $h/(\lambda \cdot a) \leq 2.18 \ (H/\lambda)^2 - 2.271 H/\lambda + 0.8263$, when $0.5 \leq H/\lambda < 0.65$, $h/(\lambda \cdot a) \leq 0.44 \ (H/\lambda)^2 - 0.578 H/\lambda + 0.4148$, and when $0.65 \leq H/\lambda \leq 0.8$, $h/(\lambda \cdot a) \leq -0.02667 H/\lambda + 0.2423$, and additionally, when $0.3 \leq H/\lambda < 0.308$, $h/(\lambda \cdot a) \geq -0.5 H/\lambda + 0.45$, when $0.308 \leq H/\lambda < 0.35$, $h/(\lambda \cdot a) \geq 25.1541 \ (H/\lambda)^2 - 18.099 H/\lambda + 3.4683$, when $0.35 \leq H/\lambda < 0.45$, $h/(\lambda \cdot a) \geq 1.8 \ (H/\lambda)^2 - 1.69 H/\lambda + 0.586$, when $0.45 \leq H/\lambda < 0.6$, $h/(\lambda \cdot a) \geq 0.3333 \ (H/\lambda)^2 - 0.4167 H/\lambda + 0.31$, and when $0.6 \leq H/\lambda \leq 0.8$, $h/(\lambda \cdot a) \geq -0.02 H/\lambda + 0.192$, when $12.5° \leq \theta < 13.5°$ and when $0.3 \leq H/\lambda < 0.32$, $h/(\lambda \cdot a) \leq H/\lambda$, when $0.32 \leq H/\lambda < 0.35$, $h/(\lambda \cdot a) \leq -H/\lambda + 0.64$, when $0.35 \leq H/\lambda < 0.373$, $h/(\lambda \cdot a) < -1.3044 H/\lambda + 0.7465$, when $0.373 \leq H/\lambda < 0.4$, $h/(\lambda \cdot a) \leq -0.6296 H/\lambda + 0.4949$, when $0.4 \leq H/\lambda < 0.5$, $h/(\lambda \cdot a) \leq 1.6 \ (H/\lambda)^2 - 1.66 H/\lambda + 0.651$, when $0.5 \leq H/\lambda < 0.65$, $h/(\lambda \cdot) \leq 0.4667 \ (H/\lambda)^2 - 0.61 H/\lambda + 0.4093$, and when $0.65 \leq H/\lambda \leq 0.8$, $h/(\lambda \cdot a) \leq -0.02 H/\lambda + 0.223$, and additionally, when $0.3 \leq H/\lambda < 0.35$, $h/(\lambda \cdot a) \geq -0.8 H/\lambda + 0.48$, when $0.35 \leq H/\lambda < 0.45$, $h/(\lambda \cdot a) \geq -0.2 H/\lambda + 0.27$, when $0.45 \leq H/\lambda < 0.625$, $h/(\lambda \cdot a) \geq 0.09524 \ (H/\lambda)^2 - 0.1595 H/\lambda + 0.2325$, and when $0.65 \leq H/\lambda \leq 0.8$, $h/(\lambda \cdot a) \geq -0.01143 H/\lambda + 0.1771$, when $13.5° \leq \theta \leq 14.5°$ and when $0.3 \leq H/\lambda < 0.318$, $h/(\lambda \cdot a) < H/\lambda$, when $0.318 \leq H/\lambda < 0.325$, $h/(\lambda \cdot a) \leq -4 H/\lambda + 1.59$, when $0.325 \leq H/\lambda < 0.4$, $h/(\lambda \cdot a) \leq 6.933 \ (H/\lambda)^2 - 5.88 H/\lambda + 1.4687$, when $0.4 \leq H/\lambda < 0.585$, $h/(\lambda \cdot a) \leq 0.6618 \ (H/\lambda)^2 - 0.7924 H/\lambda + 0.437$, and when $0.585 \leq H/\lambda \leq 0.8$, $h/(\lambda \cdot a) \leq 0.11527 \ (H/\lambda)^2 - 0.1829 H/\lambda + 0.2676$, and additionally, when $0.3 \leq H/\lambda < 0.35$, $h/(\lambda \cdot a) \geq -0.6 H/\lambda + 0.4$, when $0.35 \leq H/\lambda < 0.475$, $h/(\lambda \cdot a) \geq 0.8 \ (H/\lambda)^2 - 0.82 H/\lambda + 0.379$, when $0.475 \leq H/\lambda < 0.65$, $h/(\lambda \cdot a) \geq 0.2095 \ (H/\lambda)^2 - 0.2814 H/\lambda + 0.2564$, and when $0.65 \leq H/\lambda \leq 0.8$, $h/(\lambda \cdot a) \geq -0.0133 H/\lambda + 0.1707$, when $14.5° \leq \theta \leq 15.5°$ and when $0.3 \leq H/\lambda < 0.304$, $h/(\lambda \cdot a) \leq H/\lambda$, when $0.304 \leq H/\lambda < 0.308$, $h/(\lambda \cdot a) \leq -1.25 H/\lambda + 0.685$, when $0.308 \leq H/\lambda < 0.321$, $h/(\lambda \cdot a) \leq -2.308 H/\lambda + 1.011$, when $0.321 \leq H/\lambda < 0.375$, $h/(\lambda \cdot a) \leq 11.239 \ (H/\lambda)^2 - 8.748 H/\lambda + 1.920$, when $0.375 \leq H/\lambda < 0.5$, $h/(\lambda \cdot a) \leq 1.1733 \ (H/\lambda)^2 - 1.2347 H/\lambda + 0.518$, when $0.5 \leq H/\lambda < 0.65$, $h/(\lambda \cdot a) \leq 0.267 \ (H/\lambda)^2 - 0.36 H/\lambda + 0.3073$, and when $0.65 \leq H/\lambda \leq 0.8$, $h/(\lambda \cdot a) \leq -0.01333 H/\lambda + 0.1947$, and additionally, when $0.3 \leq H/\lambda < 0.35$, $h/(\lambda \cdot a) \geq -0.5 H/\lambda + 0.355$, when $0.35 \leq H/\lambda < 0.4$, $h/(\lambda \cdot a) \geq -0.2 H/\lambda + 0.25$, when $0.4 \leq H/\lambda < 0.5$, $h/(\lambda \cdot a) \geq -0.1 H/\lambda + 0.21$, when $0.5 \leq H/\lambda < 0.7$, $h/(\lambda \cdot a) \geq -0.03 H/\lambda + 0.175$, and when $0.7 \leq H/\lambda \leq 0.8$, $h/(\lambda \cdot a) \geq 0.154$, when $15.5° \leq \theta < 16.5°$ and when $0.3 \leq H/\lambda < 0.308$, $h/(\lambda \cdot a) \leq -1.25 H/\lambda + 0.675$, when $0.308 \leq H/\lambda < 0.311$, $h/(\lambda \cdot a) \leq -10 H/\lambda + 3.37$, when $0.311 \leq H/\lambda < 0.321$, $h/(\lambda \cdot a) \leq -2 H/\lambda + 0.882$, when $0.321 \leq H/\lambda < 0.4$, $h/(\lambda \cdot a) \leq 5.9188 \ (H/\lambda)^2 - 4.799 H/\lambda + 1.171$, when $0.4 \leq H/\lambda < 0.55$, $h/(\lambda \cdot a) \leq 0.711 \ (H/\lambda)^2 - 0.7956 H/\lambda + 0.4024$, when $0.55 \leq H/\lambda \leq 0.8$, $h/(\lambda \cdot a) \leq 0.128 \ (H/\lambda)^2 - 0.197 H/\lambda + 0.2495$, and additionally, when $0.3 \leq H/\lambda < 0.35$, $h/(\lambda \cdot a) \geq -0.4 H/\lambda + 0.31$, when $0.35 \leq H/\lambda < 0.5$, $h/(\lambda \cdot a) \geq 0.3556 \ (H/\lambda)^2 - 0.4089 H/\lambda + 0.2696$, and when $0.5 \leq H/\lambda \leq 0.8$, $h/(\lambda \cdot a) \geq 0.08762 \ (H/\lambda)^2 - 0.1306 H/\lambda + 0.1974$, when $16.5° \leq \theta < 17.5°$ and when $0.3 \leq H/\lambda < 0.4$, $h/(\lambda \cdot a) < 8.6 \ (H/\lambda)^2 - 6.75 H/\lambda + 1.511$, when $0.4 \leq H/\lambda < 0.55$, $h/(\lambda \cdot a) \leq 0.467 \ (H/\lambda)^2 - 0.557 H/\lambda + 0.335$, and when $0.55 \leq H/\lambda \leq 0.8$, $h/(\lambda \cdot a) \leq 0.0667 \ (H/\lambda)^2 - 0.11 H/\lambda + 0.2103$, and additionally, when $0.3 \leq H/\lambda < 0.45$, $h/(\lambda \cdot a) \geq 1.133 \ (H/\lambda)^2 - 1.043 H/\lambda + 0.391$, when $0.45 \leq H/\lambda < 0.6$, $h/(\lambda \cdot a) \geq 0.133 \ (H/\lambda)^2 - 0.183 H/\lambda + 0.2065$, and when $0.6 \leq H/\lambda \leq 0.8$, $h/(\lambda \cdot a) \geq -0.0075 H/\lambda + 0.149$, when $17.5° \leq \theta < 18.5°$ and when $0.3 \leq H/\lambda < 0.4$, $h/(\lambda \cdot a) \leq 4 \ (H/\lambda)^2 - 3.28 H/\lambda + 0.848$, when $0.4 \leq H/\lambda < 0.55$, $h/(\lambda \cdot a) \leq 0.467 \ (H/\lambda)^2 - 0.537 H/\lambda + 0.316$, and when $0.55 \leq H/\lambda \leq 0.8$, $h/(\lambda \cdot a) \leq 0.1 \ (H/\lambda)^2 - 0.155 H/\lambda + 0.217$, and additionally, when $0.3 \leq H/\lambda < 0.45$, $h/(\lambda \cdot a) \geq 0.867 \ (H/\lambda)^2 - 0.817 H/\lambda + 0.337$, when $0.45 \leq H/\lambda < 0.55$, $h/(\lambda \cdot a) \geq -0.05 H/\lambda + 0.1675$, and when $0.55 \leq H/\lambda \leq 0.8$, $h/(\lambda \cdot a) \geq -0.008 H/\lambda + 0.1444$, when $18.5° \leq \theta < 19.5°$ and when $0.3 \leq H/\lambda < 0.4$, $h/(\lambda \cdot a) \leq 2.8 \ (H/\lambda)^2 - 2.34 H/\lambda + 0.655$, when $0.4 \leq H/\lambda < 0.55$, $h/(\lambda \cdot a) \leq 0.467$ $(H/\lambda)^2 - 0.537$ $H/\lambda + 0.307$, and when $0.55 \leq H/\lambda \leq 0.8$, $h/(\lambda \cdot a) \leq 0.04$ $(H/\lambda)^2 - 0.07$ $H/\lambda + 0.1794$, and additionally, when $0.3 \leq H/\lambda < 0.45$, $h/(\lambda \cdot a) \geq 0.933$ $(H/\lambda)^2 - 0.847$ $H/\lambda + 0.331$, and when $0.45 \leq H/\lambda < 0.6$, $h/(\lambda \cdot a) \geq 0.081$ $(H/\lambda)^2 - 0.118$ $H/\lambda + 0.1759$, and when $0.6 \leq H/\lambda \leq 0.8$, $h/(\lambda \cdot a) \geq -0.005$ $H/\lambda + 0.137$, when $19.5° \leq \theta < 20.5°$ and when $0.3 \leq H/\lambda < 0.4$, $h/(\lambda \cdot a) \leq 2.4$ $(H/\lambda)^2 - 2$ $H/\lambda + 0.574$, when $0.4 \leq H/\lambda < 0.55$, $h/(\lambda \cdot a) \leq 0.4$ $(H/\lambda)^2 - 0.46$ $H/\lambda + 0.278$, and when $0.55 \leq H/\lambda \leq 0.8$, $h/(\lambda \cdot a) \leq 0.0933$ $(H/\lambda)^2 - 0.142$ $H/\lambda + 0.1959$, and additionally, when $0.3 \leq H/\lambda < 0.45$, $h/(\lambda \cdot a) \geq 0.667$ $(H/\lambda)^2 - 0.627$ $H/\lambda + 0.281$, and when $0.45 \leq H/\lambda < 0.575$, $h/(\lambda \cdot a) \geq 0.107$ $(H/\lambda)^2 - 0.141$ $H/\lambda + 0.176$, and when $0.575 \leq H/\lambda \leq 0.8$, $h/(\lambda \cdot a) \geq -0.00444$ $H/\lambda + 0.1326$, when $20.5° \leq \theta < 21.5°$ and when $0.3 \leq H/\lambda < 0.4$, $h/(\lambda \cdot a) \leq 2.2$ $(H/\lambda)^2 - 1.83$ $H/\lambda + 0.529$, when $0.4 \leq H/\lambda < 0.52$, $h/(\lambda \cdot a) \leq 0.357$ $(H/\lambda)^2 - 0.404$ $H/\lambda + 0.2533$, and when $0.52 \leq H/\lambda \leq 0.8$, $h/(\lambda \cdot a) \leq 0.0604$ $(H/\lambda)^2 - 0.0976$ $H/\lambda + 0.1744$, and additionally, when $0.3 \leq H/\lambda < 0.45$, $h/(\lambda \cdot a) \geq 0.733$ $(H/\lambda)^2 - 0.657$ $H/\lambda + 0.276$, and when $0.45 \leq H/\lambda \leq 0.8$, $h/(\lambda \cdot a) \geq 0.04286$ $(H/\lambda)^2 - 0.065$ $H/\lambda + 0.1496$, when $21.5° \leq \theta < 22.5°$ and when $0.3 \leq H/\lambda < 0.8$, $h/(\lambda \cdot a) \leq 0.198$ $(H/\lambda)^2 - 0.291$ $H/\lambda + 0.234$, and additionally, when $0.3 \leq H/\lambda < 0.45$, $h/(\lambda \cdot a) \geq 0.8$ $(H/\lambda)^2 - 0.69$ $H/\lambda + 0.2735$, and when $0.45 \leq H/\lambda \leq 0.8$, $h/(\lambda \cdot a) \geq -0.00286$ $H/\lambda + 0.1263$, when $22.5° \leq \theta < 23.5°$ and when $0.3 \leq H/\lambda < 0.7$, $h/(\lambda \cdot a) \leq 0.568$ $(H/\lambda)^2 - 0.649$ $H/\lambda + 0.2976$, and when $0.7 \leq H/\lambda < 0.75$, $h/(\lambda \cdot a) \leq -0.03 H/\lambda + 0.1425$, and additionally, when $0.3 \leq H/\lambda \leq 0.73$, $h/(\lambda \cdot a) \geq 0.136$ $(H/\lambda)^2 - 0.174$ $H/\lambda + 0.1719$, and when $0.73 \leq H/\lambda \leq 0.75$, $h/(\lambda \cdot a) \geq 0.125$ $H/\lambda + 0.02625$, when $23.5° \leq \theta < 24°$ and when $0.3 \leq H/\lambda < 0.5$, $h/(\lambda \cdot a) \leq 0.4$ $(H/\lambda)^2 - 0.46$ $H/\lambda + 0.246$, and when $0.5 \leq H/\lambda \leq 0.8$, $h/(\lambda \cdot a) \leq 0.116$, and additionally, when $0.3 \leq H/\lambda < 0.5$, $h/(\lambda \cdot a) \geq 0.667$ $(H/\lambda)^2 - 0.613$ $H/\lambda + 0.253$, and when $0.5 \leq H/\lambda \leq 0.8$, $h/(\lambda \cdot a) \geq -0.01$ $H/\lambda + 0.118$, or when $23.5° \leq \theta < 24°$ and when $0.3 \leq H/\lambda \leq 0.42$, $h/(\lambda \cdot a) \leq -0.208$ $H/\lambda + 0.128$, and additionally, when $0.3 \leq H/\lambda \leq 0.42$, $h/(\lambda \cdot a) \geq -0.125$ $H/\lambda + 0.0925$.

According to yet another aspect of the present invention, there is provided an elastic boundary wave device including: a LiNbO$_3$ substrate; an electrode exciting an elastic wave and provided on the substrate; and a silicon oxide film provided on the substrate to cover the electrode, and parameters of the elastic boundary wave device have any one of ranges below, where "$\theta$" is a rotation Y cut angle of the substrate, "a" is a ratio of copper density with respect to a density of a material used as the electrode, "$\lambda$" is a wavelength of the elastic wave excited by the electrode, "h" is a film thickness of the electrode, "H" is a thickness of the silicon oxide film:

when $0.03\lambda/a \leq h < 0.0375\lambda/a$ and when $0.3 \leq H/\lambda \leq 0.8$, $\theta \leq 75$ $(H/\lambda)^2 - 82.5$ $H/\lambda + 103.687$, and additionally, when $0.3 \leq H/\lambda < 0.65$, $\theta \leq -85.7$ $H/\lambda + 97.7$, and when $0.65 \leq H/\lambda \leq 0.8$, $\theta \geq 42$, or when $0.03\lambda/a \leq h < 0.0375\lambda/a$ and when $0.45 \leq H/\lambda < 0.65$, $\theta \leq 120 H/\lambda - 36$, and when $0.65 \leq H/\lambda \leq 0.8$, $\theta \leq 42$, and additionally, when $0.45 \leq H/\lambda < 0.5$, $\theta \geq 18$, and when $0.5 \leq H/\lambda \leq 0.8$, $\theta \geq 40 H/\lambda - 2$, when $0.0375\lambda/a \leq h < 0.0525\lambda/a$ and when $0.3 \leq H/\lambda \leq 0.8$, $\theta \leq 24$ $H/\lambda + 88.8$, and additionally, when $0.3 \leq H/\lambda < 0.55$, $\theta \geq -120$ $H/\lambda + 114$, and when $0.55 \leq H/\lambda \leq 0.8$, $\theta \geq 48$, or when $0.0375\lambda/a \leq h < 0.0525\lambda/a$ and when $0.43 \leq H/\lambda < 0.55$, $\theta \leq 180$ $H/\lambda - 51$, and when $0.55 \leq H/\lambda \leq 0.8$, $\theta \leq 48$, and additionally, when $0.43 \leq H/\lambda \leq 0.8$, $\theta \geq 34.3$ $H/\lambda + 11.6$, when $0.0525\lambda/a \leq h < 0.065\lambda/a$ and when $0.45 \leq H/\lambda \leq 0.8$, $\theta < 80$ $H/\lambda - 4$, and additionally, when $0.45 \leq H/\lambda \leq 0.8$, $\theta \geq 20$ $H/\lambda + 23$, when $0.065\lambda/a \leq h < 0.0725\lambda/a$ and when $0.3 \leq H/\lambda < 0.7$, $\theta \leq -26.7$ $(H/\lambda)^2 + 52$ $H/\lambda + 15.5$, and when $0.7 \leq H/\lambda < 0.8$, $\theta \leq 25$ $H/\lambda + 21$, and additionally, when $0.3 \leq H/\lambda \leq 0.8$, $\theta \geq -16.7$ $(H/\lambda)^2 + 38.3$ $H/\lambda + 16$, when $0.0725\lambda/a \leq h < 0.0775\lambda/a$ and when $0.3 \leq H/\lambda \leq 0.8$, $\theta \leq -25$ $(H/\lambda)^2 + 47.5$ $H/\lambda + 17$, and additionally, when $0.3 \leq H/\lambda \leq 0.8$, $\theta \geq -25$ $(H/\lambda)^2 + 42.5$ $H/\lambda + 15.2$, when $0.0775\lambda/a \leq h < 0.0825\lambda/a$ and when $0.3 \leq H/\lambda \leq 0.8$, $\theta \leq -21.4$ $(H/\lambda)^2 + 38.2 H/\lambda + 20.1$, and additionally, when $0.3 \leq H/\lambda \leq 0.8$, $\theta \geq -23.3$ $(H/\lambda)^2 + 35.8$ $H/\lambda + 17.4$, when $0.0825\lambda/a \leq h < 0.0875\lambda/a$ and when $0.3 \leq H/\lambda \leq 0.8$, $\theta \leq -13.3 (H/\lambda)^2 + 24.7$ $H/\lambda + 24$, and additionally, when $0.3 \leq H/\lambda \leq 0.8$, $\theta \geq 16$ $(H/\lambda)^2 + 25.6$ $H/\lambda + 19.8$, when $0.0875\lambda/a \leq h < 0.0925\lambda/a$, and when $0.3 \leq H/\lambda < 0.55$, $\theta \leq 10$ $H/\lambda + 26.5$, and when $0.55 \leq H/\lambda \leq 0.8$, $\theta \leq 6$ $H/\lambda + 28.7$, and additionally, when $0.3 \leq H/\lambda \leq 0.8$, $\theta \geq 4$ $H/\lambda + 25.3$, when $0.0925\lambda/a \leq h < 0.0975\lambda/a$ and when $0.3 \leq H/\lambda \leq 0.8$, $\theta \leq 4$ $H/\lambda + 28.3$, and additionally, when $0.3 \leq H/\lambda \leq 0.8$, $\theta \geq 2$ $H/\lambda + 25.9$, when $0.0975\lambda/a \leq h < 0.1025\lambda/a$ and when $0.3 \leq H/\lambda \leq 0.8$, $\theta \leq 2$ $H/\lambda + 28.2$, and additionally, when $0.3 \leq H/\lambda \leq 0.8$, $\theta \geq 26$, and when $0.1025\lambda/a \leq h < 0.105\lambda/a$ and when $0.3 \leq H/\lambda \leq 0.8$, $\theta \leq 28$, and additionally, when $0.3 \leq H/\lambda < 0.5$, $\theta \geq -5$ $H/\lambda + 27.5$, and when $0.5 \leq H/\lambda \leq 0.8$, $\theta \geq 25$.

According to further another aspect of the present invention, there is provided a resonator including any one of the above-described elastic boundary wave devices.

According to further another aspect of the present invention, there is provided a filter including any one of the above-described elastic boundary wave devices.

BRIEF DESCRIPTION OF THE DRAWINGS

Exemplary embodiments of the present invention will be described in detail with reference to the following drawings, wherein:

FIG. 22 shows fifteenth simulation results;
FIG. 23 shows sixteenth simulation results;
FIG. 24 shows seventeenth simulation results;
FIG. 25 shows eighteenth simulation results;
FIG. 26 shows nineteenth simulation results.

FIG. 52 shows forty-first simulation results;
FIG. 53 shows forty-second simulation results;
FIG. 54 shows forty-third simulation results;
FIG. 55 shows forty-fourth simulation results;
FIG. 56 shows forty-fifth simulation results;
FIG. 57 shows forty-sixth simulation results;
FIG. 58 shows forty-seventh simulation results.

DESCRIPTION OF THE PREFERRED EMBODIMENTS

A description will now be given, with reference to the accompanying drawings, of exemplary embodiments of the present invention.

First Exemplary Embodiment

Figure 1:
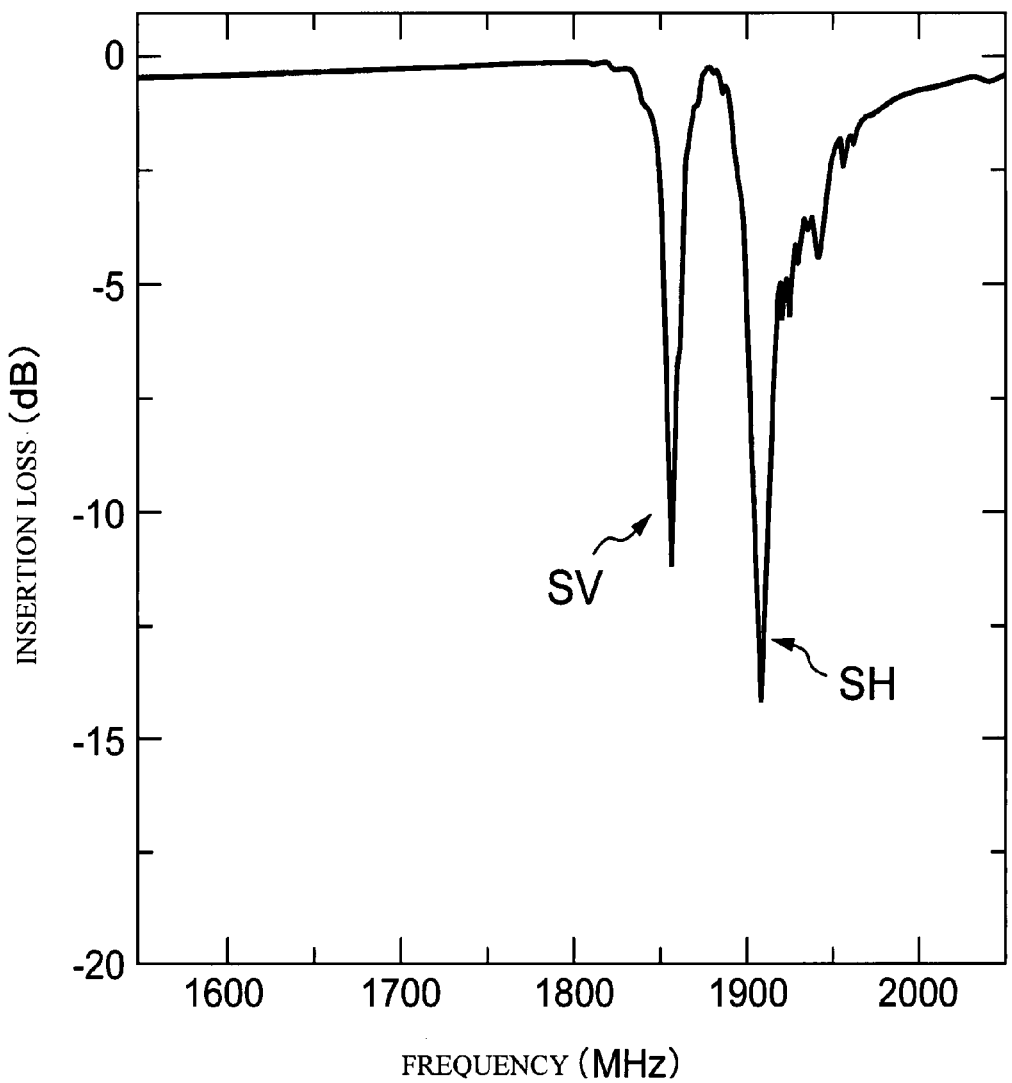
FIG. 1 shows insertion loss of a conventional elastic boundary wave device with respect to frequency.
Figure 2:
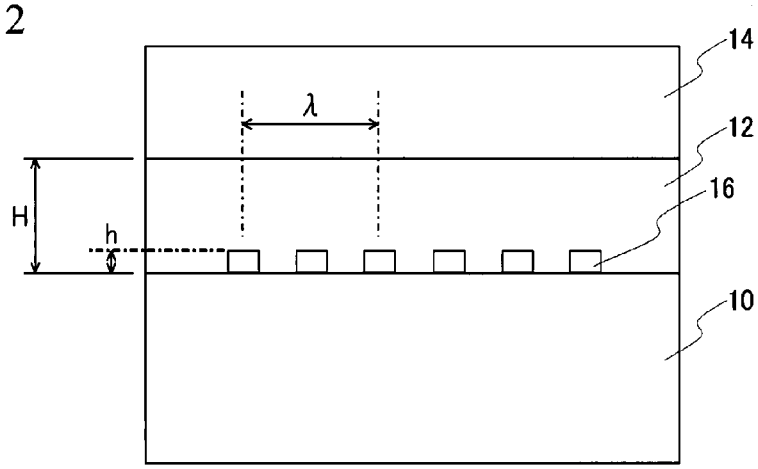
FIG. 2 is a cross-sectional view of an elastic boundary wave device employed in a first exemplary embodiment of the present invention.

The inventors of the present invention ran a simulation by means of the finite element method and calculated the magnitude of electromechanical coupling coefficient $k^2$ of the Stoneley wave in elastic boundary wave devices having various structures, in order to suppress the Stoneley wave. FIG. 2 is a cross-sectional view of an elastic boundary wave device used in the calculation. There are provided an electrode 16 having a main component of Cu (Copper) on a rotation Y plate $LiNbO_3$ substrate (LN substrate) 10. The electrode 16 is an interdigital transducer (IDT) or a comb-like electrode, and excites the elastic waves. There is provided on the substrate 10, a silicon oxide ($SiO_2$) film 12 to cover the electrode 16. There is also provided on the silicon oxide film 12, an oxide aluminum ($Al_2O_3$) film 14 (medium membrane).

Figure 3:
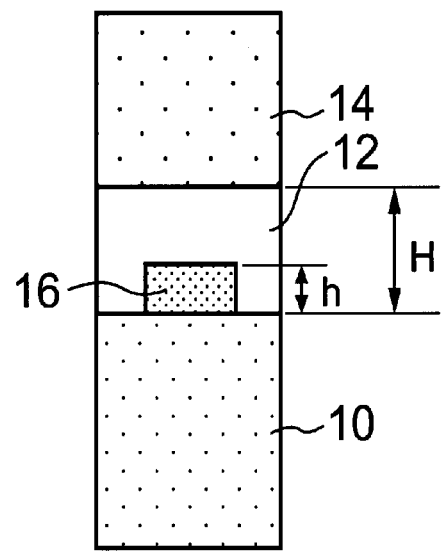
FIG. 3 is a cross-sectional view of a fundamental unit used for simulation.

Parameters used in the simulation include: ratio "a" Cu density (8.92 g/cm$^3$) in the density of the material used as the electrode 16; wavelength "A" of an elastic wave excited by the electrode 16 (namely, distance between every other electrode fingers); rotation Y cut angle "θ" of the substrate 10; film thickness "h" of the electrode 16; thickness "H" of the silicon oxide film 12. In the simulation, one electrode finger shown in FIG. 2 is a fundamental unit, as shown in FIG. 3, and the calculation is performed when the fundamental units are repeated up to infinity. In the calculation results described herein, $k^2$ of the elastic boundary wave having a main component of SH wave ranges 0.04 to 0.15, and is strong enough to compose a filter of high-frequency band. Also, judging from FIG. 4 and FIG. 8, $k^2$ becomes negative in some cases in FIG. 19; however, the absolute value of the calculated $k^2$ should be employed in a normal situation. For this reason, $k^2$ in absolute values are shown in FIG. 20 through FIG. 42, and in FIG. 47 through FIG. 67. When $k^2$ is represented as 0.00015 or less, the absolute values of the calculation result $k^2$ denotes 0.00015 or less.

Figure 4:
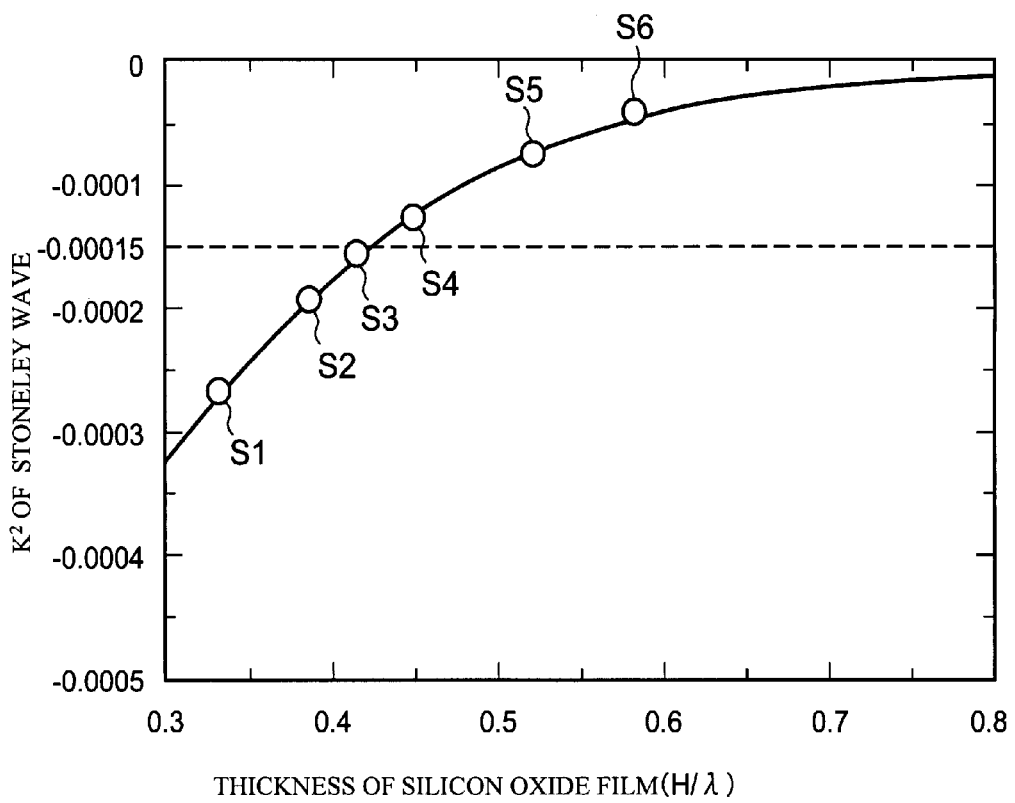
FIG. 4 shows $k^2$ with respect to the thickness of a silicon oxide film to compare simulation results and measurement results.
Figure 5B:
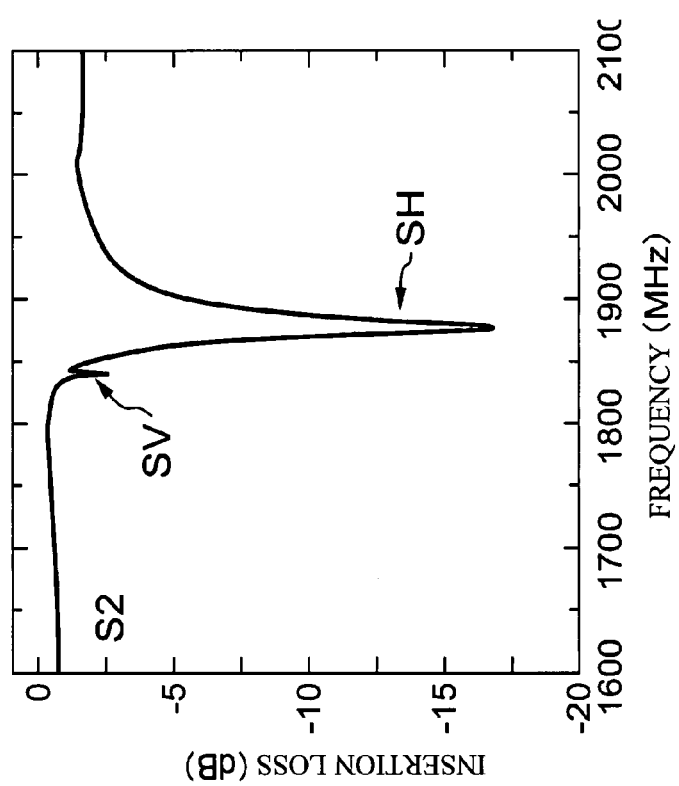
FIG. 5A and FIG. 5B show the insertion loss of S1 and S2 of FIG. 4 with respect to the frequency.
Figure 5A:
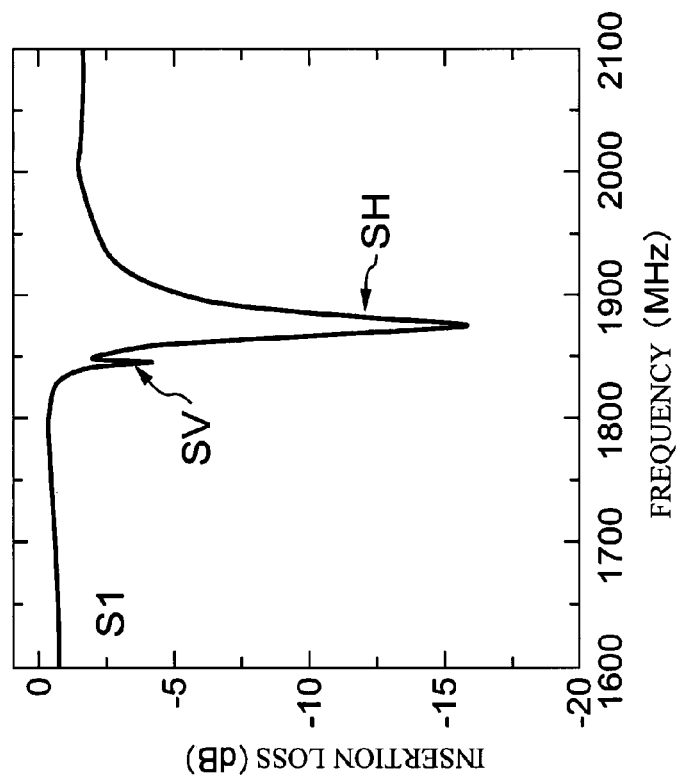
Figure 6B:
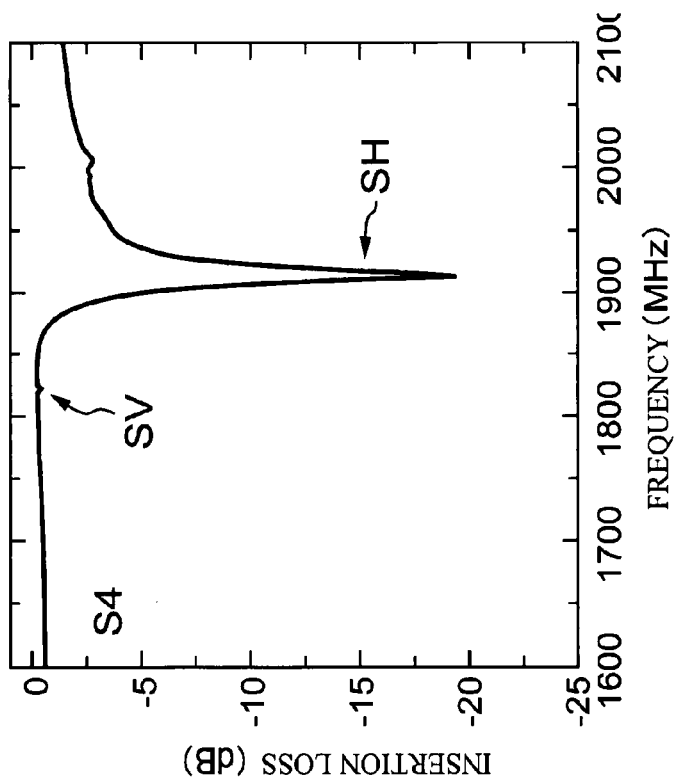
FIG. 6A and FIG. 6B show the insertion loss of S3 and S4 of FIG. 4 with respect to the frequency.
Figure 6A:
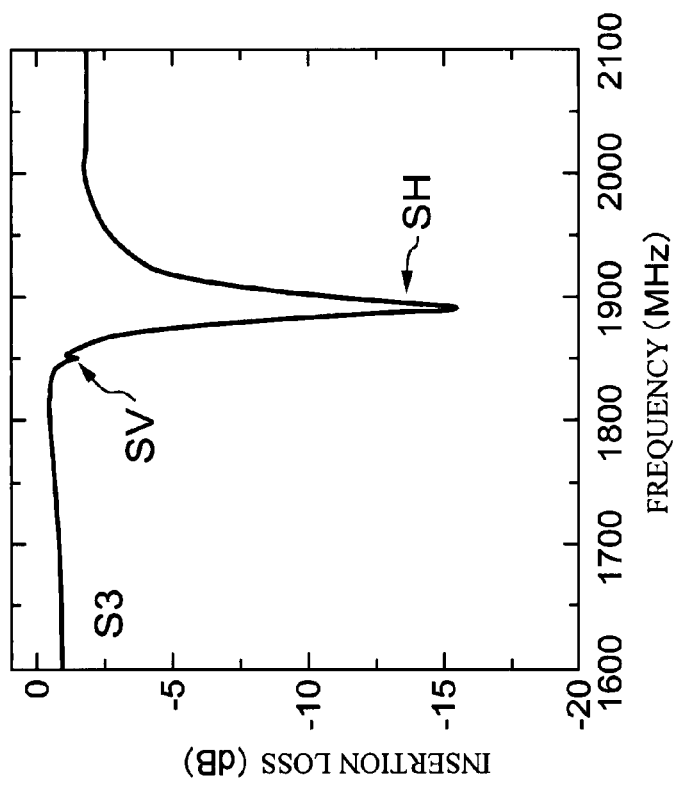
Figure 7A:
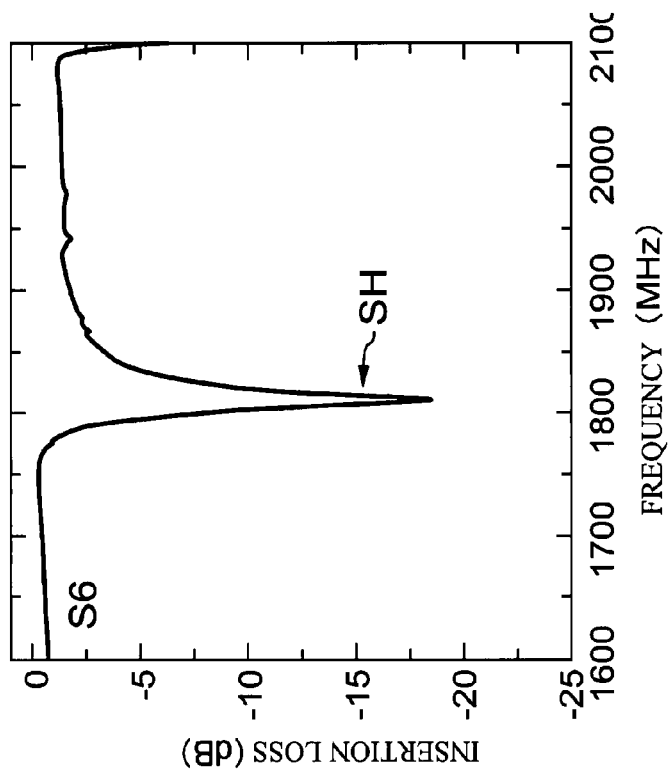
FIG. 7A and FIG. 7B show the insertion loss of S5 and S6 of FIG. 4 with respect to the frequency.
Figure 7B:
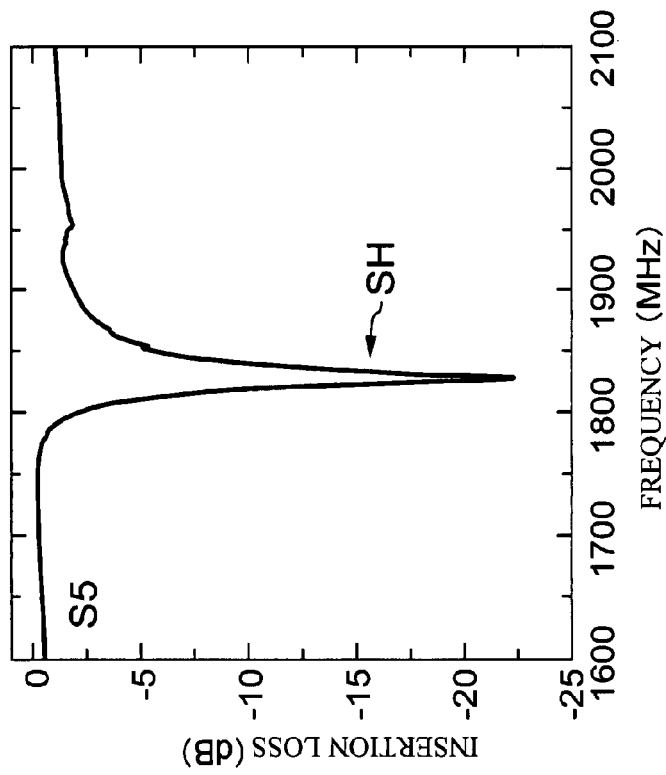

In order to examine whether $k^2$ of the actual elastic boundary wave device is calculated with accuracy in the simulation, $k^2$ of the Stoneley wave of the simulation result is compared with that of the elastic boundary wave device actually produced. The solid line in FIG. 4 represents that λ=1.982 µm, h=188 nm, and θ=30°. That is to say, FIG. 4 shows the calculation results of the dependency of $k^2$ with respect to $SiO_2$ film thickness (H/λ), where λ=0.095. In addition, other elastic boundary wave devices were respectively produced to have the $SiO_2$ film thicknesses (H/λ) of 0.33, 0.38, 0.42, 0.45, 0.52, and 0.58, with the use of same λ, h, and θ, and the frequency characteristics thereof were measured. FIG. 5A through FIG. 7B respectively show the measurement results of the frequency characteristics of the insertion loss of the elastic boundary wave devices in the one-port resonators produced. S1, S2, S3, S4, S5, and S6 of FIG. 4 respectively represent $k^2$ of the Stoneley wave in each of the elastic boundary wave devices. FIG. 5A through FIG. 7B respectively correspond to the measurement results of the elastic boundary wave devices produced under the conditions represented by S1, S2, S3, S4, S5, and S6 shown in FIG. 4. Judging from FIG. 4, the simulations that the inventors of the present invention carried out are very similar to the actual measurement results. In each of FIG. 5A and FIG. 5B, a large response of the Stoneley wave is respectively observed. However, the Stoneley wave is smaller in FIG. 6A, and becomes further smaller in FIG. 6B. In FIG. 7A and FIG. 7B, the response of the Stoneley wave is no longer observed. When the aforementioned measurement results are compared with the calculation results shown in FIG. 4, the response of the Stoneley wave is very small and actually causes no problem in a case where the value of $k^2$ of the Stoneley wave is equal to or smaller than 0.00015.

Crystal is a material used as a medium of surface acoustic wave devices and having a small value of $k^2$ of a surface acoustic wave, which is a function of the surface acoustic wave devices. The $k^2$ of crystal is 0.001. Therefore, at least the surface acoustic wave device that includes crystal is demanded to have $k^2$ of the Stoneley wave smaller than that of the surface acoustic wave used as a function thereof. That is to say, $k^2$ of the Stoneley wave is demanded to be equal to or smaller than 0.001.

Figure 8:
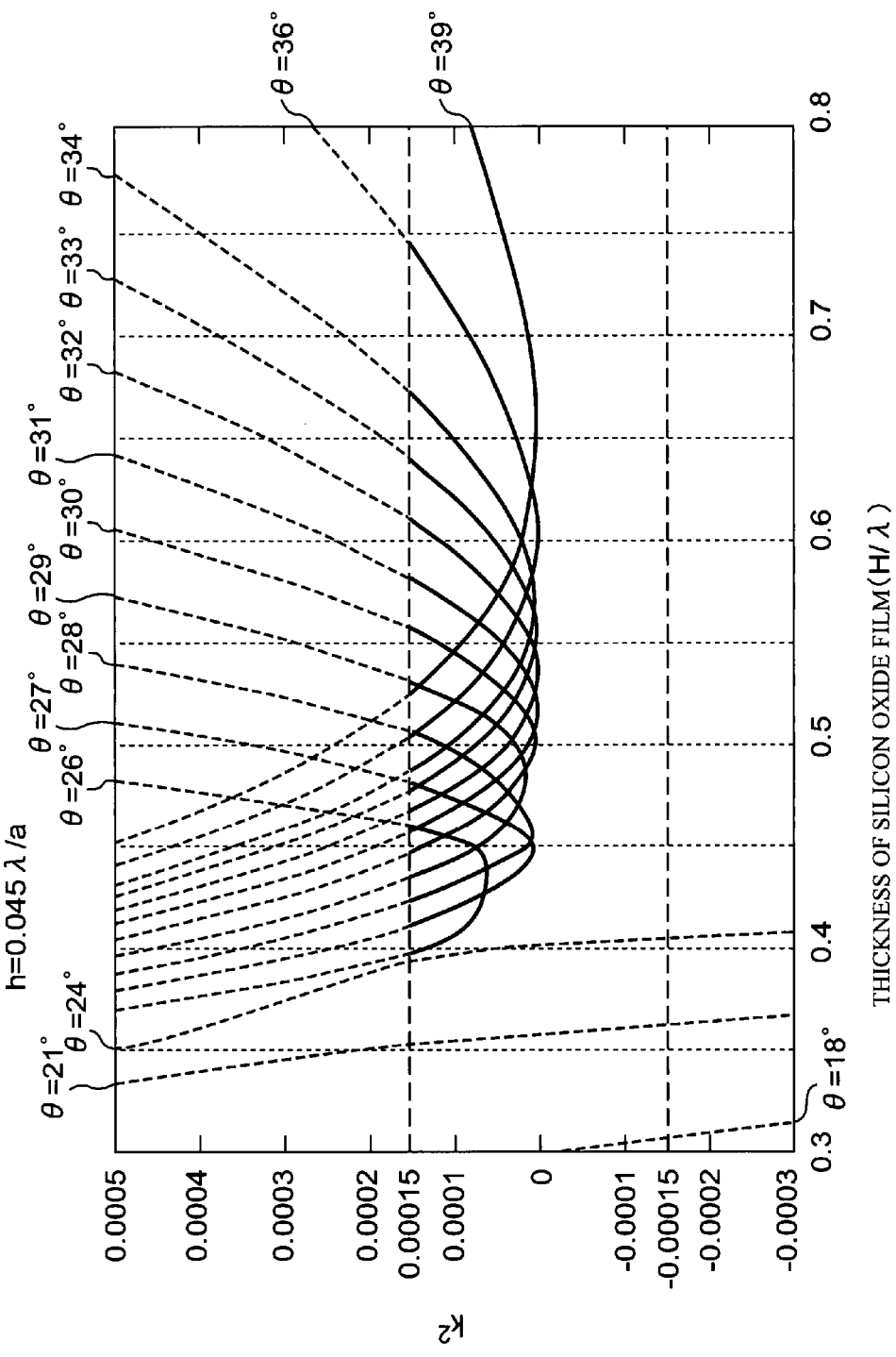
FIG. 8 shows first simulation results.

FIG. 8 through FIG. 19 are graphs showing the simulation results of the electromechanical coupling coefficient $k^2$ of the Stoneley wave with respect to $SiO_2$ film thickness $(H/\lambda)$. FIG. 8 through FIG. 19 respectively show the results where electrode film thicknesses h are respectively $0.03\lambda/a$, $0.045\lambda/a$, $0.06\lambda/a$, $0.07\lambda/a$, $0.075\lambda/a$, $0.08\lambda/a$, $0.085\lambda/a$, $0.09\lambda/a$, $0.095\lambda/a$, $0.1\lambda/a$, $0.105\lambda/a$, and $0.12\lambda/a$. It is assumed that each calculation point represents a range between middle points of both adjacent calculation points. Specifically, for example, in FIG. 10, it is assumed that the calculation result represents $0.0525\lambda/a \leq h < 0.065\lambda/a$, where $h=0.06\lambda/a$, since $0.0525\lambda/a$ is a middle point of $h=0.06\lambda/a$ and $h=0.045\lambda/a$ of FIG. 8 and FIG. 9 and $0.065\lambda/a$ is a middle point of $h=0.06\lambda/a$ and $h=0.07\lambda/a$ of FIG. 11. On the other hand, if there is no calculation value at one of the adjacent points as shown in FIG. 8, it is assumed that FIG. 8 represents the calculation value of FIG. 8 and a middle point of those of FIG. 8 and the other adjacent point. For example, in FIG. 8, it is assumed that the calculation result represents $0.045\lambda/a \leq h < 0.0525\lambda/a$, since the calculation point $h=0.045\lambda/a$ in FIG. 8 and $0.0525\lambda/a$ is a middle point of $h=0.045\lambda/a$ of FIG. 8 and FIG. 9 and the calculation point $h=0.06\lambda/a$ of FIG. 10. In a similar manner, in FIG. 8, it is assumed that the line $\theta=26°$ represents a range of $25° \leq \theta < 26.5°$, where $\theta=25°$ is a middle point of $\theta=26°$ and $\theta=24°$, and $\theta=26.5°$ is a middle point of $\theta=26°$ and $\theta=27°$.

Referring to FIG. 8 through FIG. 19, ranges where $k^2$ of the Stoneley wave is equal to or smaller than 0.00015 are obtained. It is therefore possible to cause $k^2$ of the Stoneley wave to be equal to or smaller than 0.00015, by setting the parameters of the elastic boundary wave device to have any one of the ranges shown in FIG. 8 through FIG. 19. In FIG. 8 through FIG. 19, solid lines represent the calculation results of ranges where $k^2$ is equal to or smaller than 0.00015 and dotted lines represent those of remaining ranges.

Figure 9:
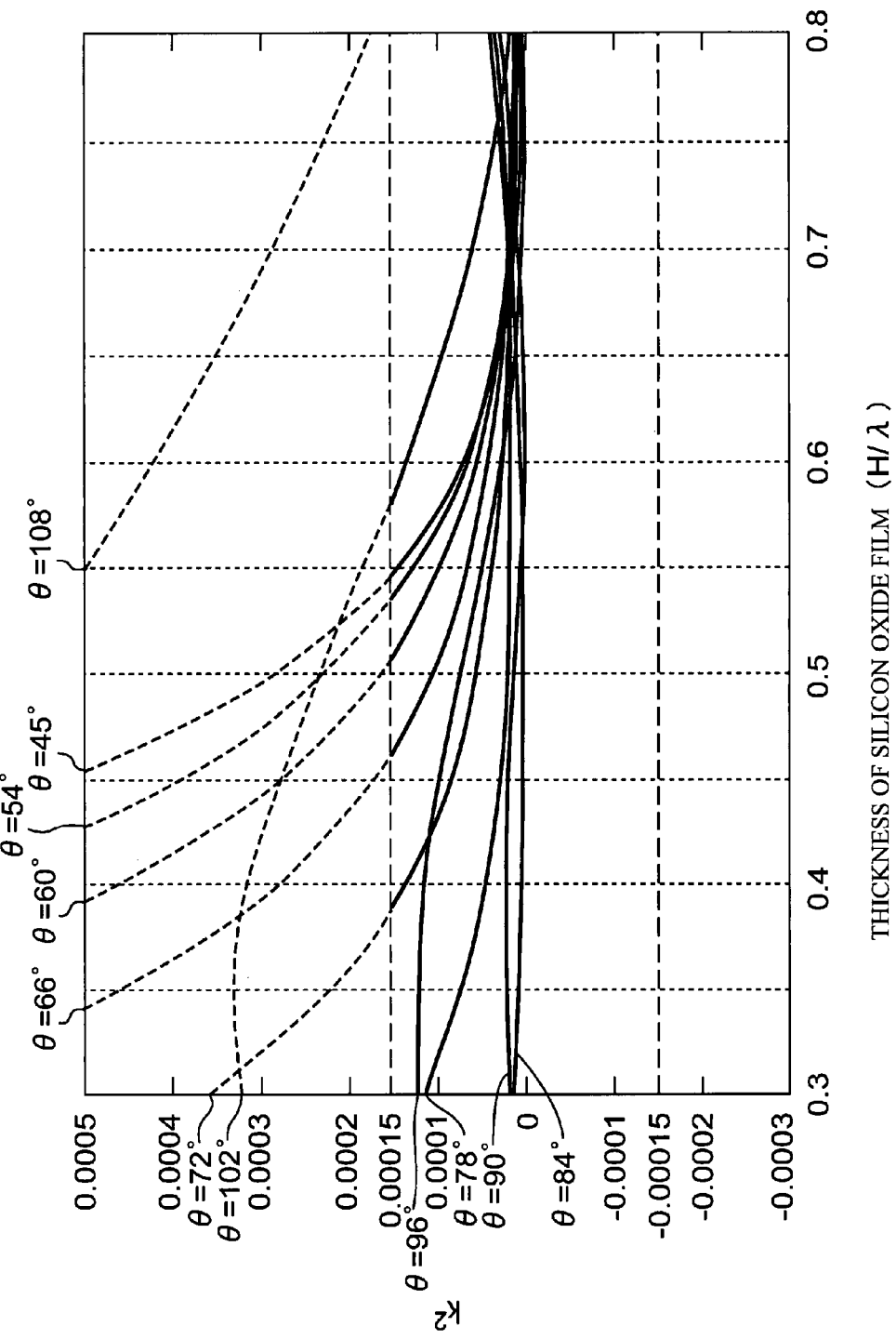
FIG. 9 shows second simulation results.

As shown in FIG. 8 and FIG. 9, there are ranges where $k^2$ is equal to or smaller than 0.00015, when $0.045\lambda/a \leq h < 0.0525\lambda/a$, and
when $25° \leq \theta < 26.5°$, $0.39\lambda \leq H < 0.46\lambda$,
when $26.5° \leq \theta < 27.5°$, $0.41\lambda \leq H < 0.48\lambda$,
when $27.5° \leq \theta < 28.5°$, $0.42\lambda \leq H < 0.51\lambda$,
when $28.5° \leq \theta < 29.5°$, $0.43\lambda \leq H < 0.53\lambda$,
when $29.5° \leq \theta < 30.5°$, $0.45\lambda \leq H < 0.56\lambda$,
when $30.5° \leq \theta < 31.5°$, $0.46\lambda \leq H < 0.58\lambda$,
when $31.5° \leq \theta < 32.5$, $0.47\lambda \leq H < 0.61\lambda$,
when $32.5° \leq \theta < 33.5°$, $0.48\lambda \leq H < 0.64\lambda$,
when $33.5° \leq \theta < 35°$, $0.48\lambda \leq H < 0.67\lambda$,
when $35° \leq \theta < 37.5°$, $0.5\lambda \leq H < 0.74\lambda$,
when $37.5° \leq \theta < 42°$, $0.52\lambda \leq H < 0.8\lambda$,
when $42° \leq \theta < 57°$, $0.55\lambda \leq H < 0.8\lambda$,
when $57° \leq \theta < 63°$, $0.51\lambda \leq H < 0.8\lambda$,
when $63° \leq \theta < 69°$, $0.46\lambda \leq H < 0.8\lambda$,
when $69° \leq \theta < 75°$, $0.39\lambda \leq H < 0.8\lambda$,
when $75° \leq \theta < 99°$, $0.3\lambda \leq H < 0.8\lambda$, and
when $99° \leq \theta < 105°$, $0.58\lambda \leq H < 0.8\lambda$.

Figure 10:
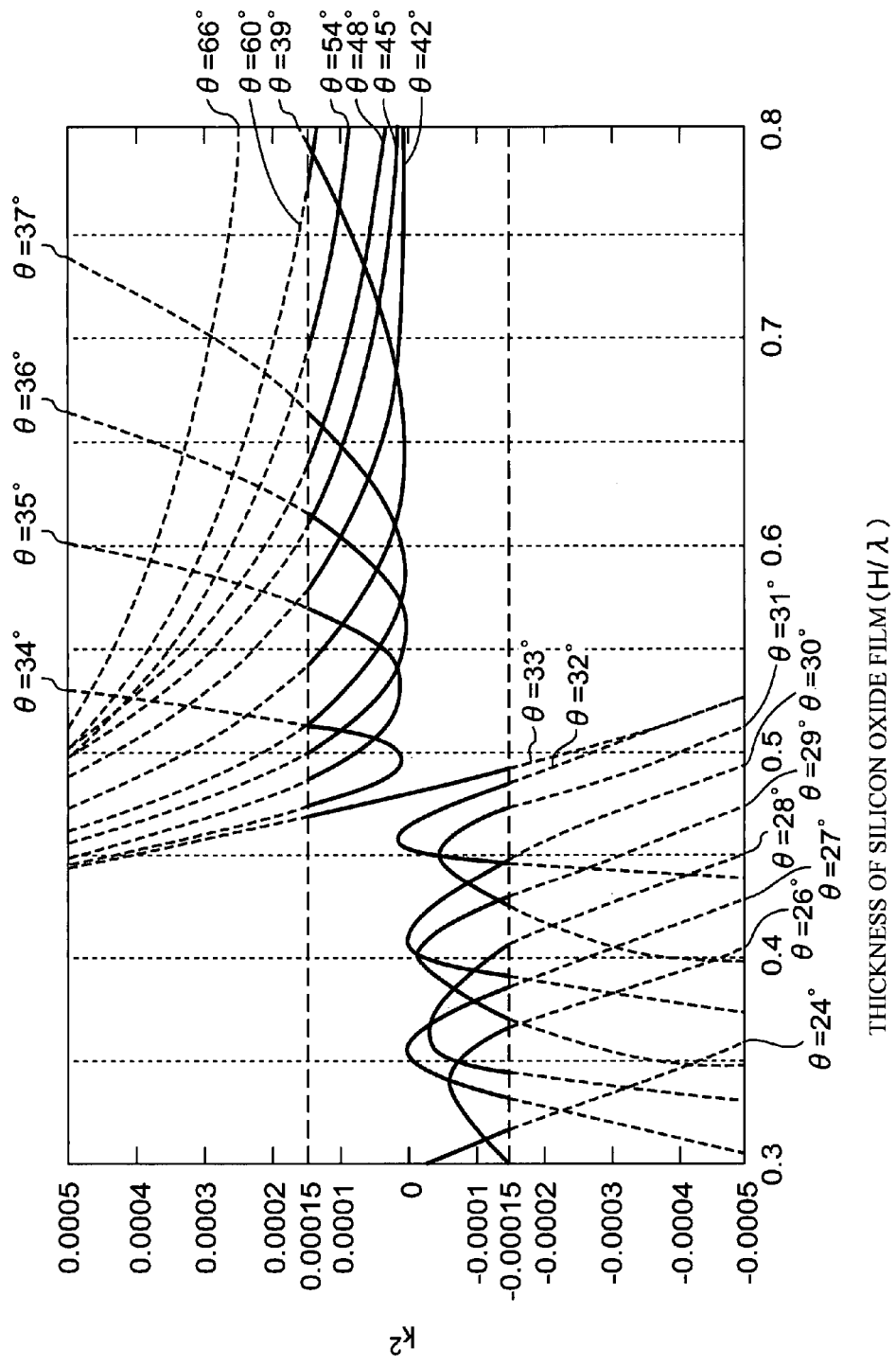
FIG. 10 shows third simulation results.

As shown in FIG. 10, there are ranges where $k^2$ is equal to or smaller than 0.00015, when $0.0525\lambda/a \leq h < 0.065\lambda/a$ and
when $24° \leq \theta < 25°$, $0.3\lambda \leq H < 0.32\lambda$,
when $25° \leq \theta < 26.5°$, $0.3\lambda \leq H < 0.37\lambda$,
when $26.5° \leq \theta < 27.5°$, $0.33\lambda \leq H < 0.38\lambda$,
when $27.5° \leq \theta < 28.5°$, $0.34\lambda \leq H < 0.41\lambda$,
when $28.5° \leq \theta < 29.5°$, $0.37\lambda \leq H < 0.43\lambda$,
when $29.5° \leq \theta < 30.5°$, $0.39\lambda \leq H < 0.44\lambda$,
when $30.5° \leq \theta < 31.5°$, $0.42\lambda \leq H < 0.47\lambda$,
when $31.5° \leq \theta < 32.5°$, $0.44\lambda \leq H < 0.48\lambda$,
when $32.5° \leq \theta < 33.5°$, $0.47\lambda \leq H < 0.49\lambda$,
when $33.5° \leq \theta < 34.5°$, $0.47\lambda \leq H < 0.51\lambda$,
when $34.5° \leq \theta < 35.5°$, $0.48\lambda \leq H < 0.57\lambda$,
when $35.5° \leq \theta < 36.5°$, $0.5\lambda \leq H < 0.62\lambda$,
when $36.5° \leq \theta < 38°$, $0.52\lambda \leq H < 0.67\lambda$,
when $38° \leq \theta < 40.5°$, $0.54\lambda \leq H < 0.79\lambda$,
when $40.5° \leq \theta < 43.5°$, $0.58\lambda \leq H < 0.8\lambda$,
when $43.5° \leq \theta < 46.5°$, $0.61\lambda \leq H < 0.8\lambda$,
when $46.5° \leq \theta < 51°$, $0.64\lambda \leq H < 0.8\lambda$,
when $51° \leq \theta < 57°$, $0.69\lambda \leq H < 0.8\lambda$, and
when $57 \leq \theta < 63°$, $0.78\lambda \leq H < 0.8\lambda$.

Figure 11:
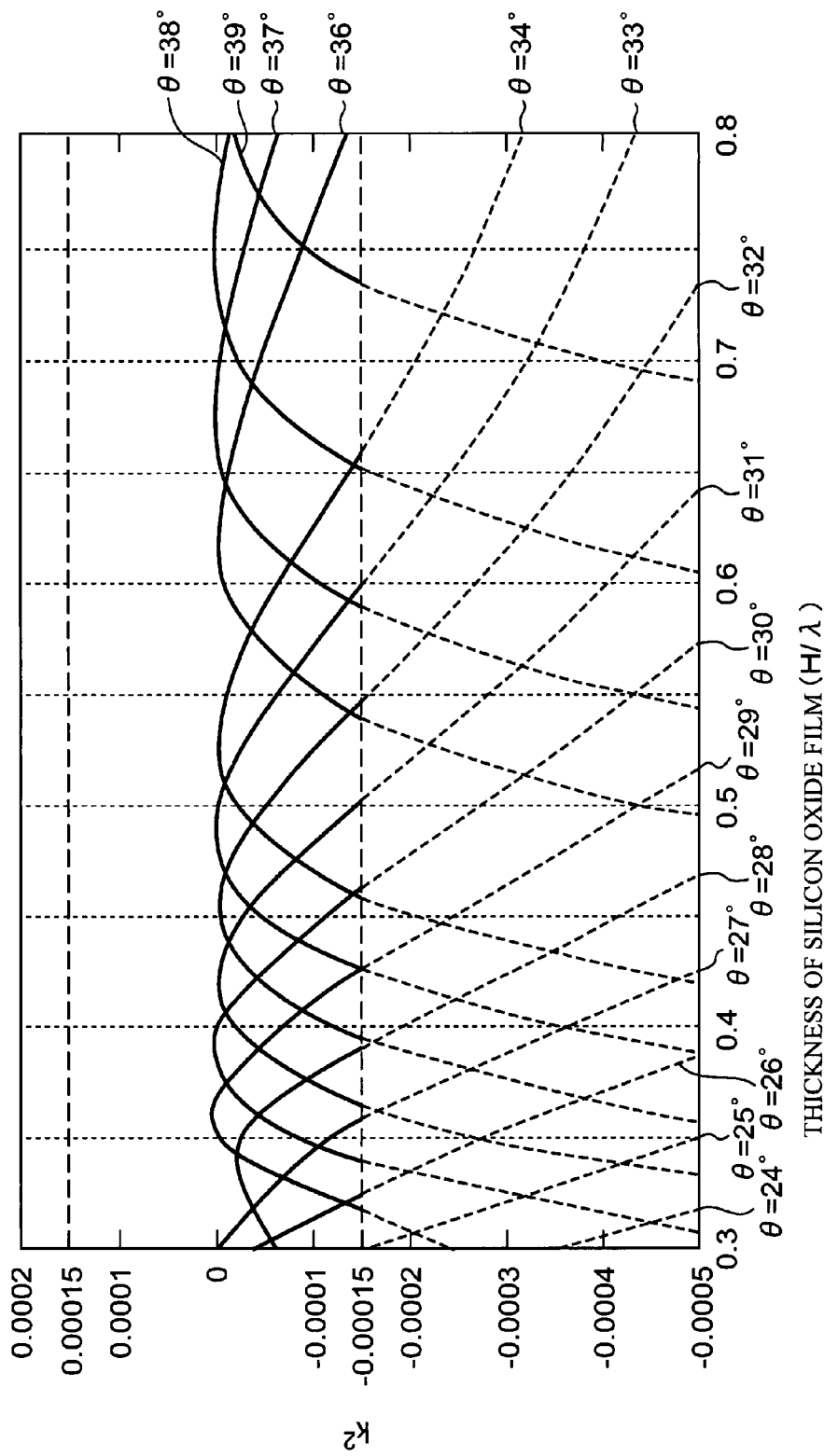
FIG. 11 shows fourth simulation results.

As shown in FIG. 11, there are ranges where $k^2$ is equal to or smaller than 0.00015, when $0.065\lambda/a \leq h < 0.0725\lambda/a$ and
when $25.5° \leq \theta < 26.5°$, $0.3\lambda \leq H < 0.32\lambda$,
when $26.5° \leq \theta < 27.5°$, $0.3\lambda \leq H < 0.36\lambda$,
when $27.5° \leq \theta < 28.5°$, $0.3\lambda \leq H < 0.38\lambda$,
when $28.5° \leq \theta < 29.5°$, $0.32\lambda \leq H < 0.43\lambda$,
when $29.5° \leq \theta < 30.5°$, $0.34\lambda \leq H < 0.46\lambda$,
when $30.5° \leq \theta < 31.5°$, $0.36\lambda \leq H < 0.5\lambda$,
when $31.5° \leq \theta < 32.5°$, $0.39\lambda \leq H < 0.55\lambda$,
when $32.5° \leq \theta < 33.5°$, $0.43\lambda \leq H < 0.6\lambda$,
when $33.5° \leq \theta < 35°$, $0.46\lambda \leq H < 0.66\lambda$,
when $35° \leq \theta < 36.5°$, $0.54\lambda \leq H < 0.8\lambda$,
when $36.5° \leq \theta < 37.5°$, $0.59\lambda \leq H < 0.8\lambda$,
when $37.5° \leq \theta < 38.5°$, $0.65\lambda \leq H < 0.8\lambda$, and
when $38.5° \leq \theta < 39°$, $0.73\lambda \leq H < 0.8\lambda$.

Figure 12:
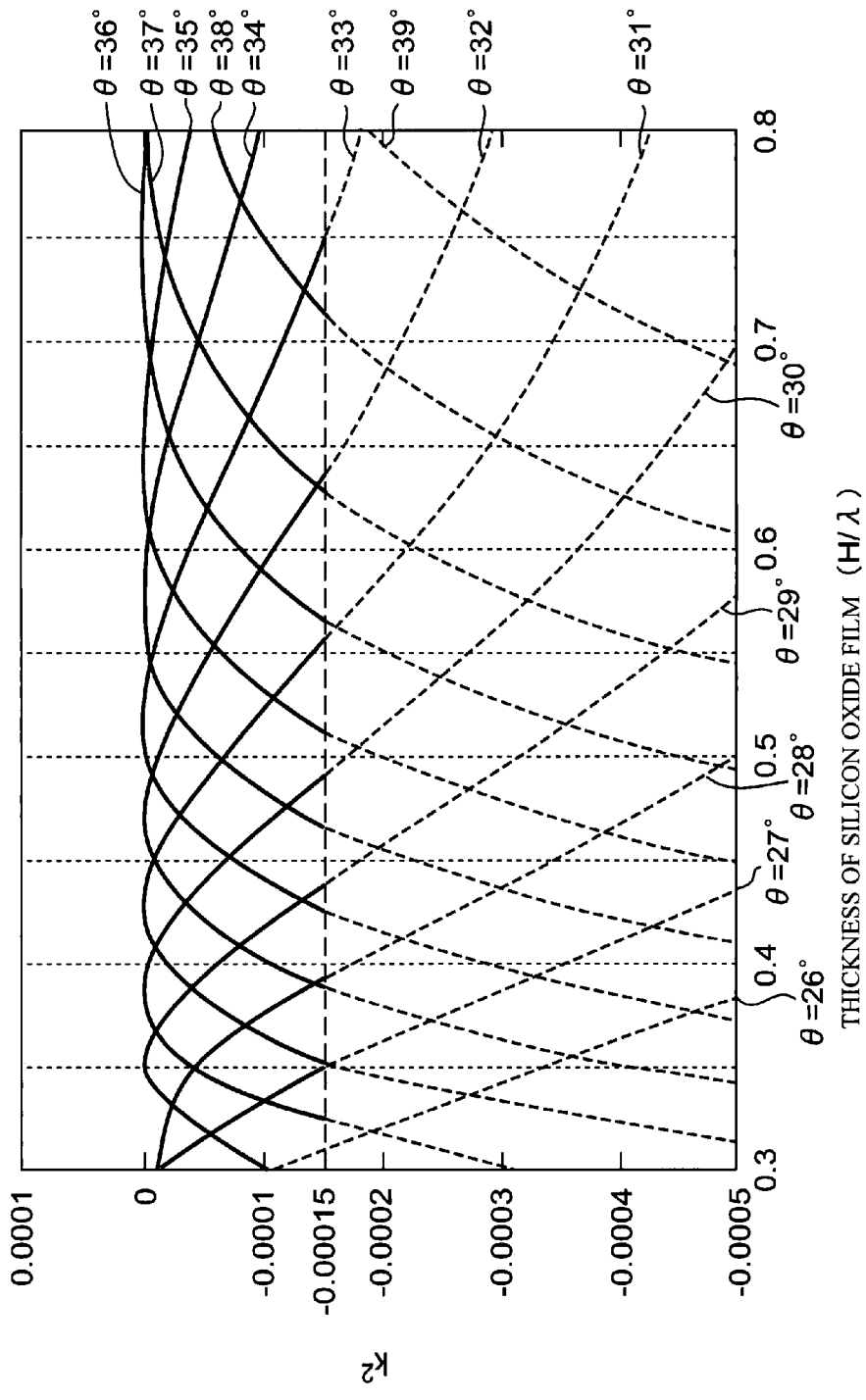
FIG. 12 shows fifth simulation results.

As shown in FIG. 12, there are ranges where $k^2$ is equal to or smaller than 0.00015, when $0.0725\lambda/a \leq h < 0.0775\lambda/a$ and
when $26.5° \leq \theta < 27.5°$, $0.3\lambda \leq H < 0.35\lambda$,
when $27.5° \leq \theta < 28.5°$, $0.3\lambda \leq H < 0.39\lambda$,
when $28.5° \leq \theta < 29.5°$, $0.3\lambda \leq H < 0.43\lambda$,
when $29.5° \leq \theta < 30.5°$, $0.33\lambda \leq H < 0.49\lambda$,
when $30.5° \leq \theta < 31.5°$, $0.35\lambda \leq H < 0.56\lambda$,
when $31.5° \leq \theta < 32.5°$, $0.39\lambda \leq H < 0.63\lambda$,
when $32.5° \leq \theta < 33.5°$, $0.43\lambda \leq H < 0.75\lambda$,
when $33.5° \leq \theta < 34.5°$, $0.47\lambda \leq H < 0.8\lambda$,
when $34.5° \leq \theta < 35.5°$, $0.52\lambda \leq H < 0.8\lambda$,
when $35.5° \leq \theta < 36.5°$, $0.57\lambda \leq H < 0.8\lambda$,
when $36.5° \leq \theta < 37.5°$, $0.63\lambda \leq H < 0.8\lambda$, and
when $37.5° \leq \theta < 38.5°$, $0.72\lambda \leq H < 0.8\lambda$.

Figure 13:
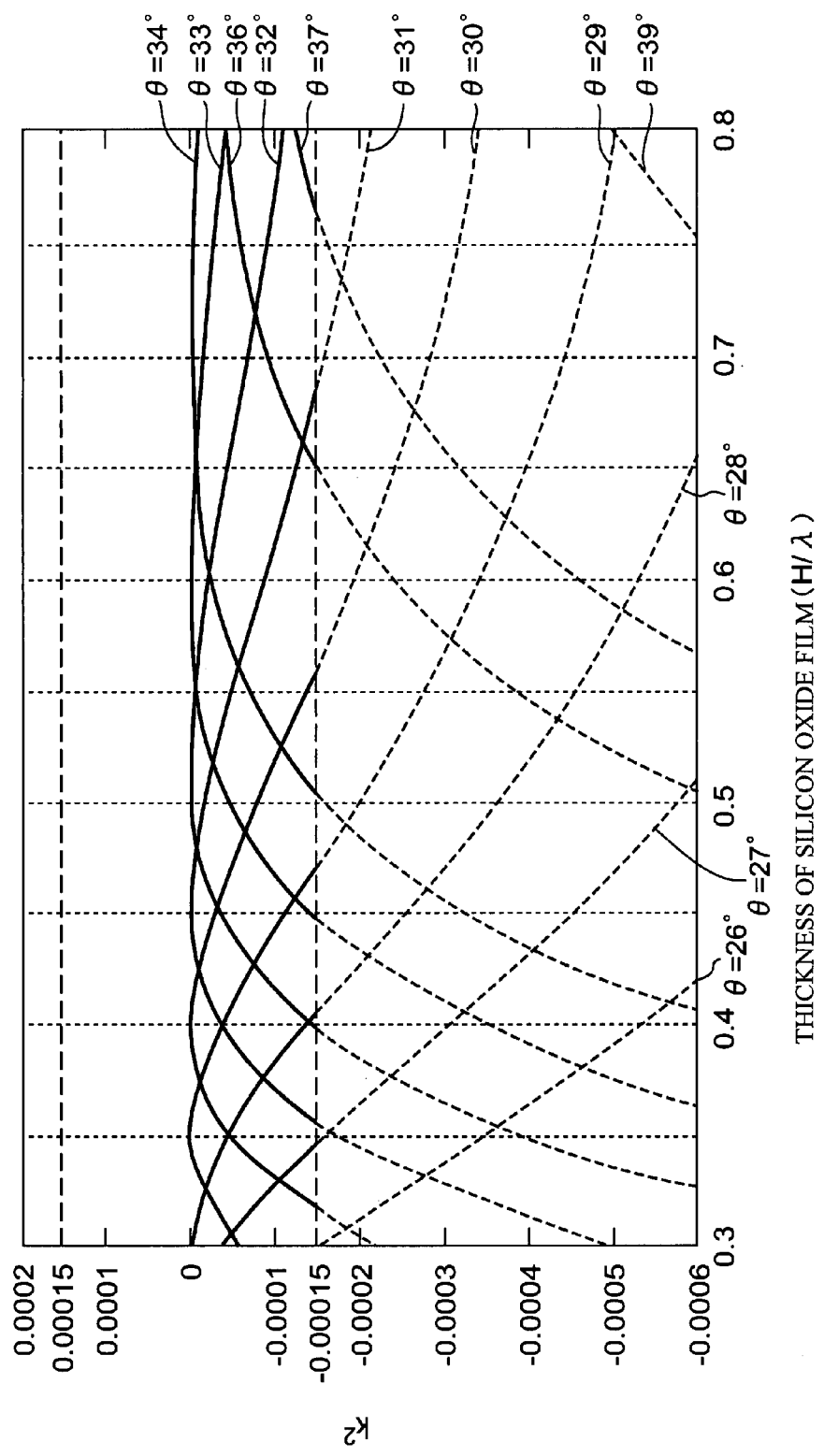
FIG. 13 shows sixth simulation results.

As shown in FIG. 13, there are ranges where $k^2$ is equal to or smaller than 0.00015, when $0.0775\lambda/a \leq h < 0.0825\lambda/a$ and when 26.5°≦θ<27.5°, 0.3λ≦H<0.34λ,
when 27.5°≦θ<28.5°, 0.3λ≦H<0.41λ,
when 28.5°≦θ<29.5°, 0.3λ≦H<0.47λ,
when 29.5°≦θ<30.5°, 0.32λ≦H<0.56λ,
when 30.5°≦θ<31.5°, 0.36λ≦H<0.69λ,
when 31.5°≦θ<32.5°, 0.39λ≦H<0.8λ,
when 32.5°≦θ<33.5°, 0.44λ≦H<0.8λ,
when 33.5°≦θ<35°, 0.5λ≦H<0.8λ,
when 35°≦θ<36.5°, 0.65λ≦H<0.8λ, and
when 36.5°≦θ<38°, 0.77λ≦H<0.8 λ.

Figure 14:
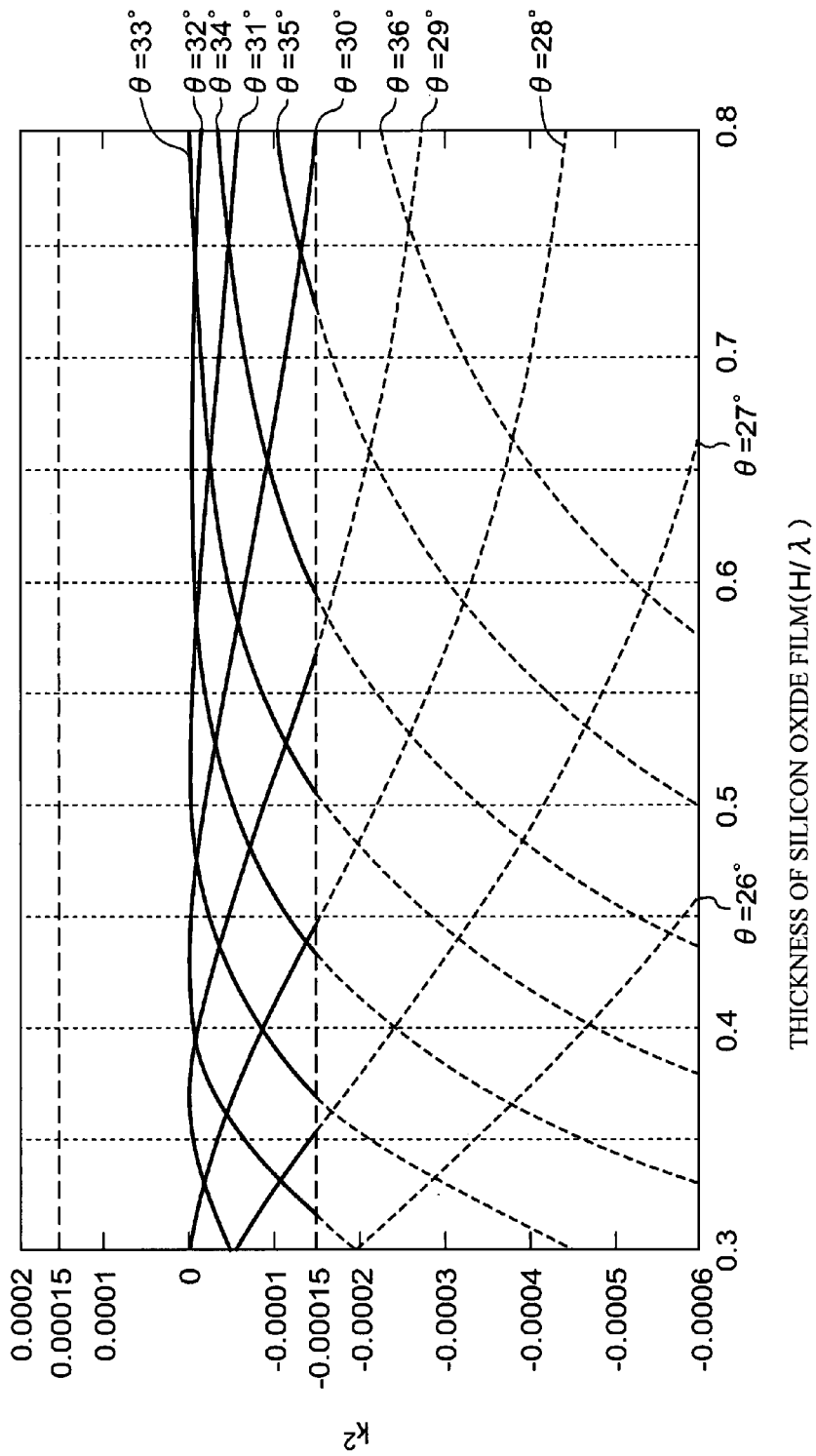
FIG. 14 shows seventh simulation results.

As shown in FIG. 14, there are ranges where $k^2$ is equal to or smaller than 0.00015, when 0.0825λ/a≦h<0.0875λ/a and
when 26.5°≦θ<27.5°, 0.3λ≦H<0.36λ,
when 27.5°≦θ<28.5°, 0.3λ≦H<0.44λ,
when 28.5°≦θ<29.5°, 0.3λ≦H<0.57λ,
when 29.5°≦θ<30.5°, 0.32λ≦H<0.8λ,
when 30.5°≦θ<31.5°, 0.37λ≦H<0.8λ,
when 31.5°≦θ<32.5°, 0.43λ≦H<0.8λ,
when 32.5°≦θ<33.5°, 0.51λ≦H<0.8λ,
when 33.5°≦θ<34.5°, 0.59λ≦H<0.8λ, and
when 34.5°≦θ<35.5°, 0.72λ≦H<0.8 λ.

Figure 15:
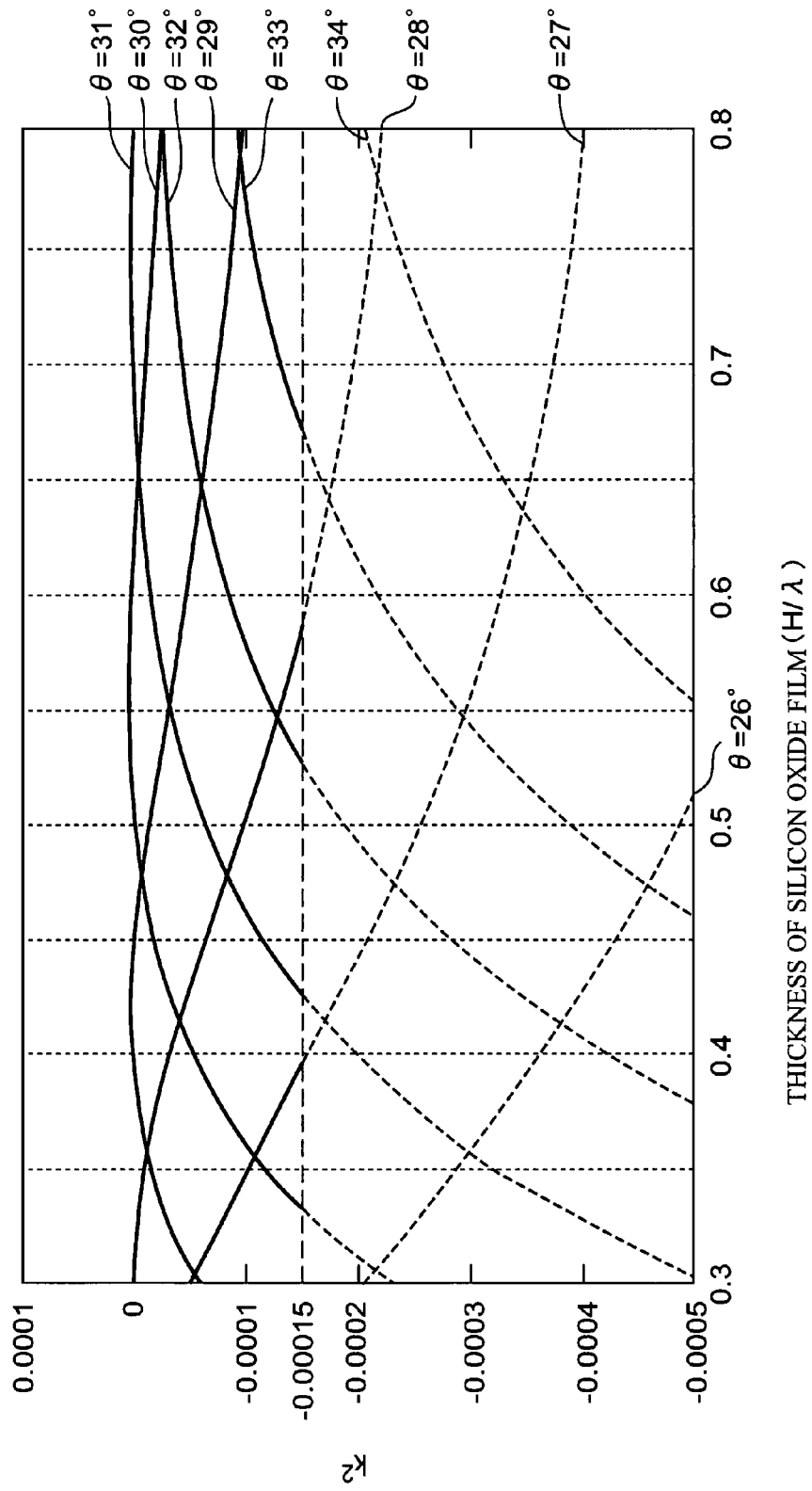
FIG. 15 shows eighth simulation results.

As shown in FIG. 15, there are ranges where $k^2$ is equal to or smaller than 0.00015, when 0.0875λ/a≦h<0.0925λ/a and
when 26.5°≦θ<27.5°, 0.3λ≦H<0.39λ,
when 27.5°≦θ<28.5°, 0.3λ≦H<0.58λ,
when 28.5°≦θ<29.5°, 0.3λ≦H<0.8λ,
when 29.5°≦θ<30.5°, 0.33λ≦H<0.8λ,
when 30.5°≦θ<31.5°, 0.43λ≦H<0.8λ,
when 31.5°≦θ<32.5°, 0.53λ≦H<0.8λ, and
when 32.5°≦θ<33.5°, 0.67λ≦H<0.8 λ.

Figure 16:
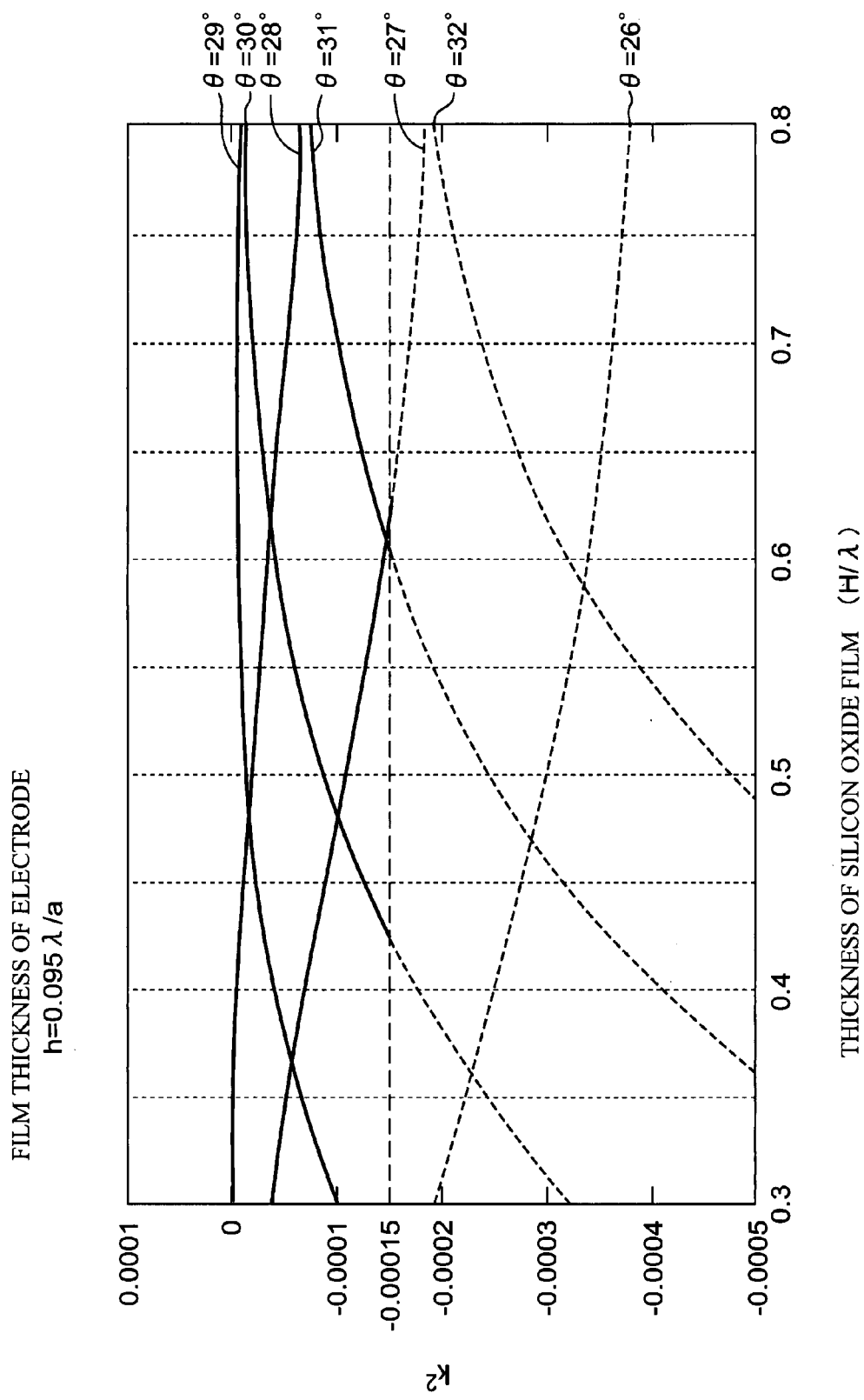
FIG. 16 shows ninth simulation results.

As shown in FIG. 16, there are ranges where $k^2$ is equal to or smaller than 0.00015, when 0.0925λ/a≦h<0.0975λ/a and
when 26.5°≦θ<27.5°, 0.3λ≦H<0.63λ,
when 27.5°≦θ<28.5°, 0.3λ≦H<0.8λ,
when 28.5°≦θ<29.5°, 0.3λ≦H<0.8λ,
when 29.5°≦θ<30.5°, 0.42λ≦H<0.8λ, and
when 30.5°≦θ<31.5°, 0.6λ≦H<0.8 λ.

Figure 17:
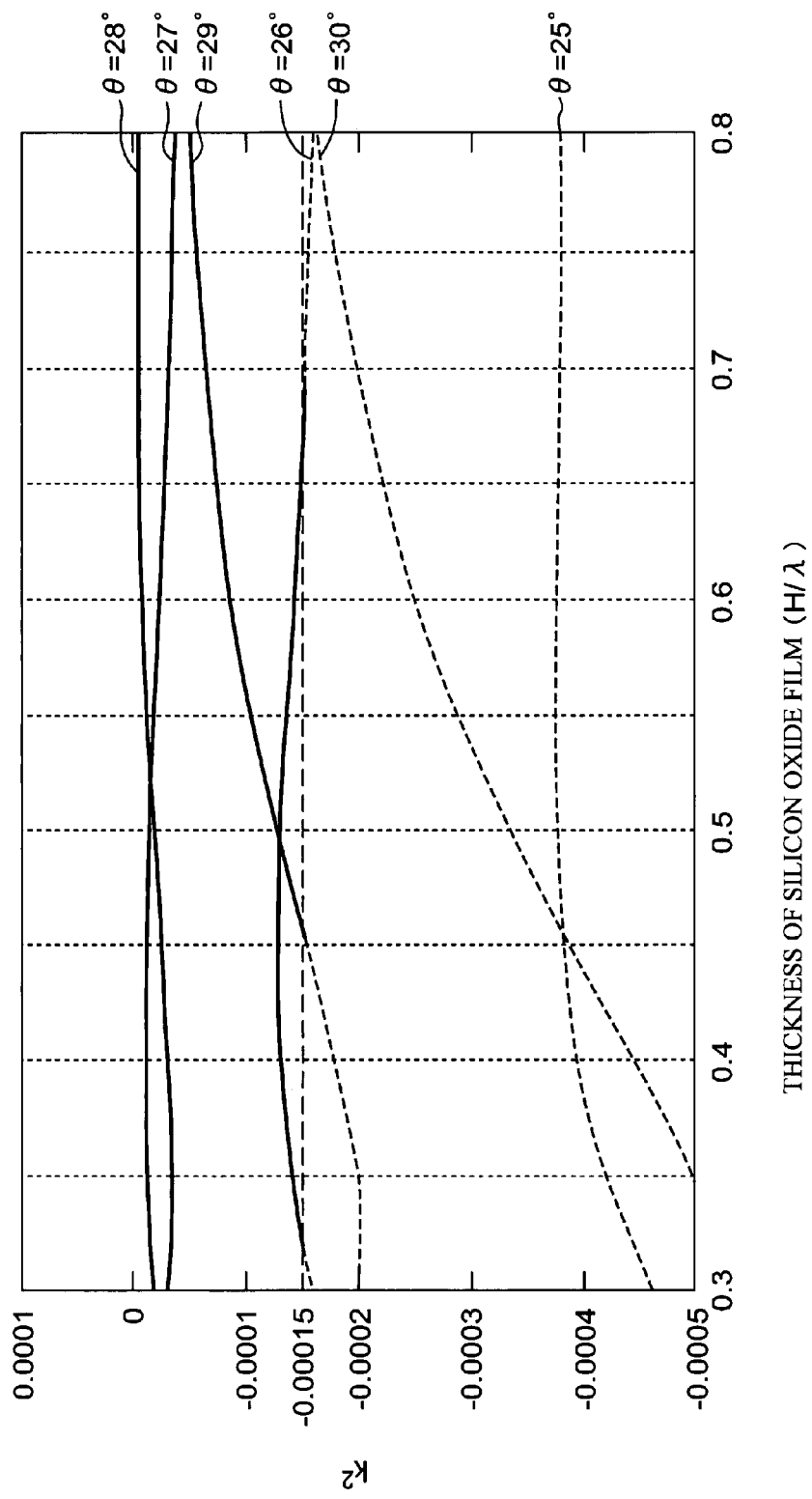
FIG. 17 shows tenth simulation results.

As shown in FIG. 17, there are ranges where $k^2$ is equal to or smaller than 0.00015, when 0.0975λ/a≦h<0.1025λ/a and
when 25.5°≦θ<26.5°, 0.32λ≦H<0.7λ,
when 26.5°≦θ<27.5°, 0.3λ≦H<0.8λ,
when 27.5°≦θ<28.5°, 0.3λ≦H<0.8λ, and
when 28.5°≦θ<29.5°, 0.45λ≦H<0.8λ.

Figure 18:
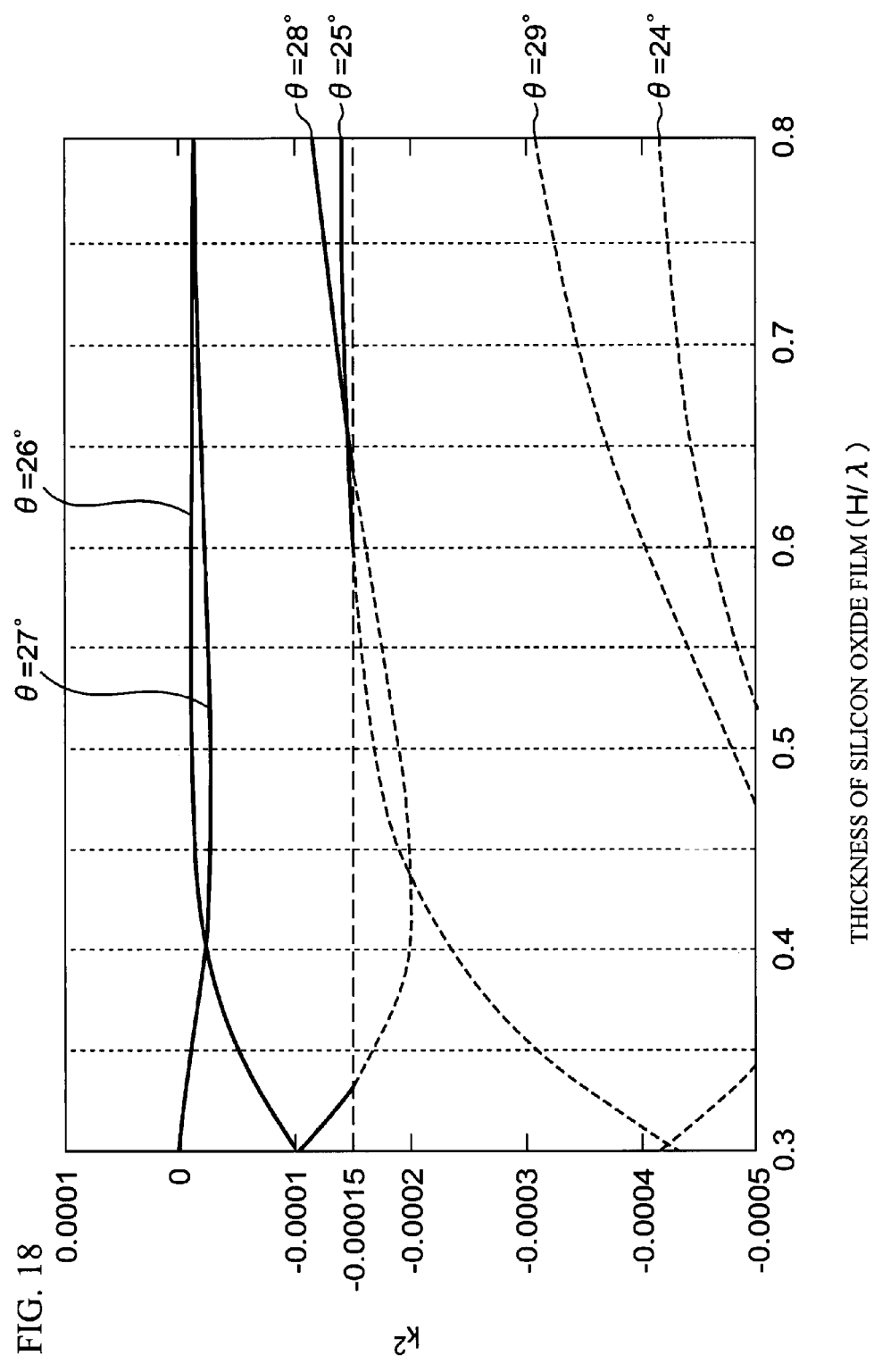
FIG. 18 shows eleventh simulation results.

As shown in FIG. 18, there are ranges where $k^2$ is equal to or smaller than 0.00015, when 0.1025λ/a≦h<0.1125λ/a and
when 24.5°≦θ<25.5°, 0.6λ≦H<0.8λ,
when 25.5°≦θ<26.5°, 0.3λ≦H<0.8λ,
when 26.5°≦θ<27.5°, 0.3λ≦H<0.8λ, and
when 27.5°≦θ<28.5°, 0.3λ≦H<0.33 λ or 0.64λ≦H<0.8 λ.

Figure 19:
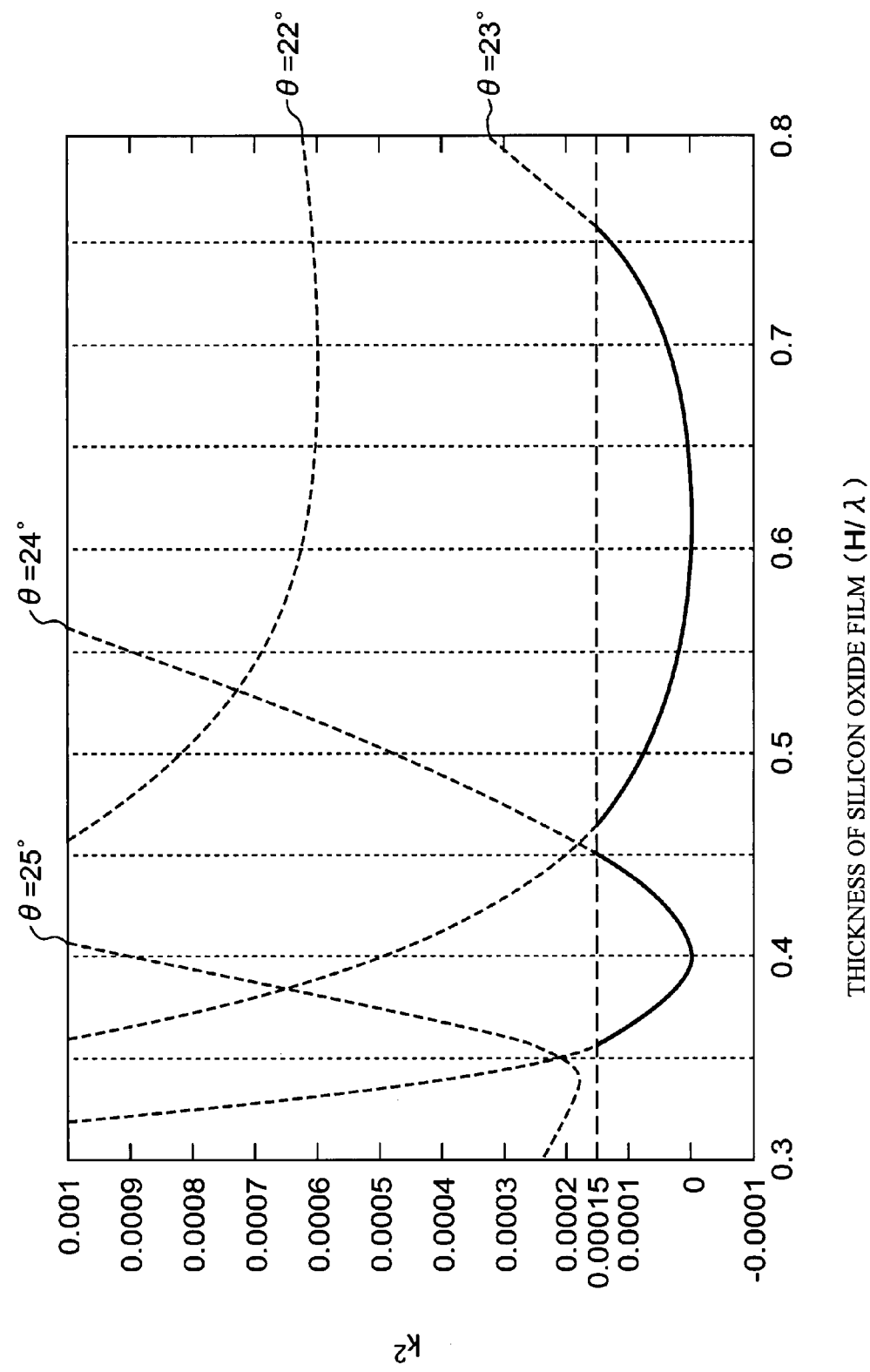
FIG. 19 shows twelfth simulation results.

As shown in FIG. 19, there are ranges where $k^2$ is equal to or smaller than 0.00015, when 0.1125λ/a≦h<0.12λ/a and
when 22.5°≦θ<23.5°, 0.47λ≦H<0.76λ, and
when 23.5°≦θ<24.5°, 0.36λ≦H<0.45 λ.

FIG. 20 through FIG. 31 are graphs showing the electromechanical coupling coefficient $k^2$ of the Stoneley wave with respect to $SiO_2$ film thickness (H/λ) and an electrode film pressure (h/λ). FIG. 20 through FIG. 31 respectively show results when Y-cut angles are 24°, 26°, 27°, 28°, 29°, 30°, 31°, 32°, 33°, 34°, 36°, and 39°. As described with reference to FIG. 8 through FIG. 19, it is assumed that each calculation point represents a range between middle points with both adjacent calculation points. There are listed below the graphs shown in FIG. 20 through FIG. 31, approximate expressions in the curve of the first or second order when $k^2$ is equal to 0.00015. From the curves shown, ranges where $k^2$ is equal to or smaller than 0.00015 are obtained from each graph. It is therefore possible to cause $k^2$ of the Stoneley wave to be equal to or smaller than 0.00015, by setting the parameters of the elastic boundary wave device to have any one of the ranges shown in FIG. 20 through FIG. 31.

Figure 20:
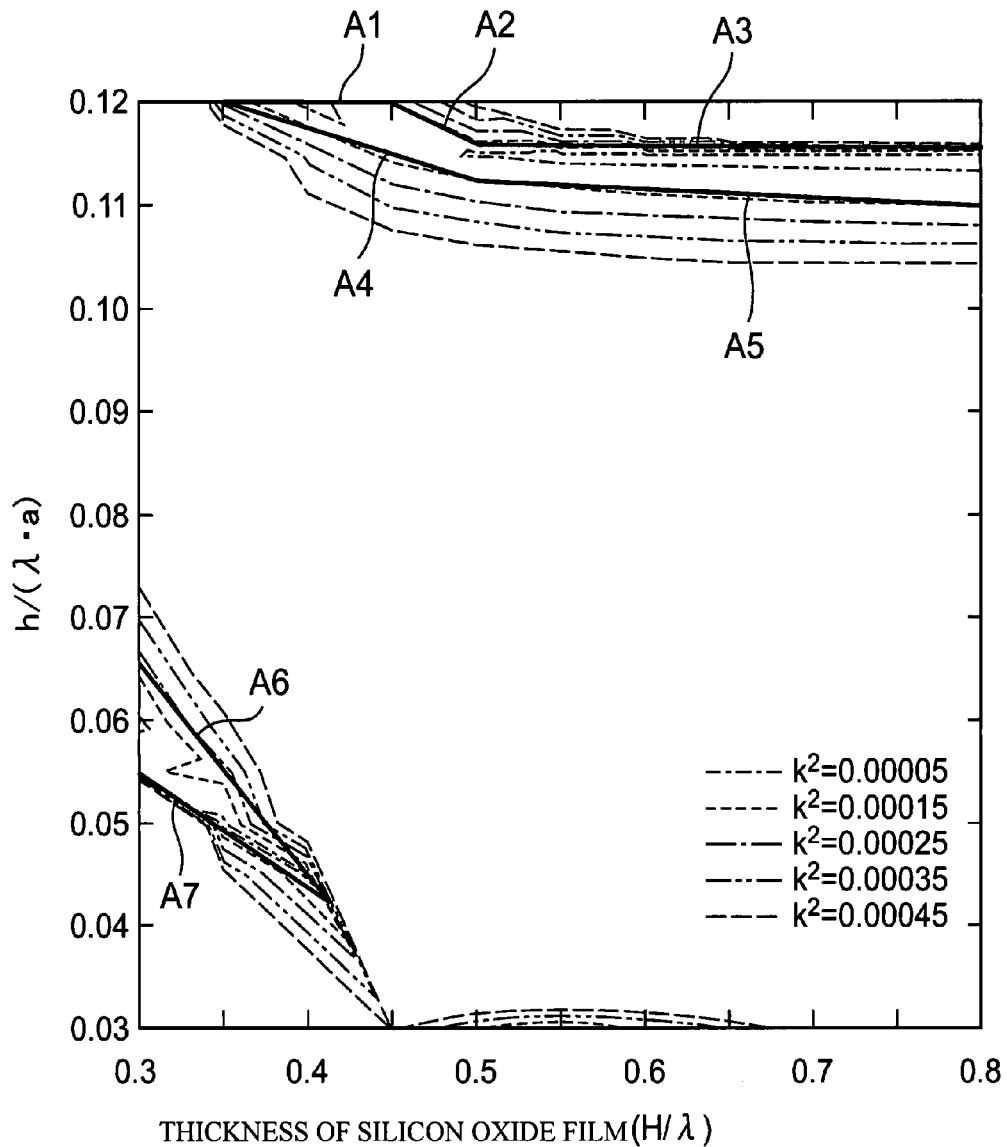
FIG. 20 shows thirteenth simulation results.

As shown in FIG. 20, there are ranges where $k^2$ is equal to or smaller than 0.00015, when 24°≦θ<25°, and
when 0.35≦H/λ<0.45, h/(λ·a)≦0.12,
when 0.45≦H/λ<0.5, h/(λ·a)≦−0.08 H/λ+0.15, and
when 0.5≦H/λ<0.8, h/(λ·a)≦0.116, and additionally,
when 0.35≦H/λ<0.5, h/(λ·a)≧−0.047 H/λ+0.136 and
when 0.5<H/λ≦0.8, h/(λ·a)≧−0.01H/λ+0.118.
Alternatively, when 24°≦θ<25° and
when 0.3≦H/λ≦0.42, h/(λ·a)≦−0.208 H/λ+0.128, and
when 0.3≦H/λ<0.42, h/(λ·a)≧−0.125H/λ+0.0925.

Figure 21:
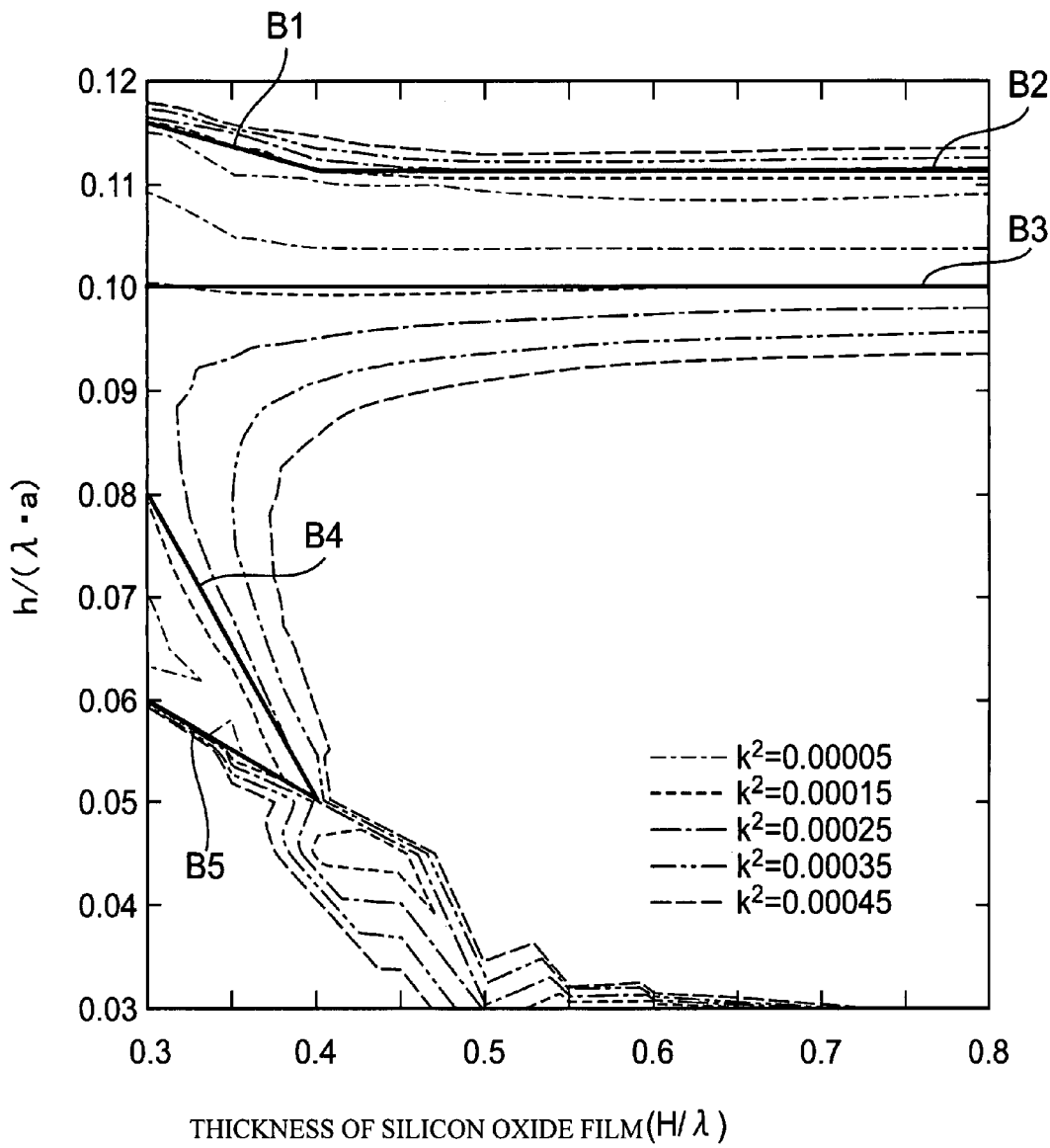
FIG. 21 shows fourteenth simulation results.

As shown in FIG. 21, there are ranges where $k^2$ is equal to or smaller than 0.00015, when 25°≦θ≦26.5° and
when 0.3≦H/λ<0.4, h/(λ·a)≦−0.05H/λ+0.132 and
when 0.4≦H/λ<0.8, h/(λ·a)≦0.112, and additionally,
when 0.3≦H/λ≦0.8, h/(λ·a)≧0.1.
Alternatively, when 25°≦θ<26.5° and
when 0.3≦H/λ≦0.4, h/(λ·a)≦−0.3 H/λ+0.17, and additionally,
when 0.3≦H/λ≦0.4, h/(λ·a)≧−0.1 H/λ+0.09.

As shown in FIG. 22, there are ranges where $k^2$ is equal to or smaller than 0.00015, when 26.5°≦θ<27.5°, and
when 0.3≦H/λ<0.35, h/(λ·a)≦0.11,
when 0.35≦H/λ<0.4, h/(λ·a)≦−0.04 H/λ+0.124, and
when 0.4≦H/λ<0.8, h/(λ·a)≦0.108, and additionally,
when 0.3≦H/λ<0.35, h/(λ·)≧0.08,
when 0.35≦H/λ<0.4, h/(λ·a)≧0.2H/λ+0.01, and
when 0.4≦H/λ<0.8, h/(λ·a)≧0.015H/λ+0.084.
Alternatively, when 26.5°≦θ<27.5° and
when 0.3≦H/λ<0.35, h/(λ·a)≦0.08, and
when 0.35≦H/λ≦0.4, h/(λ·a)≦−0.5 H/λ+0.255, and additionally,
when 0.3≦H/λ≦0.4, h/(λ·a)≧−0.09 H/λ+0.091.
Alternatively, when 26.5°≦θ<27.5° and
when 0.38≦H/λ<0.48, h/(λ·a)≦−0.1 H/λ+0.091, and additionally,
when 0.38≦H/λ<0.48, h/(λ·a)≧−0.1H/λ+0.087.

As shown in FIG. 23, there are ranges where $k^2$ is equal to or smaller than 0.00015, when 27.5°≦θ<28.5° and
when 0.3≦H/λ<0.4, h/(λ·a)≦−0.03 H/λ+0.116, and
when 0.4≦H/λ≦0.8, h/(λ·a)≦0.005 H/λ+0.102, and additionally,
when 0.3≦H/λ<0.38, h/(λ·a)≧0.07,
when 0.38≦H/λ<0.4, h/(λ·a)≧0.5 H/λ−0.12,
when 0.4≦H/<0.55, h/(λ·a)≧0.067 H/λ+0.053, and
when 0.55≦H/λ≦0.8, h/(λ·a)≧0.008H/λ+0.0856.
Alternatively, when 27.5°≦θ<28.5° and
when 0.3≦H/λ<0.38, h/(λ·a)≦0.07,
when 0.38≦H/λ<0.41, h/(λ·a)<−0.5 H/λ+0.26,
when 0.41≦H/λ<0.5, h/(λ·a)≦−0.111 H/λ+0.101, and additionally,
when 0.3≦H/<0.35, h/(λ·a)≧−0.16 H/λ+0.116,
when 0.35≦H/<0.4, h/(λ·a)≧−0.1 H/λ+0.095,
when 0.4≦H/λ<0.47, h/(λ·a)≧−0.171 H/λ+0.119, and
when 0.47≦H/≦0.5, h/(λ·a)≧0.233 H/λ−0.0717.

As shown in FIG. 24, there are ranges where $k^2$ is equal to or smaller than 0.00015, when 28.5°≦θ<29.5° and
when 0.3≦H/λ≦0.8, h/(λ·a)≦0.008H/λ+0.0956, and additionally,
when 0.3≦H/λ<0.4, h/(λ·a)≧−0.14 H/λ+0.114,
when 0.4≦H/λ≦0.42, h/(λ·a)≧0.058, and
when 0.42≦H/λ≦0.8, h/(λ·a)≧−0.342 (H/λ)$^2$+0.465H/λ−0.0648.

Alternatively, when $28.5° \leq \theta < 29.5°$,
when $0.42 \leq H/\lambda < 0.45$, $h/(\lambda \cdot a) \leq 0.0052$,
when $0.45 \leq H/\lambda < 0.53$, $h/(\lambda \cdot a) \leq -0.0875 \ H/\lambda + 0.0914$, and
when $0.53 \leq H/\lambda \leq 0.55$, $h/(\lambda \cdot a) \leq -0.75 \ H/\lambda + 0.443$, and additionally,
when $0.42 \leq H/\lambda < 0.46$, $h/(\lambda \cdot a) \geq -0.175 \ H/\lambda + 0.121$,
when $0.46 \leq H/\lambda < 0.5$, $h/(\lambda \cdot a) \geq 0.04$, and
when $0.5 \leq H/\lambda \leq 0.55$, $h/(\lambda \cdot a) \geq -0.2 \ H/\lambda + 0.14$.
Alternatively, when $28.5° \leq \theta < 29.5°$ and
when $0.55 \leq H/\lambda < 0.58$, $h/(\lambda \cdot a) \leq 0.167 H/\lambda - 0.0617$, and
when $0.58 \leq H/\lambda \leq 0.75$, $h/(\lambda \cdot a) \leq -0.0294 \ H/\lambda + 0.0521$, and additionally,
when $0.55 \leq H/\lambda \leq 0.75$, $h/(\lambda \cdot a) \geq 0.03$.

As shown in FIG. 25, there are ranges where $k^2$ is equal to or smaller than 0.00015, when $29.5° \leq \theta < 30.5°$ and
when $0.32 \leq H/\lambda \leq 0.8$, $h/(\lambda \cdot a) \leq -0.286 \ (H/\lambda)^2 + 0.356 H/\lambda - 0.0027$, and additionally,
when $0.32 \leq H/\lambda < 0.4$, $h/(\lambda \cdot a) \geq 3.33 \ (H/\lambda)^2 - 2.7 \ H/\lambda + 0.605$,
when $0.4 \leq H/\lambda < 0.44$, $h/(\lambda \cdot a) \geq 0.058$, and
when $0.44 \leq H/\lambda \leq 0.8$, $h/(\lambda \cdot a) \geq -0.75 \ (H/\lambda)^2 + 1.005 \ H/\lambda - 0.239$.

Alternatively, when $29.5° \leq \theta < 30.5°$,
when $0.43 \leq H/\lambda < 0.46$, $h/(\lambda \cdot a) \leq 0.052$,
when $0.46 \leq H/\lambda < 0.57$, $h/(\lambda \cdot a) \leq -0.0727 \ H/\lambda + 0.0855$,
when $0.57 \leq H/\lambda < 0.6$, $h/(\lambda \cdot a) \leq -0.333 \ H/\lambda + 0.234$, and
when $0.6 \leq H/\lambda \leq 0.75$, $h/(\lambda \cdot a) \leq -0.0267 \ H/\lambda + 0.05$, and additionally,
when $0.43 \leq H/\lambda < 0.45$, $h/(\lambda \cdot a) \geq -0.4 \ H/\lambda + 0.224$,
when $0.45 \leq H/\lambda < 0.55$, $h/(\lambda \cdot a) \geq -0.14 \ H/\lambda + 0.107$, and
when $0.55 \leq H/\lambda \leq 0.75$, $h/(\lambda \cdot a) \geq 0.03$.

As shown in FIG. 26, there are ranges where $k^2$ is equal to or smaller than 0.00015, when $30.5° \leq \theta < 31.5°$ and
when $0.36 \leq H/\lambda \leq 0.8$, $h/(\lambda \cdot a) \leq -0.131 \ (H/\lambda)^2 + 0.188 H/\lambda + 0.00293$, and additionally,
when $0.36 \leq H/\lambda < 0.43$, $h/(\lambda \cdot a) \geq 4.64 \ (H/\lambda)^2 - 3.95 \ H/\lambda + 0.902$,
when $0.43 \leq H/\lambda < 0.465$, $h/(\lambda \cdot a) \geq 0.06$, and
when $0.465 \leq H/\lambda \leq 0.8$, $h/(\lambda \cdot a) \geq -0.283 \ (H/\lambda)^2 + 0.424 H/\lambda - 0.0758$.

when $30.5° \leq \theta < 31.5°$ and
when $0.43 \leq H/\lambda < 0.465$, $h/(\lambda \cdot a) \leq 0.06$,
when $0.465 \leq H/\lambda < 0.65$, $h/(\lambda \cdot a) \leq -0.108 \ H/\lambda + 0.105$, and
when $0.65 \leq H/\lambda \leq 0.8$, $h/(\lambda \cdot a) \leq -0.0333 \ H/\lambda + 0.0567$, and additionally,
when $0.43 \leq H/\lambda < 0.45$, $h/(\lambda \cdot a) \geq -0.65 \ H/\lambda + 0.34$,
when $0.45 \leq H/\lambda < 0.57$, $h/(\lambda \cdot a) \geq -0.142 \ H/\lambda + 0.111$, and
when $0.57 \leq H/\lambda \leq 0.8$, $h/(\lambda \cdot a) \geq 0.03$.

Figure 27:
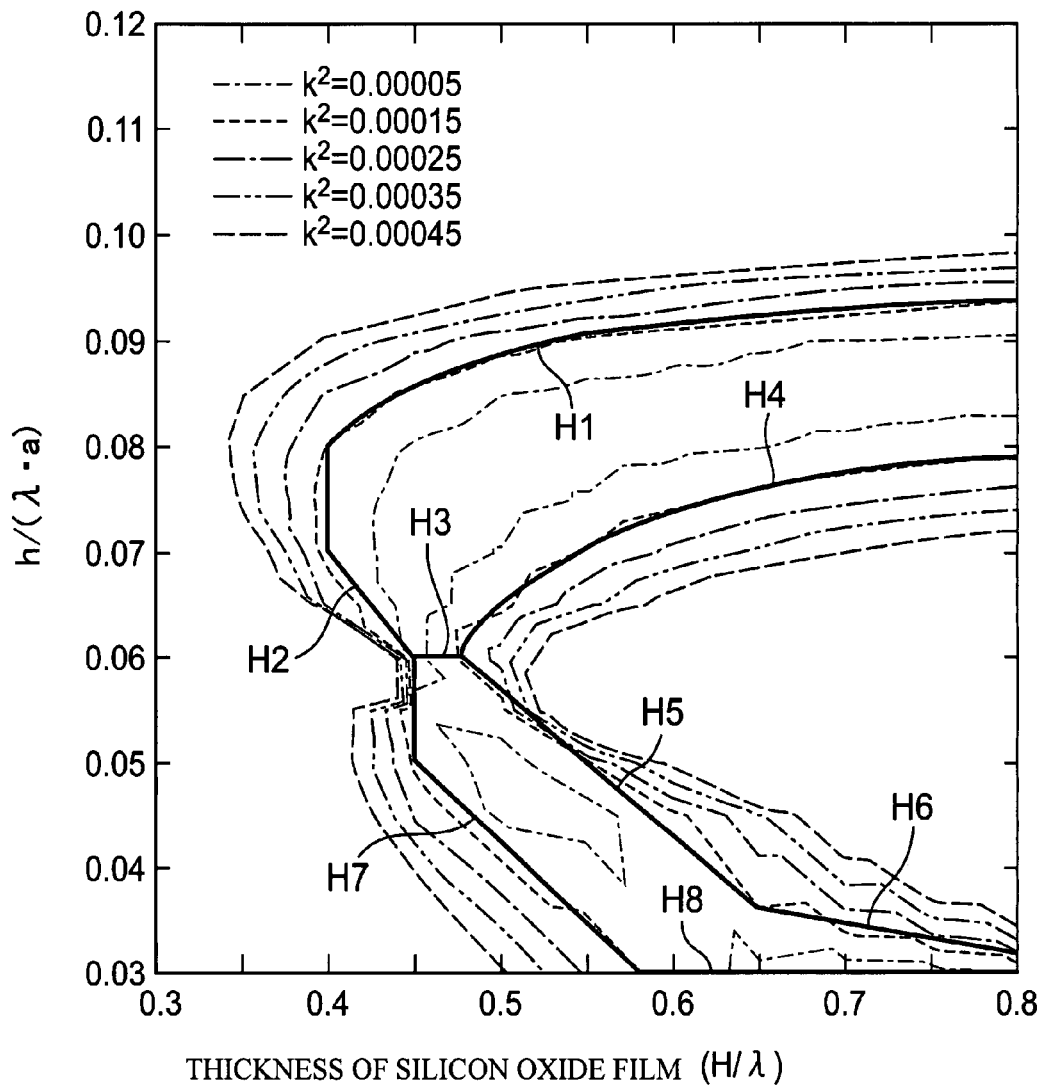
FIG. 27 shows twentieth simulation results.

As shown in FIG. 27, there are ranges where $k^2$ is equal to or smaller than 0.00015, when $31.5° \leq \theta < 32.5°$ and
when $0.39 \leq H/\lambda \leq 0.8$, $h/(\lambda \cdot a) \leq -0.153 \ (H/\lambda)^2 + 0.219 H/\lambda + 0.0169$, and additionally,
when $0.39 \leq H/\lambda < 0.45$, $h/(\lambda \cdot a) \geq -0.2 \ H/\lambda + 0.15$,
when $0.45 \leq H/\lambda < 0.48$, $h/(\lambda \cdot a) \geq 0.6$, and
when $0.48 \leq H/\lambda \leq 0.8$, $h/(\lambda \cdot a) \geq -0.346 \ (H/\lambda)^2 + 0.5 \ H/\lambda - 0.1$.

Alternatively, when $31.5° \leq \theta < 32.5°$ and
when $0.45 \leq H/\lambda < 0.48$, $h/(\lambda \cdot a) \leq 0.06$,
when $0.48 \leq H/\lambda < 0.65$, $h/(\lambda \cdot a) \leq -0.135 \ H/\lambda + 0.125$, and
when $0.65 \leq H/\lambda \leq 0.8$, $h/(\lambda \cdot a) \leq -0.0333 \ H/\lambda + 0.0587$, and additionally,
when $0.45 \leq H/\lambda < 0.58$, $h/(\lambda \cdot a) \geq -0.154 \ H/\lambda + 0.119$, and
when $0.58 \leq H/\lambda \leq 0.8$, $h/(\lambda \cdot a) \geq 0.03$.

Figure 28:
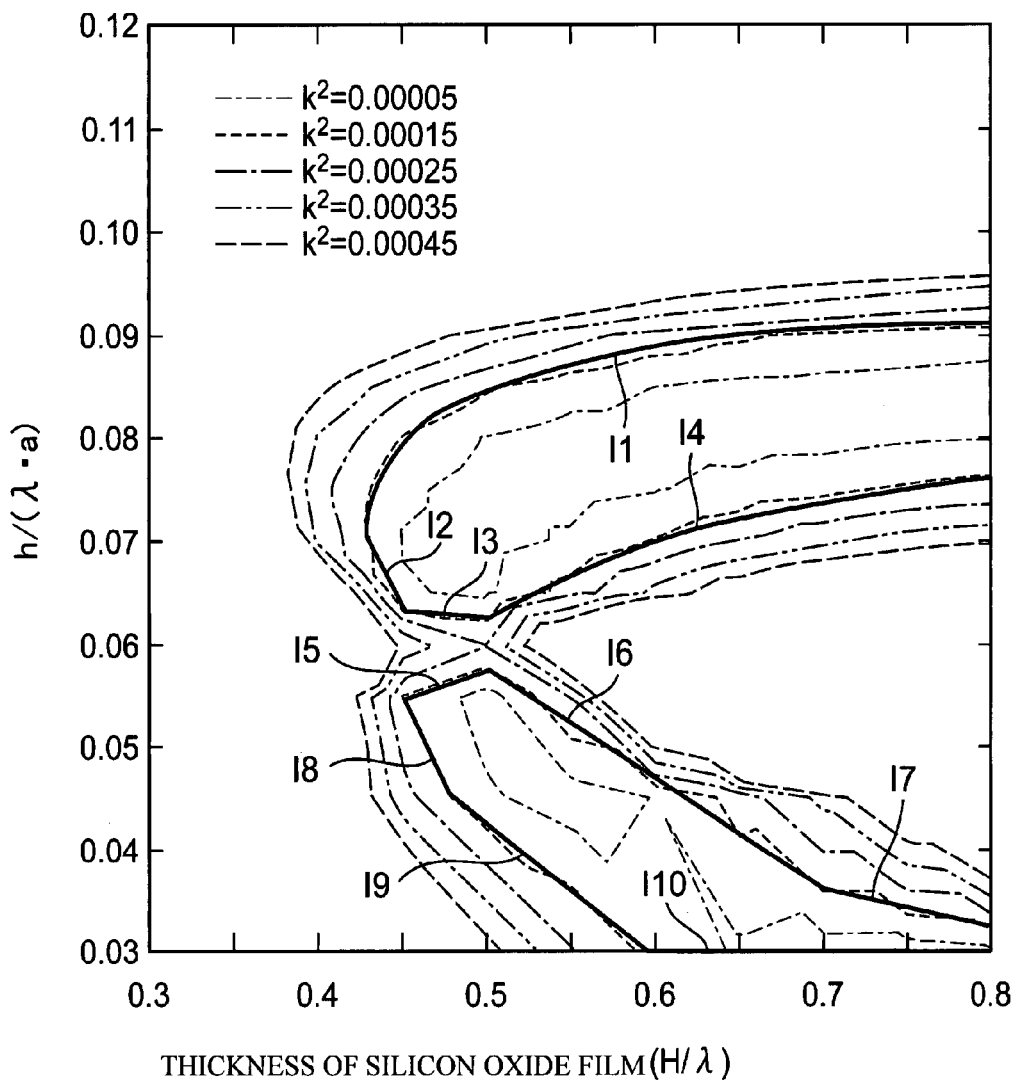
FIG. 28 shows twenty-first simulation results.

As shown in FIG. 28, there are ranges where $k^2$ is equal to or smaller than 0.00015, when $32.5° \leq \theta < 33.5°$ and
when $0.43 \leq H/\lambda \leq 0.8$, $h/(\lambda \cdot a) \leq -1.266 \ (H/\lambda)^2 + 1.614 H/\lambda - 0.39$, and additionally,
when $0.43 \leq H/\lambda < 0.45$, $h/(\lambda \cdot) \geq -0.4 \ H/\lambda + 0.242$,
when $0.45 \leq H/\lambda < 0.5$, $h/(\lambda \cdot a) \geq 0.062$, and
when $0.5 \leq H/\lambda \leq 0.8$, $h/(\lambda \cdot a) \geq -0.167 \ (H/\lambda)^2 + 0.263 \ H/\lambda - 0.028$.

Alternatively, when $32.5° \leq \theta < 33.5°$ and
when $0.45 \leq H/\lambda < 0.5$, $h/(\lambda \cdot a) \leq 0.06 \ H/\lambda + 0.028$,
when $0.5 \leq H/\lambda < 0.7$, $h/(\lambda \cdot a) \leq -0.11 \ H/\lambda + 0.113$, and
when $0.7 \leq H/\lambda \leq 0.8$, $h/(\lambda \cdot a) \leq -0.03 \ H/\lambda + 0.057$, and additionally,
when $0.45 \leq H/\lambda < 0.48$, $h/(\lambda \cdot a) \geq -0.3 \ H/\lambda + 0.19$,
when $0.48 \leq H/\lambda < 0.59$, $h/(\lambda \cdot a) \geq -0.145 \ H/\lambda + 0.116$, and
when $0.59 \leq H/\lambda \leq 0.8$, $h/(\lambda \cdot a) \geq 0.03$.

Figure 29:
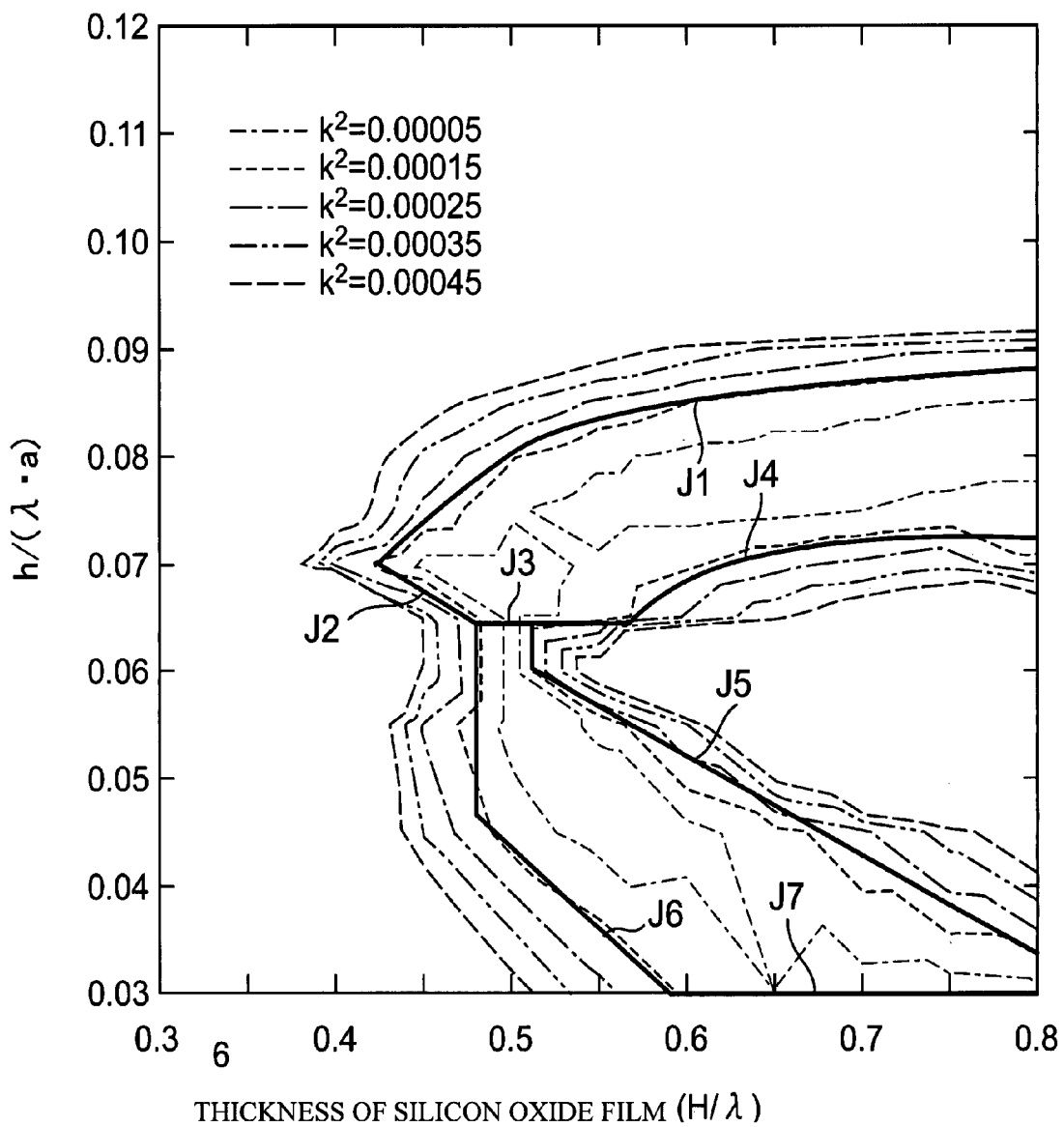
FIG. 29 shows twenty-second simulation results.

As shown in FIG. 29, there are ranges where $k^2$ is equal to or smaller than 0.00015, when $33.5° \leq \theta < 35°$ and
when $0.425 \leq H/\lambda \leq 0.8$, $h/(\lambda \cdot a) \leq -0.284 \ (H/\lambda)^2 + 0.396 H/\lambda - 0.0471$, and additionally,
when $0.425 \leq H/ \leq 0.48$, $h/(\lambda \cdot a) \geq -0.109 \ H/\lambda + 0.116$,
when $0.48 \leq H/ \leq 0.57$, $h/(\lambda \cdot a) \geq 0.064$, and
when $0.57 \leq H/ \leq 0.8$, $h/(\lambda \cdot a) \geq -0.6594 \ (H/\lambda)^2 + 0.9382 H/\lambda - 0.257$.

Alternatively, when $33.5° < \theta < 35°$ and
when $0.48 \leq H/\lambda \leq 0.52$, $h/(\lambda \cdot a) \leq 0.064$, and
when $0.52 \leq H/\lambda \leq 0.8$, $h/(\lambda \cdot a) \leq -0.0929 \ H/\lambda + 0.108$, and additionally,
when $0.48 \leq H/\lambda \leq 0.59$, $h/(\lambda \cdot a) \geq -0.155 \ H/\lambda + 0.121$, and
when $0.59 \leq H/\lambda \leq 0.8$, $h/(\lambda \cdot a) \geq 0.03$.

Figure 30:
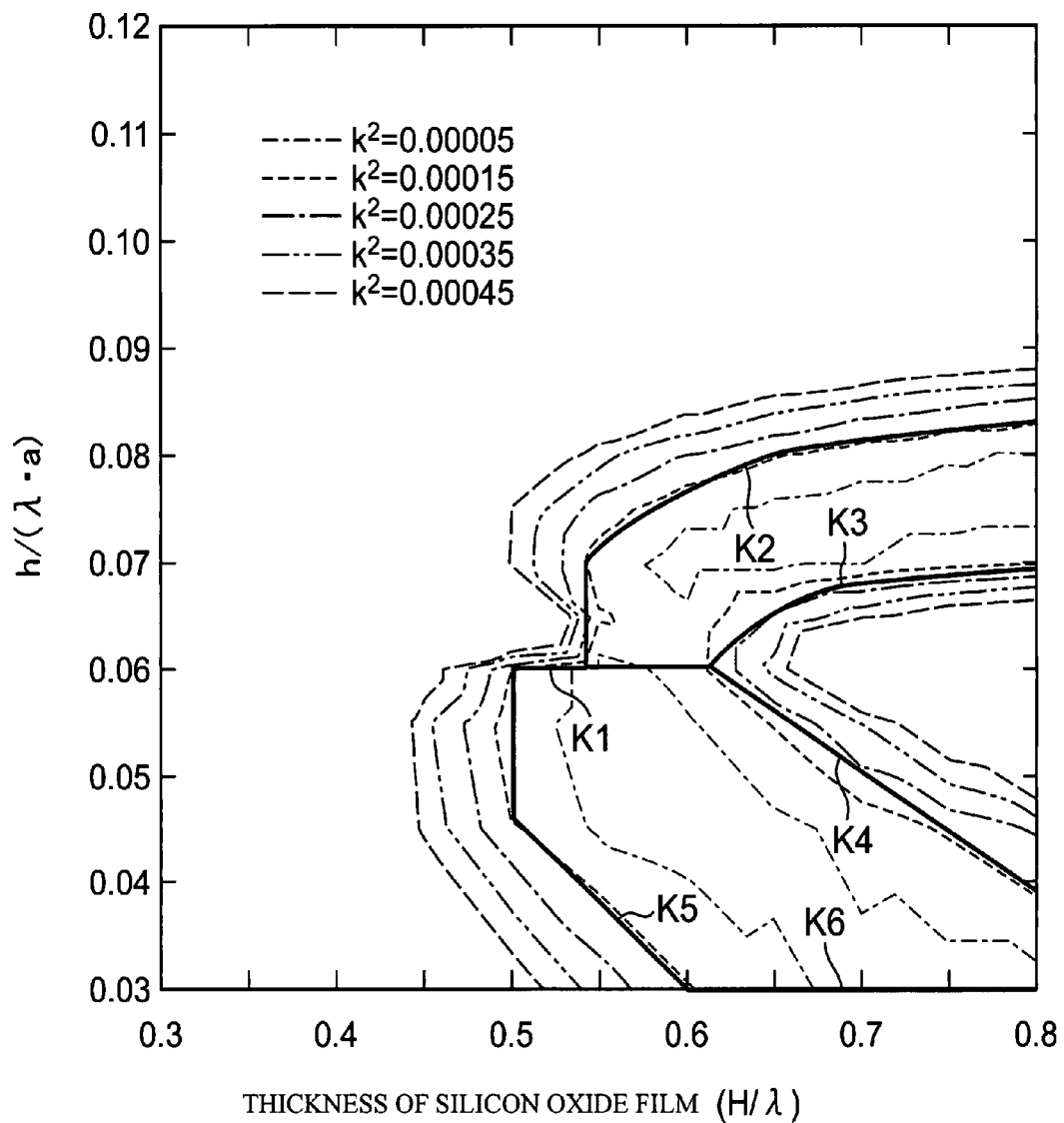
FIG. 30 shows twenty-third simulation results.

As shown in FIG. 30, there are ranges where $k^2$ is equal to or smaller than 0.00015, when $35° \leq \theta < 37.5°$ and
when $0.54 \leq H/\lambda \leq 0.8$, $h/(\lambda \cdot a) \leq -0.273 \ (H/\lambda)^2 + 0.415 H/\lambda - 0.0748$, and additionally,
when $0.54 \leq H/\lambda < 0.62$, $h/(\lambda \cdot a) \geq 0.06$, and
when $0.62 \leq H/\lambda \leq 0.8$, $h/(\lambda \cdot a) \geq -0.5 (H/\lambda)^2 + 0.76 H/\lambda - 0.219$.

Alternatively, when $35° \leq \theta < 37.5°$ and
when $0.5 \leq H/\lambda < 0.62$, $h/(\lambda \cdot a) \leq 0.06$, and
when $0.62 \leq H/\lambda \leq 0.8$, $h/(\lambda \cdot a) \leq -0.117 \ H/\lambda + 0.132$, and additionally,
when $0.5 \leq H/\lambda < 0.6$, $h/(\lambda \cdot a) \geq -0.16 \ H/\lambda + 0.126$, and
when $0.6 \leq H/\lambda \leq 0.8$, $h/(\lambda \cdot a) \geq 0.03$.

Figure 31:
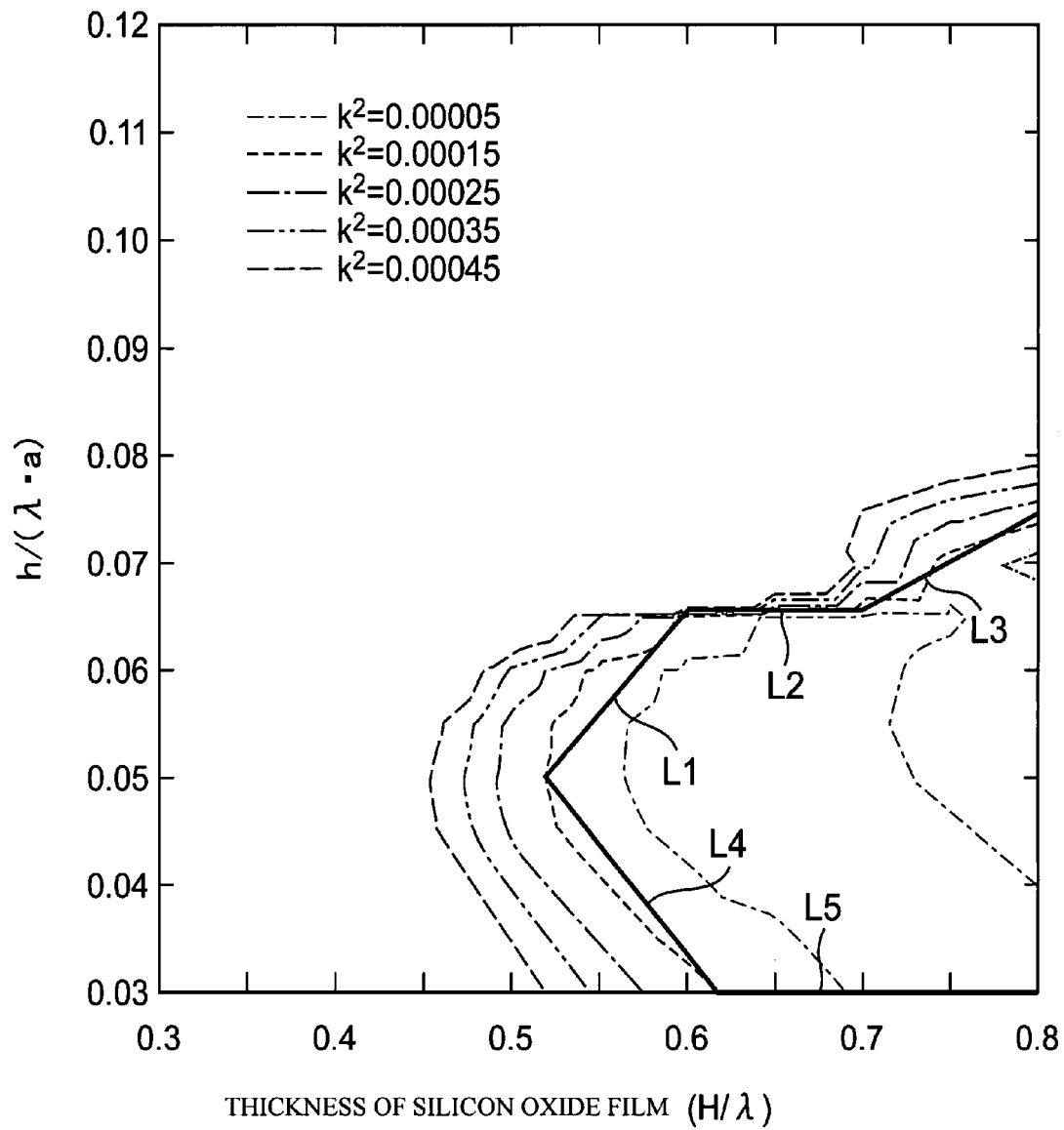
FIG. 31 shows twenty-fourth simulation results.

As shown in FIG. 31, there are ranges where $k^2$ is equal to or smaller than 0.00015, when $37.5° < \theta < 39°$ and
when $0.52 \leq H/\lambda < 0.6$, $h/(\lambda \cdot a) \leq 0.2 \ H/\lambda - 0.054$,
when $0.6 \leq H/\lambda < 0.7$, $h/(\lambda \cdot a) \leq 0.066$,
when $0.7 \leq H/\lambda \leq 0.8$, $h/(\lambda \cdot a) \leq 0.09 \ H/\lambda + 0.003$, and additionally,
when $0.52 \leq H/\lambda < 0.62$, $h/(\lambda \cdot a) \geq -0.2 \ H/\lambda + 0.154$, and
when $0.62 \leq H/\lambda < 0.8$, $h/(\lambda \cdot a) \geq 0.03$.

FIG. 32 through FIG. 42 are graphs showing the electromechanical coupling coefficient $k^2$ of the Stoneley wave with respect to $SiO_2$ film thickness ($H/\lambda$) and Y-cut angle $\theta$. FIG. 32 through FIG. 42 respectively show the results where electrode film thicknesses h are respectively $0.03\lambda/a$, $0.045\lambda/a$, $0.06\lambda/a$, $0.07\lambda/a$, $0.075\lambda/a$, $0.08\lambda/a$, $0.085\lambda/a$, $0.09\lambda/a$, $0.095\lambda/a$, $0.10\lambda/a$, and $0.105\lambda/a$. As described in FIG. 8 through FIG. 19, it is assumed that each calculation point represents a range between middle points with both adjacent calculation points. There are listed below the graphs shown in FIG. 32 through FIG. 42, approximate expressions in the curve of the first or second order when $k^2$ is equal to 0.00015. From the curves shown in each graph, ranges where $k^2$ is equal to or smaller than 0.00015 are obtained. It is therefore possible to cause $k^2$ of the Stoneley wave to be equal to or smaller than 0.00015, by setting the parameters of the elastic boundary wave device to have any one of the ranges shown in FIG. 32 through FIG. 42.

Figure 32:
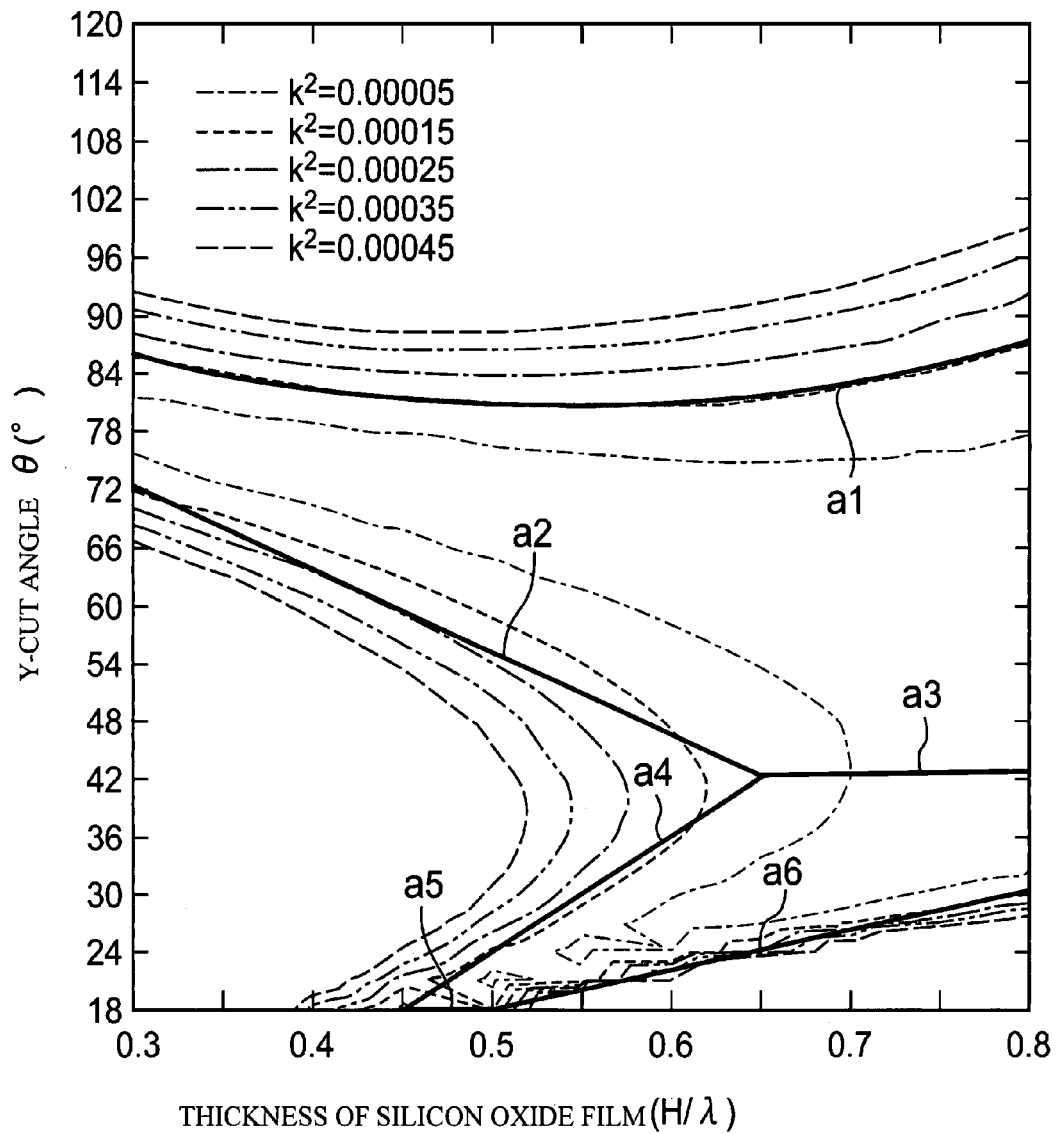
FIG. 32 shows twenty-fifth simulation results.

As shown in FIG. 32, there are ranges where $k^2$ is equal to or smaller than 0.00015, when $0.03\lambda/a \leq h < 0.0375\lambda/a$ and when $0.3 \leq H/\lambda \leq 0.8$, $\theta \leq 75 (H/\lambda)^2 - 82.5 H/\lambda + 103.687$, and additionally,
  when $0.3 \leq H/\lambda < 0.65$, $\theta \geq -85.7 H/\lambda + 97.7$, and
  when $0.65 \leq H/\lambda \leq 0.8$, $\theta \geq 42$.
  Alternatively,
  when $0.03\lambda/a \leq h < 0.0375\lambda/a$ and
  when $0.45 \leq H/\lambda < 0.65$, $\theta \leq 120 H/\lambda - 36$, and
  when $0.65 \leq H/\lambda \leq 0.8$, $\theta \leq 42$, and additionally,
  when $0.45 \leq H/\lambda < 0.5$, $\theta \leq 18$, and
  when $0.5 \leq H/\lambda \leq 0.8$, $\theta \geq 40H/\lambda - 2$.

Figure 33:
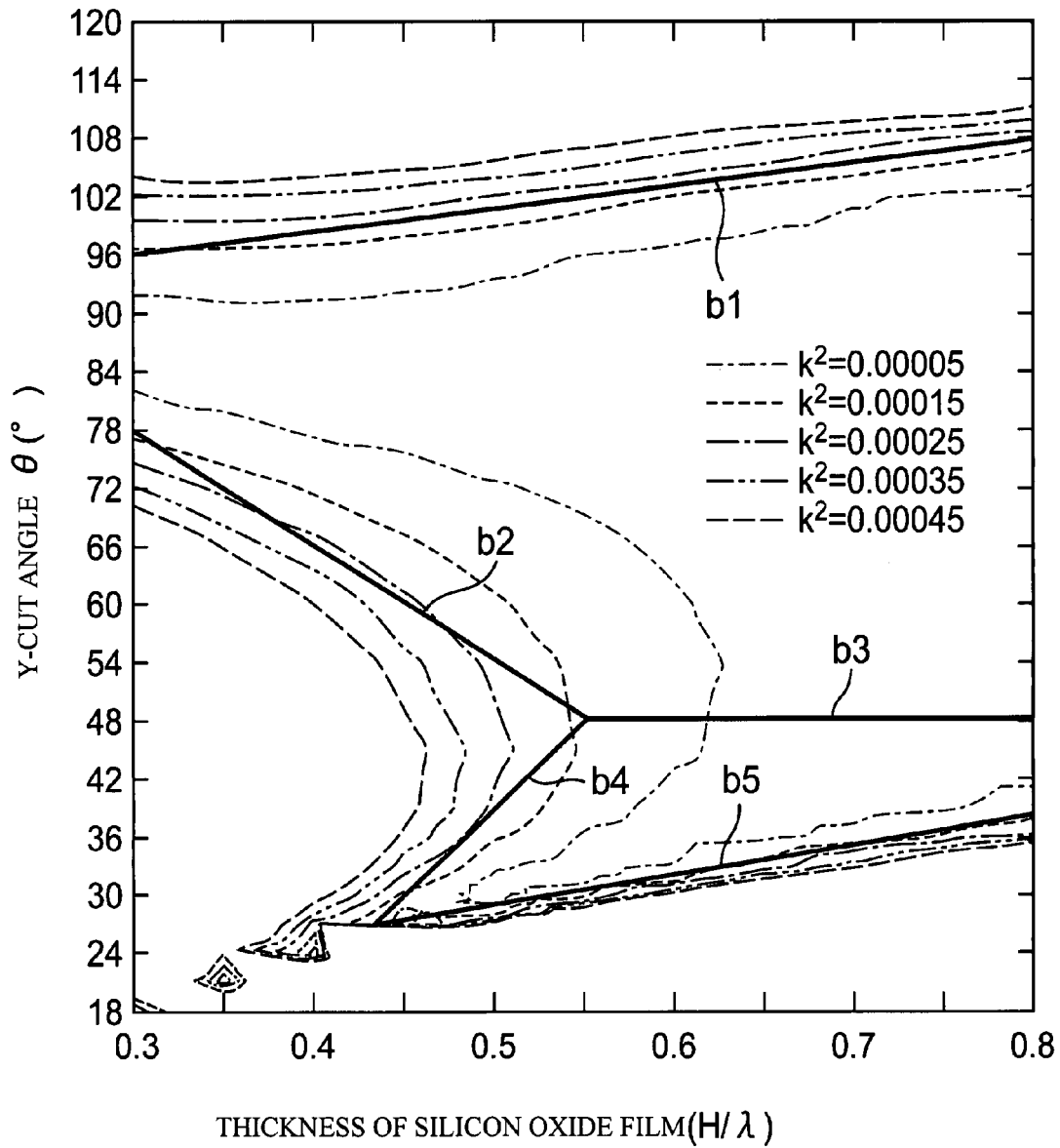
FIG. 33 shows twenty-sixth simulation results.

As shown in FIG. 33, there are ranges where $k^2$ is equal to or smaller than 0.00015, when $0.0375\lambda/a \leq h < 0.0525\lambda/a$ and
  when $0.3 \leq H/\lambda \leq 0.8$, $\theta \leq 24 H/\lambda + 88.8$, and additionally,
  when $0.3 \leq H/\lambda < 0.55$, $\theta \geq -120 H/\lambda + 114$, and
  when $0.55 \leq H/\lambda \leq 0.8$, $\theta \geq 48$.
  Alternatively,
  when $0.0375\lambda/a \leq h < 0.0525\lambda/a$ and
  when $0.43 \leq H/\lambda < 0.55$, $\theta \leq 180 H/\lambda - 51$, and
  when $0.55 \leq H/\leq 0.8$, $\theta \leq 48$, and additionally,
  when $0.43 \leq H/\lambda \leq 0.8$, $\theta \geq 34.3 H/\lambda + 11.6$.

Figure 34:
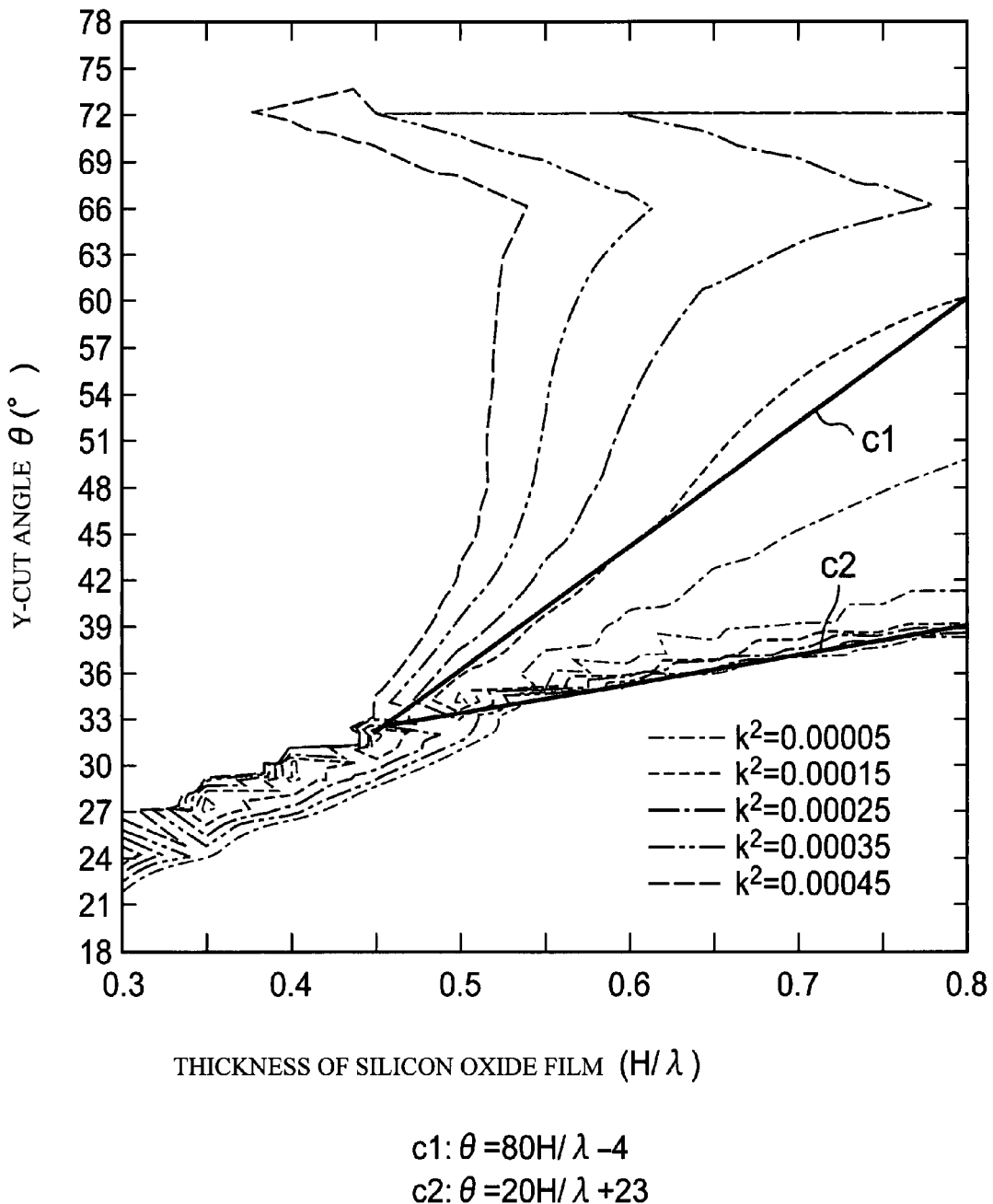
FIG. 34 shows twenty-seventh simulation results.

As shown in FIG. 34, there are ranges where $k^2$ is equal to or smaller than 0.00015, when $0.0525\lambda/a \leq h < 0.065\lambda/a$ and
  when $0.45 \leq H/\lambda \leq 0.8$, $\theta \leq 80 H/\lambda - 4$, and additionally,
  when $0.45 \leq H/\lambda \leq 0.8$, $\theta \geq 20H/\lambda + 23$.

Figure 35:
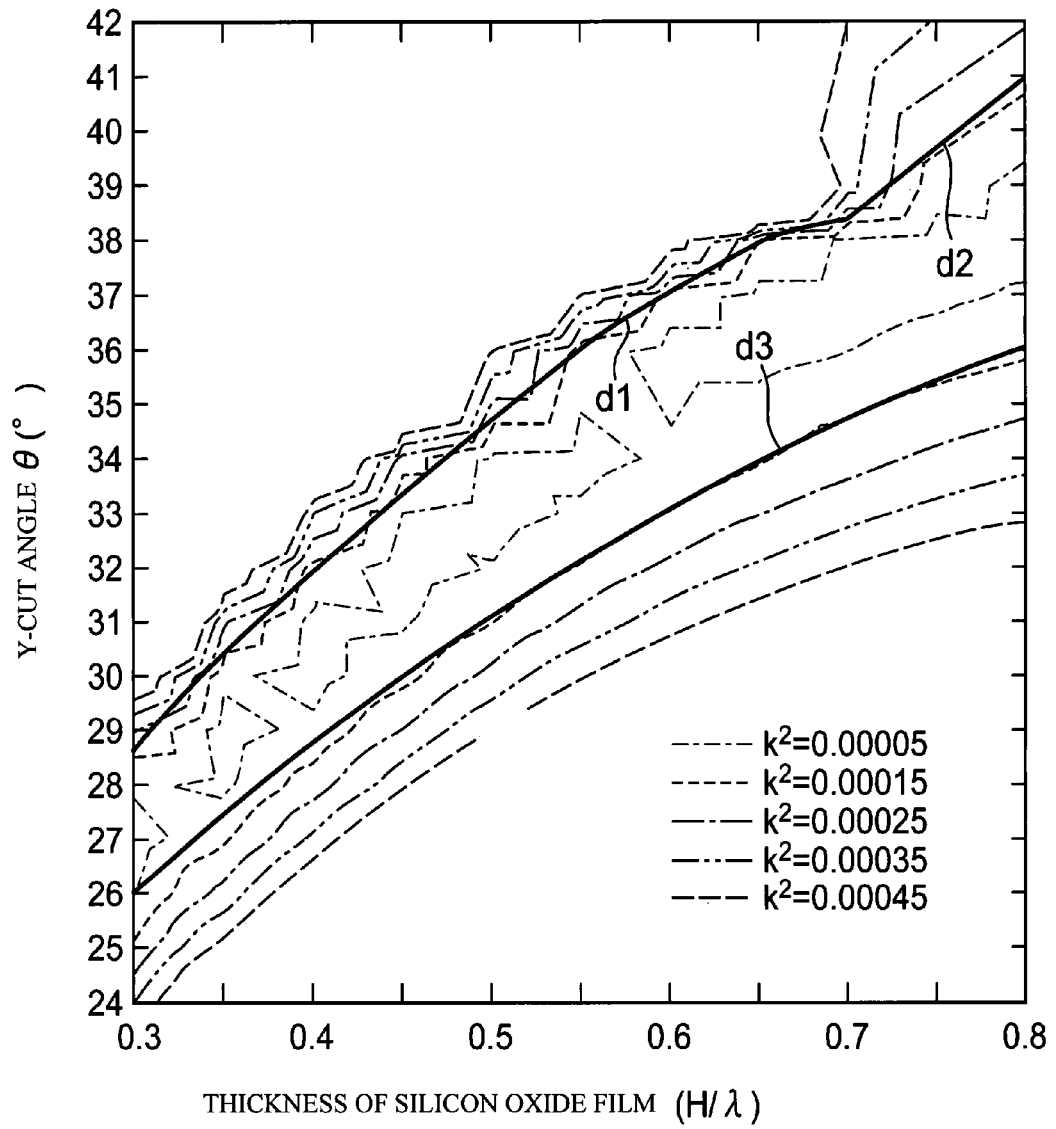
FIG. 35 shows twenty-eighth simulation results.

As shown in FIG. 35, there are ranges where $k^2$ is equal to or smaller than 0.00015, when $0.065\lambda/a \leq h < 0.0725\lambda/a$ and
  when $0.3 \leq H/\lambda < 0.7$, $\theta < -26.7 (H/\lambda)^2 + 52 H/\lambda + 15.5$, and
  when $0.7 \leq H/\lambda \leq 0.8$, $\theta \leq 25 H/\lambda + 21$, and additionally,
  when $0.3 \leq H/\lambda \leq 0.8$, $\theta \geq -16.7 (H/\lambda)^2 + 38.3 H/\lambda + 16$.

Figure 36:
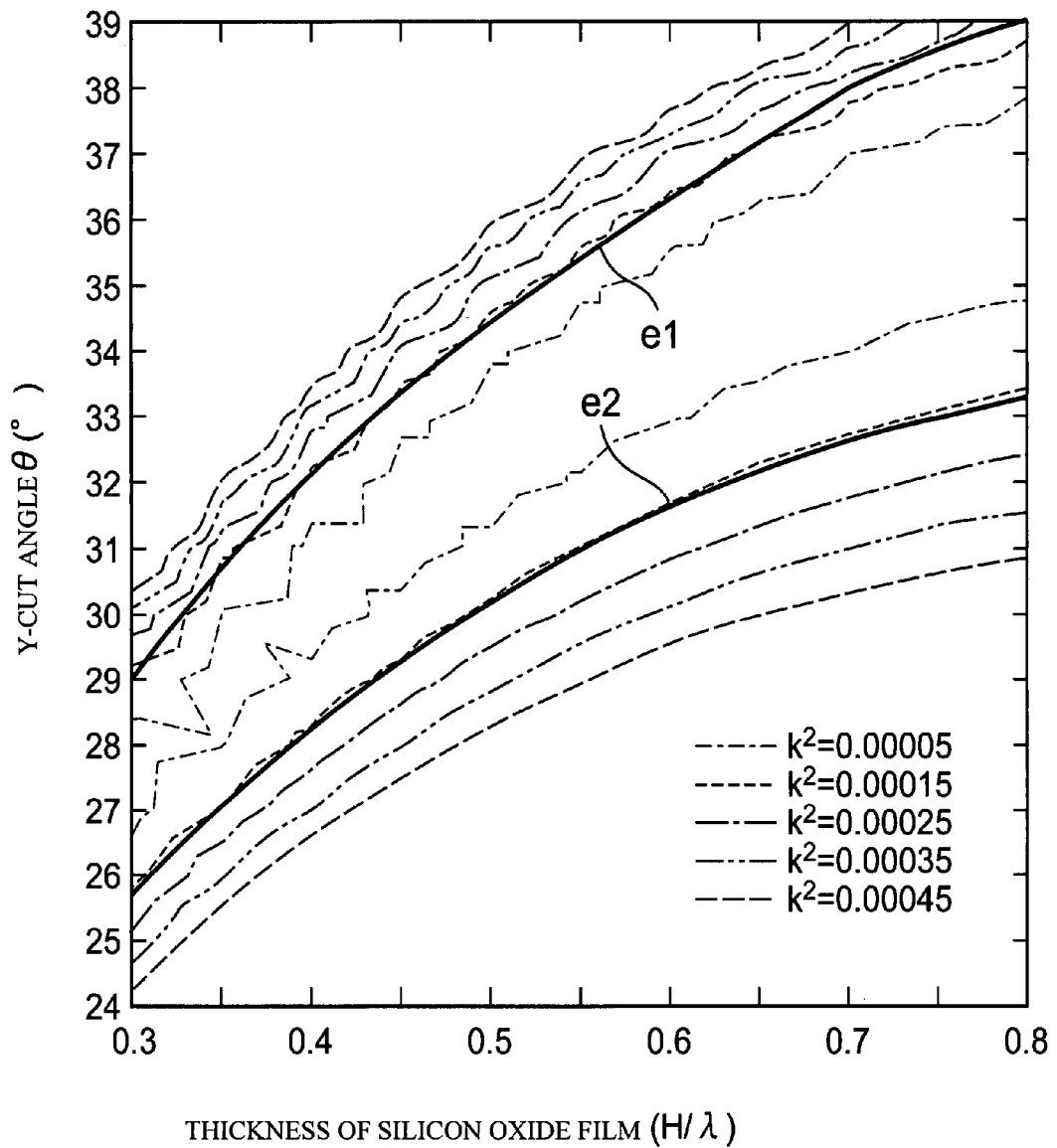
FIG. 36 shows twenty-ninth simulation results.

As shown in FIG. 36, there are ranges where $k^2$ is equal to or smaller than 0.00015, when $0.0725\lambda/a \leq h < 0.0775\lambda/a$ and
  when $0.3 \leq H/\lambda \leq 0.8$, $\theta < -25 (H/\lambda)^2 + 47.5 H/\lambda + 17$, and additionally,
  when $0.3 \leq H/\lambda \leq 0.8$, $\theta \geq -25 (H/\lambda)^2 + 42.5 H/\lambda + 15.2$.

Figure 37:
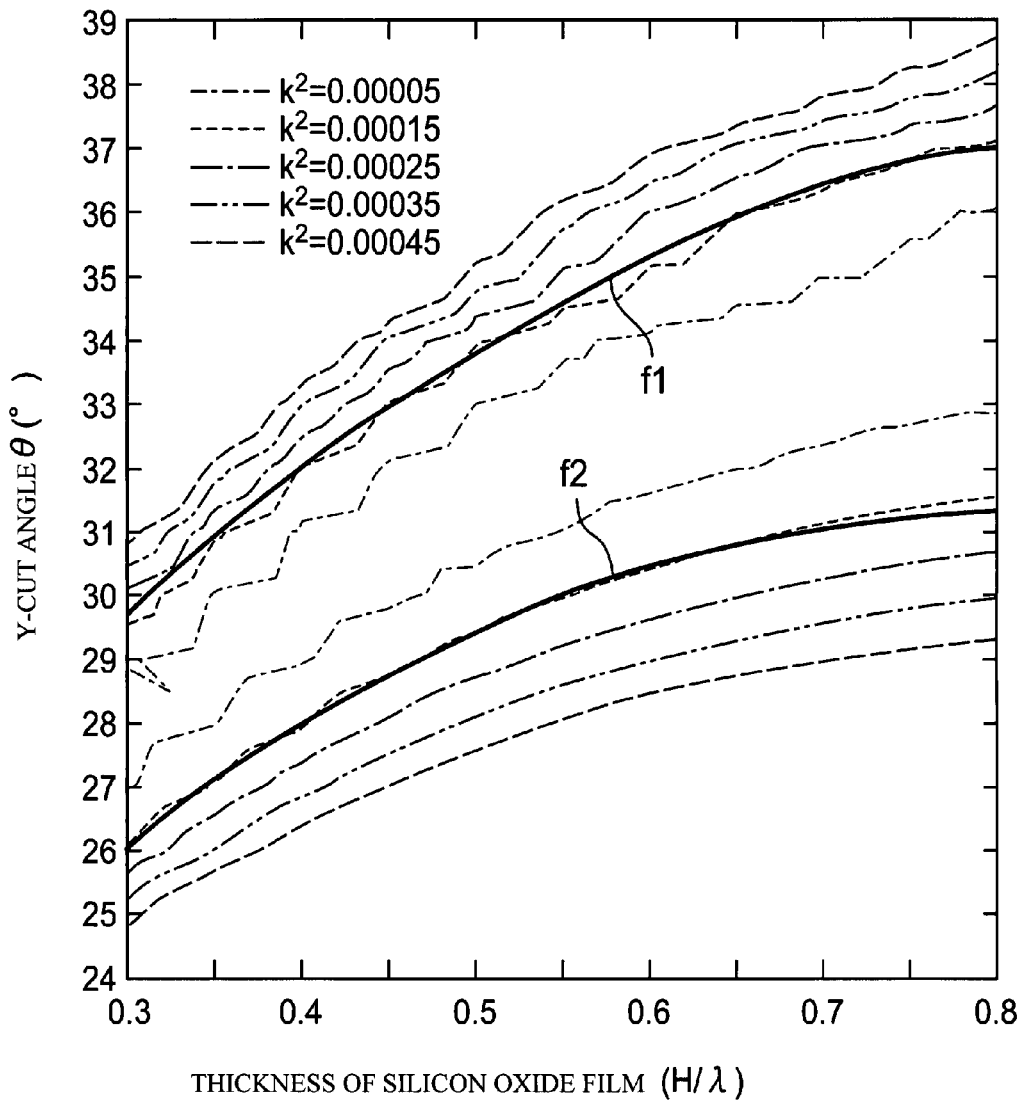
FIG. 37 shows thirtieth simulation results.

As shown in FIG. 37, there are ranges where $k^2$ is equal to or smaller than 0.00015, when $0.0775\lambda/a \leq h < 0.0825\lambda/a$ and
  when $0.3 \leq H/\lambda \leq 0.8$, $\theta \leq -21.4 (H/\lambda)^2 + 38.2 H/\lambda + 20.1$, and additionally,
  when $0.3 \leq H/\lambda \leq 0.8$, $\theta \geq -23.3 (H/\lambda)^2 + 35.8H/\lambda + 17.4$.

Figure 38:
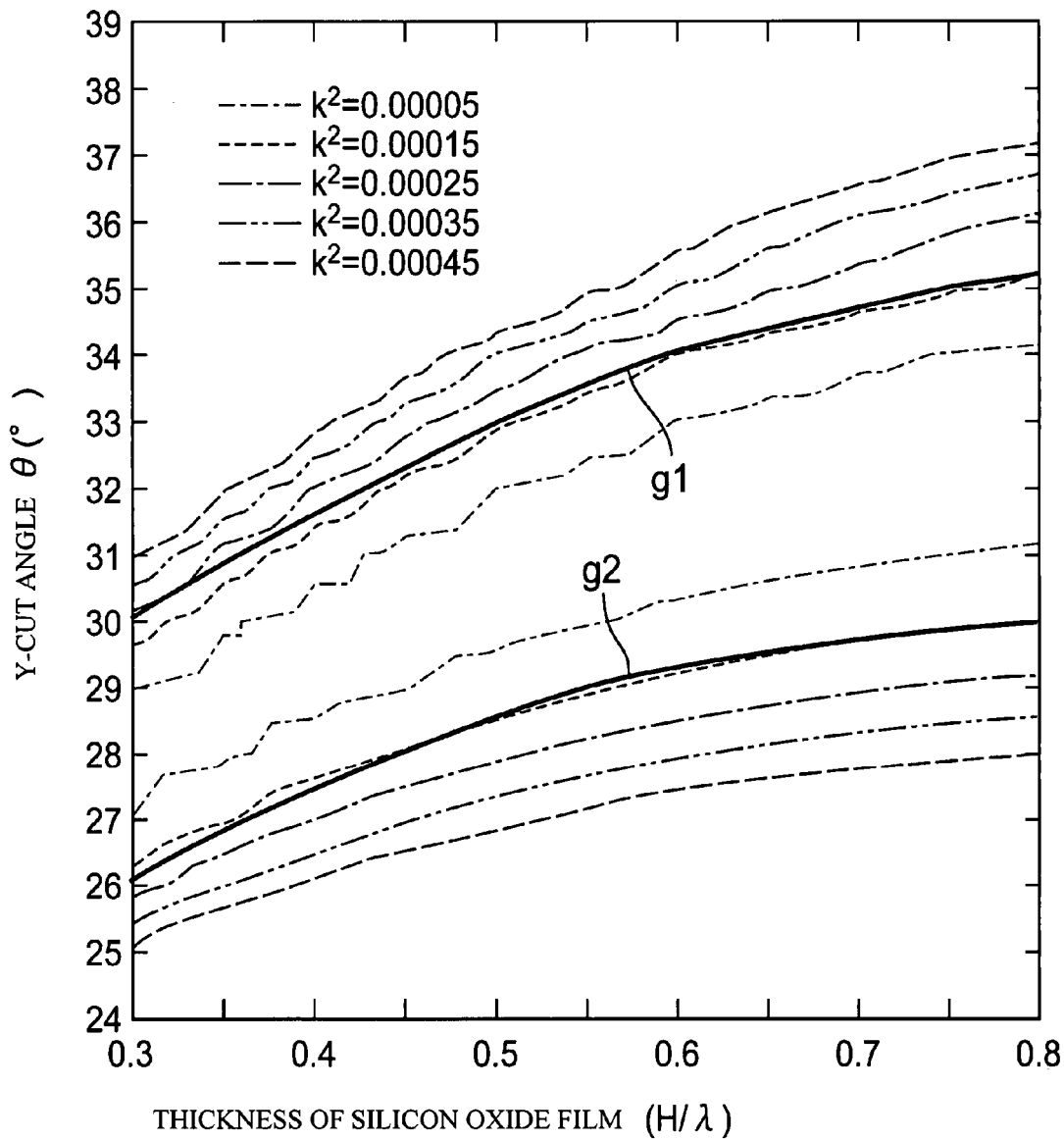
FIG. 38 shows thirty-first simulation results.

As shown in FIG. 38, there are ranges where $k^2$ is equal to or smaller than 0.00015, when $0.0825\lambda/a \leq h < 0.0875\lambda/a$ and
  when $0.3 \leq H/\lambda \leq 0.8$, $\theta \leq -13.3(H/\lambda)^2 + 24.7H/\lambda + 24$, and additionally,
  when $0.3 \leq H/\lambda \leq 0.8$, $\theta \geq -16 (H/\lambda)^2 + 25.6 H/\lambda + 19.8$.

Figure 39:
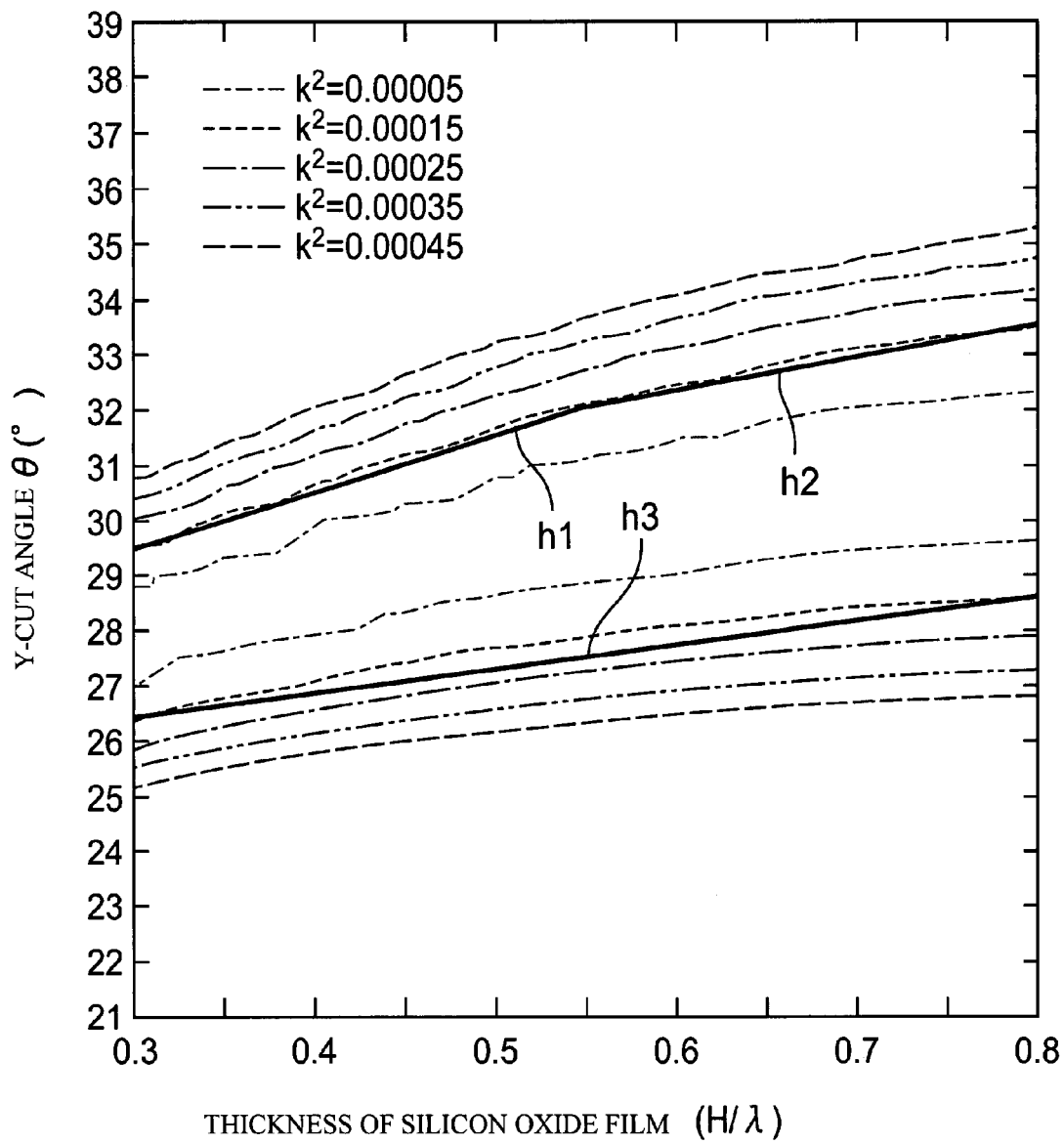
FIG. 39 shows thirty-second simulation results.

As shown in FIG. 39, there are ranges where $k^2$ is equal to or smaller than 0.00015, when $0.0875\lambda/a \leq h < 0.0925\lambda/a$, and
  when $0.3 \leq H/\lambda < 0.55$, $\theta \leq 10 H/\lambda + 26.5$, and
  when $0.55 \leq H/\lambda \leq 0.8$, $\theta \leq 6 H/\lambda + 28.7$, and additionally,
  when $0.3 \leq H/\lambda \leq 0.8$, $\theta \geq 4 H/\lambda + 25.3$.

Figure 40:
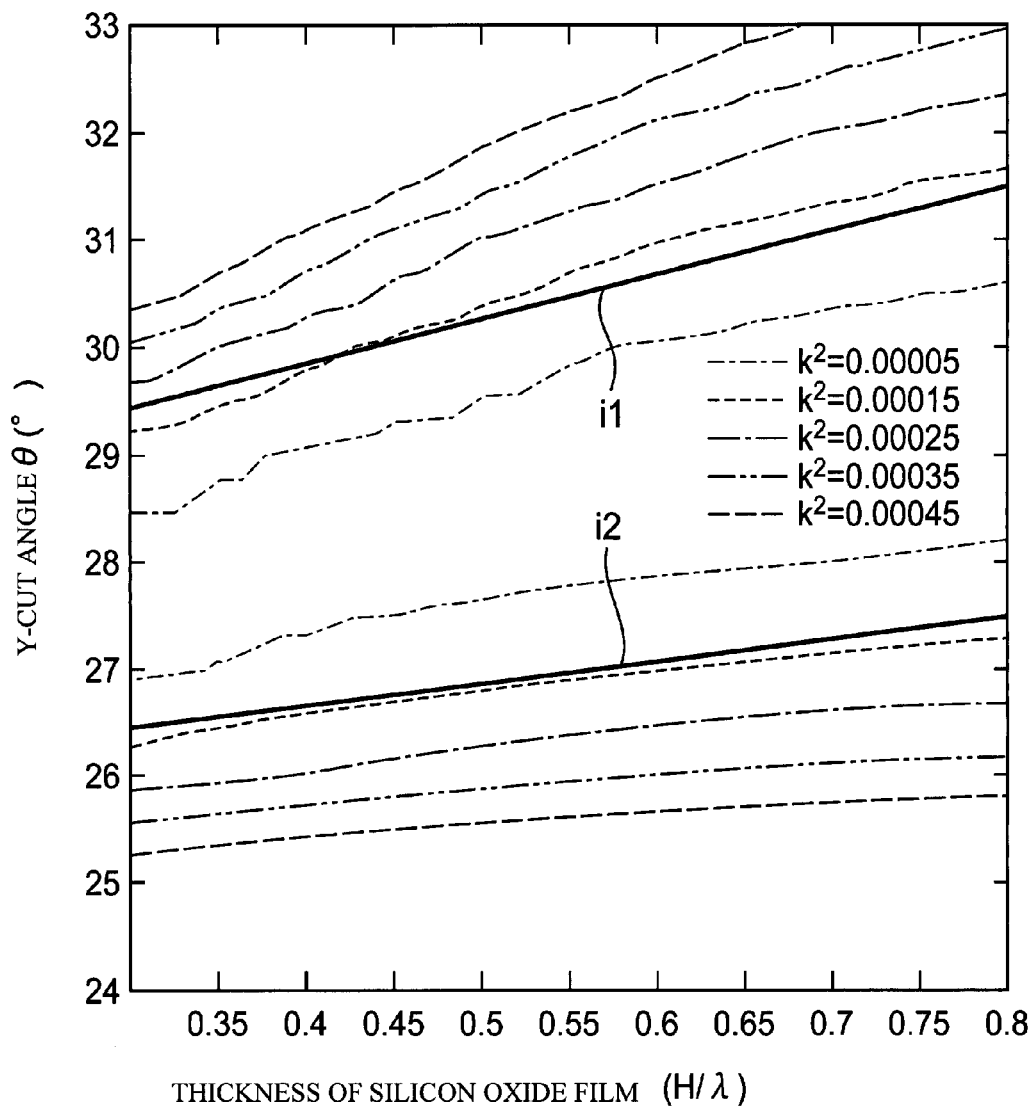
FIG. 40 shows thirty-third simulation results.

As shown in FIG. 40, there are ranges where $k^2$ is equal to or smaller than 0.00015, when $0.0925\lambda/a \leq h < 0.0975\lambda/a$ and
  when $0.3 \leq H/\lambda \leq 0.8$, $\theta \leq 4 H/\lambda + 28.3$, and additionally,
  when $0.3 \leq H/\lambda \leq 0.8$, $\theta \geq 2 H/\lambda + 25.9$.

Figure 41:
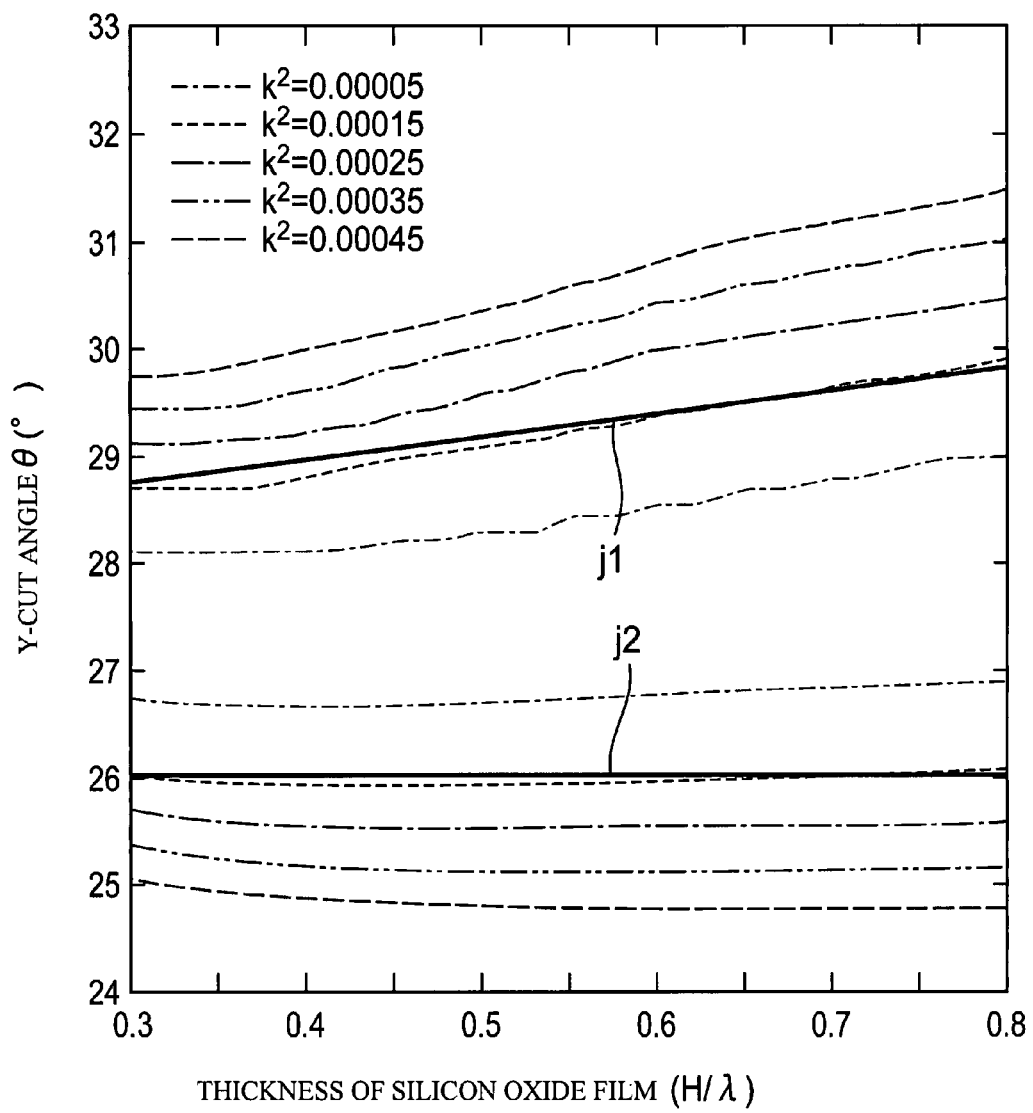
FIG. 41 shows thirty-fourth simulation results.

As shown in FIG. 41, there are ranges where $k^2$ is equal to or smaller than 0.00015, when $0.0975\lambda/a \leq h < 0.1025\lambda/a$ and
  when $0.3 \leq H/\lambda \leq 0.8$, $\theta \leq 2 H/\lambda + 28.2$, and additionally,
  when $0.3 \leq H/\lambda \leq 0.8$, $\theta \geq 26$.

Figure 42:
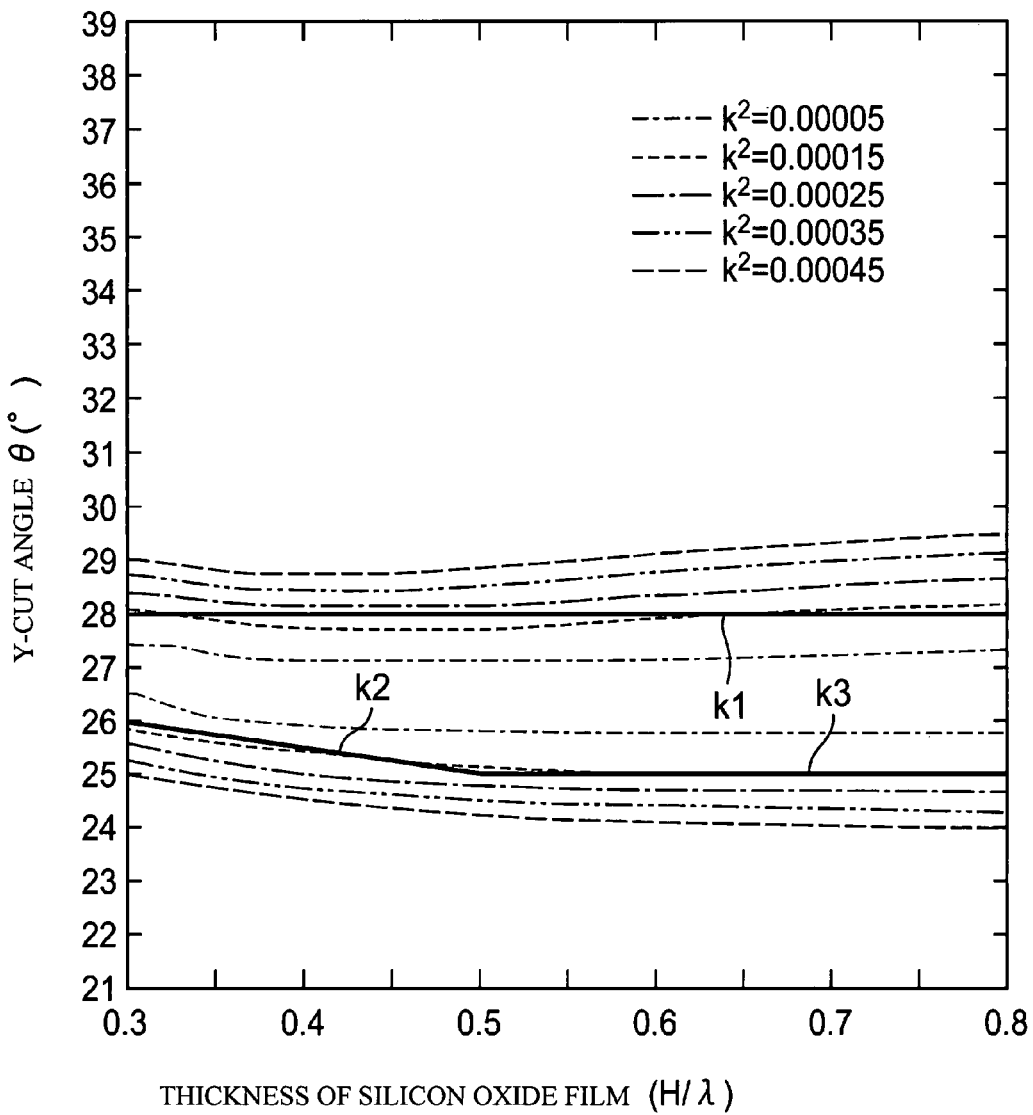
FIG. 42 shows thirty-fifth simulation results.

As shown in FIG. 42, there are ranges where $k^2$ is equal to or smaller than 0.00015, when $0.1025\lambda/a \leq h < 0.105\lambda/a$ and
  when $0.3 \leq H/\lambda \leq 0.8$, $\theta \leq 28$, and additionally,
  when $0.3 \leq H/\lambda < 0.5$, $\theta \geq -5 H/\lambda + 27.5$, and
  when $0.5 \leq H/\lambda \leq 0.8$, $\theta \geq 25$.

As stated heretofore, it is possible to make the $k^2$ of the Stoneley wave equal to or smaller than 0.00015, by setting the parameters of the elastic boundary wave device to have any of the ranges shown in FIG. 8 through FIG. 42, thereby reducing the influence on the elastic boundary wave device.

In accordance with the first exemplary embodiment of the present invention, the propagation direction of the boundary wave having a main component of SH is an x-axis direction of LN substrate.

In the first exemplary embodiment of the present invention, a description has been given of the oxide aluminum film 14 serving as a medium membrane on the silicon oxide film 12; however, in a case where the sound velocity of the medium membrane is faster than that of $SiO_2$ and the film thickness of the medium membrane is as thick as 1λ or more, the above-described simulation may be employed. When the sound velocity of the medium membrane is faster than that of the silicon oxide film 12, the elastic boundary wave is confined in the silicon oxide film 12. As a medium membrane having a sound velocity faster than that of the silicon oxide film 12, the medium membrane preferably includes any one of silicon nitride, aluminum silicon, aluminum oxide, and silicon.

Preferably, the density of the electrode 16 is greater than that of the silicon oxide film 12. This allows the increase of the reflection of the elastic boundary wave. Furthermore, as the electrode 16, copper (Cu) is preferably included. Since copper has a higher density and lower resistance than the silicon oxide film 12, the electrical loss can be lowered. Also, the silicon oxide film 12 may be made of a film that mainly includes silicon oxide within a range where the above-described simulation can be employed.

Second Exemplary Embodiment

Figure 43:
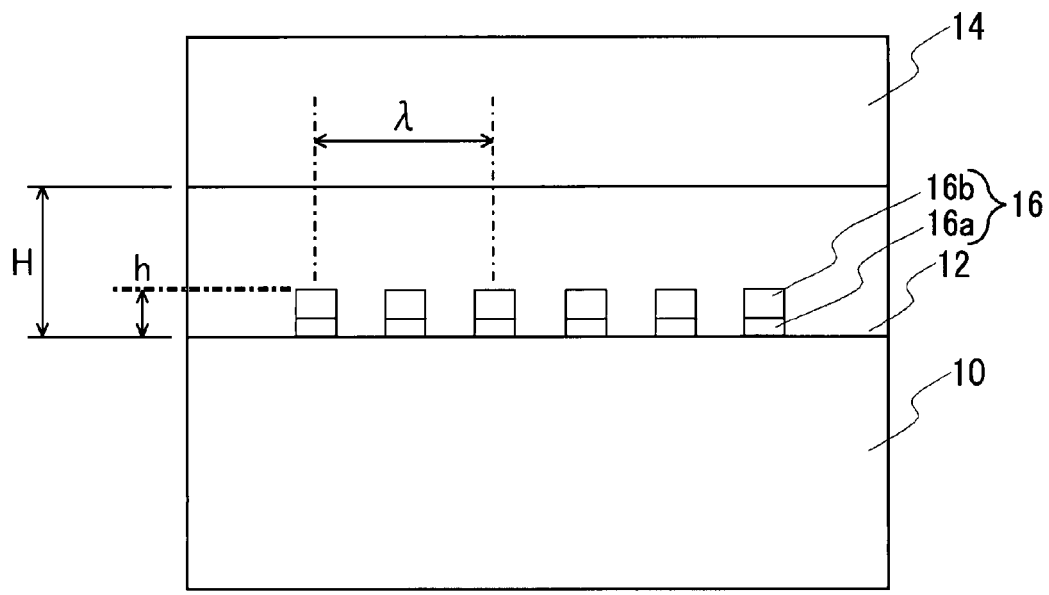
FIG. 43 is a cross-sectional view of an elastic boundary wave device employed in a second exemplary embodiment of the present invention.

The simulation results obtained in the first exemplary embodiment of the present invention may be employed for a case where the electrode 16 has a multilayer structure with two or more layers. Referring to FIG. 43, the electrode 16 is composed of a titanium (Ti) layer 16a and a cupper (Cu) layer 16b, as compared with the electrode 16 in FIG. 2. Hereinafter, in the second exemplary embodiment of the present invention, the same components and configurations as those employed in FIG. 2 have the same reference numerals and a detailed explanation will be omitted. As shown in FIG. 43, the electrode 16 may have a multilayer structure where the Ti layer 16a is provided on the substrate 10 and the Cu layer 16b is provided on the Ti layer 16a. This can promote the adherence between the electrode 16 and the substrate 10. In the second exemplary embodiment of the present invention, an average density "r" of the electrode 16 is expressed as:

$r = p \times b/(b+c) + q \times c/(b+c)$, where "p" is the density of the Cu layer 16b, "q" is the density of the Ti layer 16a, "b" is the film thickness of the Cu layer 16b, and "c" is the film thickness of the Ti layer 16a.

Also, the simulation results described in the first exemplary embodiment of the present invention may be used by setting:

$a = r/\text{density of Cu } (8.92 \text{ g/cm}^3)$.

The simulation results described in the first exemplary embodiment of the present invention may be employed by calculating the average density of the electrode 16 with the same calculation method and then obtaining "a", also in a case where the electrode 16 has three or more layers. Herein, the Cu layer 16b includes cupper such that the reflection of the elastic boundary wave can be increased and the loss thereof can be decreased with a low resistance. The Ti layer 16a includes titanium such that the electrode 16 and the substrate 10 can be adhered to each other.

Third Exemplary Embodiment

Figure 44:
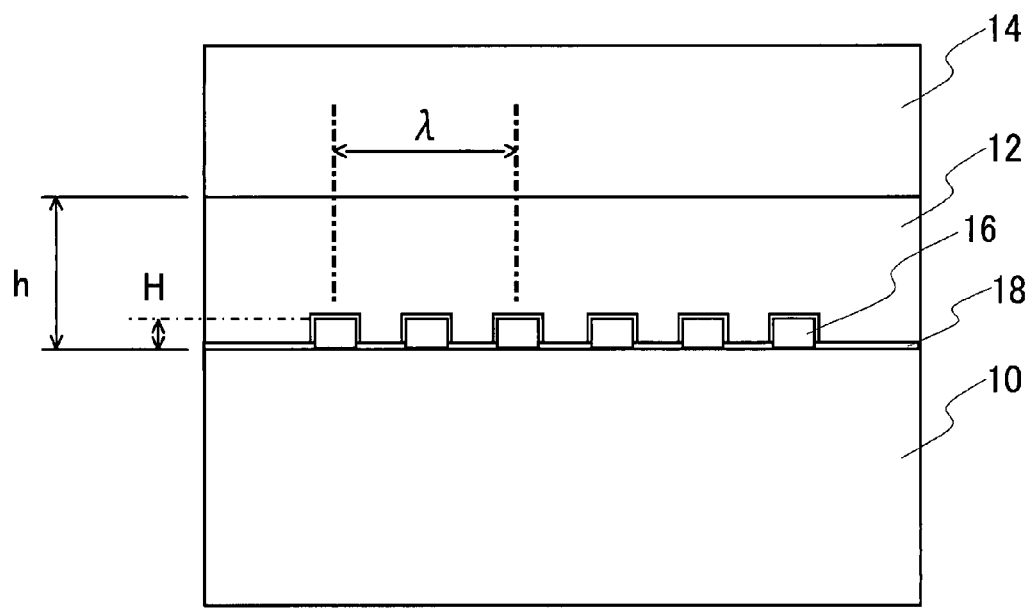
FIG. 44 is a cross-sectional view of an elastic boundary wave device employed in a third exemplary embodiment of the present invention.

The simulation results described in the first exemplary embodiment of the present invention may be used for a case where there is provided a barrier layer 18 that covers the electrode 16. Referring to FIG. 44, there is provided the barrier layer 18 made of a silicon nitride ($Si_3N_4$) film and covering the electrode 16. Hereinafter, in the third exemplary embodiment of the present invention, the same components and configurations as those employed in FIG. 2 have the same reference numerals and a detailed explanation will be omitted. The barrier layer 18 prevents the metal included in the electrode 16 from dissipating into the silicon oxide film 12. In particular, when the electrode 16 includes copper, copper easily dissipates into the silicon oxide film 12. Hence, it is preferable that barrier layer 18 be provided. It is also preferable that a silicon nitride film be employed as the barrier layer 18 because of the barrier capability and the ease of formation thereof. In addition to the silicon nitride film, a film having the capability that suppresses the dissipation of the metal included in the electrode 16 into the silicon oxide film may be employed.

Fourth Exemplary Embodiment

Figure 45:
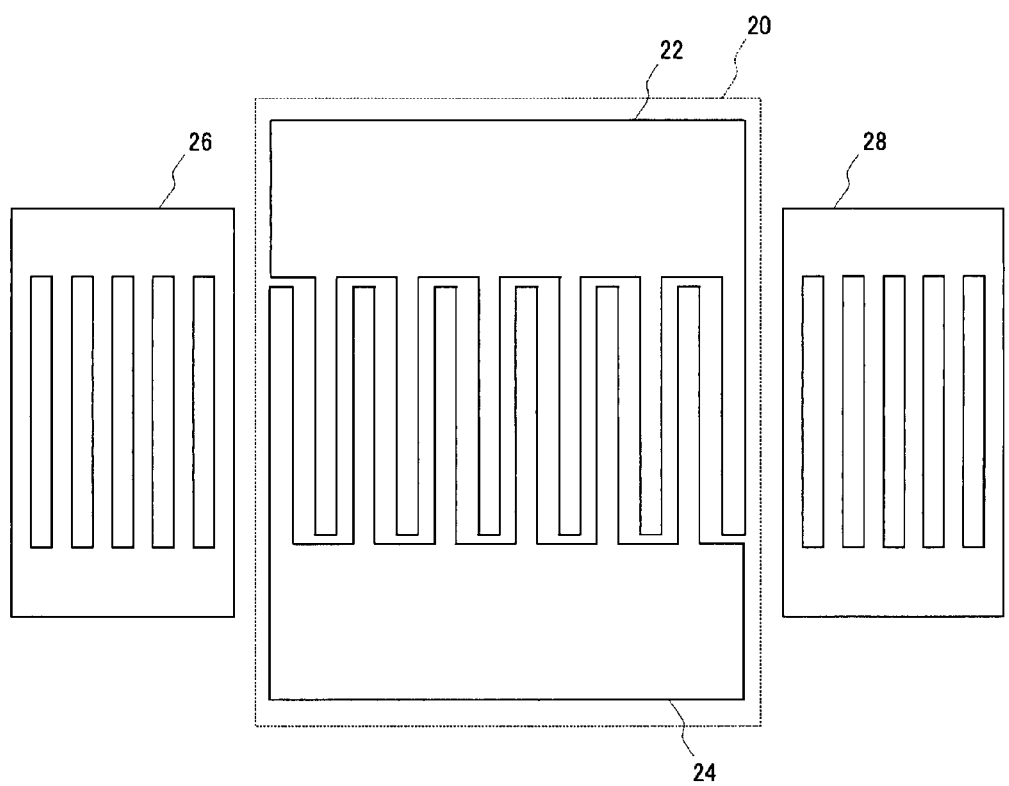
FIG. 45 is a plan view of a resonator employed in a fourth exemplary embodiment of the present invention.

A fourth exemplary embodiment of the present invention is an example of a resonator having any of the elastic boundary wave devices employed in the first through third exemplary embodiments of the present invention. FIG. 45 is a plan view showing electrodes included in a resonator. There are arranged reflectors 26 and 28 at both sides of an elastic boundary wave device 20 having comb-like electrodes. The 20 includes an input electrode 22 and an output electrode 24. The reflector 26 and 28 are fabricated simultaneously with the elastic boundary wave device 20 that includes the comb-like electrodes. Boundary waves propagating to the both sides from the elastic boundary wave device 20 are reflected by the reflector 26 and 28. Such reflected boundary waves become standing waves of the boundary waves in the elastic boundary wave device 20. The resonator operates in this manner. In accordance with the fourth exemplary embodiment of the present invention, the resonator suppressing the Stoneley wave is available by configuring the resonator with any of the elastic boundary wave devices employed in the first through third exemplary embodiments of the present invention. This improves frequency characteristics of the resonator.

Fifth Exemplary Embodiment

Figure 46:
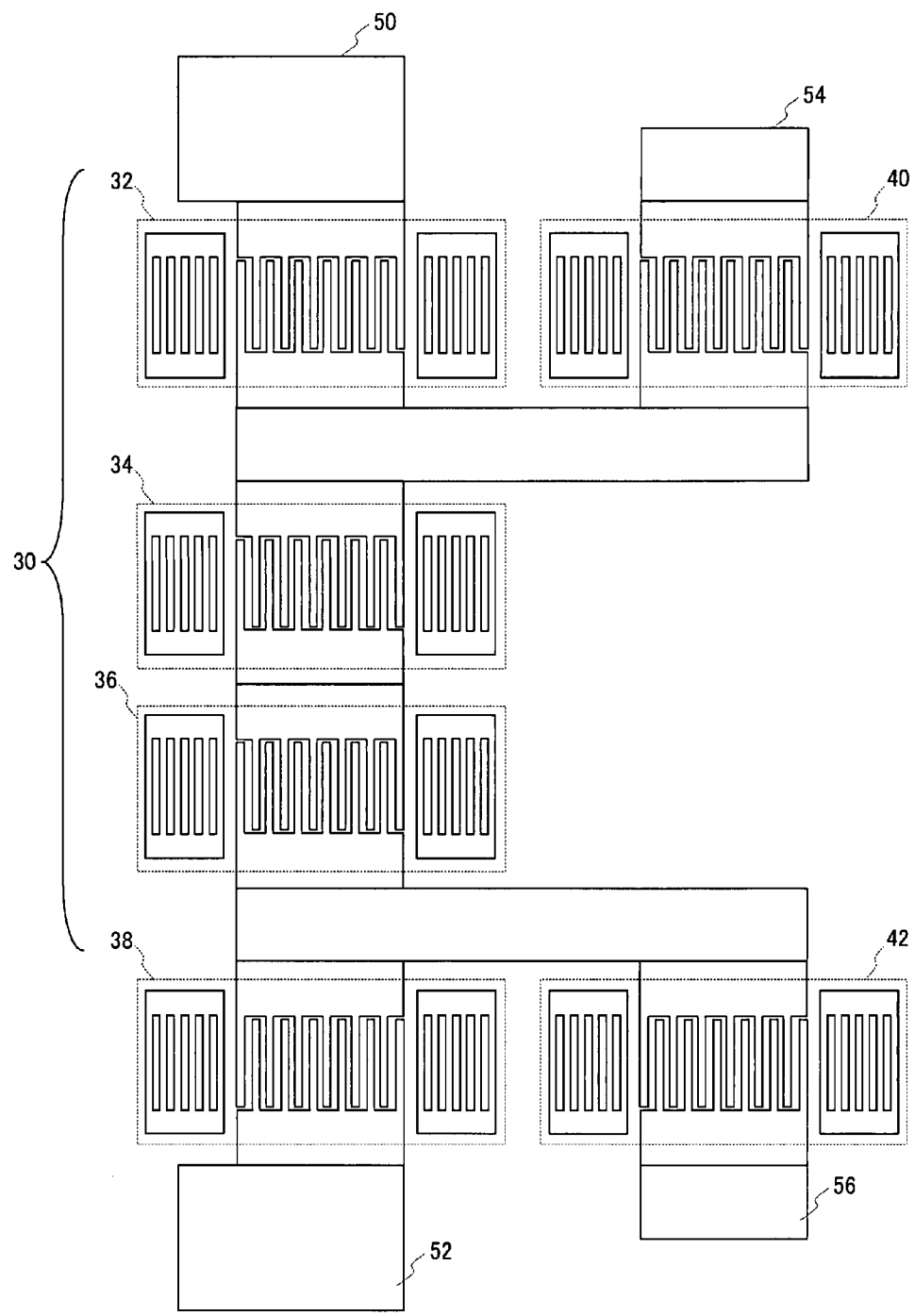
FIG. 46 is a plan view of a filter employed in a fifth exemplary embodiment of the present invention.

A fifth exemplary embodiment of the present invention is an example of a four-stage ladder type filter that includes the resonator employed in the fourth exemplary embodiment of the present invention. FIG. 46 is a plan view showing electrodes included in the ladder type filter employed in the fourth exemplary embodiment of the present invention. There are provided resonators 32, 34, 36, and 38 connected in series to serve as a series-arm resonator 30, the resonators being employed in the fourth exemplary embodiment of the present invention. One end of the resonator 32 is connected to an input pad electrode 50, and one end of the resonator 38 is connected to an electrode 52. An electrode, not shown, connected by the resonator 32 and the resonator 34 is further connected to the resonator 40, and an electrode, not shown, connected by the resonator 38 and the resonator 36 is further connected to the resonator 42. One end of the resonator 40 is connected to a ground pad electrode 54, the one end being not connected by a resonator. One end of the resonator 42 is connected to a ground pad electrode 56, the one end being not connected by a resonator. The resonators 40 and 42 function as a parallel-arm resonator. The above-described configuration allows the filter employed in the fifth exemplary embodiment of the present invention to operate as a ladder-type filter. In accordance with the fifth exemplary embodiment, the filter suppressing the Stoneley wave is available by configuring the ladder-type filter with any of the elastic boundary wave devices employed in the first through third exemplary embodiments of the present invention. This improves frequency characteristics of the filter. In the fifth exemplary embodiment of the present invention, a description has been given of the ladder-type filter; however, in addition to the ladder-type filter, for example, a double-mode filter may be configured with any of the elastic boundary wave devices employed in the first through third exemplary embodiments of the present invention.

FIG. 47 through FIG. 67 are graphs showing the electromechanical coupling coefficient k of the Stoneley wave with respect to $SiO_2$ film thickness ($H/\lambda$) and the electrode film pressure ($h/\lambda$), in addition to the graphs shown in FIG. 20 through FIG. 31 used in the first exemplary embodiment of the present invention. FIG. 47 through FIG. 67 respectively show results of Y-cut angles θ of 0°, 1°, 3°, 6°, 9°, 10°, 11°, 12°, 13°, 14°, 15°, 16°, 170°, 18°, 19°, 20°, 21°, 22°, 23°, 24°, and 177°. It is assumed that each calculation point represents a range between middle points with both adjacent calculation points, in a similar manner as shown in FIG. 20 through FIG. 31. There are listed below the graphs shown in FIG. 47 through FIG. 67, approximate expressions in the curve of the first or second order when $k^2$ is equal to 0.00015. It is therefore possible to cause $k^2$ of the Stoneley wave to be equal to or smaller than 0.00015, by setting the parameters of the elastic boundary wave device to have any one of the ranges shown in FIG. 47 through FIG. 67.

Figure 47:
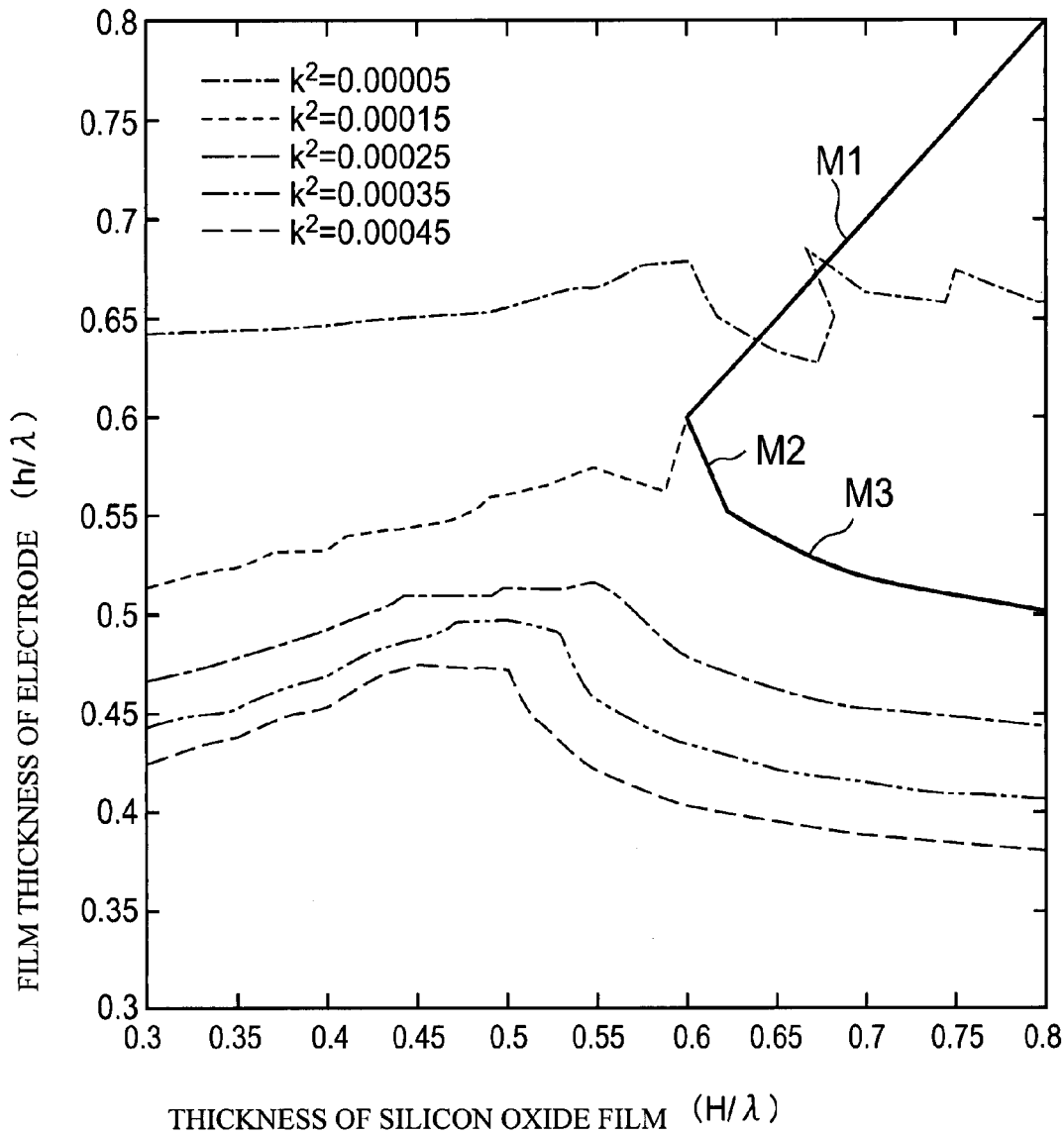
FIG. 47 shows thirty-sixth simulation results.

As shown in FIG. 47, there are ranges where $k^2$ is equal to or smaller than 0.00015, when 0°<θ<0.5° and when $0.6 \leq H/\lambda \leq 0.8$, $h/(\lambda \cdot a) \leq H/\lambda$. Here, the reason $h/(\lambda \cdot a) \leq H/\lambda$ is $h/(\lambda \cdot a) > H/\lambda$ is not taken into consideration in the model used for the simulation. Also, when $0.6 \leq H/\lambda < 0.625$, $h/(\lambda \cdot a) \geq -2 \ H/\lambda + 1.8$, and when $0.625 \leq H/\lambda \leq 0.8$, $h/(\lambda \cdot a) \geq 1.543 \ (H/\lambda)^2 - 2.484 \ H/\lambda + 1.5$.

Figure 48:
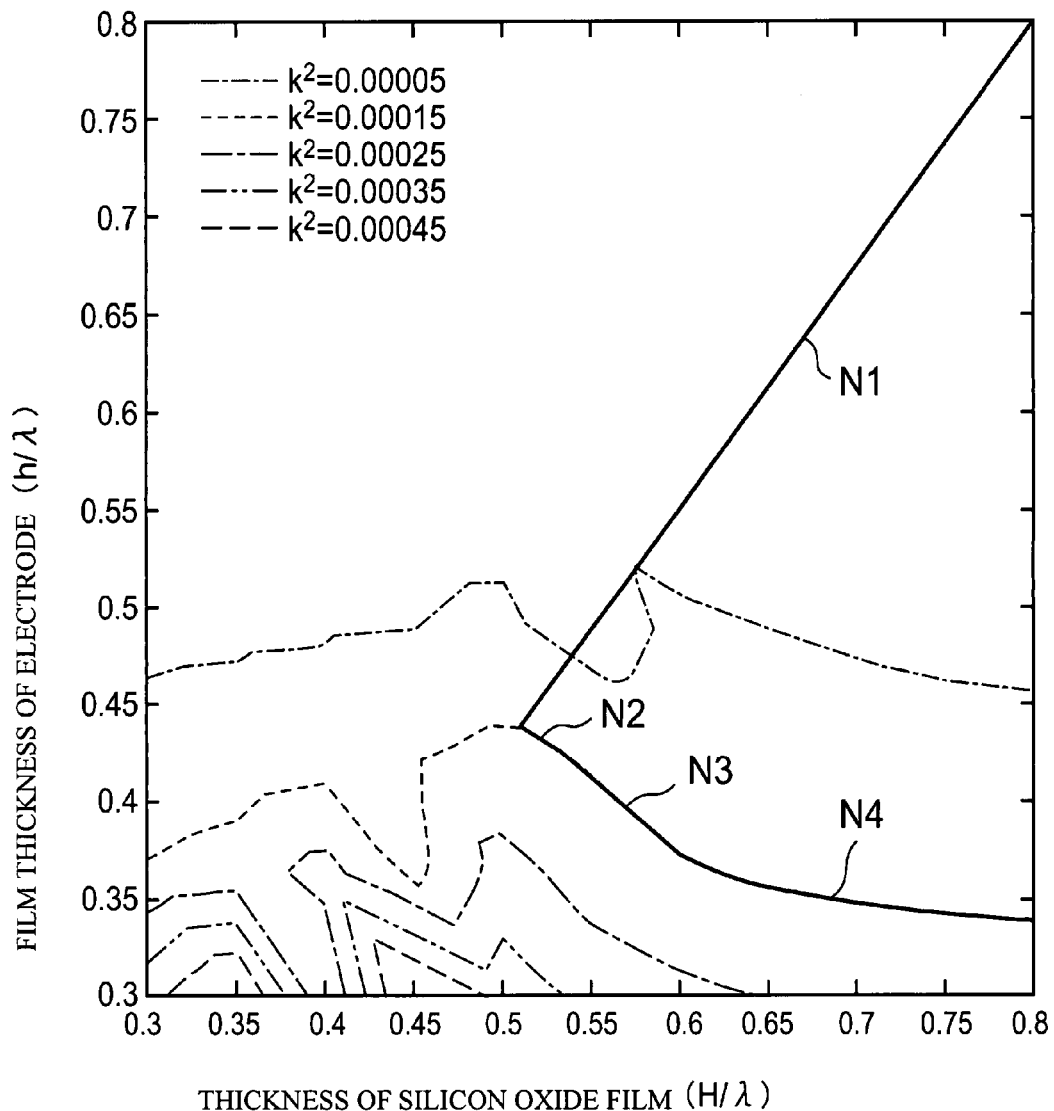
FIG. 48 shows thirty-seventh simulation results.

As shown in FIG. 48, there are ranges where $k^2$ is equal to or smaller than 0.00015, when 0.5°<θ<2° and
when $0.508 \leq H/\lambda \leq 0.8$, $h/(\lambda \cdot a) \leq H/\lambda$, and additionally,
when $0.508 \leq H/\lambda < 0.531$, $h/(\lambda \cdot a) \geq -0.3478 H/\lambda + 0.6847$,
when $0.531 \leq H/\lambda < 0.6$, $h/(\lambda \cdot a) \geq -0.6087 \ H/\lambda + 0.8232$, and
when $0.6 \leq H/\lambda \leq 0.8$, $h/(\lambda \cdot a) \geq 0.6 \ (H/\lambda)^2 - 0.98 \ H/\lambda + 0.83$.

Figure 49:
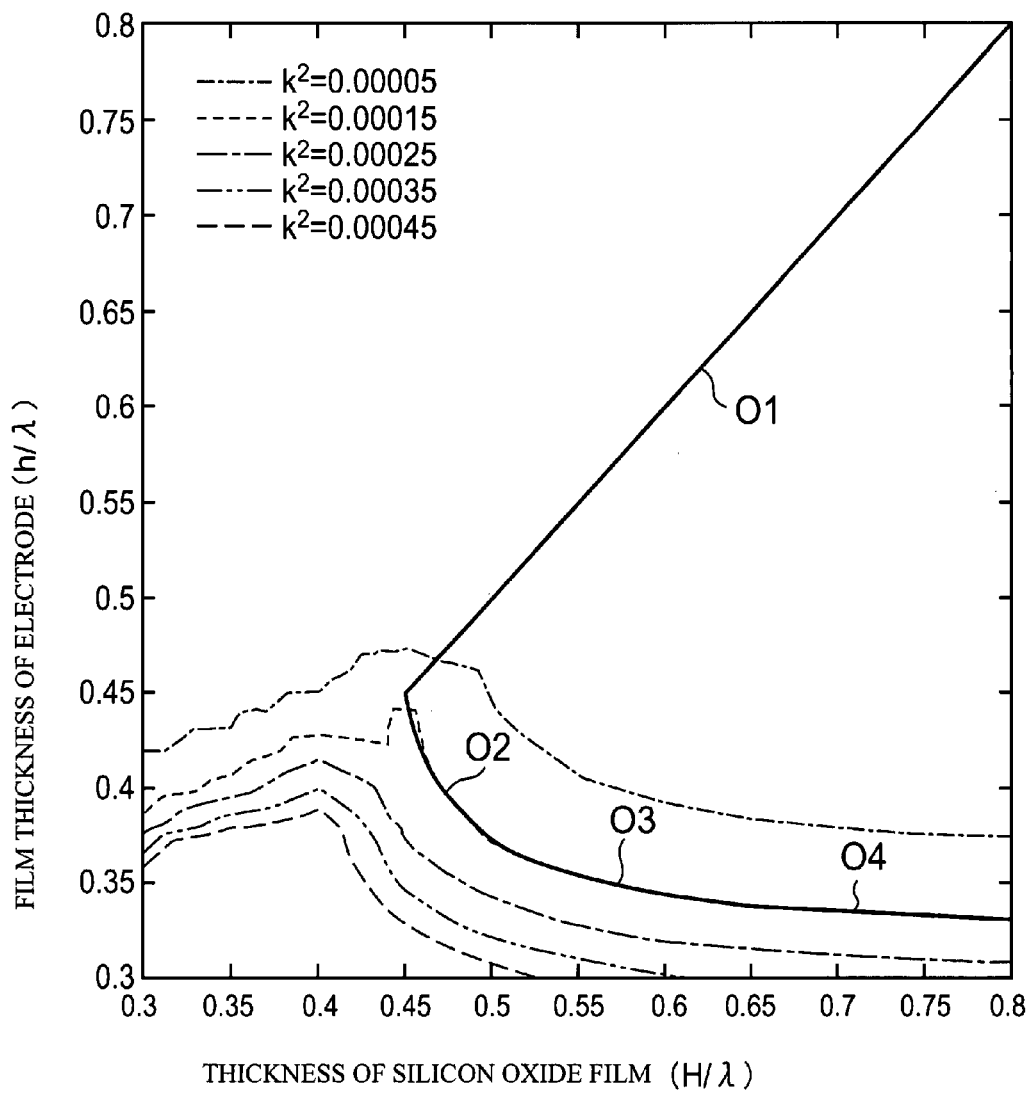
FIG. 49 shows thirty-eighth simulation results.

As shown in FIG. 49, there are ranges where $k^2$ is equal to or smaller than 0.00015, when 2°≤θ<4.5° and
when $0.45 \leq H/\lambda \leq 0.8$, $h/(\lambda \cdot a) \leq H/\lambda$, and additionally,
when $0.45 \leq H/\lambda < 0.5$, $h/(\lambda \cdot a) \geq 28.998 \ (H/\lambda)^2 - 29.088 \ H/\lambda + 7.668$,
when $0.5 \leq H/\lambda < 0.65$, $h/(\lambda \cdot a) \geq 1.6 \ (H/\lambda)^2 - 2.06 H/\lambda + 1.003$, and
when $0.65 \leq H/\lambda \leq 0.8$, $h/(\lambda \cdot a) \geq -0.0733 H/\lambda + 0.3877$.

Figure 50:
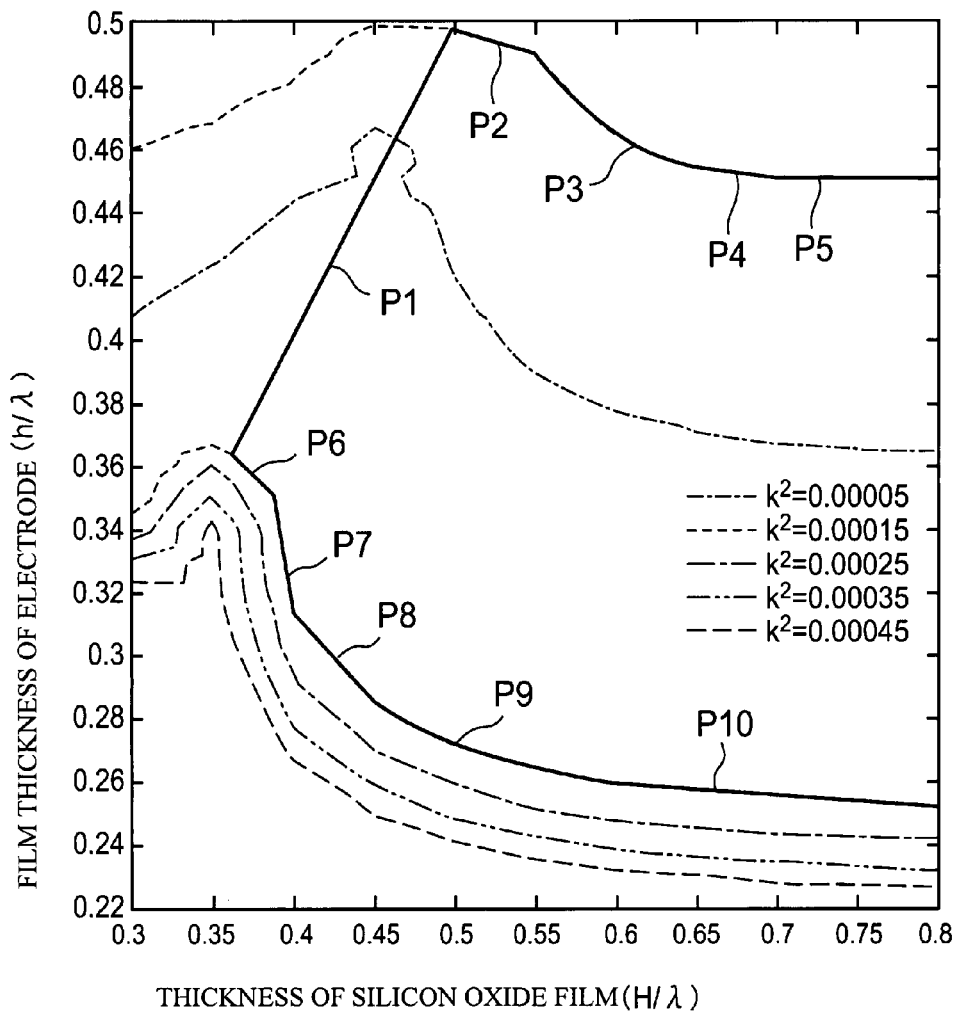
FIG. 50 shows thirty-ninth simulation results.

As shown in FIG. 50, there are ranges where $k^2$ is equal to or smaller than 0.00015, when 4.5°≤θ<7.5° and
when $0.3625 \leq H/\lambda < 0.496$, $h/(\lambda \cdot a) \leq H/\lambda$,
when $0.496 \leq H/\lambda < 0.55$, $h/(\lambda \cdot a) \leq -0.111 \ H/\lambda + 0.5511$,
when $0.55 \leq H/\lambda < 0.65$, $h/(\lambda \cdot a) \leq 3.4 \ (H/\lambda)^2 - 4.45 \ H/\lambda + 1.909$,
when $0.65 \leq H/\lambda < 0.7$, $h/(\lambda \cdot a) \leq -0.06 \ H/\lambda + 0.492$, and
when $0.7 \leq H/\lambda \leq 0.8$, $h/(\lambda \cdot a) \leq 0.45$, and additionally,
when $0.3625 \leq H/\lambda < 0.3875$, $h/(\lambda \cdot a) \geq -0.46 \ H/\lambda + 0.5293$,
when $0.3875 \leq H/\lambda < 0.4$, $h/(\lambda \cdot a) \geq -2.96 \ H/\lambda + 1.498$,
when $0.4 \leq H/\lambda < 0.45$, $h/(\lambda \cdot a) \geq -0.58 \ H/\lambda + 0.546$,
when $0.45 \leq H/\lambda < 0.6$, $h/(\lambda \cdot a) \geq 1.2667 \ (H/\lambda)^2 - 1.503 \ H/\lambda + 0.705$, and
when $0.6 \leq H/\lambda \leq 0.8$, $h/(\lambda \cdot a) \geq -0.04 \ H/\lambda + 0.283$.

Figure 51:
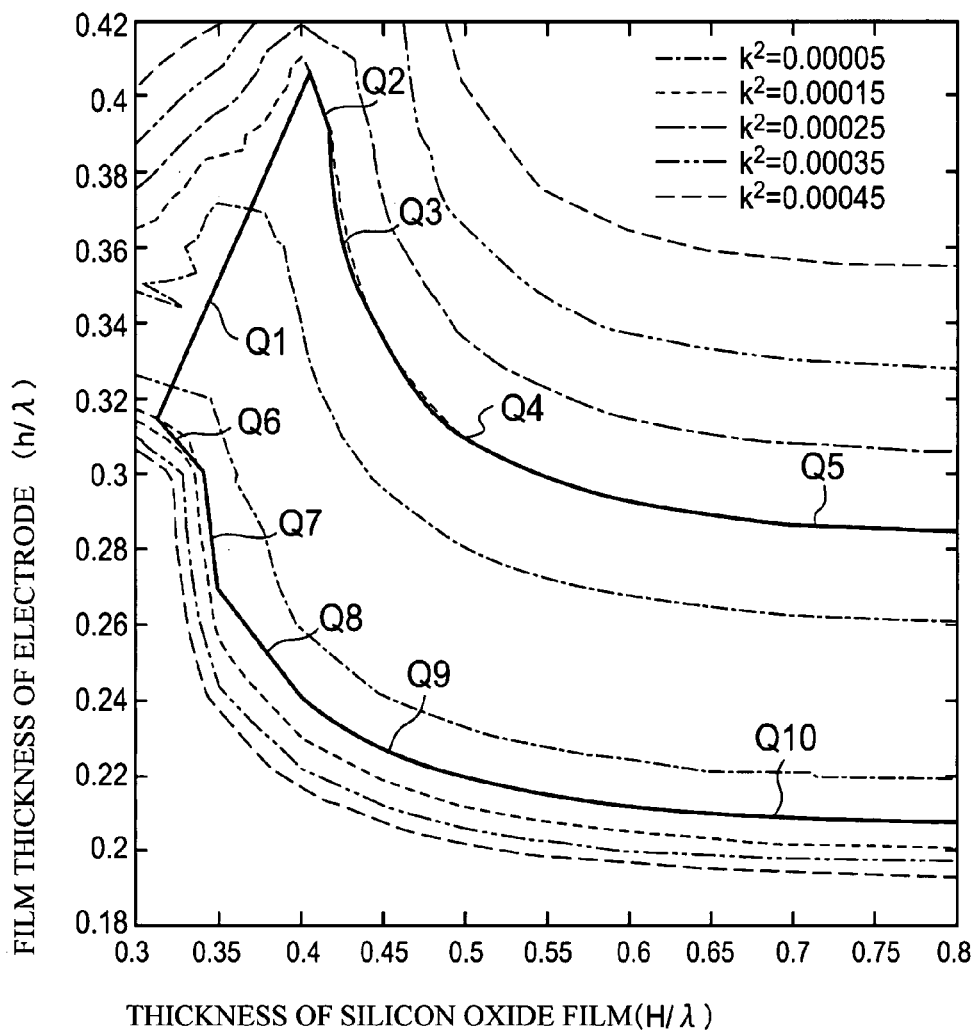
FIG. 51 shows forty simulation results.

As shown in FIG. 51, there are ranges where $k^2$ is equal to or smaller than 0.00015, when $7.5° \leq \theta < 9.5°$ and when $0.315 \leq H/\lambda < 0.406$, $h/(\lambda \cdot a) \leq H/\lambda$,
when $0.406 \leq H/\lambda < 0.419$, $h/(\lambda \cdot a) \leq -1.077\ H/\lambda + 0.8432$,
when $0.419 \leq H/\lambda < 0.45$, $h/(\lambda \cdot a) \leq 61.7512\ (H/\lambda)^2 - 55.565\ H/\lambda + 12.8326$,
when $0.45 \leq H/\lambda < 0.6$, $h/(\lambda \cdot a) \leq 1.8667\ (H/\lambda)^2 - 2.233\ H/\lambda + 0.96$, and
when $0.6 \leq H/\lambda \leq 0.8$, $h/(\lambda \cdot a) \leq 0.2\ (H/\lambda)^2 - 0.32\ H/\lambda + 0.412$, and additionally,
when $0.315 \leq H/\lambda < 0.342$, $h/(\lambda \cdot a) \geq -0.5556\ H/\lambda + 0.49$,
when $0.342 \leq H/\lambda < 0.35$, $h/(\lambda \cdot a) \geq -3.75\ H/\lambda + 1.5825$,
when $0.35 \leq H/\lambda < 0.4$, $h/(\lambda \cdot a) \geq -0.6\ H/\lambda + 0.48$,
when $0.4 \leq H/\lambda < 0.55$, $h/(\lambda \cdot a) \geq 1.133\ (H/\lambda)^2 - 1.243\ H/\lambda + 0.556$, and
when $0.55 \leq H/\lambda \leq 0.8$, $h/(\lambda \cdot a) \geq 0.1067\ (H/\lambda)^2 - 0.18\ H/\lambda + 0.2817$.

As shown in FIG. 52, there are ranges where $k^2$ is equal to or smaller than 0.00015, when $9.5° \leq \theta < 10.5°$ and when $0.31 \leq H/\lambda < 0.37$, $h/(\lambda \cdot a) \leq H/\lambda$,
when $0.37 \leq H/\lambda < 0.383$, $h/(\lambda \cdot a) \leq 0.37$,
when $0.383 \leq H/\lambda < 0.392$, $h/(\lambda \cdot a) \leq -1.111\ H/\lambda + 0.7956$,
when $0.392 \leq H/\lambda < 0.4$, $h/(\lambda \cdot a) \leq -2.5\ H/\lambda + 1.34$,
when $0.4 \leq H/\lambda < 0.45$, $h/(\lambda \cdot a) \leq 12\ (H/\lambda)^2 - 11.1\ H/\lambda + 2.86$,
when $0.45 \leq H/\lambda < 0.5$, $h/(\lambda \cdot a) \leq 3.2\ (H/\lambda)^2 - 3.36\ H/\lambda + 1.159$,
when $0.5 \leq H/\lambda < 0.61$, $h/(\lambda \cdot a) \leq 0.5455\ (H/\lambda)^2 - 0.7327\ H/\lambda + 0.509$, and
when $0.61 \leq H/\lambda \leq 0.8$, $h/(\lambda \cdot a) \leq 0.08848\ (H/\lambda)^2 - 0.1616\ H/\lambda + 0.3307$, and additionally,
when $0.31 \leq H/\lambda < 0.331$, $h/(\lambda \cdot a) \geq -0.4762\ H/\lambda + 0.4576$,
when $0.331 \leq H/\lambda < 0.35$, $h/(\lambda \cdot a) \geq -2.632\ H/\lambda + 1.171$,
when $0.35 \leq H/\lambda < 0.4$, $h/(\lambda \cdot a) \geq -0.5\ H/\lambda + 0.425$,
when $0.4 \leq H/\lambda < 0.5$, $h/(\lambda \cdot a) \geq (H/\lambda)^2 - 1.09H/\lambda + 0.501$, and
when $0.5 \leq H/\lambda \leq 0.8$, $h/(\lambda \cdot a) \geq 0.1\ (H/\lambda)^2 - 0.17\ H/\lambda + 0.266$.

As shown in FIG. 53, there are ranges where $k^2$ is equal to or smaller than 0.00015, when $10.5° \leq \theta < 11.5°$ and when $0.304 \leq H/\lambda < 0.36$, $h/(\lambda \cdot a) \leq H/\lambda$,
when $0.36 \leq H/\lambda < 0.3625$, $h/(\lambda \cdot a) \leq -4\ H/\lambda + 1.8$,
when $0.3625 \leq H/\lambda < 0.375$, $h/(\lambda \cdot a) \leq -0.8\ H/\lambda + 0.64$,
when $0.375 \leq H/\lambda < 0.4$, $h/(\lambda \cdot a) \leq 80.702\ (H/\lambda)^2 - 64.344\ H/\lambda + 13.120$,
when $0.4 \leq H/\lambda < 0.5$, $h/(\lambda \cdot a) \leq 3\ (H/\lambda)^2 - 3.091\ H/\lambda + 1.051$,
when $0.5 \leq H/\lambda < 0.7$, $h/(\lambda \cdot a) \leq 0.4\ (H/\lambda)^2 - 0.56\ H/\lambda + 0.436$, and
when $0.7 \leq H/\lambda \leq 0.8$, $h/(\lambda \cdot a) \leq -0.02\ H/\lambda + 0.254$, and additionally,
when $0.304 \leq H/\lambda < 0.329$, $h/(\lambda \cdot a) \geq -0.56\ H/\lambda + 0.474$,
when $0.329 \leq H/\lambda < 0.331$, $h/(\lambda \cdot a) \geq -15\ H/\lambda + 5.225$,
when $0.331 \leq H/\lambda < 0.35$, $h/(\lambda \cdot a) \geq -1.579\ H/\lambda + 0.7826$,
when $0.35 \leq H/\lambda < 0.4$, $h/(\lambda \cdot a) \geq -0.4\ H/\lambda + 0.37$,
when $0.4 \leq H/\lambda < 0.575$, $h/(\lambda \cdot a) \geq 0.4762\ (H/\lambda)^2 - 0.5786\ H/\lambda + 0.3652$, and
when $0.575 \leq H/\lambda \leq 0.8$, $h/(\lambda \cdot a) \geq 0.0381\ (H/\lambda)^2 - 0.07905\ H/\lambda + 0.2229$.

As shown in FIG. 54, there are ranges where $k^2$ is equal to or smaller than 0.00015, when $11.5° \leq \theta < 12.5°$, and when $0.3 \leq H/\lambda < 0.35$, $h/(\lambda \cdot a) \leq H/\lambda$,
when $0.35 \leq H/\lambda < 0.358$, $h/(\lambda \cdot a) \leq -1.25\ H/\lambda + 0.7875$,
when $0.358 \leq H/\lambda < 0.3625$, $h/(\lambda \cdot a) \leq -6.667\ H/\lambda + 2.7267$,
when $0.3625 \leq H/\lambda < 0.4$, $h/(\lambda \cdot a) \leq 27.781\ (H/\lambda)^2 - 22.3379\ H/\lambda + 4.7569$,
when $0.4 \leq H/\lambda < 0.5$, $h/(\lambda \cdot a) \leq 2.18\ (H/\lambda)^2 - 2.271\ H/\lambda + 0.8263$,
when $0.5 \leq H/\lambda < 0.65$, $h/(\lambda \cdot a) \leq 0.44\ (H/\lambda)^2 - 0.578\ H/\lambda + 0.4148$, and
when $0.65 \leq H/\lambda \leq 0.8$, $h/(\lambda \cdot a) \leq -0.02667\ H/\lambda + 0.2423$, and additionally,
when $0.3 \leq H/\lambda < 0.308$, $h/(\lambda \cdot a) \geq -0.5\ H/\lambda + 0.45$,
when $0.308 \leq H/\lambda < 0.35$, $h/(\lambda \cdot a) \geq 25.1541\ (H/\lambda)^2 - 18.099\ H/\lambda + 3.4683$,
when $0.35 \leq H/\lambda < 0.45$, $h/(\lambda \cdot a) \geq 1.8\ (H/\lambda)^2 - 1.69\ H/\lambda + 0.586$,
when $0.45 \leq H/\lambda < 0.6$, $h/(\lambda \cdot a) \geq 0.3333\ (H/\lambda)^2 - 0.4167\ H/\lambda + 0.31$, and
when $0.6 \leq H/\lambda \leq 0.8$, $h/(\lambda \cdot a) \geq -0.02\ H/\lambda + 0.192$.

As shown in FIG. 55, there are ranges where $k^2$ is equal to or smaller than 0.00015, when $12.5° \leq \theta < 13.5°$ and when $0.3 \leq H/\lambda < 0.32$, $h/(\lambda \cdot a) \leq H/\lambda$,
when $0.32 \leq H/\lambda < 0.35$, $h/(\lambda \cdot a) \leq -H/\lambda + 0.64$,
when $0.35 \leq H/\lambda < 0.373$, $h/(\lambda \cdot a) \leq -1.3044\ H/\lambda + 0.7465$,
when $0.373 \leq H/\lambda < 0.4$, $h/(\lambda \cdot a) \leq -0.6296\ H/\lambda + 0.4949$,
when $0.4 \leq H/\lambda < 0.5$, $h/(\lambda \cdot a) \leq 1.6\ (H/\lambda)^2 - 1.66\ H/\lambda + 0.651$,
when $0.5 \leq H/\lambda < 0.65$, $h/(\lambda \cdot a) \leq 0.4667\ (H/\lambda)^2 - 0.61\ H/\lambda + 0.4093$, and
when $0.65 \leq H/\lambda \leq 0.8$, $h/(\lambda \cdot a) \leq -0.02\ H/\lambda + 0.223$, and additionally,
when $0.3 \leq H/\lambda < 0.35$, $h/(\lambda \cdot a) \geq -0.8\ H/\lambda + 0.48$,
when $0.35 \leq H/\lambda < 0.45$, $h/(\lambda \cdot a) \geq -0.2\ H/\lambda + 0.27$,
when $0.45 \leq H/\lambda < 0.625$, $h/(\lambda \cdot a) \geq 0.09524\ (H/\lambda)^2 - 0.1595\ H/\lambda + 0.2325$, and
when $0.65 \leq H/\lambda \leq 0.8$, $h/(\lambda \cdot a) \geq -0.01143\ H/\lambda + 0.1771$.

As shown in FIG. 56, there are ranges where $k^2$ is equal to or smaller than 0.00015, when $13.5° \leq \theta < 14.5°$ and when $0.3 \leq H/\lambda < 0.318$, $h/(\lambda \cdot a) \leq H/\lambda$,
when $0.318 \leq H/\lambda < 0.325$, $h/(\lambda \cdot a) \leq -4\ H/\lambda + 1.59$,
when $0.325 \leq H/\lambda < 0.4$, $h/(\lambda \cdot a) \leq 6.933\ (H/\lambda)^2 - 5.88\ H/\lambda + 1.4687$,
when $0.4 \leq H/\lambda < 0.585$, $h/(\lambda \cdot a) \leq 0.6618\ (H/\lambda)^2 - 0.7924\ H/\lambda + 0.437$, and
when $0.585 \leq H/\lambda \leq 0.8$, $h/(\lambda \cdot a) \leq 0.11527\ (H/\lambda)^2 - 0.1829\ H/\lambda + 0.2676$, and additionally,
when $0.3 \leq H/\lambda < 0.35$, $h/(\lambda \cdot a) \geq -0.6\ H/\lambda + 0.4$,
when $0.35 \leq H/\lambda < 0.475$, $h/(\lambda \cdot a) \geq 0.8\ (H/\lambda)^2 - 0.82\ H/\lambda + 0.379$,
when $0.475 \leq H/\lambda < 0.65$, $h/(\lambda \cdot a) \geq 0.2095\ (H/\lambda)^2 - 0.2814\ H/\lambda + 0.2564$, and
when $0.65 \leq H/\lambda \leq 0.8$, $h/(\lambda \cdot a)^2 - 0.0133\ H/\lambda + 0.1707$.

As shown in FIG. 57, there are ranges where $k^2$ is equal to or smaller than 0.00015, when $14.5° \leq \theta < 15.5°$ and when $0.3 \leq H/\lambda < 0.304$, $h/(\lambda \cdot a) \leq H/\lambda$,
when $0.304 \leq H/\lambda < 0.308$, $h/(\lambda \cdot a) \leq -1.25H/\lambda + 0.685$,
when $0.308 \leq H/\lambda < 0.321$, $h/(\lambda \cdot a) \leq -2.308\ H/\lambda + 1.011$,
when $0.321 \leq H/\lambda < 0.375$, $h/(\lambda \cdot a) \leq 11.239\ (H/\lambda)^2 - 8.748\ H/\lambda + 1.920$,
when $0.375 \leq H/\lambda < 0.5$, $h/(\lambda \cdot a) \leq 1.1733\ (H/\lambda)^2 - 1.2347\ H/\lambda + 0.518$,
when $0.5 \leq H/\lambda < 0.65$, $h/(\lambda \cdot a) \leq 0.267\ (H/\lambda)^2 - 0.36\ H/\lambda + 0.3073$, and
when $0.65 \leq H/\lambda \leq 0.8$, $h/(\lambda \cdot a) \leq -0.01333\ H/\lambda + 0.1947$, and additionally,
when $0.3 \leq H/\lambda < 0.35$, $h/(\lambda \cdot a) \geq -0.5\ H/\lambda + 0.355$,
when $0.35 \leq H/\lambda < 0.4$, $h/(\lambda \cdot a) \geq -0.2\ H/\lambda + 0.25$,
when $0.4 \leq H/\lambda < 0.5$, $h/(\lambda \cdot a) \geq -0.1\ H/\lambda + 0.21$,
when $0.5 \leq H/\lambda < 0.7$, $h/(\lambda \cdot a) \geq -0.03\ H/\lambda + 0.175$, and
when $0.7 \leq H/\lambda \leq 0.8$, $h/(\lambda \cdot a) \geq 0.154$.

As shown in FIG. 58, there are ranges where $k^2$ is equal to or smaller than 0.00015, when $15.5° \leq \theta < 16.5°$ and when $0.3 \leq H/\lambda < 0.308$, $h/(\lambda \cdot a) \leq -1.25\ H/\lambda + 0.675$,
when $0.308 \leq H/\lambda < 0.311$, $h/(\lambda \cdot a) \leq -10\ H/\lambda + 3.37$,
when $0.311 \leq H/\lambda < 0.321$, $h/(\lambda \cdot a) \leq -2\ H/\lambda + 0.882$,
when $0.321 \leq H/\lambda < 0.4$, $h/(\lambda \cdot a) \leq 5.9188\ (H/\lambda)^2 - 4.799\ H/\lambda + 1.171$, when $0.4 \leq H/\lambda < 0.55$, $h/(\lambda \cdot a) \leq 0.711 \ (H/\lambda)^2 - 0.7956 \ H/\lambda + 0.4024$, when $0.55 \leq H/\lambda \leq 0.8$, $h/(\lambda \cdot a) \leq 0.128 \ (H/\lambda)^2 - 0.197 \ H/\lambda + 0.2495$, and additionally, when $0.3 \leq H/\lambda < 0.35$, $h/(\lambda \cdot a) \geq -0.4 \ H/\lambda + 0.31$, when $0.35 \leq H/\lambda < 0.5$, $h/(\lambda \cdot a) \geq 0.3556 \ (H/\lambda)^2 - 0.4089 \ H/\lambda + 0.2696$, and when $0.5 \leq H/\lambda \leq 0.8$, $h/(\lambda \cdot a) \geq 0.08762 \ (H/\lambda)^2 - 0.1306 \ H/\lambda + 0.1974$.

Figure 59:
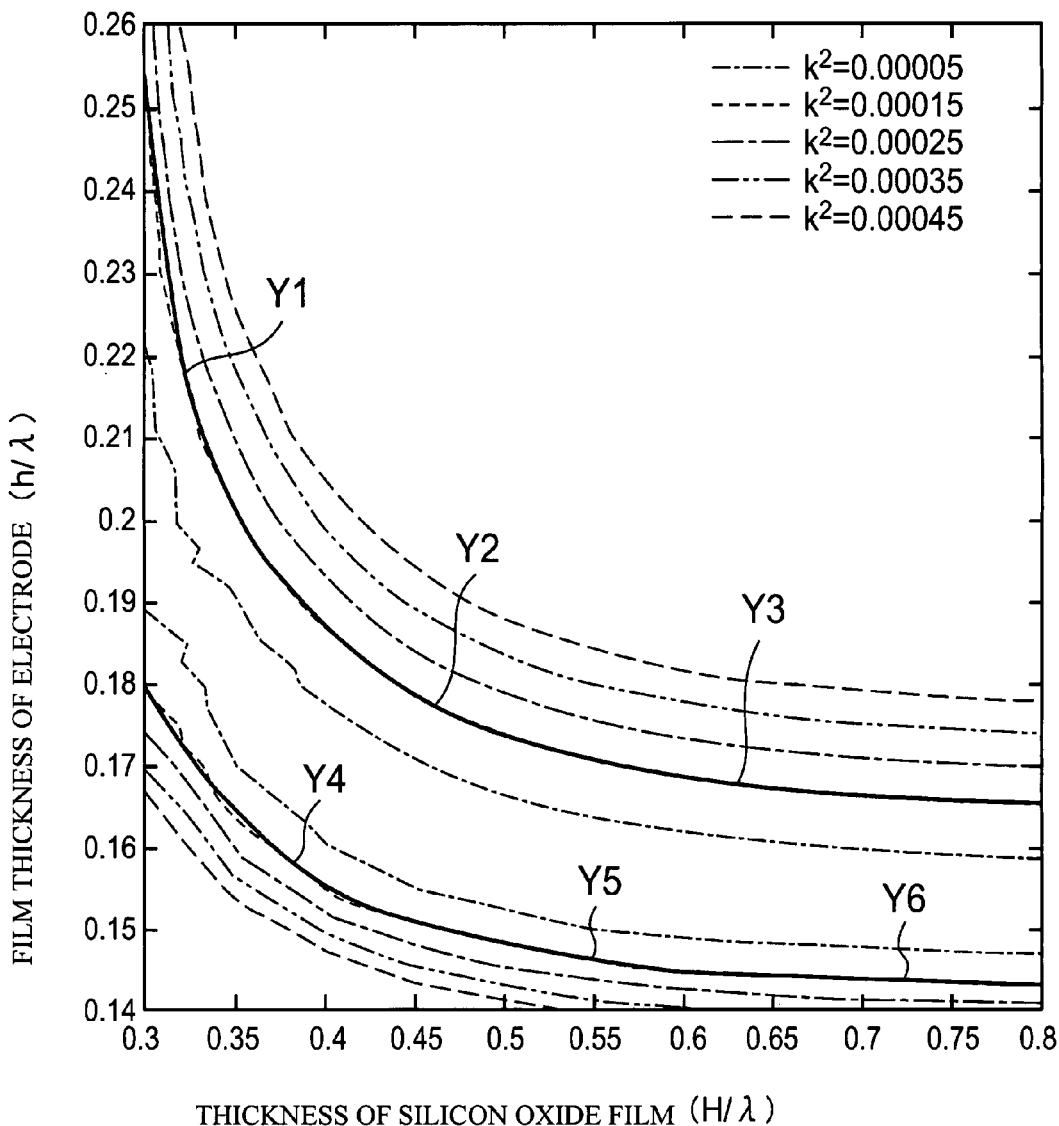
FIG. 59 shows forty-eighth simulation results.

As shown in FIG. 59, there are ranges where $k^2$ is equal to or smaller than 0.00015, when $16.5° \leq \theta < 17.5°$ and when $0.3 \leq H/\lambda < 0.4$, $h/(\lambda \cdot a) \leq 8.6 \ (H/\lambda)^2 - 6.75 \ H/\lambda + 1.511$, when $0.4 \leq H/\lambda < 0.55$, $h/(\lambda \cdot a) \leq 0.467 \ (H/\lambda)^2 - 0.557 \ H/\lambda + 0.335$, and when $0.55 \leq H/\lambda \leq 0.8$, $h/(\lambda \cdot a) \leq 0.0667 \ (H/\lambda)^2 - 0.11 \ H/\lambda + 0.2103$, and additionally, when $0.3 \leq H/\lambda < 0.45$, $h/(\lambda \cdot a) \geq 1.133 \ (H/\lambda)^2 - 1.043 \ H/\lambda + 0.391$, when $0.45 \leq H/\lambda < 0.6$, $h/(\lambda \cdot a) \geq 0.133 \ (H/\lambda)^2 - 0.183 \ H/\lambda + 0.2065$, and when $0.6 \leq H/\lambda < 0.8$, $h/(\lambda \cdot a) \geq -0.0075 \ H/\lambda + 0.149$.

Figure 60:
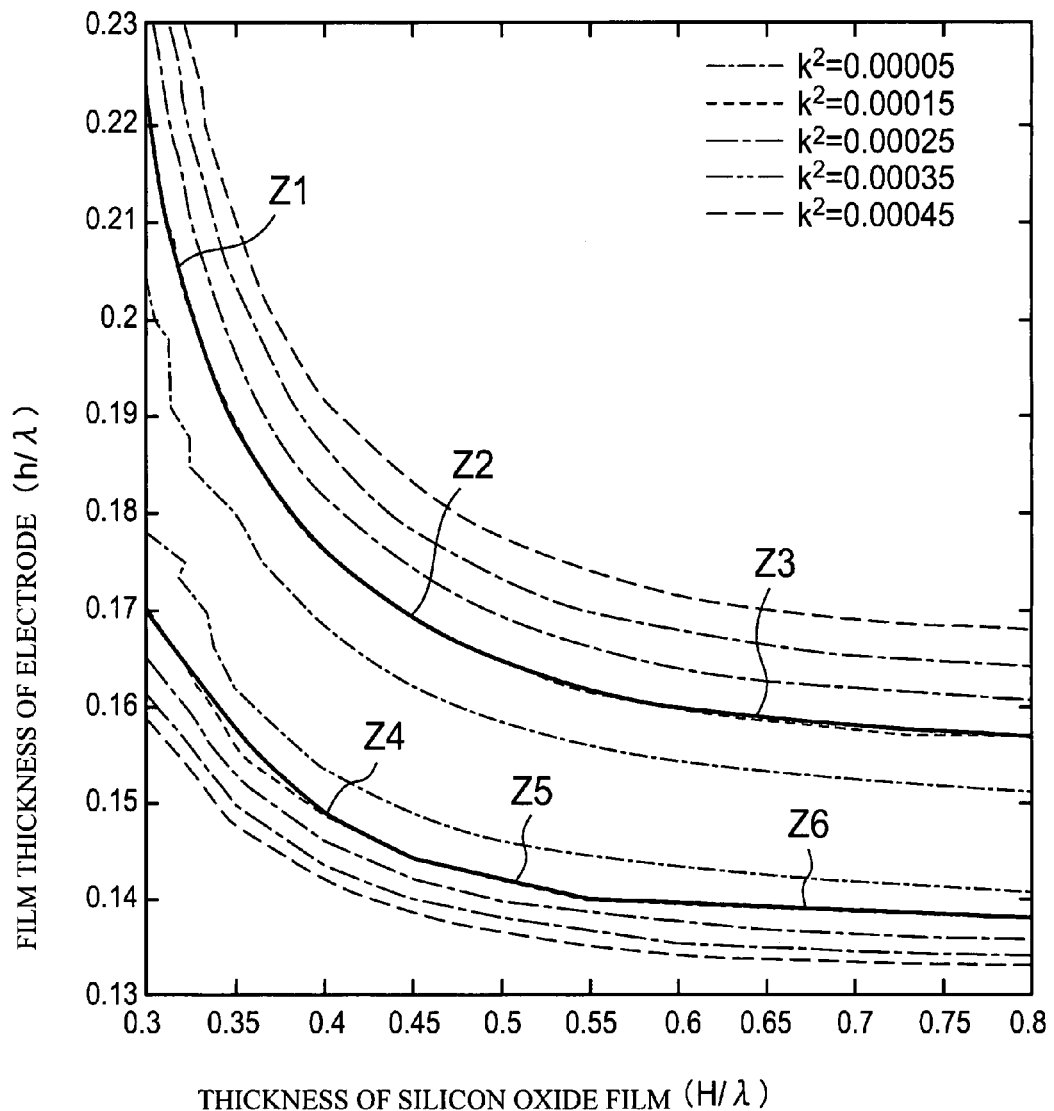
FIG. 60 shows forty-ninth simulation results.

As shown in FIG. 60, there are ranges where $k^2$ is equal to or smaller than 0.00015, when $17.5° < \theta < 18.5°$ and when $0.3 \leq H/\lambda < 0.4$, $h/(\lambda \cdot a) \leq 4 \ (H/\lambda)^2 - 3.28 \ H/\lambda + 0.848$, when $0.4 \leq H/\lambda < 0.55$, $h/(\lambda \cdot a) \leq 0.467 \ (H/\lambda)^2 - 0.537 \ H/\lambda + 0.316$, and when $0.55 \leq H/\lambda \leq 0.8$, $h/(\lambda \cdot a) \leq 0.1 \ (H/\lambda)^2 - 0.155 \ H/\lambda + 0.217$, and additionally, when $0.3 \leq H/\lambda < 0.45$, $h/(\lambda \cdot a) \geq 0.867 \ (H/\lambda)^2 - 0.817 \ H/\lambda + 0.337$, when $0.45 \leq H/\lambda < 0.55$, $h/(\lambda \cdot a) \geq -0.05 \ H/\lambda + 0.1675$, and when $0.55 \leq H/\lambda \leq 0.8$, $h/(\lambda \cdot a) \geq -0.008 \ H/\lambda + 0.1444$.

Figure 61:
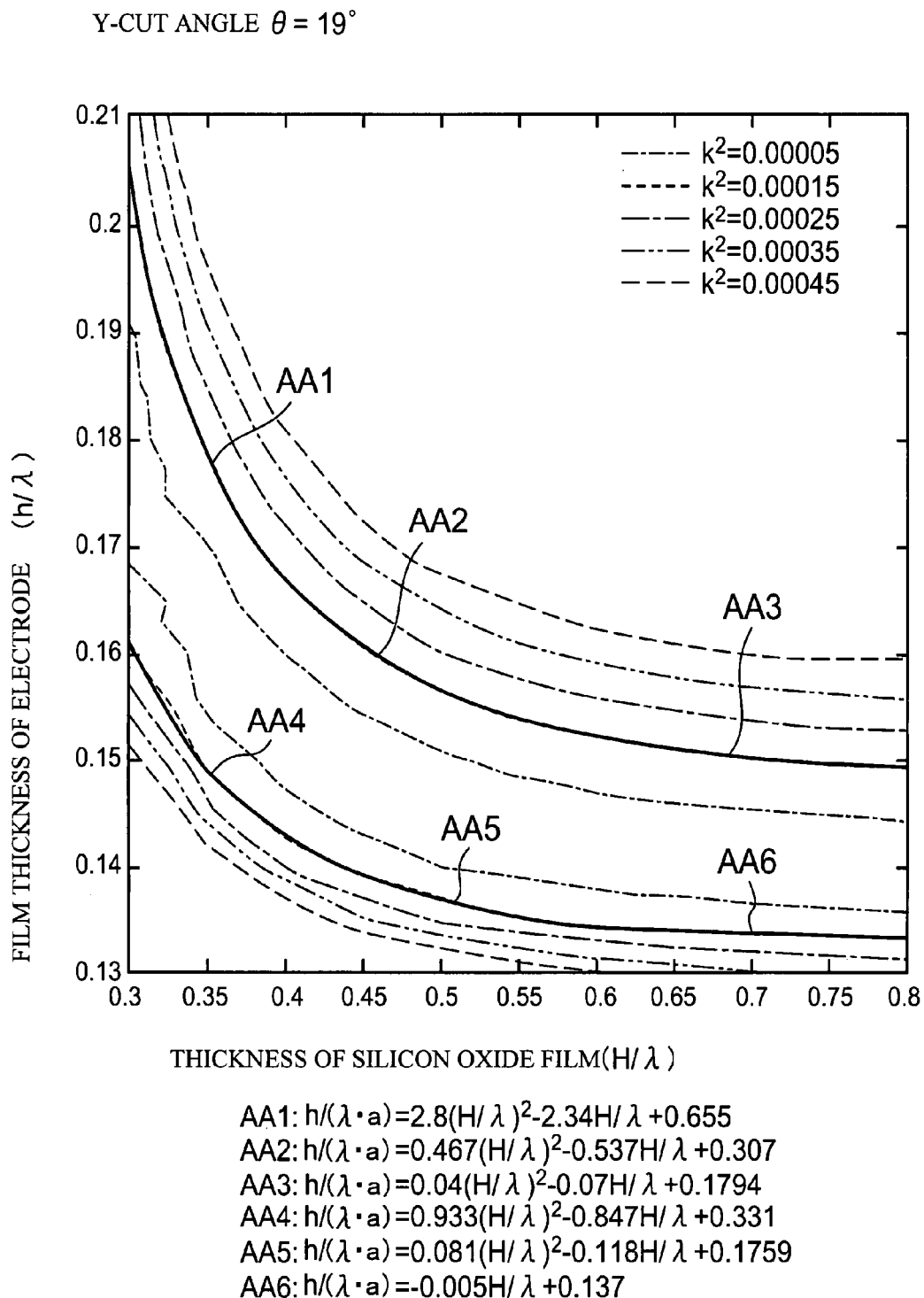
FIG. 61 shows fifty simulation results.

As shown in FIG. 61, there are ranges where $k^2$ is equal to or smaller than 0.00015, when $18.5° \leq \theta < 19.5°$ and when $0.3 \leq H/\lambda < 0.4$, $h/(\lambda \cdot a) \leq 2.8 \ (H/\lambda)^2 - 2.34 \ H/\lambda + 0.655$, when $0.4 \leq H/\lambda < 0.55$, $h/(\lambda \cdot a) \leq 0.467 \ (H/\lambda)^2 - 0.537 \ H/\lambda + 0.307$, and when $0.55 \leq H/\lambda \leq 0.8$, $h/(\lambda \cdot a) \leq 0.04 \ (H/\lambda)^2 - 0.07 \ H/\lambda + 0.1794$, and additionally, when $0.3 \leq H/\lambda < 0.45$, $h/(\lambda \cdot a) \geq 0.933 \ (H/\lambda)^2 - 0.847 \ H/\lambda + 0.331$, and when $0.45 \leq H/\lambda < 0.6$, $h/(\lambda \cdot a) \geq 0.081 \ (H/\lambda)^2 - 0.118 \ H/\lambda + 0.1759$, and when $0.6 \leq H/\lambda \leq 0.8$, $h/(\lambda \cdot a) \geq -0.005 \ H/\lambda + 0.137$.

Figure 62:
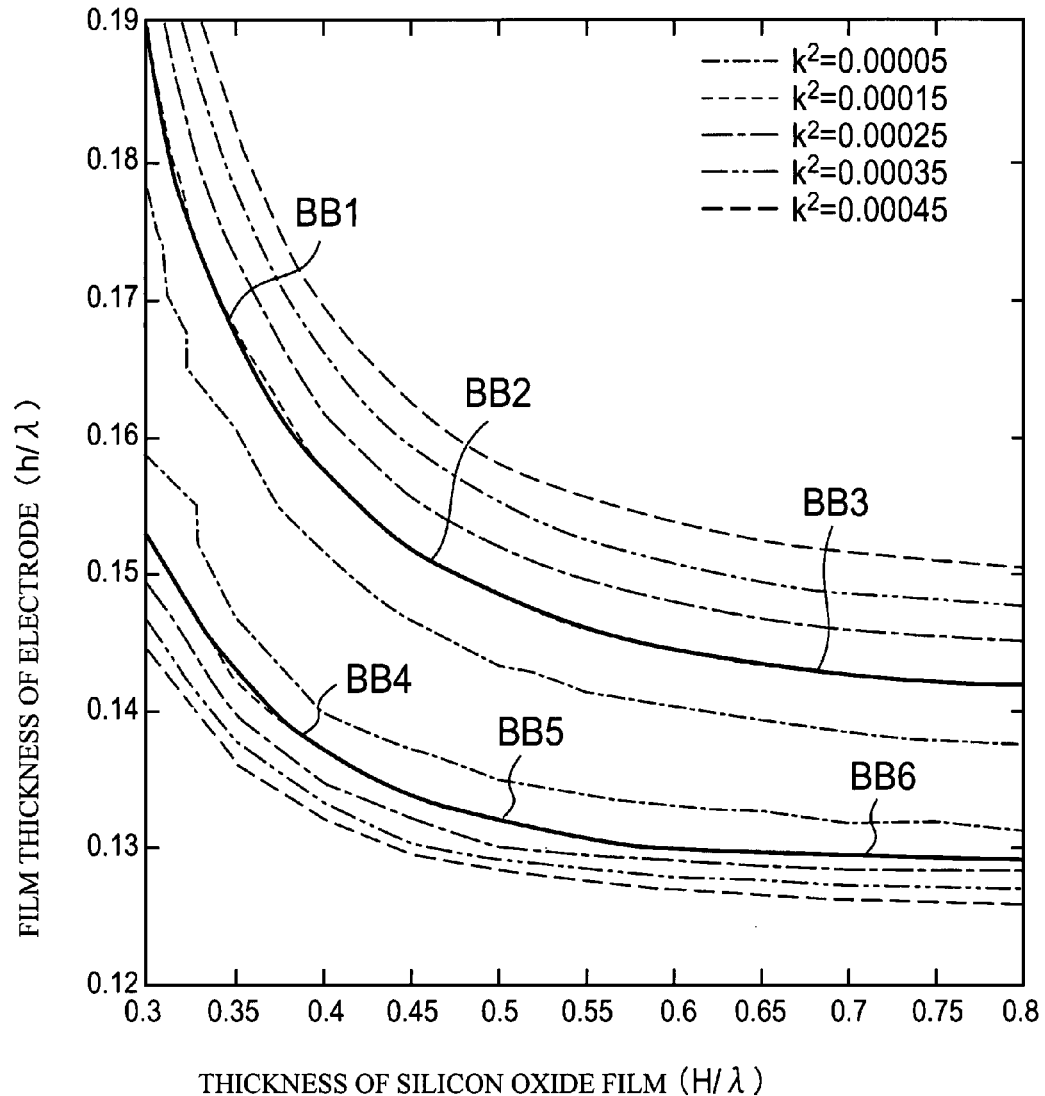
FIG. 62 shows fifty-first simulation results.

As shown in FIG. 62, there are ranges where $k^2$ is equal to or smaller than 0.00015, when $19.5° \leq \theta < 20.5°$ and when $0.3 \leq H/\lambda < 0.4$, $h/(\lambda \cdot a) \leq 2.4 \ (H/\lambda)^2 - 2 \ H/\lambda + 0.574$, when $0.4 \leq H/\lambda < 0.55$, $h/(\lambda \cdot a) \leq 0.4 \ (H/\lambda)^2 - 0.46 \ H/\lambda + 0.278$, and when $0.55 \leq H/\lambda \leq 0.8$, $h/(\lambda \cdot a) \leq 0.0933 \ (H/\lambda)^2 - 0.142 \ H/\lambda + 0.1959$, and additionally, when $0.3 \leq H/\lambda < 0.45$, $h/(\lambda \cdot a) \geq 0.667 \ (H/\lambda)^2 - 0.627 \ H/\lambda + 0.281$, and when $0.45 \leq H/\lambda < 0.575$, $h/(\lambda \cdot a) \geq 0.107 \ (H/\lambda)^2 - 0.141 \ H/\lambda + 0.176$, and when $0.575 \leq H/\lambda \leq 0.8$, $h/(\lambda \cdot a) \geq -0.00444 \ H/\lambda + 0.1326$.

Figure 63:
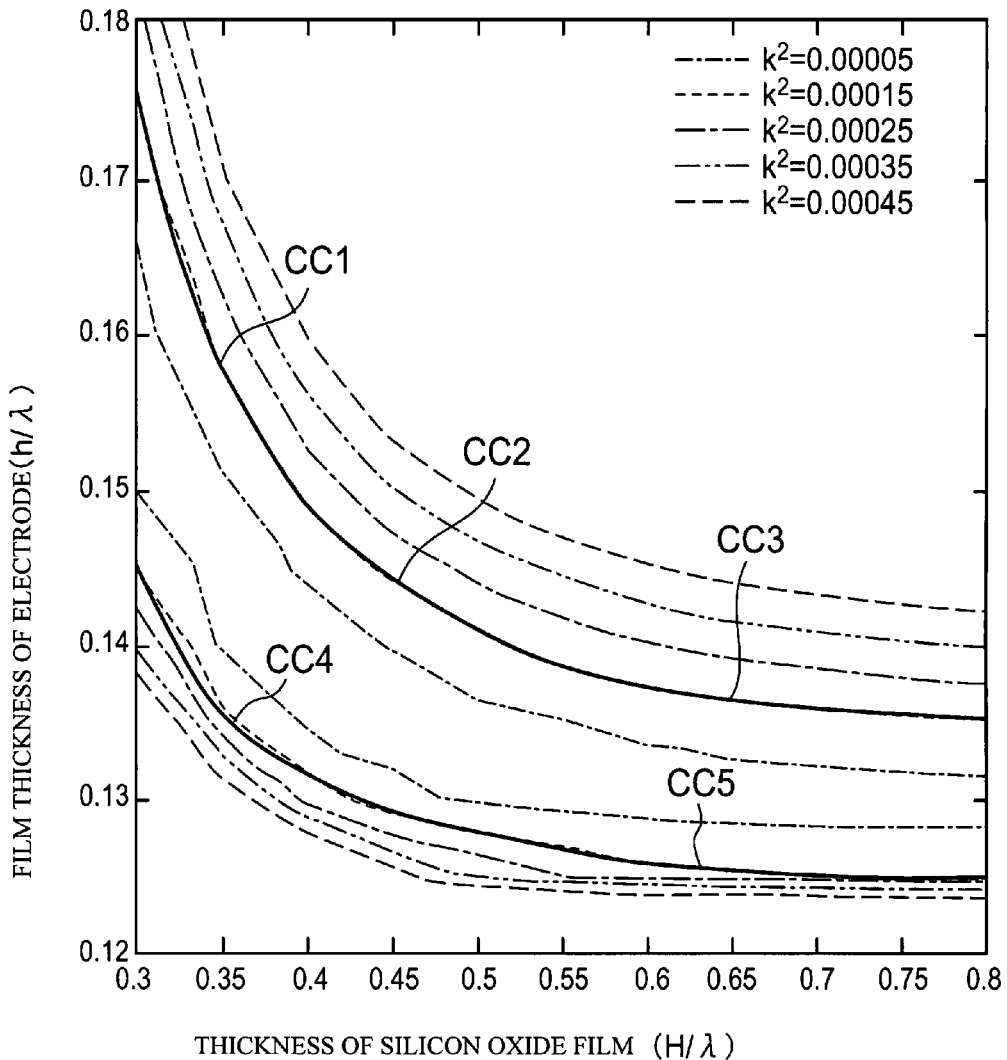
FIG. 63 shows fifty-second simulation results.

As shown in FIG. 63, there are ranges where $k^2$ is equal to or smaller than 0.00015, when $20.5° \leq \theta < 21.5°$ and when $0.3 \leq H/\lambda < 0.4$, $h/(\lambda \cdot a) \leq 2.2 \ (H/\lambda)^2 - 1.83 \ H/\lambda + 0.529$, when $0.4 \leq H/\lambda < 0.52$, $h/(\lambda \cdot a) \leq 0.357 \ (H/\lambda)^2 - 0.404 \ H/\lambda + 0.2533$, and when $0.52 \leq H/\lambda \leq 0.8$, $h/(\lambda \cdot a) \leq 0.0604 \ (H/\lambda)^2 \ 0.0976 \ H/\lambda + 0.1744$, and additionally, when $0.3 \leq H/\lambda < 0.45$, $h/(\lambda \cdot a) \geq 0.733 \ (H/\lambda)^2 - 0.657 \ H/\lambda + 0.276$, and when $0.45 \leq H/\lambda \leq 0.8$, $h/(\lambda \cdot a) \geq 0.04286 \ (H/\lambda)^2 - 0.065 \ H/\lambda + 0.1496$.

Figure 64:
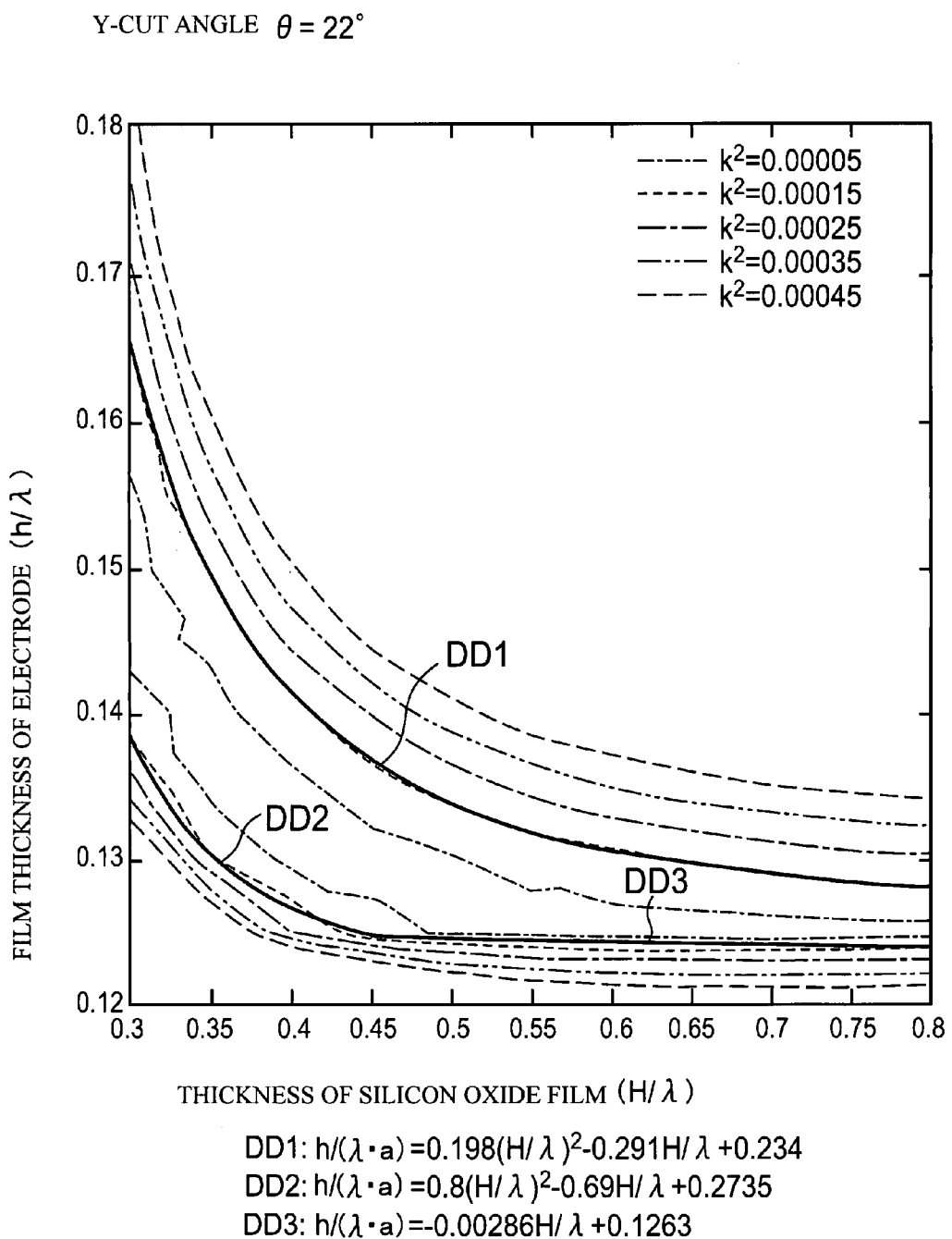
FIG. 64 shows fifty-third simulation results.

As shown in FIG. 64, there are ranges where $k^2$ is equal to or smaller than 0.00015, when $21.5° \leq \theta < 22.5°$ and when $0.3 \leq H/\lambda \leq 0.8$, $h/(\lambda \cdot a) \leq 0.198 \ (H/\lambda)^2 - 0.291 \ H/\lambda + 0.234$, and additionally, when $0.3 \leq H/\lambda \leq 0.45$, $h/(\lambda \cdot a) \geq 0.8 \ (H/\lambda)^2 - 0.69 \ H/\lambda + 0.2735$, and when $0.45 \leq H/\lambda \leq 0.8$, $h/(\lambda \cdot a) \geq -0.00286 \ H/\lambda + 0.1263$.

Figure 65:
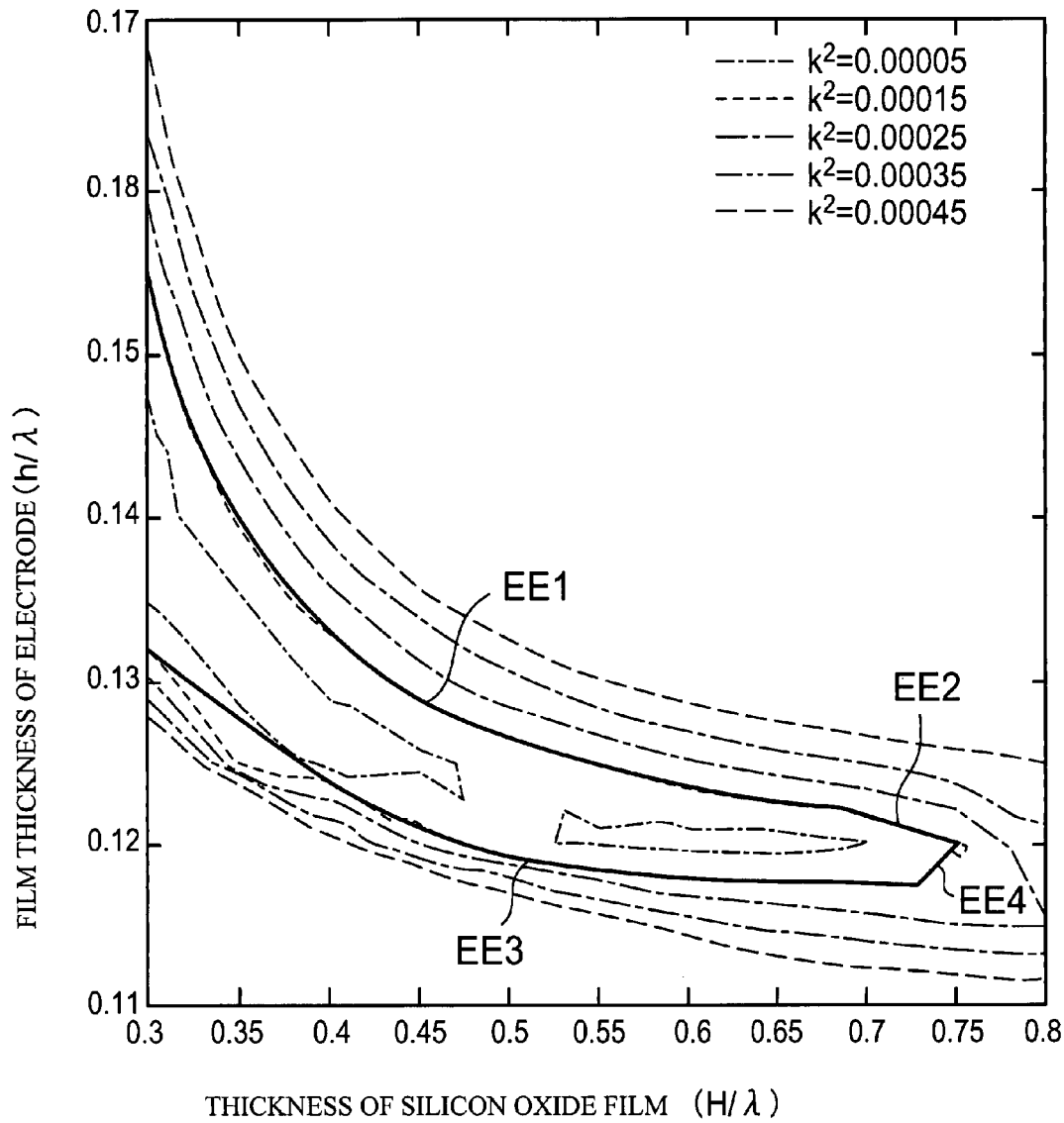
FIG. 65 shows fifty-fourth simulation results.

As shown in FIG. 65, there are ranges where $k^2$ is equal to or smaller than 0.00015, when $22.5° \leq \theta < 23.5°$ and when $0.3 \leq H/\lambda < 0.7$, $h/(\lambda \cdot a) \leq 0.568 \ (H/\lambda)^2 - 0.649 \ H/\lambda + 0.2976$, and when $0.7 \leq H/\lambda < 0.75$, $h/(\lambda \cdot a) \leq -0.03 \ H/\lambda + 0.1425$, and additionally, when $0.3 \leq H/\lambda < 0.73$, $h/(\lambda \cdot a) \geq 0.136 \ (H/\lambda)^2 - 0.174 \ H/\lambda + 0.1719$, and when $0.73 \leq H/\lambda \leq 0.75$, $h/(\lambda \cdot a) \geq 0.125 \ H/\lambda + 0.02625$.

Figure 66:
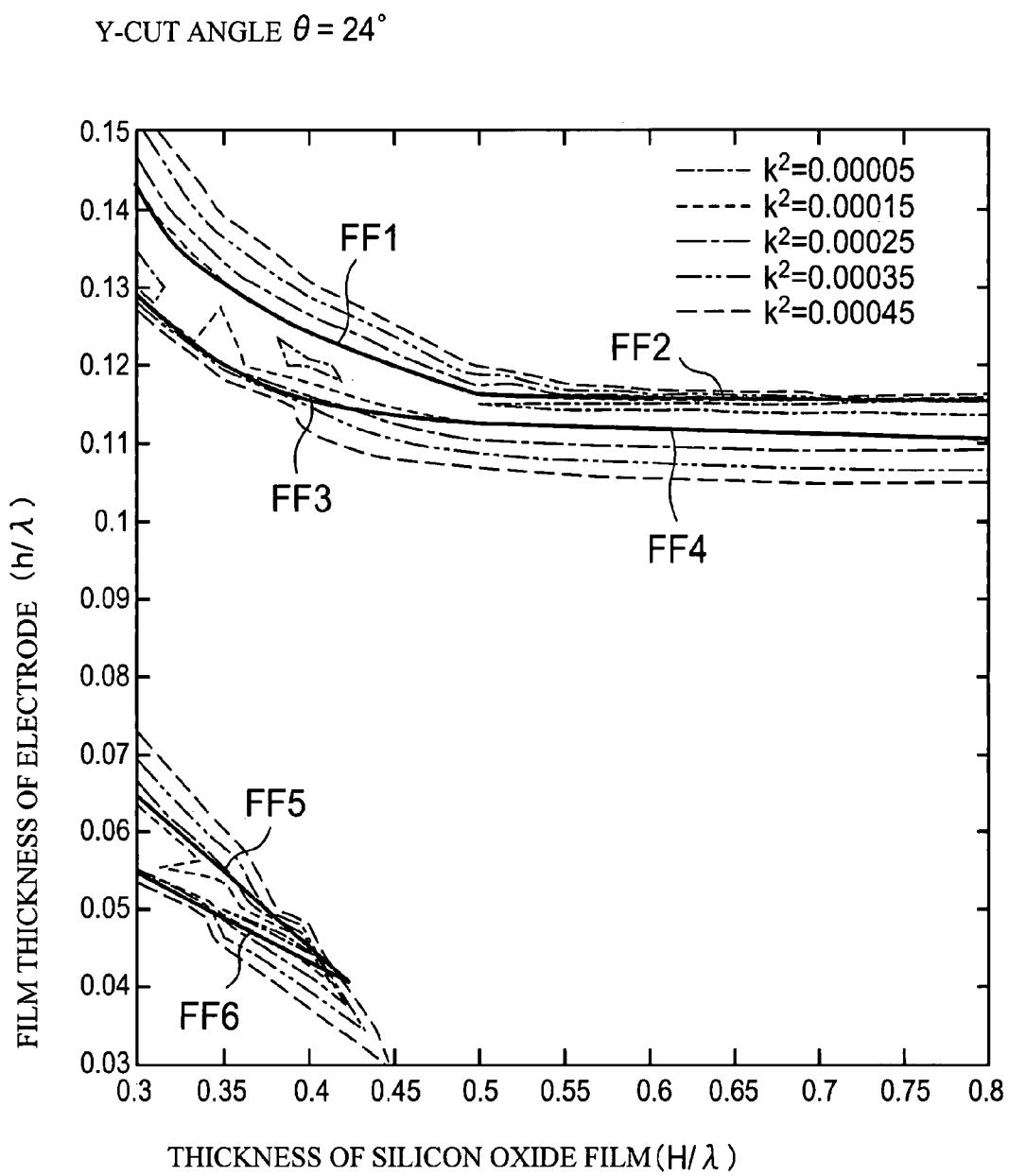
FIG. 66 shows fifty-fifth simulation results.

As shown in FIG. 66, there are ranges where $k^2$ is equal to or smaller than 0.00015, when $23.5° \leq \theta < 24°$ and when $0.3 \leq H/\lambda < 0.5$, $h/(\lambda \cdot a) \leq 0.4 \ (H/\lambda)^2 - 0.46 \ H/\lambda + 0.246$, and when $0.5 \leq H/\lambda \leq 0.8$, $h/(\lambda \cdot a) \leq 0.116$, and additionally, when $0.3 \leq H/\lambda < 0.5$, $h/(\lambda \cdot a) \geq 0.667 \ (H/\lambda)^2 - 0.613 \ H/\lambda + 0.253$, and when $0.5 \leq H/\lambda \leq 0.8$, $h/(\lambda \cdot a) \geq -0.01 \ H/\lambda + 0.118$.

when $23.5° \leq \theta \leq 24°$ and when $0.3 \leq H/\lambda \leq 0.42$, $h/(\lambda \cdot a) \leq -0.208 \ H/\lambda + 0.128$, and additionally, when $0.3 \leq H/\lambda \leq 0.42$, $h/(\lambda \cdot a) \geq -0.125 \ H/\lambda + 0.0925$.

Figure 67:
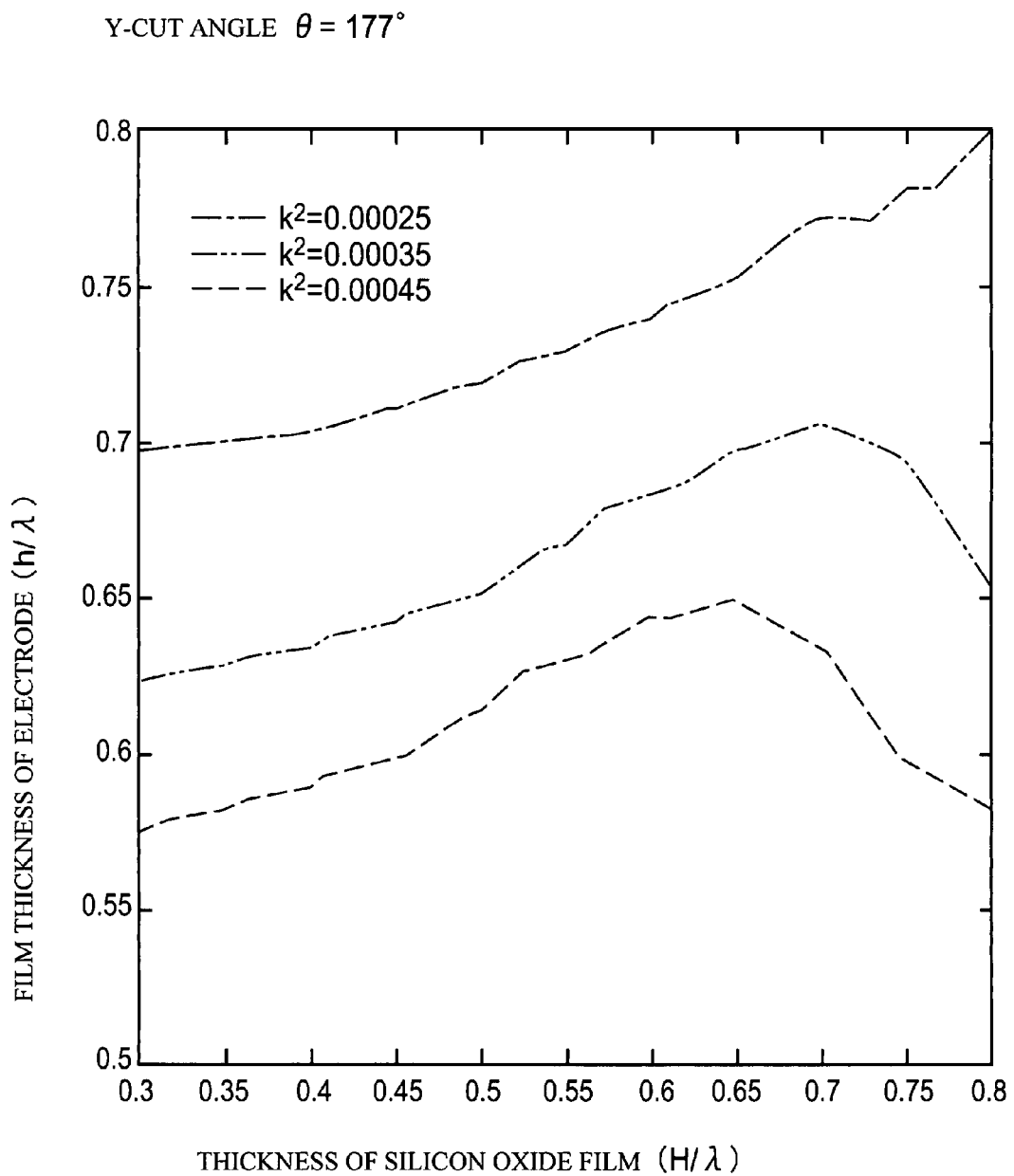
FIG. 67 shows fifty-sixth simulation results.

As shown in FIG. 67, there is no range where $k^2$ is equal to or smaller than 0.00015, when $\theta = 177°$.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-053486 filed on Feb. 28, 2006 and Japanese Patent Application No. 2007-017473 filed on Jan. 29, 2007, the entire disclosure of which is hereby incorporated by reference.

What is claimed is:

1. An elastic boundary wave device comprising:

a $LiNbO_3$ substrate;

an electrode exciting an elastic wave and provided on the substrate; and a silicon oxide film provided on the substrate to cover the electrode, wherein parameters of the elastic boundary wave device have any one of ranges below, where "θ" is a rotation Y cut angle of the substrate, "a" is a ratio of copper density with respect to a density of a material used as the electrode, "λ" is a wavelength of the elastic wave excited by the electrode, "h" is a film thickness of the electrode, "H" is a thickness of the silicon oxide film:

when $0.045\lambda/a \leq h < 0.0525\lambda/a$, and when $25° \leq \theta < 26.5°$, $0.39\lambda \leq H < 0.46\lambda$, when $26.5° \leq \theta < 27.5°$, $0.41\lambda \leq H < 0.48\lambda$, when $27.5° \leq \theta < 28.5°$, $0.42\lambda \leq H < 0.51\lambda$, when $28.5° \leq \theta < 29.5°$, $0.43\lambda \leq H < 0.53\lambda$, when $29.5° \leq \theta < 30.5°$, $0.45\lambda \leq H < 0.56\lambda$, when $30.5° \leq \theta < 31.5°$, $0.46\lambda \leq H < 0.58\lambda$, when $31.5° \leq \theta < 32.5°$, $0.47\lambda \leq H < 0.61\lambda$, when $32.5° \leq \theta < 33.5°$, $0.48\lambda \leq H < 0.64\lambda$, when $33.5° \leq \theta < 35°$, $0.48\lambda \leq H < 0.67\lambda$, when $35° \leq \theta < 37.5°$, $0.5\lambda \leq H < 0.74\lambda$, when 37.5°≦θ<42°, 0.52λ≦H<0.8λ,
when 42°≦θ<57°, 0.55λ≦H<0.8λ,
when 57°≦θ<63°, 0.51λ≦H<0.8λ,
when 63°≦θ<69°, 0.46λ≦H<0.8λ,
when 69°≦θ<75°, 0.39λ≦H<0.8λ,
when 75°≦θ<99°, 0.3λ≦H<0.8λ, and
when 99°≦θ<105°, 0.58λ≦H<0.8λ,
when 0.0525λ/a≦h<0.065λ/a and
    when 24°≦θ<25°, 0.3λ≦H<0.32λ,
    when 25°≦θ<26.5°, 0.3λ≦H<0.37λ,
    when 26.5°≦θ<27.5°, 0.33λ≦H<0.38λ,
    when 27.5°≦θ<28.5°, 0.34λ≦H<0.41λ,
    when 28.5°≦θ<29.5°, 0.37λ≦H<0.43λ,
    when 29.5°≦θ<30.5°, 0.39λ≦H<0.44λ,
    when 30.5°≦θ<31.5°, 0.42λ≦H<0.47λ,
    when 31.5°≦θ<32.5°, 0.44λ≦H<0.48λ,
    when 32.5°≦θ<33.5°, 0.47λ≦H<0.49λ,
    when 33.5°≦θ<34.5°, 0.47λ≦H<0.51λ,
    when 34.5°≦θ<35.5°, 0.48λ≦H<0.57λ,
    when 35.5°≦θ<36.5°, 0.5λ≦H<0.62λ,
    when 36.5°≦θ<38°, 0.52λ≦H<0.67λ,
    when 38°≦θ<40.5°, 0.54λ≦H<0.79λ,
    when 40.5°≦θ<43.5°, 0.58λ≦H<0.8λ,
    when 43.5°≦θ<46.5°, 0.61λ≦H<0.8λ,
    when 46.5°≦θ<51°, 0.64λ≦H<0.8λ,
    when 51°≦θ<57°, 0.69λ≦H<0.8λ, and
    when 57°≦θ<63°, 0.78λ≦H<0.8λ,
when 0.065λ/a≦h<0.0725λ/a and
    when 25.5°≦θ<26.5°, 0.3λ≦H<0.32λ,
    when 26.5°≦θ<27.5°, 0.3λ≦H<0.36λ,
    when 27.5°≦θ<28.5°, 0.3λ≦H<0.38λ,
    when 28.5°≦θ<29.5°, 0.32λ≦H<0.43λ,
    when 29.5°≦θ<30.5°, 0.34λ≦H<0.46λ,
    when 30.5°≦θ<31.5°, 0.36λ≦H<0.5λ,
    when 31.5°≦θ<32.5°, 0.39λ≦H<0.55λ,
    when 32.5°≦θ<33.5°, 0.43λ≦H<0.6λ,
    when 33.5°≦θ<35°, 0.46λ≦H<0.66λ,
    when 35°≦θ<36.5°, 0.54λ≦H<0.8λ,
    when 36.5°≦θ<37.5°, 0.59λ≦H<0.8λ,
    when 37.5°≦θ<38.5°, 0.65λ≦H<0.8λ, and
    when 38.5°≦θ<39°, 0.73λ≦H<0.8λ,
when 0.0725λ/a≦h<0.0775λ/a and
    when 26.5°≦θ<27.5°, 0.3λ≦H<0.35λ,
    when 27.5°≦θ<28.5°, 0.3 λ≦H<0.39λ,
    when 28.5°≦θ<29.5°, 0.3λ≦H<0.43λ,
    when 29.5°≦θ<30.5°, 0.33λ≦H<0.49λ,
    when 30.5°≦θ<31.5°, 0.35λ≦H<0.56λ,
    when 31.5°≦θ<32.5°, 0.39λ≦H<0.63λ,
    when 32.5°≦θ<33.5°, 0.43λ≦H<0.75λ,
    when 33.5°≦θ<34.5°, 0.47λ≦H<0.8λ,
    when 34.5°≦θ<35.5°, 0.52λ≦H<0.8λ,
    when 35.5°≦θ<36.5°, 0.57λ≦H<0.8λ,
    when 36.5°≦θ≦37.5°, 0.63λ≦H<0.8λ, and
    when 37.5°≦θ<38.5°, 0.72λ≦H<0.8λ,
when 0.0775λ/a≦h<0.0825λ/a and
    when 26.5°≦θ<27.5°, 0.3λ≦H<0.34λ,
    when 27.5°≦θ<28.5°, 0.3λ≦H<0.41λ,
    when 28.5°≦θ<29.5°, 0.3λ≦H<0.47λ,
    when 29.5°≦θ<30.5°, 0.32λ≦H<0.56λ,
    when 30.5°≦θ<31.5°, 0.36λ≦H<0.69λ,
    when 31.5°≦θ<32.5°, 0.39λ≦H<0.8λ,
    when 32.5°≦θ<33.5°, 0.44λ≦H<0.8λ,
    when 33.5°≦θ<35°, 0.5λ≦H<0.8λ,
    when 35°≦θ<36.5°, 0.65λ≦H<0.8λ, and
    when 36.5°≦θ<38°, 0.77λ≦H<0.8λ,
when 0.0825λ/a≦h<0.0875λ/a and
    when 26.5°≦θ<27.5°, 0.3λ≦H<0.36λ,
    when 27.5°≦θ<28.5°, 0.3λ≦H<0.44λ,
    when 28.5°≦θ<29.5°, 0.3λ≦H<0.57λ,
    when 29.5°≦θ<30.5°, 0.32λ≦H<0.8λ,
    when 30.5°≦θ<31.5°, 0.37λ≦H<0.8λ,
    when 31.5°≦θ<32.5°, 0.43λ≦H<0.8λ,
    when 32.5°≦θ<33.5°, 0.51λ≦H<0.8λ,
    when 33.5°≦θ<34.5°, 0.59λ≦H<0.8λ, and
    when 34.5°≦θ<35.5°, 0.72λ≦H<0.8 λ.
when 0.0875λ/a≦h<0.0925λ/a and
    when 26.5°≦θ<27.5°, 0.3λ≦H<0.39λ,
    when 27.5°≦θ<28.5°, 0.3λ≦H<0.58λ,
    when 28.5°≦θ<29.5°, 0.3λ≦H<0.8λ,
    when 29.5°≦θ<30.5°, 0.33λ≦H<0.8λ,
    when 30.5°≦θ<31.5°, 0.43λ≦H<0.8λ,
    when 31.5°≦θ<32.5°, 0.53λ≦H<0.8λ, and
    when 32.5°≦θ<33.5°, 0.67λ≦H<0.8λ,
when 0.0925λ/a≦h<0.0975λ/a and
    when 26.5°≦θ<27.5°, 0.3λ≦H<0.63λ,
    when 27.5°≦θ<28.5°, 0.3λ≦H<0.8λ,
    when 28.5°≦θ<29.5°, 0.3λ≦H<0.8λ,
    when 29.5°≦θ<30.5°, 0.42λ≦H<0.8λ, and
    when 30.5°≦θ<31.5°, 0.6λ≦H<0.8λ,
when 0.0975λ/a≦h<0.1025λ/a and
    when 25.5°≦θ<26.5°, 0.32λ≦H<0.7λ,
    when 26.5°≦θ<27.5°, 0.3λ≦H<0.8λ,
    when 27.5°≦θ<28.5°, 0.3λ≦H<0.8λ, and
    when 28.5°≦θ<29.5°, 0.45λ≦H<0.8λ,
when 0.1025λ/a≦h<0.1125λ/a and
    when 24.5°≦θ<25.5°, 0.6λ≦H<0.8λ,
    when 25.5°≦θ<26.5°, 0.3λ≦H<0.8λ,
    when 26.5°≦θ<27.5°, 0.3λ≦H<0.8λ, and
    when 27.5°≦θ<28.5°, 0.3λ≦H<0.33λ and
    0.64λ≦H<0.8λ, and
when 0.1125λ/a≦h<0.12λ/a and
    when 22.5°≦θ<23.5°, 0.47λ≦H<0.76λ, and
    when 23.5°≦θ<24.5°, 0.36λ≦H<0.45 λ.

2. An elastic boundary wave device comprising:
a LiNbO$_3$ substrate;
an electrode exciting an elastic wave and provided on the substrate; and
a silicon oxide film provided on the substrate to cover the electrode,
wherein parameters of the elastic boundary wave device have any one of ranges below, where "θ" is a rotation Y cut angle of the substrate, "a" is a ratio of copper density with respect to a density of a material used as the electrode, "λ" is a wavelength of the elastic wave excited by the electrode, "h" is a film thickness of the electrode, "H" is a thickness of the silicon oxide film:
when 0°≦θ<0.5° and
    when 0.6≦H/λ<0.8, h/(λ·a)≦H/λ, and additionally,
    when 0.6≦H/λ<0.625, h/(λ·a)≧−2 H/λ+1.8, and
    when 0.625≦H/λ<0.8, h/(λ·a)≧1.543 (H/λ)$^2$−2.484 H/λ+1.5,
when 0.5°≦θ<2° and
    when 0.508≦H/λ<0.8, h/(λ·a)≦H/λ, and additionally,
    when 0.508≦H/λ<0.531, h/(λ·a)≧−0.3478 H/λ+0.6847,
    when 0.531≦H/λ<0.6, h/(λ·a)≧−0.6087 H/λ+0.8232, and
    when 0.6≦H/λ<0.8, h/(λ·a)≧0.6 (H/λ)$^2$−0.98 H/λ+0.83,
when 2°≦θ<4.5° and
    when 0.45≦H/λ<0.8, h/(λ·a)≦H/λ, and additionally,
    when 0.45≦H/λ<0.5, h/(λ·a)≧28.998 (H/λ)$^2$−29.088 H/λ+7.668,
    when 0.5≦H/λ<0.65, h/(λ·a)≧1.6 (H/λ)$^2$−2.06 H/λ+1.003, and
    when 0.65≦H/λ<0.8, h/(λ·a)≧−0.0733 H/λ+0.3877,
when 4.5°≦θ<7.5° and when $0.3625 \leq H/\lambda < 0.496$, $h/(\lambda \cdot a) \leq H/\lambda$,
when $0.496 \leq H/\lambda < 0.55$, $h/(\lambda \cdot a) \leq -0.111\ H/\lambda + 0.5511$,
when $0.55 \leq H/\lambda < 0.65$, $h/(\lambda \cdot a) \leq 3.4\ (H/\lambda)^2 - 4.45\ H/\lambda + 1.909$,
when $0.65 \leq H/\lambda < 0.7$, $h/(\lambda \cdot a) \leq -0.06\ H/\lambda + 0.492$, and
when $0.7 \leq H/\lambda \leq 0.8$, $h/(\lambda \cdot a) \leq 0.45$, and additionally,
when $0.3625 \leq H/\lambda < 0.3875$, $h/(\lambda \cdot a) \geq -0.46\ H/\lambda + 0.5293$,
when $0.3875 \leq H/\lambda < 0.4$, $h/(\lambda \cdot a) \geq -2.96\ H/\lambda + 1.498$,
when $0.4 \leq H/\lambda < 0.45$, $h/(\lambda \cdot a) \geq -0.58\ H/\lambda + 0.546$,
when $0.45 \leq H/\lambda < 0.6$, $h/(\lambda \cdot a) \geq 1.2667\ (H/\lambda)^2 - 1.503\ H/\lambda + 0.705$, and
when $0.6 \leq H/\lambda \leq 0.8$, $h/(\lambda \cdot a) \geq -0.04\ H/\lambda + 0.283$,
when $7.5° \leq \theta < 9.5°$ and
when $0.315 \leq H/\lambda < 0.406$, $h/(\lambda \cdot a) \leq H/\lambda$,
when $0.406 \leq H/\lambda < 0.419$, $h/(\lambda \cdot a) \leq -1.077\ H/\lambda + 0.8432$,
when $0.419 \leq H/\lambda < 0.45$, $h/(\lambda \cdot a) \leq 61.7512\ (H/\lambda)^2 - 55.565\ H/\lambda + 12.8326$,
when $0.45 \leq H/\lambda < 0.6$, $h/(\lambda \cdot a) \leq 1.8667\ (H/\lambda)^2 - 2.233\ H/\lambda + 0.96$, and
when $0.6 \leq H/\lambda \leq 0.8$, $h/(\lambda \cdot a) \leq 0.2\ (H/\lambda)^2 - 0.32\ H/\lambda + 0.412$, and additionally,
when $0.315 \leq H/\lambda < 0.342$, $h/(\lambda \cdot a) \geq -0.5556\ H/\lambda + 0.49$,
when $0.342 \leq H/\lambda < 0.35$, $h/(\lambda \cdot a) \geq -3.75\ H/\lambda + 1.5825$,
when $0.35 \leq H/\lambda < 0.4$, $h/(\lambda \cdot a) \geq -0.6\ H/\lambda + 0.48$,
when $0.4 \leq H/\lambda < 0.55$, $h/(\lambda \cdot a) \geq 1.133\ (H/\lambda)^2 - 1.243\ H/\lambda + 0.556$, and
when $0.55 \leq H/\lambda \leq 0.8$, $h/(\lambda \cdot a) \geq 0.1067\ (H/\lambda)^2 - 0.18\ H/\lambda + 0.2817$,
when $9.5° \leq \theta < 10.5°$ and
when $0.31 \leq H/\lambda < 0.37$, $h/(\lambda \cdot a) \leq H/\lambda$,
when $0.37 \leq H/\lambda < 0.383$, $h/(\lambda \cdot a) \leq 0.37$,
when $0.383 \leq H/\lambda < 0.392$, $h/(\lambda \cdot a) \leq -1.111\ H/\lambda + 0.7956$,
when $0.392 \leq H/\lambda < 0.4$, $h/(\lambda \cdot a) \leq -2.5\ H/\lambda + 1.34$,
when $0.4 \leq H/\lambda < 0.45$, $h/(\lambda \cdot a) \leq 12\ (H/\lambda)^2 - 11.1\ H/\lambda + 2.86$,
when $0.45 \leq H/\lambda < 0.5$, $h/(\lambda \cdot a) \leq 3.2\ (H/\lambda)^2 - 3.36\ H/\lambda + 1.159$,
when $0.5 \leq H/\lambda < 0.61$, $h/(\lambda \cdot a) \leq 0.5455\ (H/\lambda)^2 - 0.7327\ H/\lambda + 0.509$, and
when $0.61 \leq H/\lambda \leq 0.8$, $h/(\lambda \cdot a) \leq 0.08848\ (H/\lambda)^2 - 0.1616\ H/\lambda + 0.3307$, and additionally,
when $0.31 \leq H/\lambda < 0.331$, $h/(\lambda \cdot a) \geq -0.4762\ H/\lambda + 0.4576$,
when $0.331 \leq H/\lambda < 0.35$, $h/(\lambda \cdot a) \geq -2.632\ H/\lambda + 1.171$,
when $0.35 \leq H/\lambda < 0.4$, $h/(\lambda \cdot a) \geq -0.5\ H/\lambda + 0.425$,
when $0.4 \leq H/\lambda < 0.5$, $h/(\lambda \cdot a) \geq (H/\lambda)^2 - 1.09 H/\lambda + 0.501$, and
when $0.5 \leq H/\lambda \leq 0.8$, $h/(\lambda \cdot a) \geq 0.1\ (H/\lambda)^2 - 0.17 H/\lambda + 0.266$,
when $10.5° \leq \theta < 11.5°$ and
when $0.304 \leq H/\lambda < 0.36$, $h/(\lambda \cdot a) \leq H/\lambda$,
when $0.36 \leq H/\lambda < 0.3625$, $h/(\lambda \cdot a) \leq -4\ H/\lambda + 1.8$,
when $0.3625 \leq H/\lambda < 0.375$, $h/(\lambda \cdot a) \leq -0.8\ H/\lambda + 0.64$,
when $0.375 \leq H/\lambda < 0.4$, $h/(\lambda \cdot a) \leq 80.702\ (H/\lambda)^2 - 64.344\ H/\lambda + 13.120$,
when $0.4 \leq H/\lambda < 0.5$, $h/(\lambda \cdot a) \leq 3\ (H/\lambda)^2 - 3.091\ H/\lambda + 1.051$,
when $0.5 \leq H/\lambda < 0.7$, $h/(\lambda \cdot a) \leq 0.4\ (H/\lambda)^2 - 0.56\ H/\lambda + 0.436$, and
when $0.7 \leq H/\lambda \leq 0.8$, $h/(\lambda \cdot a) \leq -0.02\ H/\lambda + 0.254$, and additionally,
when $0.304 \leq H/\lambda < 0.329$, $h/(\lambda \cdot a) \geq -0.56\ H/\lambda + 0.474$,
when $0.329 \leq H/\lambda < 0.331$, $h/(\lambda \cdot a) \geq -15\ H/\lambda + 5.225$,
when $0.331 \leq H/\lambda < 0.35$, $h/(\lambda \cdot a) \geq -1.579\ H/\lambda + 0.7826$,
when $0.35 \leq H/\lambda < 0.4$, $h/(\lambda \cdot a) \geq -0.4\ H/\lambda + 0.37$,
when $0.4 \leq H/\lambda < 0.575$, $h/(\lambda \cdot a) \geq 0.4762\ (H/\lambda)^2 - 0.5786\ H/\lambda + 0.3652$, and
when $0.575 \leq H/\lambda \leq 0.8$, $h/(\lambda \cdot a) \geq 0.0381\ (H/\lambda)^2 - 0.07905\ H/\lambda + 0.2229$,
when $11.5° \leq \theta < 12.5°$, and
when $0.3 \leq H/\lambda < 0.35$, $h/(\lambda \cdot a) \leq H/\lambda$,
when $0.35 \leq H/\lambda < 0.358$, $h/(\lambda \cdot a) \leq -1.25\ H/\lambda + 0.7875$,
when $0.358 \leq H/\lambda < 0.3625$, $h/(\lambda \cdot a) \leq -6.667\ H/\lambda + 2.7267$,
when $0.3625 \leq H/\lambda < 0.4$, $h/(\lambda \cdot a) \leq 27.781\ (H/\lambda)^2 - 22.3379\ H/\lambda + 4.7569$,
when $0.4 \leq H/\lambda < 0.5$, $h/(\lambda \cdot a) \leq 2.18\ (H/\lambda)^2 - 2.271\ H/\lambda + 0.8263$,
when $0.5 \leq H/\lambda < 0.65$, $h/(\lambda \cdot a) \leq 0.44\ (H/\lambda)^2 - 0.578\ H/\lambda + 0.4148$, and
when $0.65 \leq H/\lambda \leq 0.8$, $h/(\lambda \cdot a) \leq -0.02667\ H/\lambda + 0.2423$, and additionally,
when $0.3 \leq H/\lambda < 0.308$, $h/(\lambda \cdot a) \geq -0.5\ H/\lambda + 0.45$,
when $0.308 \leq H/\lambda < 0.35$, $h/(\lambda \cdot a) \geq 25.1541\ (H/\lambda)^2 - 18.099\ H/\lambda + 3.4683$,
when $0.35 \leq H/\lambda < 0.45$, $h/(\lambda \cdot a) \geq 1.8\ (H/\lambda)^2 - 1.69\ H/\lambda + 0.586$,
when $0.45 \leq H/\lambda < 0.6$, $h/(\lambda \cdot a) \geq 0.3333\ (H/\lambda)^2 - 0.4167\ H/\lambda + 0.31$, and
when $0.6 \leq H/\lambda \leq 0.8$, $h/(\lambda \cdot a) \geq -0.02\ H/\lambda + 0.192$,
when $12.5° \leq \theta < 13.5°$ and
when $0.3 \leq H/\lambda < 0.32$, $h/(\lambda \cdot a) \leq H/\lambda$,
when $0.32 \leq H/\lambda < 0.35$, $h/(\lambda \cdot a) \leq -H/\lambda + 0.64$,
when $0.35 \leq H/\lambda < 0.373$, $h/(\lambda \cdot a) \leq -1.3044\ H/\lambda + 0.7465$,
when $0.373 \leq H/\lambda < 0.4$, $h/(\lambda \cdot a) \leq -0.6296\ H/\lambda + 0.4949$,
when $0.4 \leq H/\lambda < 0.5$, $h/(\lambda \cdot a) \leq 1.6\ (H/\lambda)^2 - 1.66\ H/\lambda + 0.651$,
when $0.5 \leq H/\lambda < 0.65$, $h/(\lambda \cdot a) \leq 0.4667\ (H/\lambda)^2 - 0.61\ H/\lambda + 0.4093$, and
when $0.65 \leq H/\lambda \leq 0.8$, $h/(\lambda \cdot a) \leq -0.02\ H/\lambda + 0.223$, and additionally,
when $0.3 \leq H/\lambda < 0.35$, $h/(\lambda \cdot a) \geq -0.8\ H/\lambda + 0.48$,
when $0.35 \leq H/\lambda < 0.45$, $h/(\lambda \cdot a) \geq -0.2\ H/\lambda + 0.27$,
when $0.45 \leq H/\lambda < 0.625$, $h/(\lambda \cdot a) \geq 0.09524\ (H/\lambda)^2 - 0.1595\ H/\lambda + 0.2325$, and
when $0.65 \leq H/\lambda \leq 0.8$, $h/(\lambda \cdot a) \geq -0.01143\ H/\lambda + 0.1771$,
when $13.5° \leq \theta < 14.5°$ and
when $0.3 \leq H/\lambda < 0.318$, $h/(\lambda \cdot a) \leq H/\lambda$,
when $0.318 \leq H/\lambda < 0.325$, $h/(\lambda \cdot a) \leq -4\ H/\lambda + 1.59$,
when $0.325 \leq H/\lambda < 0.4$, $h/(\lambda \cdot a) \leq 6.933\ (H/\lambda)^2 - 5.88\ H/\lambda + 1.4687$,
when $0.4 \leq H/\lambda < 0.585$, $h/(\lambda \cdot a) \leq 0.6618\ (H/\lambda)^2 - 0.7924\ H/\lambda + 0.437$, and
when $0.585 \leq H/\lambda \leq 0.8$, $h/(\lambda \cdot a) \leq 0.11527\ (H/\lambda)^2 - 0.1829\ H/\lambda + 0.2676$, and additionally,
when $0.3 \leq H/\lambda < 0.35$, $h/(\lambda \cdot a) \geq -0.6\ H/\lambda + 0.4$,
when $0.35 \leq H/\lambda < 0.475$, $h/(\lambda \cdot a) \geq 0.8\ (H/\lambda)^2 - 0.82\ H/\lambda + 0.379$,
when $0.475 \leq H/\lambda < 0.65$, $h/(\lambda \cdot a) \geq 0.2095\ (H/\lambda)^2 - 0.2814\ H/\lambda + 0.2564$, and
when $0.65 \leq H/\lambda \leq 0.8$, $h/(\lambda \cdot a) \geq -0.0133\ H/\lambda + 0.1707$,
when $14.5° \leq \theta < 15.5°$ and
when $0.3 \leq H/\lambda < 0.304$, $h/(\lambda \cdot a) \leq H/\lambda$,
when $0.304 \leq H/\lambda < 0.308$, $h/(\lambda \cdot a) \leq -1.25\ H/\lambda + 0.685$,
when $0.308 \leq H/\lambda < 0.321$, $h/(\lambda \cdot a) \leq -2.308\ H/\lambda + 1.011$,
when $0.321 \leq H/\lambda < 0.375$, $h/(\lambda \cdot a) \leq 11.239\ (H/\lambda)^2 - 8.748\ H/\lambda + 1.920$,
when $0.375 \leq H/\lambda < 0.5$, $h/(\lambda \cdot a) \leq 1.1733\ (H/\lambda)^2 - 1.2347\ H/\lambda + 0.518$,
when $0.5 \leq H/\lambda < 0.65$, $h/(\lambda \cdot a) \leq 0.267\ (H/\lambda)^2 - 0.36\ H/\lambda + 0.3073$, and
when $0.65 \leq H/\lambda \leq 0.8$, $h/(\lambda \cdot a) \leq -0.01333\ H/\lambda + 0.1947$, and additionally,
when $0.3 \leq H/\lambda < 0.35$, $h/(\lambda \cdot a) \geq -0.5\ H/\lambda + 0.355$,
when $0.35 \leq H/\lambda < 0.4$, $h/(\lambda \cdot a) \geq -0.2\ H/\lambda + 0.25$,
when $0.4 \leq H/\lambda < 0.5$, $h/(\lambda \cdot a) \geq -0.1\ H/\lambda + 0.21$,
when $0.5 \leq H/\lambda < 0.7$, $h/(\lambda \cdot a) \geq -0.03\ H/\lambda + 0.175$, and
when $0.7 \leq H/\lambda \leq 0.8$, $h/(\lambda \cdot a) \geq 0.154$,
when $15.5° \leq \theta < 16.5°$ and
when $0.3 \leq H/\lambda < 0.308$, $h/(\lambda \cdot a) \leq -1.25\ H/\lambda + 0.675$,
when $0.308 \leq H/\lambda < 0.311$, $h/(\lambda \cdot a) \leq -10\ H/\lambda + 3.37$, when $0.311 \leq H/\lambda < 0.321$, $h/(\lambda \cdot a) \leq -2\ H/\lambda + 0.882$, when $0.321 \leq H/\lambda < 0.4$, $h/(\lambda \cdot a) \leq 5.9188\ (H/\lambda)^2 - 4.799\ H/\lambda + 1.171$, when $0.4 \leq H/\lambda < 0.55$, $h/(\lambda \cdot a) \leq 0.711\ (H/\lambda)^2 - 0.7956\ H/\lambda + 0.4024$, when $0.55 \leq H/\lambda \leq 0.8$, $h/(\lambda \cdot a) \leq 0.128\ (H/\lambda)^2 - 0.197\ H/\lambda + 0.2495$, and additionally, when $0.3 \leq H/\lambda < 0.35$, $h/(\lambda \cdot a) \geq -0.4\ H/\lambda + 0.31$, when $0.35 \leq H/\lambda < 0.5$, $h/(\lambda \cdot a) \geq 0.3556\ (H/\lambda)^2 - 0.4089\ H/\lambda + 0.2696$, and when $0.5 \leq H/\lambda \leq 0.8$, $h/(\lambda \cdot a) \geq 0.08762\ (H/\lambda)^2 - 0.1306\ H/\lambda + 0.1974$, when $16.5° \leq \theta < 17.5°$ and when $0.3 \leq H/\lambda < 0.4$, $h/(\lambda \cdot a) \leq 8.6\ (H/\lambda)^2 - 6.75\ H/\lambda + 1.511$, when $0.4 \leq H/\lambda < 0.55$, $h/(\lambda \cdot a) \leq 0.467\ (H/\lambda)^2 - 0.557\ H/\lambda + 0.335$, and when $0.55 \leq H/\lambda \leq 0.8$, $h/(\lambda \cdot a) \leq 0.0667\ (H/\lambda)^2 - 0.11\ H/\lambda + 0.2103$, and additionally, when $0.3 \leq H/\lambda < 0.45$, $h/(\lambda \cdot a) \geq 1.133\ (H/\lambda)^2 - 1.043\ H/\lambda + 0.391$, when $0.45 \leq H/\lambda < 0.6$, $h/(\lambda \cdot a) \geq 0.133\ (H/\lambda)^2 - 0.183\ H/\lambda + 0.2065$, and when $0.6 \leq H/\lambda \leq 0.8$, $h/(\lambda \cdot a) \geq -0.0075\ H/\lambda + 0.149$, when $17.5° \leq \theta < 18.5°$ and when $0.3 \leq H/\lambda < 0.4$, $h/(\lambda \cdot a) \leq 4\ (H/\lambda)^2 - 3.28\ H/\lambda + 0.848$, when $0.4 \leq H/\lambda < 0.55$, $h/(\lambda \cdot a) \leq 0.467\ (H/\lambda)^2 - 0.537\ H/\lambda + 0.316$, and when $0.55 \leq H/\lambda \leq 0.8$, $h/(\lambda \cdot a) \leq 0.1\ (H/\lambda)^2 - 0.155\ H/\lambda + 0.217$, and additionally, when $0.3 \leq H/\lambda < 0.45$, $h/(\lambda \cdot a) \geq 0.867\ (H/\lambda)^2 - 0.817\ H/\lambda + 0.337$, when $0.45 \leq H/\lambda < 0.55$, $h/(\lambda \cdot a) \geq -0.05\ H/\lambda + 0.1675$, and when $0.55 \leq H/\lambda \leq 0.8$, $h/(\lambda \cdot a) \geq 0.008\ H/\lambda + 0.1444$, when $18.5° \leq \theta < 19.5°$ and when $0.3 \leq H/\lambda < 0.4$, $h/(\lambda \cdot a) \leq 2.8\ (H/\lambda)^2 - 2.34\ H/\lambda + 0.655$, when $0.4 \leq H/\lambda < 0.55$, $h/(\lambda \cdot a) \leq 0.467\ (H/\lambda)^2 - 0.537\ H/\lambda + 0.307$, and when $0.55 \leq H/\lambda \leq 0.8$, $h/(\lambda \cdot a) \leq 0.04\ (H/\lambda)^2 - 0.07\ H/\lambda + 0.1794$, and additionally, when $0.3 \leq H/\lambda < 0.45$, $h/(\lambda \cdot a) \geq 0.933\ (H/\lambda)^2 - 0.847\ H/\lambda + 0.331$, and when $0.45 \leq H/\lambda < 0.6$, $h/(\lambda \cdot a) \geq 0.081\ (H/\lambda)^2 - 0.118\ H/\lambda + 0.1759$, and when $0.6 \leq H/\lambda \leq 0.8$, $h/(\lambda \cdot a) \geq -0.005\ H/\lambda + 0.137$, when $19.5° \leq \theta < 20.5°$ and when $0.3 \leq H/\lambda < 0.4$, $h/(\lambda \cdot a) \leq 2.4\ (H/\lambda)^2 - 2\ H/\lambda + 0.574$, when $0.4 \leq H/\lambda < 0.55$, $h/(\lambda \cdot a) \leq 0.4\ (H/\lambda)^2 - 0.46\ H/\lambda + 0.278$, and when $0.55 \leq H/\lambda \leq 0.8$, $h/(\lambda \cdot a) \leq 0.0933\ (H/\lambda)^2 - 0.142\ H/\lambda + 0.1959$, and additionally, when $0.3 \leq H/\lambda < 0.45$, $h/(\lambda \cdot a) \geq 0.667\ (H/\lambda)^2 - 0.627\ H/\lambda + 0.281$, and when $0.45 \leq H/\lambda < 0.575$, $h/(\lambda \cdot a) \geq 0.107\ (H/\lambda)^2 - 0.141\ H/\lambda + 0.176$, and when $0.575 \leq H/\lambda \leq 0.8$, $h/(\lambda \cdot a) \geq -0.00444\ H/\lambda + 0.1326$, when $20.5° \leq \theta < 21.5°$ and when $0.3 \leq H/\lambda < 0.4$, $h/(\lambda \cdot a) \leq 2.2\ (H/\lambda)^2 - 1.83\ H/\lambda + 0.529$, when $0.4 \leq H/\lambda < 0.52$, $h/(\lambda \cdot a) \leq 0.357\ (H/\lambda)^2 - 0.404\ H/\lambda + 0.2533$, and when $0.52 \leq H/\lambda \leq 0.8$, $h/(\lambda \cdot a) \leq 0.0604\ (H/\lambda)^2 - 0.0976\ H/\lambda + 0.1744$, and additionally, when $0.3 \leq H/\lambda < 0.45$, $h/(\lambda \cdot a) \geq 0.733\ (H/\lambda)^2 - 0.657\ H/\lambda + 0.276$, and when $0.45 \leq H/\lambda \leq 0.8$, $h/(\lambda \cdot a) \geq 0.04286\ (H/\lambda)^2 - 0.065\ H/\lambda + 0.1496$, when $21.5° \leq \theta < 22.5°$ and when $0.3 \leq H/\lambda \leq 0.8$, $h/(\lambda \cdot a) \leq 0.198\ (H/\lambda)^2 - 0.291\ H/\lambda + 0.234$, and additionally, when $0.3 \leq H/\lambda < 0.45$, $h/(\lambda \cdot a) \geq 0.8\ (H/\lambda)^2 - 0.69\ H/\lambda + 0.2735$, and when $0.45 \leq H/\lambda \leq 0.8$, $h/(\lambda \cdot a) \geq -0.00286\ H/\lambda + 0.1263$, when $22.5° \leq \theta < 23.5°$ and when $0.3 \leq H/\lambda < 0.7$, $h/(\lambda \cdot a) \leq 0.568\ (H/\lambda)^2 - 0.649\ H/\lambda + 0.2976$, and when $0.7 \leq H/\lambda < 0.75$, $h/(\lambda \cdot a) \leq -0.03\ H/\lambda + 0.1425$, and additionally, when $0.3 \leq H/\lambda < 0.73$, $h/(\lambda \cdot a) \geq 0.136\ (H/\lambda)^2 - 0.174\ H/\lambda + 0.1719$, and when $0.73 \leq H/\lambda < 0.75$, $h/(\lambda \cdot a) \geq 0.125\ H/\lambda + 0.02625$, when $23.5° \leq \theta < 24°$ and when $0.3 \leq H/\lambda < 0.5$, $h/(\lambda \cdot a) \leq 0.4\ (H/\lambda)^2 - 0.46\ H/\lambda + 0.246$, and when $0.5 \leq H/\lambda \leq 0.8$, $h/(\lambda \cdot a) \leq 0.116$, and additionally, when $0.3 \leq H/\lambda < 0.5$, $h/(\lambda \cdot a) \geq 0.667\ (H/\lambda)^2 - 0.613\ H/\lambda + 0.253$, and when $0.5 \leq H/\lambda \leq 0.8$, $h/(\lambda \cdot a) \geq -0.01\ H/\lambda + 0.118$, or when $23.5° \leq \theta < 24°$ and when $0.3 \leq H/\lambda < 0.42$, $h/(\lambda \cdot a) \leq -0.208\ H/\lambda + 0.128$, and additionally, when $0.3 \leq H/\lambda < 0.42$, $h/(\lambda \cdot a) \geq -0.125\ H/\lambda + 0.0925$.

3. An elastic boundary wave device comprising:
a LiNbO$_3$ substrate;
an electrode exciting an elastic wave and provided on the substrate; and
a silicon oxide film provided on the substrate to cover the electrode,
wherein parameters of the elastic boundary wave device have any one of ranges below, where "$\theta$" is a rotation Y cut angle of the substrate, "a" is a ratio of copper density with respect to a density of a material used as the electrode, "$\lambda$" is a wavelength of the elastic wave excited by the electrode, "h" is a film thickness of the electrode, "H" is a thickness of the silicon oxide film:

when $0.03\lambda/a \leq h < 0.0375\lambda/a$ and when $0.3 \leq H/\lambda \leq 0.8$, $\theta \leq 75\ (H/\lambda)^2 - 82.5\ H/\lambda + 103.687$, and additionally, when $0.3 \leq H/\lambda < 0.65$, $\theta \geq -85.7\ H/\lambda + 97.7$, and when $0.65 \leq H/\lambda \leq 0.8$, $\theta \geq 42$, or when $0.03\lambda/a \leq h < 0.0375\lambda/a$ and when $0.45 \leq H/\lambda < 0.65$, $\theta \leq 120 H/\lambda - 36$, and when $0.65 \leq H/\lambda \leq 0.8$, $\theta \leq 42$, and additionally, when $0.45 \leq H/\lambda < 0.5$, $\theta \geq 18$, and when $0.5 \leq H/\lambda \leq 0.8$, $\theta \geq 40\ H/\lambda - 2$, when $0.0375\lambda/a \leq h < 0.0525\lambda/a$ and when $0.3 \leq H/\lambda \leq 0.8$, $\theta \leq 24\ H/\lambda + 88.8$, and additionally, when $0.3 \leq H/\lambda < 0.55$, $\theta \geq -120\ H/\lambda + 114$, and when $0.55 \leq H/\lambda \leq 0.8$, $\theta \geq 48$, or when $0.0375\lambda/a \leq h < 0.0525\lambda/a$ and when $0.43 \leq H/\lambda < 0.55$, $\theta \leq 180\ H/\lambda - 51$, and when $0.55 \leq H/\lambda \leq 0.8$, $\theta \leq 48$, and additionally, when $0.43 \leq H/\lambda \leq 0.8$, $\theta \geq 34.3\ H/\lambda + 11.6$, when $0.0525\lambda/a \leq h < 0.065\lambda/a$ and when $0.45 \leq H/\lambda \leq 0.8$, $\theta \leq 80\ H/\lambda - 4$, and additionally, when $0.45 \leq H/\lambda \leq 0.8$, $\theta \geq 20\ H/\lambda + 23$, when $0.065\lambda/a \leq h < 0.0725\lambda/a$ and when $0.3 \leq H/\lambda < 0.7$, $\theta \leq -26.7\ (H/\lambda)^2 + 52\ H/\lambda + 15.5$, and when $0.7 \leq H/\lambda \leq 0.8$, $\theta \leq 25\ H/\lambda + 21$, and additionally, when $0.3 \leq H/\lambda \leq 0.8$, $\theta \geq -16.7\ (H/\lambda)^2 + 38.3\ H/\lambda + 16$, when $0.0725\lambda/a \leq h < 0.0775\lambda/a$ and when $0.3 \leq H/\lambda \leq 0.8$, $\theta \leq -25\ (H/\lambda)^2 + 47.5\ H/\lambda + 17$, and additionally, when $0.3 \leq H/\lambda \leq 0.8$, $\theta \geq -25\ (H/\lambda)^2 + 42.5\ H/\lambda + 15.2$, when $0.0775\lambda/a \leq h < 0.0825\lambda/a$ and
  when $0.3 \leq H/\lambda \leq 0.8$, $\theta \leq -21.4\,(H/\lambda)^2 + 38.2\,H/\lambda + 20.1$, and additionally,
  when $0.3 \leq H/\lambda \leq 0.8$, $\theta \geq -23.3\,(H/\lambda)^2 + 35.8\,H/\lambda + 17.4$,
when $0.0825\lambda/a \leq h < 0.0875\lambda/a$ and
  when $0.3 \leq H/\lambda \leq 0.8$, $\theta \leq -13.3\,(H/\lambda)^2 + 24.7\,H/\lambda + 24$, and additionally,
  when $0.3 \leq H/\lambda \leq 0.8$, $\theta \geq -16\,(H/\lambda)^2 + 25.6\,H/\lambda + 19.8$,
when $0.0875\lambda/a \leq h < 0.0925\lambda/a$, and
  when $0.3 \leq H/\lambda < 0.55$, $\theta \leq 10\,H/\lambda + 26.5$, and
  when $0.55 \leq H/\lambda \leq 0.8$, $\theta \leq 6\,H/\lambda + 28.7$, and additionally,
  when $0.3 \leq H/\lambda \leq 0.8$, $\theta \geq 4\,H/\lambda + 25.3$,
when $0.0925\lambda/a \leq h < 0.0975\lambda/a$ and
  when $0.3 \leq H/\lambda \leq 0.8$, $\theta \leq 4\,H/\lambda + 28.3$, and additionally,
  when $0.3 \leq H/\lambda \leq 0.8$, $\theta \geq 2\,H/\lambda + 25.9$,
when $0.0975\lambda/a \leq h < 0.1025\lambda/a$ and
  when $0.3 < H/\lambda \leq 0.8$, $\theta \leq 2\,H/\lambda + 28.2$, and additionally,
  when $0.3 \leq H/\lambda \leq 0.8$, $\theta \geq 26$, and
when $0.1025\lambda/a \leq h < 0.105\lambda/a$ and
  when $0.3 \leq H/\lambda \leq 0.8$, $\theta \leq 28$, and additionally,
  when $0.3 \leq H/\lambda < 0.5$, $\theta \geq -5\,H/\lambda + 27.5$, and
  when $0.5 \leq H/\lambda \leq 0.8$, $\theta \geq 25$.

4. The elastic boundary wave device as claimed in claim 2, wherein a propagation direction of the elastic wave having a main component of SH wave is an x-axis direction of the substrate.

5. The elastic boundary wave device as claimed in claim 2, further comprising a medium membrane provided on the silicon oxide film.

6. The elastic boundary wave device as claimed in claim 5, wherein a sound velocity in the medium membrane is faster than that in the silicon oxide film.

7. The elastic boundary wave device as claimed in claim 5, wherein the medium membrane includes any of silicon nitride, aluminum silicon, aluminum oxide, and silicon.

8. The elastic boundary wave device as claimed in claim 2, wherein the density of the electrode is greater than that of the silicon oxide film.

9. The elastic boundary wave device as claimed in claim 2, wherein the electrode includes copper.

10. The elastic boundary wave device as claimed in claim 2, wherein the electrode has a multilayer structure with two or more layers.

11. The elastic boundary wave device as claimed in claim 10, wherein the electrode includes a titanium layer provided on the substrate and a copper layer provided on the titanium layer.

12. The elastic boundary wave device as claimed in claim 2, further comprising a barrier layer covering the electrode.

13. A resonator comprising the elastic boundary wave device as claimed in any one of claims 1 through 3.

14. A filter comprising the elastic boundary wave device as claimed in any one of claims 1 through 3.

* * * * *